US011450752B2

(12) United States Patent
Fukuda et al.

(10) Patent No.: US 11,450,752 B2
(45) Date of Patent: Sep. 20, 2022

(54) SEMICONDUCTOR DEVICE

(71) Applicant: ROHM CO., LTD., Kyoto (JP)

(72) Inventors: Yoshinori Fukuda, Kyoto (JP); Hajime Okuda, Kyoto (JP); Yuji Osumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 71 days.

(21) Appl. No.: 16/831,791

(22) Filed: Mar. 26, 2020

(65) Prior Publication Data

US 2020/0312975 A1 Oct. 1, 2020

(30) Foreign Application Priority Data

Mar. 29, 2019 (JP) ............................. JP2019-068673

(51) Int. Cl.

| | |
|---|---|
| ***H01L 29/41*** | (2006.01) |
| ***H01L 29/49*** | (2006.01) |
| ***G05F 1/46*** | (2006.01) |
| ***H01L 29/861*** | (2006.01) |

(52) U.S. Cl.
CPC .......... *H01L 29/4916* (2013.01); *G05F 1/463* (2013.01); *H01L 29/861* (2013.01)

(58) Field of Classification Search
CPC combination set(s) only.
See application file for complete search history.

(56) References Cited

U.S. PATENT DOCUMENTS

| | | | | |
|---|---|---|---|---|
| 2015/0325558 A1* | 11/2015 | Hikasa | H01L 29/861 257/49 |
| 2015/0378376 A1 | 12/2015 | Matsui et al. | |
| 2018/0350960 A1* | 12/2018 | Naito | H01L 21/743 |

* cited by examiner

*Primary Examiner* — Moin M Rahman
(74) *Attorney, Agent, or Firm* — Rabin & Berdo, P.C.

(57) ABSTRACT

A semiconductor device includes a substrate having a main surface, and a temperature-sensitive diode structure having a trench formed in the main surface, a polysilicon layer embedded in the trench, a p-type anode region formed in the polysilicon layer, and an n-type cathode region formed in the polysilicon layer.

18 Claims, 86 Drawing Sheets

SEMICONDUCTOR DEVICE

CROSS REFERENCE TO RELATED APPLICATIONS

This application claims the benefit of priority to Japanese Patent Application No. 2019-068673 filed on Mar. 29, 2019. The entire contents of the application are hereby incorporated herein by reference.

BACKGROUND OF THE INVENTION

1. Field of the Invention

The present invention relates to a semiconductor device having a temperature-sensitive diode structure.

2. Description of the Related Art

US2015378376A1 discloses a semiconductor device which includes a substrate, an insulation film formed on the substrate, and a temperature detecting diode formed on the insulation film (temperature-sensitive diode structure). The temperature detecting diode includes a polysilicon layer, a p-type anode region formed in the polysilicon layer, and an n-type cathode region formed in the polysilicon layer.

SUMMARY OF THE INVENTION

A preferred embodiment of the present invention provides a semiconductor device which includes a substrate having a main surface, and a temperature-sensitive diode structure having a trench formed in the main surface, a polysilicon layer embedded in the trench, a p-type anode region formed in the polysilicon layer, and an n-type cathode region formed in the polysilicon layer.

The aforementioned or other objects, features, and effects of the present invention will be clarified by the following description of preferred embodiments given below with reference to the accompanying drawings.

DETAILED DESCRIPTION OF THE PREFERRED EMBODIMENTS

A preferred embodiment of the present invention provides a semiconductor device which includes a substrate having a main surface, and a temperature-sensitive diode structure having a trench formed in the main surface, a polysilicon layer embedded in the trench, a p-type anode region formed in the polysilicon layer, and an n-type cathode region formed in the polysilicon layer. According to this structure, it is possible to provide a semiconductor device capable of suppressing an increase in size thereof due to the temperature-sensitive diode structure.

Hereinafter, with reference to attached drawings, a description will be given of preferred embodiments of the present invention.

Figure 1:
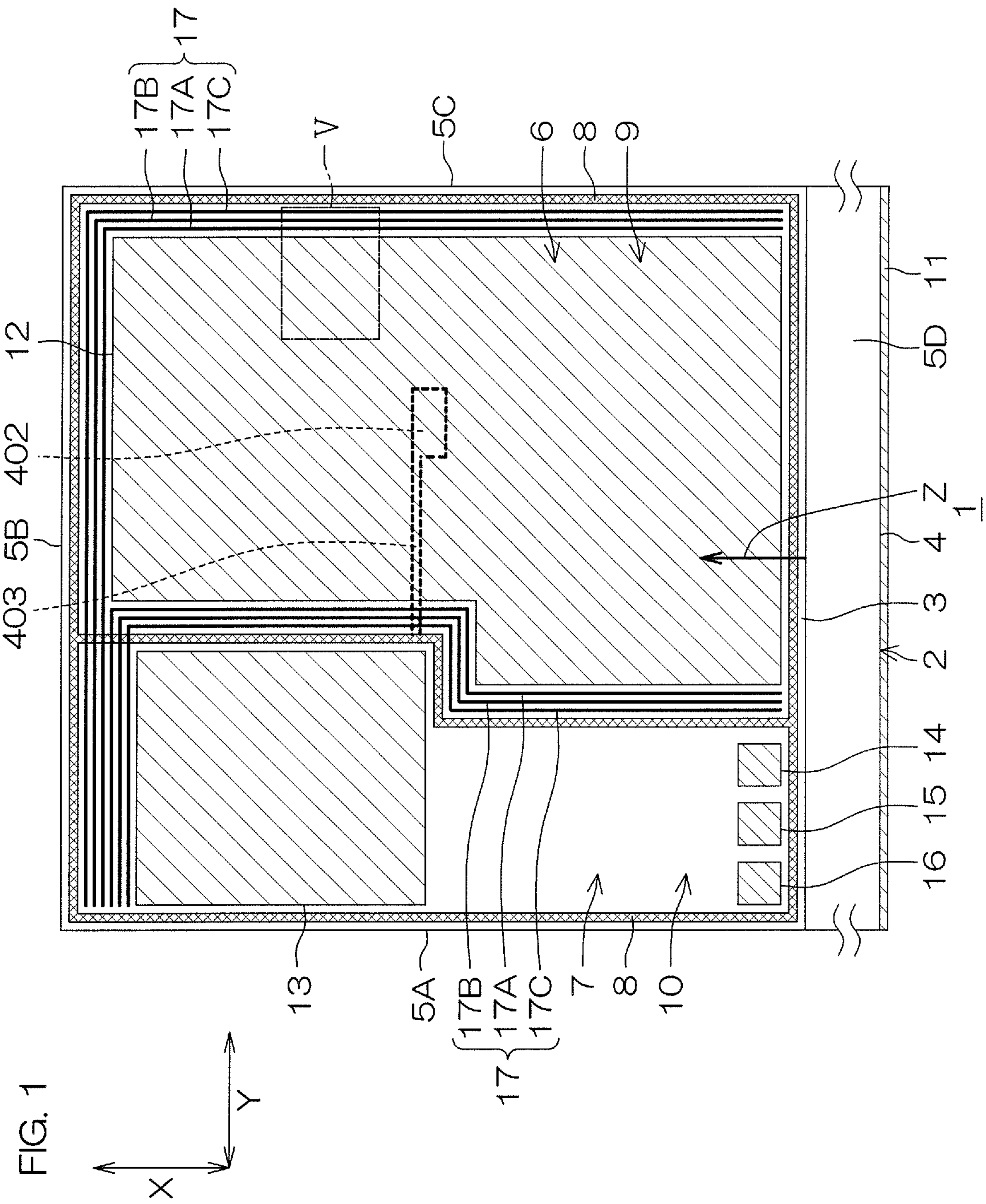
FIG. 1 is a perspective view of a semiconductor device according to a first preferred embodiment of the present invention which is viewed from one direction.

FIG. 1 is a perspective view of a semiconductor device 1 according to a first preferred embodiment of the present invention which is viewed from one direction. Hereinafter, a description will be given of a configuration example in which the semiconductor device 1 is a high-side switching device. However, the semiconductor device 1 is not restricted to the high-side switching device. The semiconductor device 1 can also be provided as a low-side switching device by adjusting electrical connection configurations and functions of various structures.

With reference to FIG. 1, the semiconductor device 1 includes a semiconductor layer 2 as an example of a substrate. The semiconductor layer 2 includes silicon. The semiconductor layer 2 is formed in a rectangular parallelepiped chip shape. The semiconductor layer 2 has a first main surface 3 on one side, a second main surface 4 on the other side, and side surfaces 5A, 5B, 5C, and 5D connecting the first main surface 3 and the second main surface 4.

The first main surface 3 and the second main surface 4 are each formed in a rectangular shape in plan view when viewed from a normal direction Z thereof (hereinafter, simply referred to as "plan view"). The side surface 5A and the side surface 5C extend along a first direction X and face each other in a second direction Y which intersects the first direction X. The side surface 5B and the side surface 5D extend along the second direction Y and face each other in the first direction X. Specifically, the second direction Y is orthogonal to the first direction X.

An output region 6 and an input region 7 are defined in the semiconductor layer 2. The output region 6 is defined in a region at the side surface 5C side. The input region 7 is defined in a region at the side surface 5A side. In plan view, an area SOUT of the output region 6 is equal to or larger than an area SIN of the input region 7 (SIN≤SOUT).

A ratio SOUT/SIN of the area SOUT with respect to the area SIN may be from not less than 1 to not more than 10 (1≤SOUT/SIN≤10). The ratio SOUT/SIN may be from not less than 1 to not more than 2, from not less than 2 to not more than 4, from not less than 4 to not more than 6, from not less than 6 to not more than 8, or from not less than 8 to not more than 10. Planar shapes of the input region 7 and the output region 6 are arbitrary and not restricted to particular shapes. As a matter of course, the ratio SOUT/SIN may be in excess of 0 and less than 1.

The output region 6 is a transistor region which includes a power MISFET (Metal Insulator Semiconductor Field Effect Transistor) 9 as an example of an insulation gate type transistor. The power MISFET 9 includes a gate, a drain, and a source.

The input region 7 includes a control IC (Integrated Circuit) 10 as an example of a control circuit. The control IC 10 includes plural types of functional circuits which realize various functions. The plural types of functional circuits include a circuit generating gate control signals which drive and control the power MISFET 9 based on an external electrical signal. The control IC 10 forms a so-called IPD (Intelligent Power Device) together with the power MISFET 9. The IPD is also referred to as an IPM (Intelligent Power Module).

The input region 7 is electrically insulated from the output region 6 by a region separation structure 8. In FIG. 1, the region separation structure 8 is indicated by hatching. Although a specific description shall be omitted, the region separation structure 8 may have a trench insulating structure in which an insulator is embedded in the trench.

On the semiconductor layer 2, a plurality of (in this embodiment, six) of electrodes 11, 12, 13, 14, 15, and 16 are formed. In FIG. 1, the plurality of electrodes 11 to 16 are indicated by hatching. Each of the electrodes 11 to 16 is formed as a terminal electrode to be externally connected by a lead wire (for example, bonding wire), etc. The number, the arrangement, and the shape of the plurality of electrodes 11 to 16 are arbitrary and are not restricted to the configuration shown in FIG. 1.

The number, the arrangement, and the shape of the plurality of electrodes 11 to 16 are adjusted according to the specification of the power MISFET 9 and/or the specification of the control IC 10. In this embodiment, the plurality of electrodes 11 to 16 include a drain electrode 11 (power supply electrode), a source electrode 12 (output electrode), an input electrode 13, a reference voltage electrode 14, an ENABLE electrode 15, and a SENSE electrode 16.

The drain electrode 11 is formed on the second main surface 4 of the semiconductor layer 2. The drain electrode 11 is electrically connected to the second main surface 4 of the semiconductor layer 2. The drain electrode 11 transmits a power supply voltage VB to the drain of the power MISFET 9 and to various types of circuits of the control IC 10.

The drain electrode 11 may include at least any one of a Ti layer, a Ni layer, an Au layer, an Ag layer and an Al layer. The drain electrode 11 may have a single layer structure which includes a Ti layer, a Ni layer, an Au layer, an Ag layer, or an Al layer. The drain electrode 11 may have a laminated structure in which at least two of a Ti layer, a Ni layer, an Au layer, an Ag layer, and an Al layer are laminated in any given manner.

The source electrode 12 is formed on the output region 6 in the first main surface 3. The source electrode 12 is electrically connected to the source of the power MISFET 9. The source electrode 12 transmits an electrical signal generated by the power MISFET 9 to the outside.

The input electrode 13, the reference voltage electrode 14, the ENABLE electrode 15, and the SENSE electrode 16 are each formed on the input region 7 in the first main surface 3. The input electrode 13 transmits an input voltage for driving the control IC 10.

The reference voltage electrode 14 transmits the reference voltage (for example, a ground voltage) to the control IC 10. The ENABLE electrode 15 transmits an electrical signal for partially or totally enabling or disabling functions of the control IC 10. The SENSE electrode 16 transmits an electrical signal for detecting malfunction of the control IC 10.

A gate control wiring 17 as an example of a control wiring is also formed anywhere on the semiconductor layer 2. The gate control wiring 17 is selectively laid around on the output region 6 and on the input region 7. The gate control wiring 17 is electrically connected to the gate of the power MISFET 9 in the output region 6 and electrically connected to the control IC 10 in the input region 7.

The gate control wiring 17 transmits gate control signals generated by the control IC 10 to the gate of the power MISFET 9. The gate control signals include an ON signal Von and an OFF signal Voff, and control an ON state and an OFF state of the power MISFET 9.

The ON signal Von is not less than a gate threshold voltage Vth of the power MISFET 9 (Vth≤Von). The OFF signal Voff is less than the gate threshold voltage Vth of the power MISFET 9 (Voff<Vth). The OFF signal Voff may be the reference voltage (for example, the ground voltage).

In this embodiment, the gate control wiring 17 includes a first gate control wiring 17A, a second gate control wiring 17B, and a third gate control wiring 17C. The first gate control wiring 17A, the second gate control wiring 17B, and the third gate control wiring 17C are electrically insulated from each other.

In this embodiment, two first gate control wirings 17A are laid around in different regions. Two second gate control wirings 17B are also laid around in different regions. Further, two third gate control wirings 17C are laid around in different regions.

The first gate control wiring 17A, the second gate control wiring 17B, and the third gate control wiring 17C transmit the same gate control signal or different gate control signals to the gate of the power MISFET 9. The number, the arrangement, and the shape, etc., of the gate control wiring 17 are arbitrary and adjusted in accordance with a transmitted distance of the gate control signals and/or the number of the gate control signals to be transmitted.

The source electrode 12, the input electrode 13, the reference voltage electrode 14, the ENABLE electrode 15, the SENSE electrode 16, and the gate control wiring 17 may each include at least any one of nickel, palladium, aluminum, copper, an aluminum alloy, and a copper alloy.

The source electrode 12, the input electrode 13, the reference voltage electrode 14, the ENABLE electrode 15, the SENSE electrode 16, and the gate control wiring 17 may each include at least any one of an Al—Si—Cu (aluminum-silicon-copper) alloy, an Al—Si (aluminum-silicon) alloy, and an Al—Cu (aluminum-copper) alloy.

The source electrode 12, the input electrode 13, the reference voltage electrode 14, the ENABLE electrode 15, the SENSE electrode 16, and the gate control wiring 17 may include the same type of electrode material or may include an electrode material which is different from each other.

Figure 2:
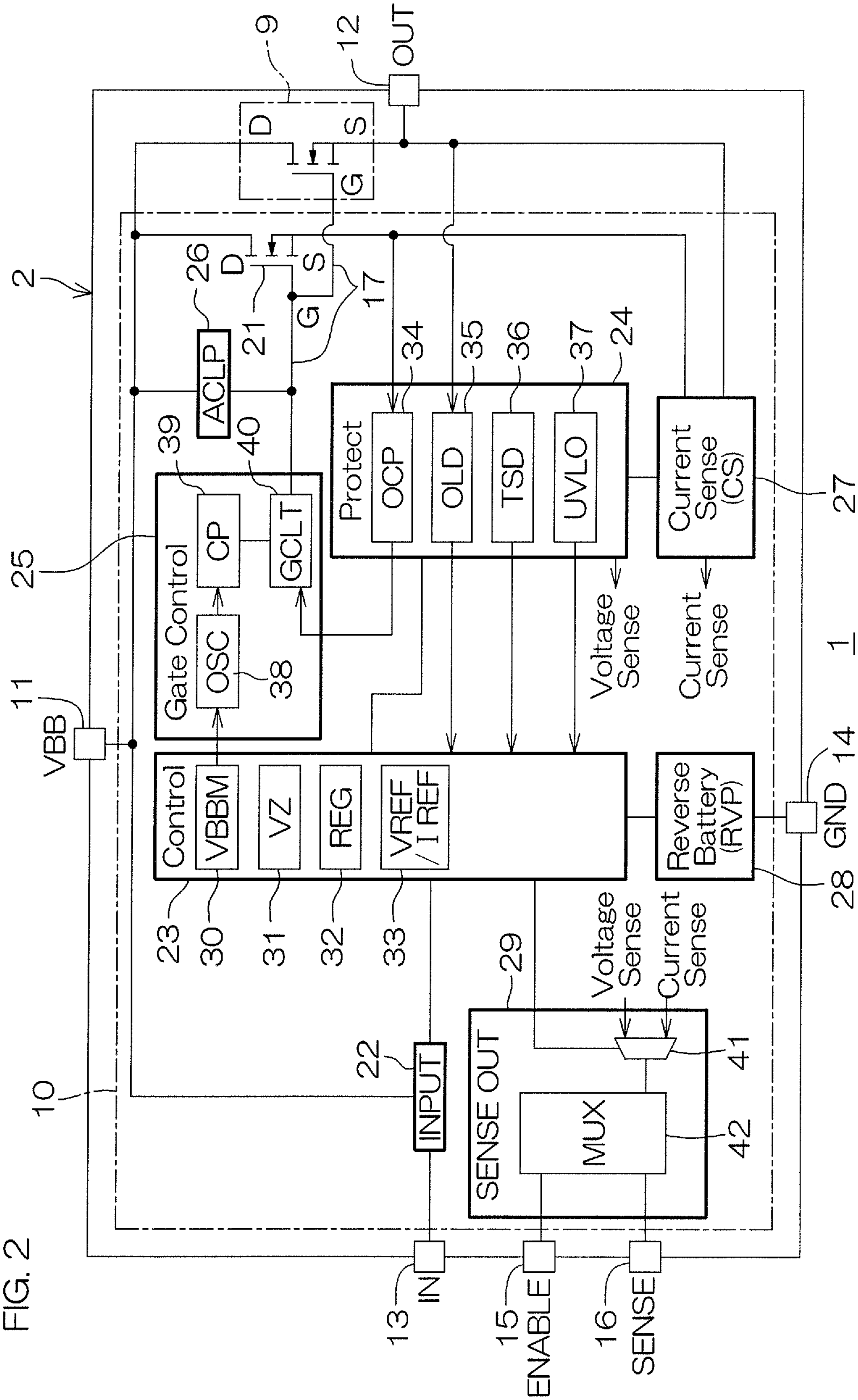
FIG. 2 is a block circuit diagram which shows an electrical configuration of the semiconductor device shown in FIG. 1.

FIG. 2 is a block circuit diagram which shows an electrical configuration of the semiconductor device 1 shown in FIG. 1. Hereinafter, a description will be given of an example in which the semiconductor device 1 is adopted into a vehicle.

The semiconductor device 1 includes a drain electrode 11, a source electrode 12, an input electrode 13, the reference voltage electrode 14, an ENABLE electrode 15, a SENSE electrode 16, a gate control wiring 17, a power MISFET 9, and a control IC 10.

The drain electrode 11 is connected to a power supply. The drain electrode 11 supplies a power supply voltage VB to the power MISFET 9 and the control IC 10. The power supply voltage VB may be from not less than 10 V to not more than 20 V. The source electrode 12 is connected to a load.

The input electrode 13 may be connected to an MCU (Micro Controller Unit), a DC/DC converter, an LDO (Low Drop Out), etc. The input electrode 13 supplies an input voltage to the control IC 10. The input voltage may be from not less than 1 V to not more than 10 V. The reference voltage electrode 14 is connected to the reference voltage wiring. The reference voltage electrode 14 supplies the reference voltage to the power MISFET 9 and the control IC 10.

The ENABLE electrode 15 may be connected to an MCU. An electrical signal partially or totally enabling or disabling functions of the control IC 10 is input to the ENABLE electrode 15. The SENSE electrode 16 may be connected to a resistor.

The gate of the power MISFET 9 is connected to the control IC 10 (a gate control circuit 25 to be described later) through the gate control wiring 17. The drain of the power MISFET 9 is connected to the drain electrode 11. The source of the power MISFET 9 is connected to the control IC 10 (a current detecting circuit 27 to be described later) and the source electrode 12.

The control IC 10 includes a sensor MISFET 21, an input circuit 22, a current-voltage control circuit 23, a protection circuit 24, a gate control circuit 25, an active clamp circuit 26, a current detecting circuit 27, a power-supply reverse connection protection circuit 28, and a malfunction detection circuit 29.

A gate of the sensor MISFET 21 is connected to the gate control circuit 25. A drain of the sensor MISFET 21 is connected to the drain electrode 11. A source of the sensor MISFET 21 is connected to the current detecting circuit 27.

The input circuit 22 is connected to the input electrode 13 and the current-voltage control circuit 23. The input circuit 22 may include a Schmitt trigger circuit. The input circuit 22 shapes a waveform of an electrical signal applied to the input electrode 13. The signal generated by the input circuit 22 is input to the current-voltage control circuit 23.

The current-voltage control circuit 23 is connected to the protection circuit 24, the gate control circuit 25, the power-supply reverse connection protection circuit 28, and the malfunction detection circuit 29. The current-voltage control circuit 23 may include a logic circuit.

The current-voltage control circuit 23 generates various voltages according to an electrical signal from the input circuit 22 and an electrical signal from the protection circuit 24. In this embodiment, the current-voltage control circuit 23 includes a driving voltage generation circuit 30, a first constant voltage generation circuit 31, a second constant voltage generation circuit 32, and the reference voltage-reference current generation circuit 33.

The driving voltage generation circuit 30 generates a driving voltage by which the gate control circuit 25 is driven. The driving voltage may be set at a value obtained by subtracting a predetermined value from the power supply voltage VB. The driving voltage generation circuit 30 may generate a driving voltage of not less than 5 V to not more than 15 V which is obtained by subtracting 5 V from the power supply voltage VB. The driving voltage is input to the gate control circuit 25.

The first constant voltage generation circuit 31 generates a first constant voltage for driving the protection circuit 24. The first constant voltage generation circuit 31 may include a Zener diode and/or a regulator circuit (here, the Zener diode is included). The first constant voltage may be from not less than 1 V to not more than 5 V. The first constant voltage is input to the protection circuit 24 (specifically, a load open detection circuit 35 to be described, etc.).

The second constant voltage generation circuit 32 generates a second constant voltage for driving the protection circuit 24. The second constant voltage generation circuit 32 may include a Zener diode and/or a regulator circuit (here, the regulator circuit). The second constant voltage may be from not less than 1 V to not more than 5 V. The second constant voltage is input to the protection circuit 24 (specifically, an overheat protection circuit 36 and a low-voltage malfunction suppression circuit 37 which are to be described later).

The reference voltage-reference current generation circuit 33 generates the reference voltage and a reference current of various types of circuits. The reference voltage may be from not less than 1 V to not more than 5 V. The reference current may be from not less than 1 mA to not more than 1 A. The reference voltage and the reference current are input to various types of circuits. In a case where various types of circuits include a comparator, the reference voltage and the reference current may be input to the comparator.

The protection circuit 24 is connected to the current-voltage control circuit 23, the gate control circuit 25, the malfunction detection circuit 29, the source of the power MISFET 9, and the source of the sensor MISFET 21. The protection circuit 24 includes an overcurrent protection circuit 34, a load open detection circuit 35, an overheat protection circuit 36, and a low-voltage malfunction suppression circuit 37.

The overcurrent protection circuit 34 protects the power MISFET 9 from an overcurrent. The overcurrent protection circuit 34 is connected to the gate control circuit 25 and the source of the sensor MISFET 21. The overcurrent protection circuit 34 may include a current monitor circuit. A signal generated by the overcurrent protection circuit 34 is input to the gate control circuit 25 (specifically, a driving signal output circuit 40 to be described later).

The load open detection circuit 35 detects a load short state or a load open state. The load open detection circuit 35 is connected to the current-voltage control circuit 23 and the source of the power MISFET 9. A signal generated by the load open detection circuit 35 is input to the current-voltage control circuit 23.

The overheat protection circuit 36 monitors a temperature of the power MISFET 9 to protect the power MISFET 9 from an excessive temperature rise. The overheat protection circuit 36 is connected to the current-voltage control circuit 23. The overheat protection circuit 36 includes a temperature sensitive device. Specifically, the overheat protection circuit 36 includes a temperature-sensitive diode DT as an example of the temperature sensitive device. A signal generated by the overheat protection circuit 36 is input to the current-voltage control circuit 23.

The low-voltage malfunction suppression circuit 37 suppresses malfunction of the power MISFET 9 in a case where the power supply voltage VB is less than a predetermined value. The low-voltage malfunction suppression circuit 37 is connected to the current-voltage control circuit 23. A signal generated by the low-voltage malfunction suppression circuit 37 is input to the current-voltage control circuit 23.

The gate control circuit 25 controls an ON state and an OFF state of the power MISFET 9 as well as an ON state and an OFF state of the sensor MISFET 21. The gate control circuit 25 is connected to the current-voltage control circuit 23, the protection circuit 24, the gate of the power MISFET 9, and the gate of the sensor MISFET 21.

The gate control circuit 25 generates plural types of gate control signals in accordance with the number of the gate control wirings 17 in response to an electrical signal from the current-voltage control circuit 23 and an electrical signal from the protection circuit 24. The plural types of gate control signals are each input to the gate of the power MISFET 9 and the gate of the sensor MISFET 21 through the gate control wiring 17.

The gate control circuit 25 may include an oscillation circuit 38, a charge pump circuit 39, and a driving signal output circuit 40. The oscillation circuit 38 oscillates in response to the electrical signal from the current-voltage control circuit 23 to generate a predetermined electrical signal. The electrical signal generated by the oscillation circuit 38 is input to the charge pump circuit 39. The charge pump circuit 39 boosts the electrical signal sent from the oscillation circuit 38. The electrical signal which is boosted by the charge pump circuit 39 is input to the driving signal output circuit 40.

The driving signal output circuit 40 generates plural types of gate control signals in response to the electrical signal from the charge pump circuit 39 and the electrical signal from the protection circuit 24 (specifically, the overcurrent protection circuit 34). The plural types of gate control signals are input to the gate of the power MISFET 9 and the gate of the sensor MISFET 21 through the gate control wiring 17. The sensor MISFET 21 and the power MISFET 9 are controlled at the same time by the gate control circuit 25.

The active clamp circuit 26 protects the power MISFET 9 from a counter electromotive force. The active clamp circuit 26 is connected to the drain electrode 11, the gate of the power MISFET 9, and the gate of the sensor MISFET 21. The active clamp circuit 26 may include a plurality of diodes.

The active clamp circuit 26 may include a plurality of diodes which are connected to each other in a biased manner. The active clamp circuit 26 may include a plurality of diodes which are connected to each other in a reverse-biased manner. The active clamp circuit 26 may include a plurality of diodes which are connected to each other in a biased manner and a plurality of diodes which are connected to each other in a reverse-biased manner.

The plurality of diodes may include a pn junction diode or a Zener diode, or a pn junction diode and a Zener diode. The active clamp circuit 26 may include a plurality of Zener diodes which are connected to each other in a biased manner. The active clamp circuit 26 may include a Zener diode and a pn junction diode which are connected to each other in a reverse-biased manner.

The current detecting circuit 27 detects a current which flows through the power MISFET 9 and the sensor MISFET 21. The current detecting circuit 27 is connected to the protection circuit 24, the malfunction detection circuit 29, the source of the power MISFET 9, and the source of the sensor MISFET 21. The current detecting circuit 27 generates a current detection signal in response to an electrical signal generated by the power MISFET 9 and an electrical signal generated by the sensor MISFET 21. The current detection signal is input to the malfunction detection circuit 29.

The power-supply reverse connection protection circuit 28 protects the current-voltage control circuit 23, the power MISFET 9, etc., from a reverse voltage when a power supply is connected reversely. The power-supply reverse connection protection circuit 28 is connected to the reference voltage electrode 14 and the current-voltage control circuit 23.

The malfunction detection circuit 29 monitors a voltage of the protection circuit 24. The malfunction detection circuit 29 is connected to the current-voltage control circuit 23, the protection circuit 24, and the current detecting circuit 27. In a case where malfunction (change in voltage, etc.) occurs in any of the overcurrent protection circuit 34, the load open detection circuit 35, the overheat protection circuit 36, and the low-voltage malfunction suppression circuit 37, the malfunction detection circuit 29 generates and outputs to the outside a malfunction detecting signal in accordance with a voltage of the protection circuit 24.

Specifically, the malfunction detection circuit 29 includes a first multiplexer circuit 41 and a second multiplexer circuit 42. The first multiplexer circuit 41 includes two input portions, one output portion, and one selection control input portion. The protection circuit 24 and the current detecting circuit 27 are each connected to the input portions of the first multiplexer circuit 41. The second multiplexer circuit 42 is connected to the output portion of the first multiplexer circuit 41. The current-voltage control circuit 23 is connected to the selection control input portion of the first multiplexer circuit 41.

The first multiplexer circuit 41 generates a malfunction detecting signal in response to an electrical signal from the current-voltage control circuit 23, a voltage detecting signal from the protection circuit 24, and a current detection signal from the current detecting circuit 27. The malfunction detecting signal generated by the first multiplexer circuit 41 is input to the second multiplexer circuit 42.

The second multiplexer circuit 42 includes two input portions and one output portion. The output portion of the second multiplexer circuit 42 and the ENABLE electrode 15 are each connected to the input portions of the second multiplexer circuit 42. The SENSE electrode 16 is connected to the output portion of the second multiplexer circuit 42.

In a case where the MCU is connected to the ENABLE electrode 15 and the resistor is connected to the SENSE electrode 16, an ON signal is input from the MCU to the ENABLE electrode 15 and a malfunction detecting signal is taken out from the SENSE electrode 16. The malfunction detecting signal is converted to an electrical signal by the resistor connected to the SENSE electrode 16. A malfunction state of the semiconductor device 1 is detected based in the electrical signal.

Figure 3:
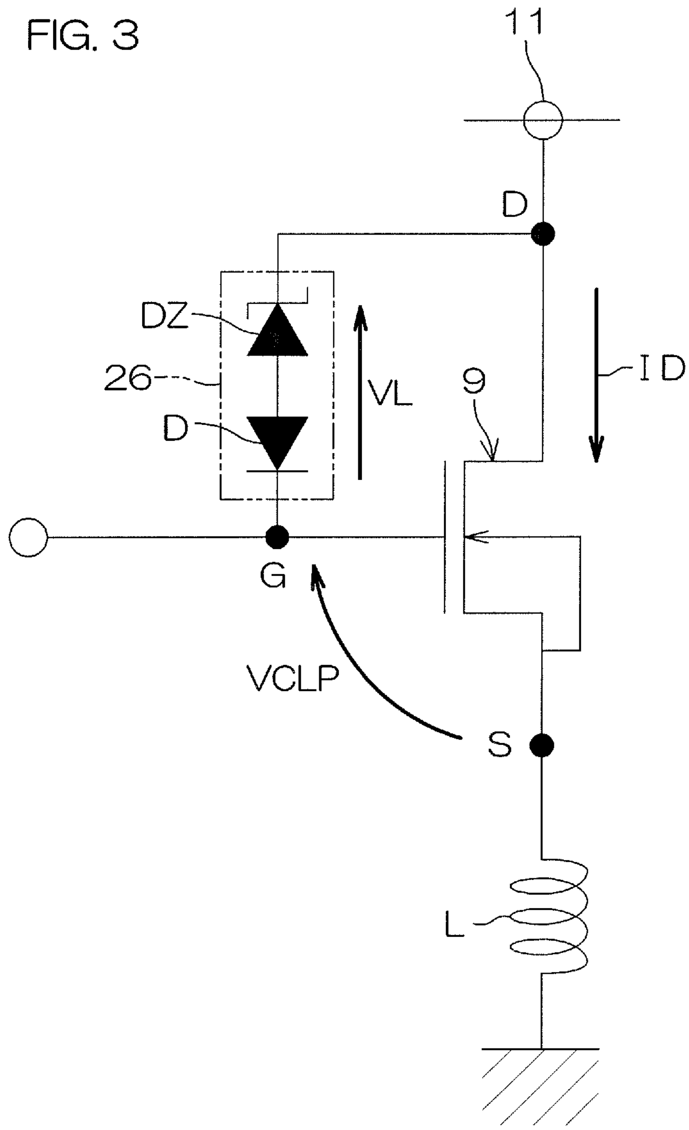
FIG. 3 is a circuit diagram for describing a normal operation and an active clamp operation of the semiconductor device shown in FIG. 1.
Figure 4:
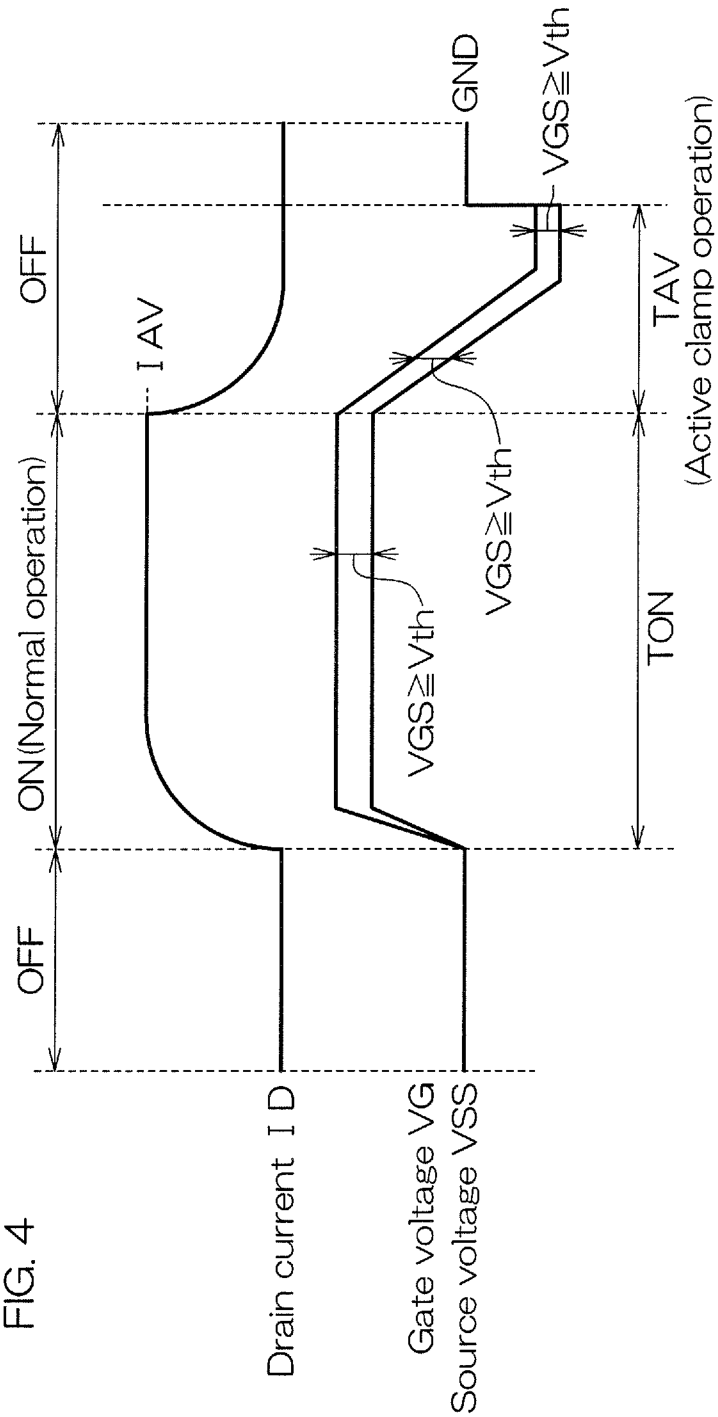
FIG. 4 is a waveform chart of a main electrical signal applied to the circuit diagram shown in FIG. 3.

FIG. 3 is a circuit diagram for describing active clamp operation of the semiconductor device 1 shown in FIG. 1. FIG. 4 is a waveform chart of a main electrical signal of the circuit diagram shown in FIG. 3.

Here, a circuit example in which an inductive load L is connected to the power MISFET 9 is used to describe a normal operation and an active clamp operation of the semiconductor device 1. A device which uses a winding (coil) such as a solenoid, a motor, a transformer, a relay, etc., is shown as an example of the inductive load L. The inductive load L is also called an L load.

With reference to FIG. 3, the source of the power MISFET 9 is electrically connected to the inductive load L. The drain of the power MISFET 9 is electrically connected to the drain electrode 11. The gate and the drain of the power MISFET 9 are connected to the active clamp circuit 26. In this circuit example, the active clamp circuit 26 includes the m number (m is a natural number) of Zener diodes DZ and the n number (n is a natural number) of pn junction diodes D. The pn junction diode D is connected to the Zener diode DZ in a reverse-biased manner.

With reference to FIG. 3 and FIG. 4, when an ON signal Von is input to the gate of the power MISFET 9 in an OFF state, the power MISFET 9 is switched from the OFF state to an ON state (a normal operation). The ON signal Von has a voltage equal to or larger than the gate threshold voltage Vth (Vth≤Von). The power MISFET 9 is kept in the ON state only for a predetermined in time TON.

When the power MISFET 9 is switched to the ON state, a drain current ID starts to flow from the drain of the power MISFET 9 to the source. The drain current ID increases from zero to a predetermined value and saturates. The inductive load L allows an inductive energy to accumulate due to an increase in the drain current ID.

When an OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage).

In transition when the power MISFET 9 is switched from the ON state to the OFF state, an inductive energy of the inductive load L is applied as a counter electromotive force to the power MISFET 9. Thereby, the power MISFET 9 is shifted to an active clamp state (an active clamp operation). When the power MISFET 9 is shifted to the active clamp state, a source voltage VSS sharply lowers to a negative voltage less than the reference voltage (ground voltage).

At this time, the source voltage VSS is limited to a voltage equal to or more than a voltage obtained by subtracting a limit voltage VL and a clamp ON voltage VCLP from a power supply voltage VB due to operation of the active clamp circuit 26 (VSS≥VB-VL-VCLP).

In other words, when the power MISFET 9 is shifted to an active clamp state, a drain voltage VDS between the drain and the source of the power MISFET 9 sharply rises to a clamp voltage VDSSCL. The clamp voltage VDSSCL is limited to a voltage equal to or less than a voltage obtained by adding a clamp ON voltage VCLP and a limit voltage VL (VDS≤VCLP+VL) by the power MISFET 9 and the active clamp circuit 26.

In this embodiment, the limit voltage VL is a sum of a voltage between terminals VZ of a Zener diode DZ and a voltage between terminals VF of a pn junction diode in the active clamp circuit 26 (VL=m·VZ+n·VF).

The clamp ON voltage VCLP is a positive voltage (that is, a gate voltage VGS) applied between the gate and the source of the power MISFET 9. The clamp ON voltage VCLP is equal to or more than the gate threshold voltage Vth (Vth≤VCLP). Therefore, the power MISFET 9 keeps the ON state in an active clamp state.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL≤VDSS).

In a case where the clamp voltage VDSSCL is equal to or less than the maximum rated drain voltage VDSS (VDSSCL≤VDSS), a drain current ID continuously flows from the drain of the power MISFET 9 to the source thereof, and an inductive energy of the inductive load L is consumed (absorbed) in the power MISFET 9.

Through an active clamp time TAV, the drain current ID is reduced to zero from a peak value IAV which is immediately before the power MISFET 9 becomes the OFF state. Thereby, the gate voltage VGS becomes the reference voltage (for example, the ground voltage) and the power MISFET 9 is switched from the ON state to the OFF state.

The active clamp capability Eac of the power MISFET 9 is defined by the capability of the power MISFET 9 in the active clamp operation. Specifically, the active clamp capability Eac is defined by the capability of the power MISFET 9 with respect to the counter electromotive force caused by the inductive energy of the inductive load L in transition when the power MISFET 9 is switched from the ON state to the OFF state.

More specifically, the active clamp capability Eac is defined by the capability of the power MISFET 9 with respect to the energy caused by the clamp voltage VDSSCL. For example, the active clamp capability Eac is expressed by a formula of Eac=(VL+VCLP)×ID×TAV by using the limit voltage VL, the clamp ON voltage VCLP, the drain current ID, and the active clamp time TAV.

Figure 5:
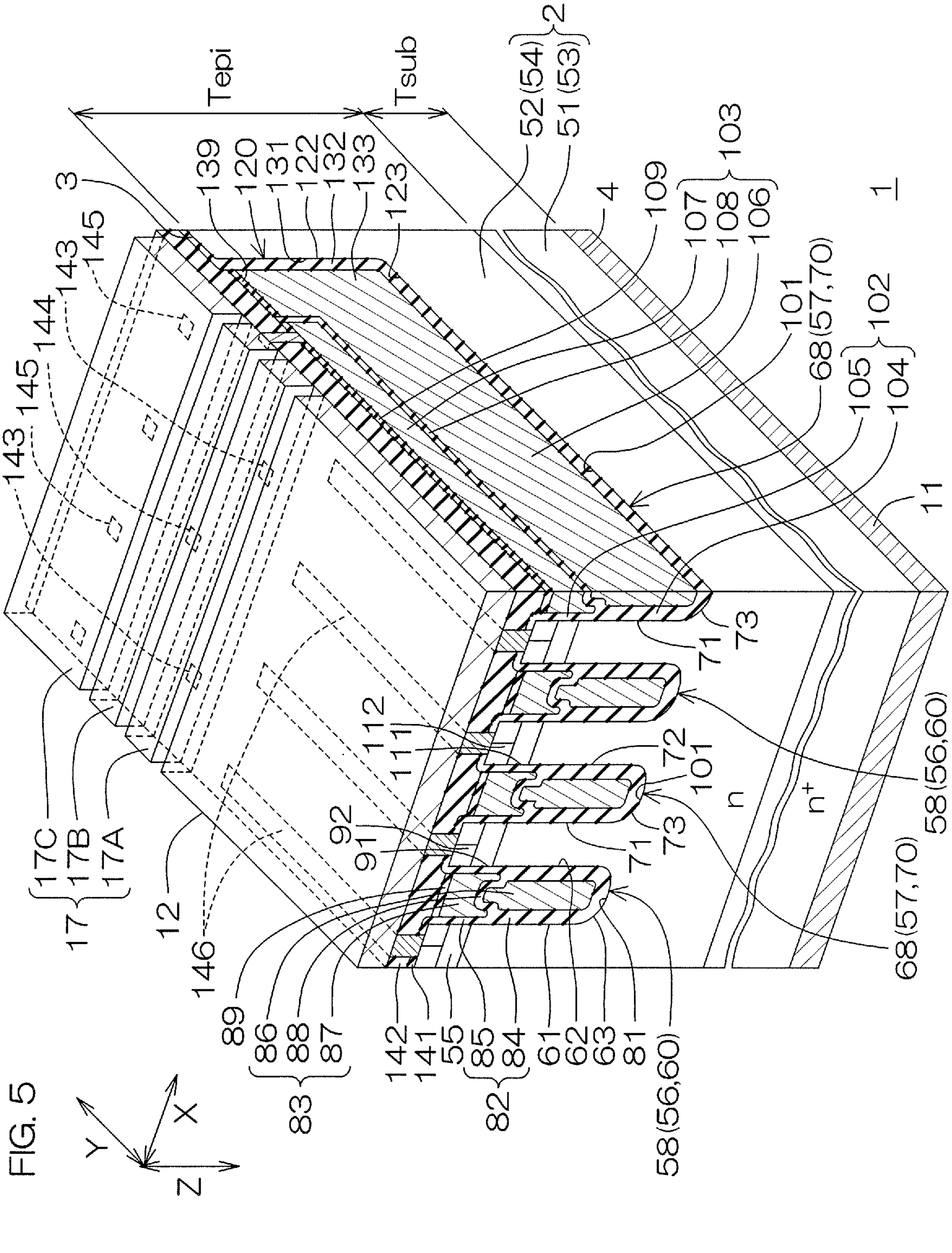
FIG. 5 is a sectional perspective view of a region V shown in FIG. 1.
Figure 6:
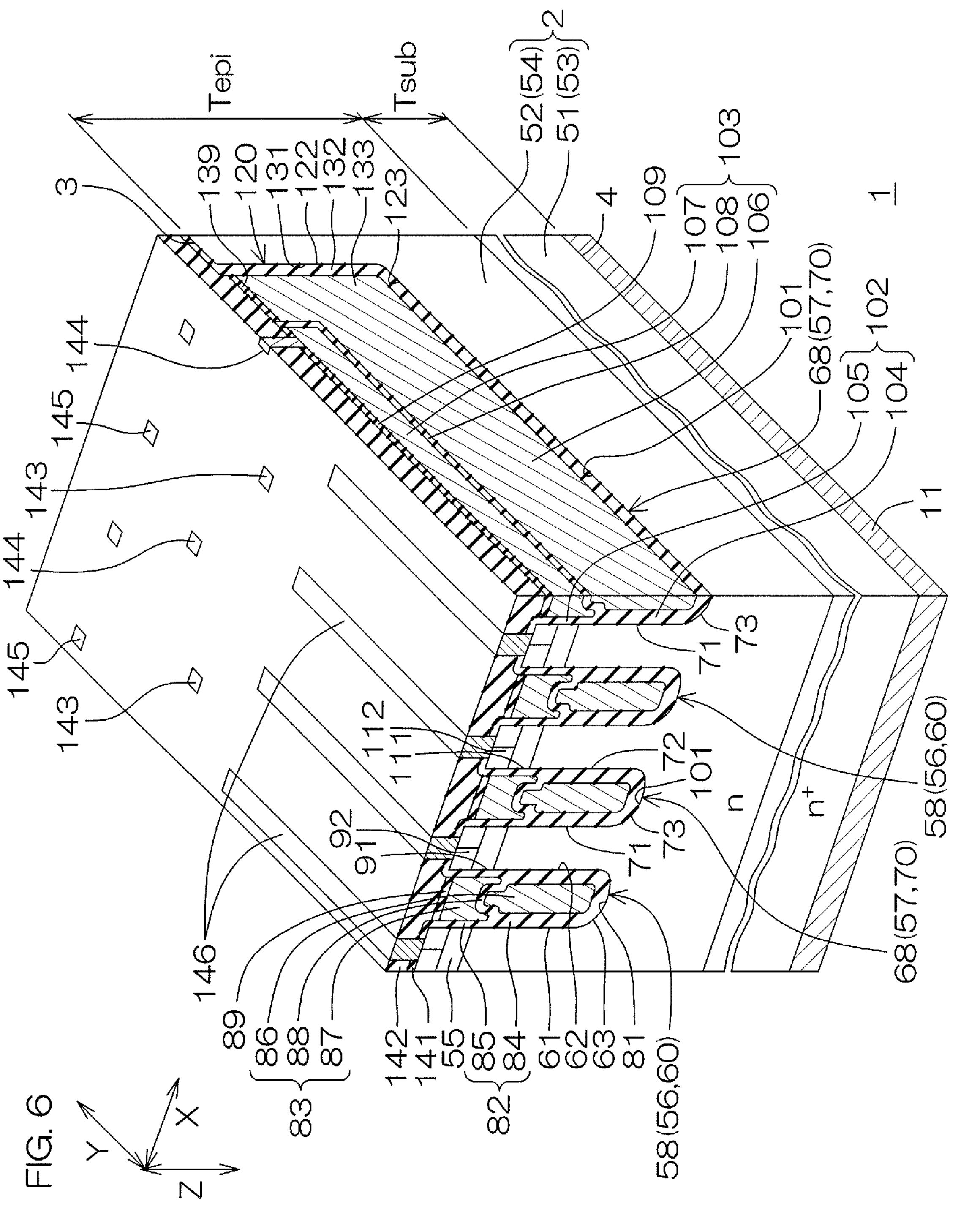
FIG. 6 is a sectional perspective view in which an electrode is removed from FIG. 5.
Figure 7:
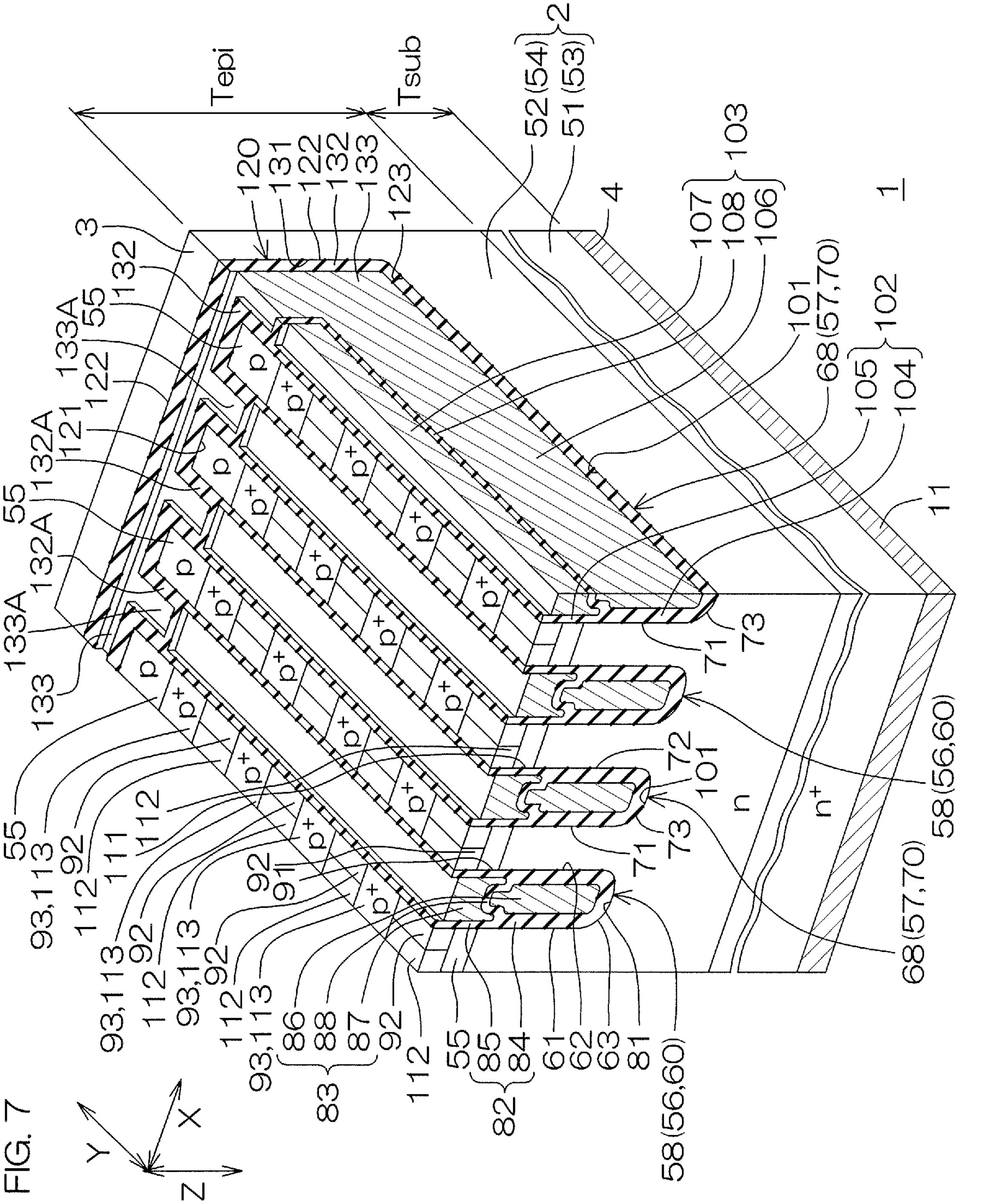
FIG. 7 is a sectional perspective view in which structures on a semiconductor layer are removed from FIG. 6 and is a sectional perspective view which shows a channel structure according to a first configuration example.

FIG. 5 is a sectional perspective view of a region V shown in FIG. 1. FIG. 6 is a sectional perspective view in which the source electrode 12 and the gate control wiring 17 are removed from FIG. 5. FIG. 7 is a sectional perspective view in which an interlayer insulation layer 142 is removed from FIG. 6 and is a sectional perspective view which shows a configuration of the channel structure according to the first configuration example.

Figure 8:
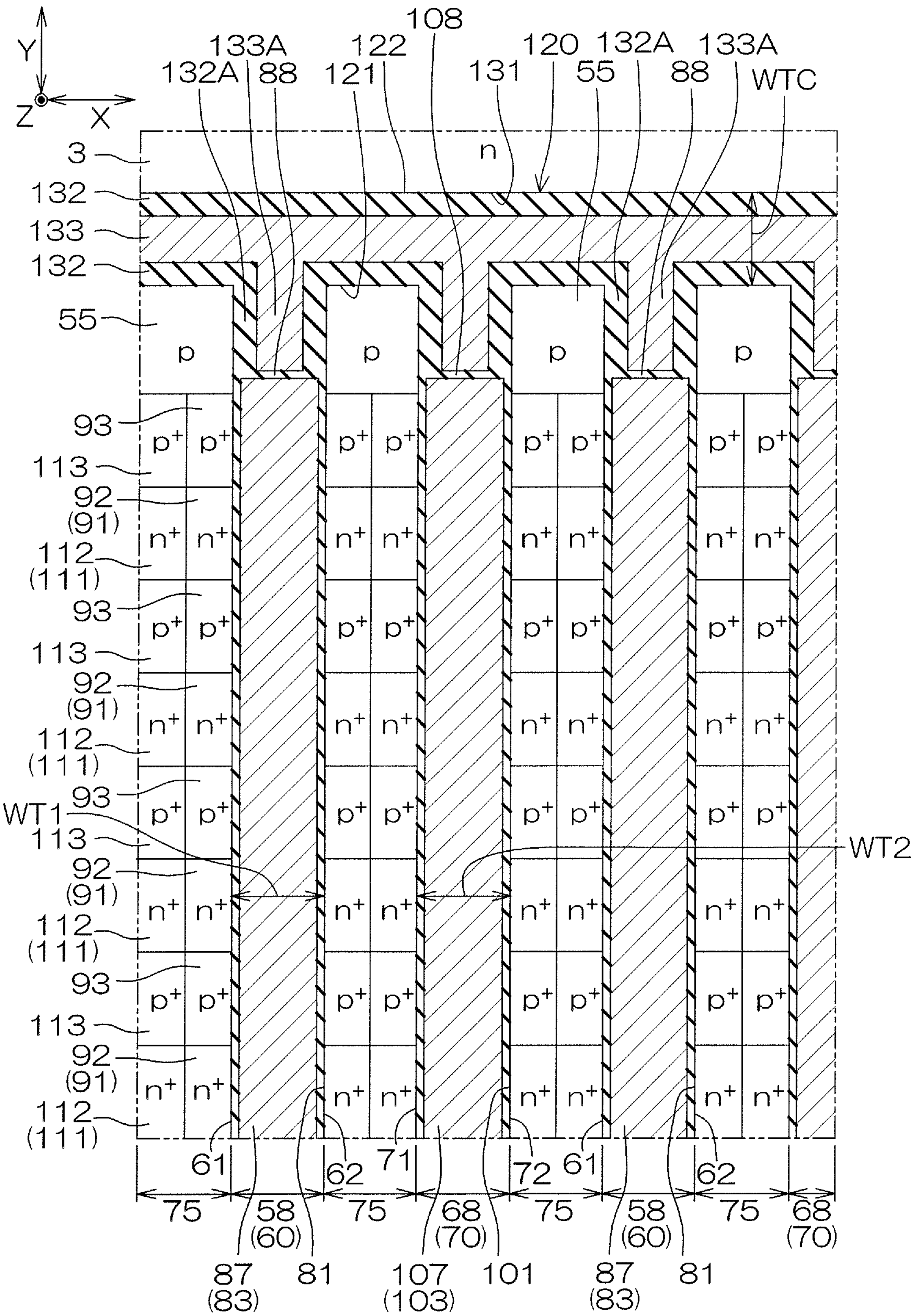
FIG. 8 is a plan view of the semiconductor layer shown in FIG. 7.
Figure 9:
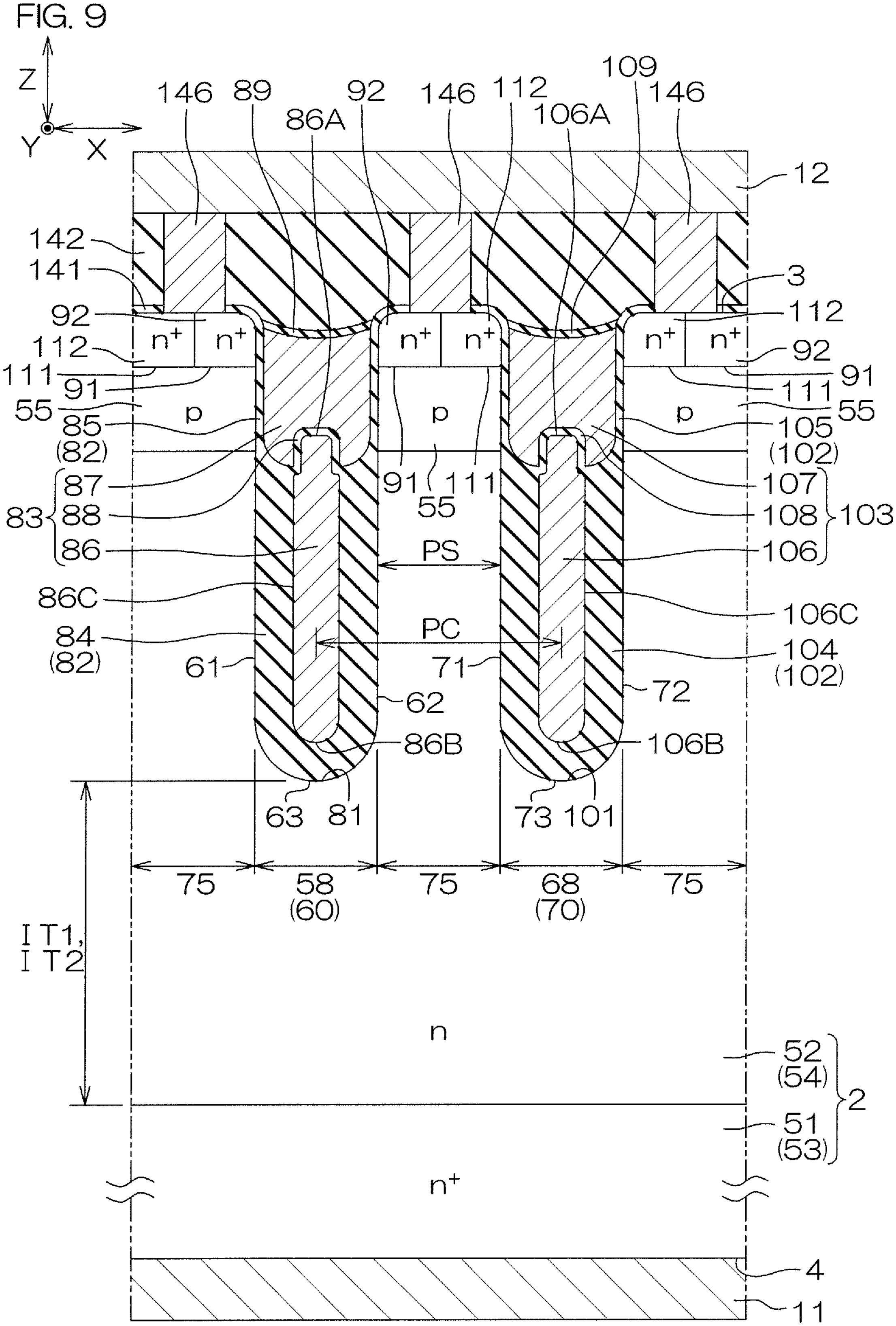
FIG. 9 is an enlarged sectional view of a region which includes a first trench gate structure and a second trench gate structure shown in FIG. 5.
Figure 10:
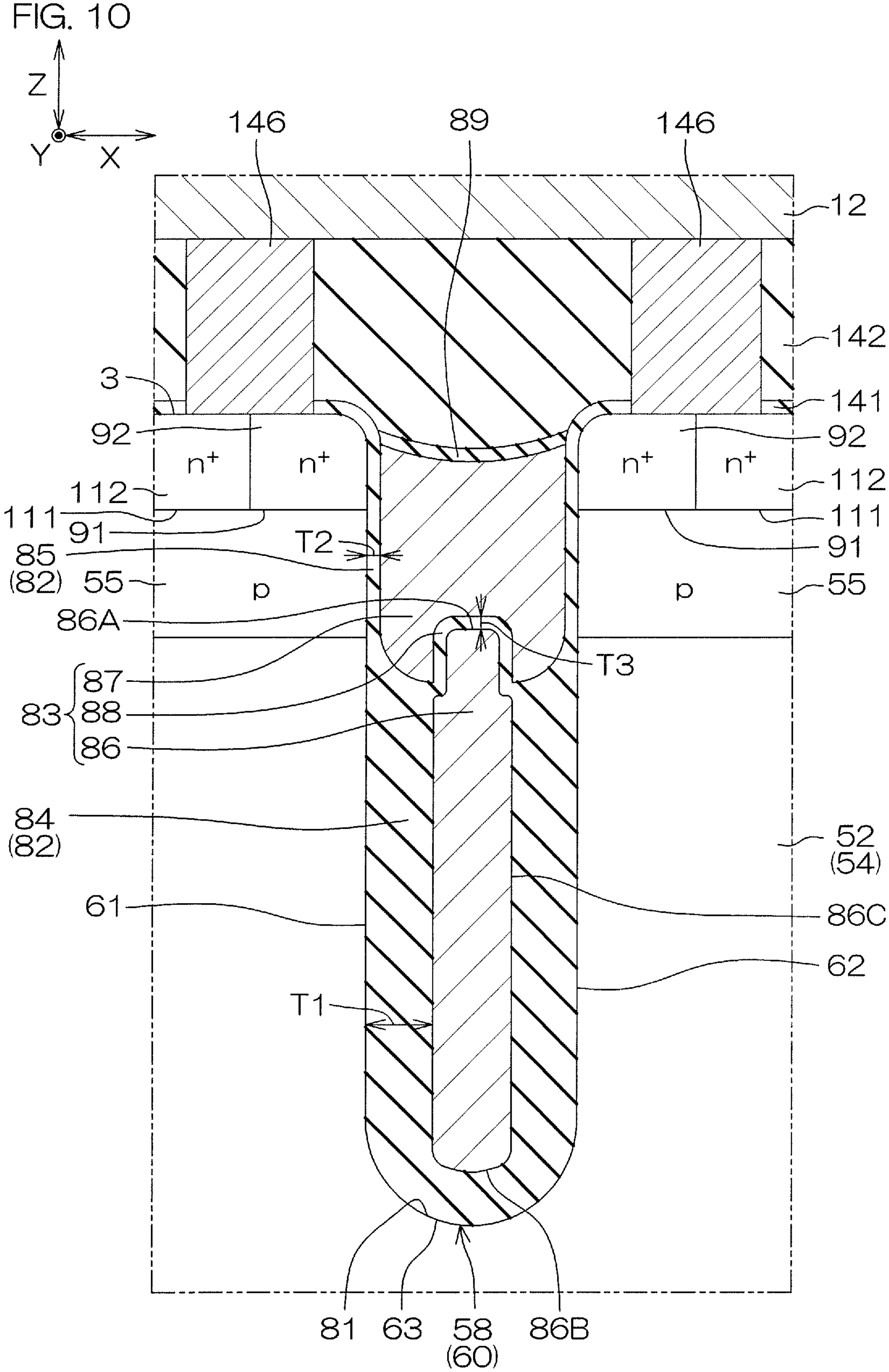
FIG. 10 is an enlarged sectional view of the first trench gate structure shown in FIG. 5.
Figure 11:
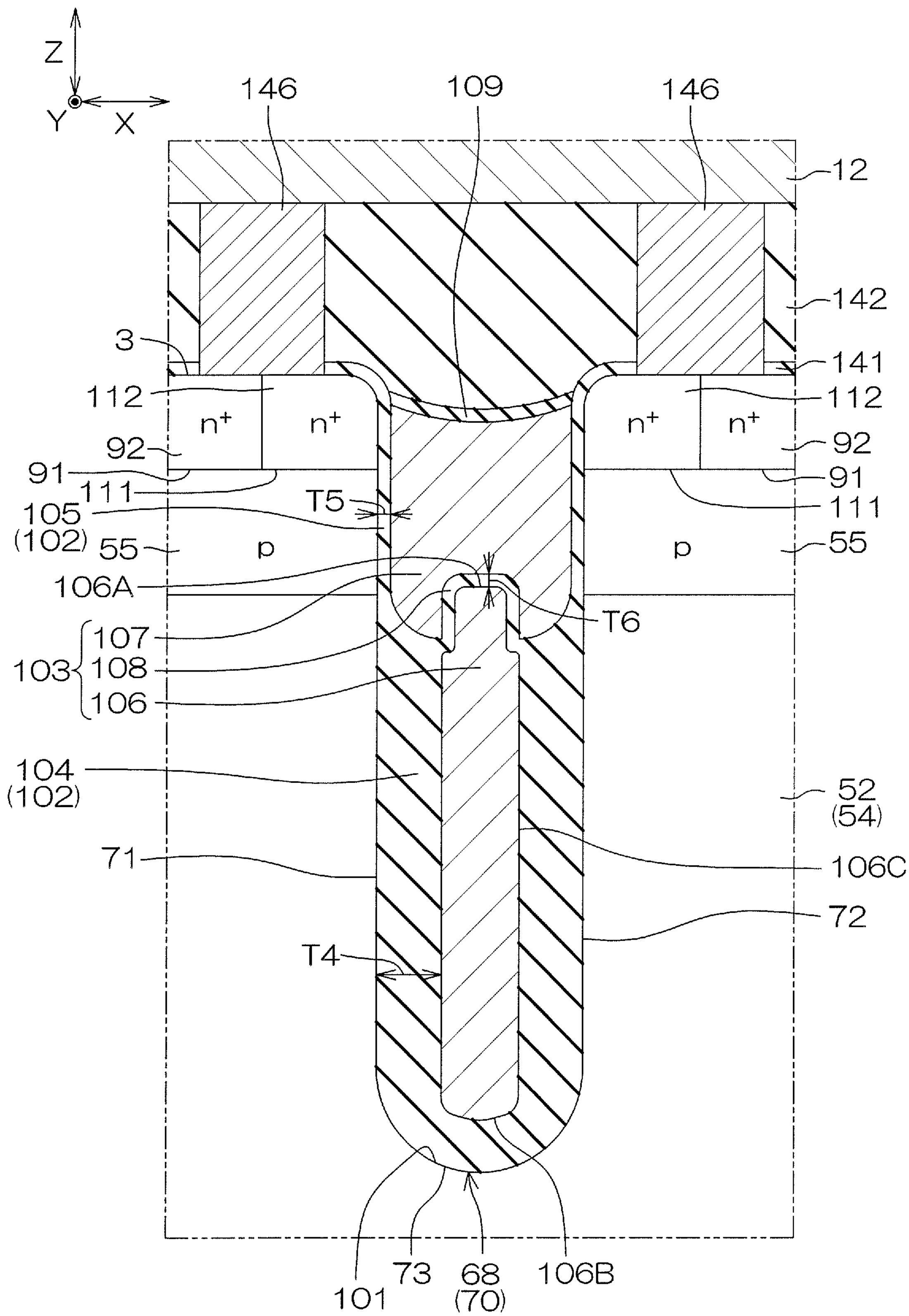
FIG. 11 is an enlarged sectional view of the second trench gate structure shown in FIG. 5

FIG. 8 is a plan view of the semiconductor layer 2 shown in FIG. 7. FIG. 9 is an enlarged sectional view of a region which includes a first trench gate structure 60 (first gate structure) and a second trench gate structure 70 (second gate structure) shown in FIG. 5. FIG. 10 is an enlarged sectional view of the first trench gate structure 60 shown in FIG. 5. FIG. 11 is an enlarged sectional view of the second trench gate structure 70 shown in FIG. 5.

With reference to FIG. 5 to FIG. 11, in this embodiment, the semiconductor layer 2 has a laminated structure including an $n^+$-type semiconductor substrate 51 and an n-type epitaxial layer 52. The second main surface 4 of the semiconductor layer 2 is formed by the semiconductor substrate 51. The first main surface 3 of the semiconductor layer 2 is formed by the epitaxial layer 52. The side surfaces 5A to 5D of the semiconductor layer 2 are formed by the semiconductor substrate 51 and the epitaxial layer 52.

The epitaxial layer 52 has an n-type impurity concentration less than an n-type impurity concentration of the semiconductor substrate 51. The n-type impurity concentration of the semiconductor substrate 51 may be from not less than $1\times10^{18}$ cm$^{-3}$ to not more than $1\times10^{20}$ cm$^{-3}$. The n-type impurity concentration of the epitaxial layer 52 may be from not less than $1\times10^{15}$ cm$^{-3}$ to not more than $1\times10^{18}$ cm$^{-3}$.

The epitaxial layer 52 has a thickness Tepi less than a thickness Tsub of the semiconductor substrate 51 (Tepi<Tsub). The thickness Tsub may be from not less than 50 μm to not more than 450 μm. The thickness Tsub may be from not less than 50 μm to not more than 150 μm, from not less than 150 μm to not more than 250 μm, from not less than 250 μm to not more than 350 μm, or from not less than 350 μm to not more than 450 μm.

By reducing the thickness Tsub, it becomes possible to reduce a resistance value. The thickness Tsub is adjusted by grinding. In this case, the second main surface 4 of the semiconductor layer 2 may be a ground surface having a grinding mark.

The thickness Tepi of the epitaxial layer 52 is preferably not more than 1/10 of the thickness Tsub. The thickness Tepi may be from not less than 5 μm to not more than 20 μm. The thickness Tepi may be from not less than 5 μm to not more than 10 μm, from not less than 10 μm to not more than 15 μm, or from not less than 15 μm to not more than 20 μm. The thickness Tepi is preferably from not less than 5 μm to not more than 15 μm.

The semiconductor substrate 51 is formed in the second main surface 4 side of the semiconductor layer 2 as a drain region 53. The epitaxial layer 52 is formed in a surface layer portion of the first main surface 3 of the semiconductor layer 2 as a drift region 54 (drain drift region). A bottom portion of the drift region 54 is formed by a boundary between the semiconductor substrate 51 and the epitaxial layer 52. Hereinafter, the epitaxial layer 52 is referred to as the drift region 54.

A p-type body region 55 is formed in a surface layer portion of the first main surface 3 of the semiconductor layer 2 in the output region 6. The body region 55 is a region which serves as a base of the power MISFET 9. A p-type impurity concentration of the body region 55 may be from not less than $1\times10^{16}$ cm$^{-3}$ to not more than $1\times10^{18}$ cm$^{-3}$.

The body region 55 is formed in a surface layer portion of the drift region 54. A bottom portion of the body region 55 is formed in a region in the first main surface 3 side with respect to the bottom portion of the drift region 54. A thickness of the body region 55 may be from not less than 0.5 μm to not more than 2 μm. The thickness of the body region 55 may be from not less than 0.5 μm to not more than 1 μm, from not less than 1 μm to not more than 1.5 μm, or from not less than 1.5 μm to not more than 2 μm.

The power MISFET 9 includes a first MISFET 56 (first transistor) and a second MISFET 57 (second transistor). The first MISFET 56 is electrically separated from the second MISFET 57 and controlled independently. The second MISFET 57 is electrically separated from the first MISFET 56 and controlled independently.

That is, the power MISFET 9 is configured such as to be driven when the first MISFET 56 and the second MISFET 57 are both in ON states (Full-ON control). The power MISFET 9 is also configured such as to be driven when the first MISFET 56 is in an ON state while the second MISFET 57 is in an OFF state (first Half-ON control). Further, the power MISFET 9 is configured such as to be driven when the first MISFET 56 is in an OFF state while the second MISFET 57 is in an ON state (second Half-ON control).

In the case of Full-ON control, the power MISFET 9 is driven in a state where all current paths are opened. Therefore, an ON resistance inside the semiconductor layer 2 is relatively reduced. On the other hand, in the case of first Half-ON control or second Half-ON control, the power MISFET 9 is driven in a state where some of the current paths are blocked. Therefore, the ON resistance inside the semiconductor layer 2 is relatively increased.

Specifically, the first MISFET 56 includes a plurality of first FET (Field Effect Transistor) structures 58. The plurality of first FET structures 58 are arrayed at intervals along the first direction X, and extend in a band shape along the second direction Y, respectively, in plan view. The plurality of first FET structures 58 are formed in a stripe shape as a whole in plan view.

In FIG. 5 to FIG. 8, a region of the first FET structure 58 at one end portion side is shown, while a region of the first FET structure 58 at the other end portion side is omitted. The region of the first FET structure 58 at the other end portion side is substantially similar in structure to the region of the first FET structure 58 at one end portion side. Hereinafter, the structure of the region of the first FET structure 58 at one end portion side is described as an example, and a description of the structure of the region of the first FET structure 58 at the other end portion side shall be omitted.

In this embodiment, each of the first FET structures 58 includes a first trench gate structure 60. A first width WT1 of the first trench gate structure 60 may be from not less than 0.5 μm to not more than 5 μm. The first width WT1 is a width in a direction (first direction X) orthogonal to a direction (second direction Y) in which the first trench gate structure 60 extends.

The first width WT1 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The first width WT1 is preferably from not less than 0.8 μm to not more than 1.2 μm.

The first trench gate structure 60 penetrates through the body region 55 and reaches the drift region 54. A first depth DT1 of the first trench gate structure 60 may be from not less than 1 μm to not more than 10 μm. The first depth DT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first depth DT1 is preferably from not less than 2 μm to not more than 6 μm.

The first trench gate structure 60 includes a first side wall 61 on one side, a second side wall 62 on the other side, and a bottom wall 63 which connects the first side wall 61 and the second side wall 62. Hereinafter, the first side wall 61, the second side wall 62, and the bottom wall 63 may be collectively referred to as "an inner wall" or "an outer wall."

An absolute value of an angle (taper angel) formed between the first side wall 61 and the first main surface 3 inside the semiconductor layer 2 may be in excess of 90° and not more than 95° (for example, approximately 91°). The absolute value of an angle (taper angel) formed between the second side wall 62 and the first main surface 3 inside the semiconductor layer 2 may be in excess of 90° and not more than 95° (for example, approximately 91°). The first trench gate structure 60 may be formed in a shape (tapered shape) that the first width WT1 is made narrow from the first main surface 3 side to the bottom wall 63 side in sectional view.

The bottom wall 63 of the first trench gate structure 60 is positioned in a region at the first main surface 3 side with respect to the bottom portion of the drift region 54. The bottom wall 63 of the first trench gate structure 60 is formed in a convex curved shape (U letter shape) toward the bottom portion of the drift region 54.

The bottom wall 63 of the first trench gate structure 60 is positioned in a region at the first main surface 3 side with a first interval IT1 of not less than 1 μm to not more than 10 μm from the bottom portion of the drift region 54. The first interval IT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first interval IT1 is preferably from not less than 1 μm to not more than 5 μm.

In this embodiment, the second MISFET 57 includes a plurality of second FET structures 68. The plurality of second FET structures 68 are arrayed at intervals along the first direction X, and extend in a band shape along the second direction Y, respectively, in plan view.

The plurality of second FET structures 68 extend along the same direction as the plurality of first FET structures 58. The plurality of second FET structures 68 are formed in a stripe shape as a whole in plan view. In this embodiment, the plurality of second FET structures 68 are arrayed alternately with the plurality of first FET structures 58 in a manner that one first FET structure 58 is held therebetween.

In FIG. 5 to FIG. 8, a region of the second FET structure 68 at one end portion side is shown in the drawing, while a region of the second FET structure 68 at the other end portion side is omitted. The region of the second FET structure 68 at the other end portion side is substantially similar in structure to the region of the second FET structure 68 at one end portion side. Hereinafter, the structure of the region of the second FET structure 68 at one end portion side is described as an example, and a description of the structure of the region of the second FET structure 68 at the other end portion side shall be omitted.

In this embodiment, each of the second FET structures 68 includes a second trench gate structure 70. A second width WT2 of the second trench gate structure 70 may be from not less than 0.5 μm to not more than 5 μm. The second width WT2 is a width in a direction (first direction X) orthogonal to a direction (second direction Y) in which the second trench gate structure 70 extends.

The second width WT2 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The second width WT2 is preferably from not less than 0.8 μm to not more than 1.2 μm.

The second width WT2 of the second trench gate structure 70 may be equal to or more than the first width WT1 of the first trench gate structure 60 (WT1≤WT2). The second width WT2 may be equal to or less than the first width WT1 (WT1≥WT2). It is preferable that the second width WT2 is substantially equal to the first width WT1 (WT1=WT2).

The second trench gate structure 70 penetrates through the body region 55 and reaches the drift region 54. A second depth DT2 of the second trench gate structure 70 may be from not less than 1 μm to not more than 10 μm. The second depth DT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second depth DT2 is preferably from not less than 2 μm to not more than 6 μm.

The second depth DT2 of the second trench gate structure 70 may be equal to or more than the first depth DT1 of the first trench gate structure 60 (DT1≤DT2). The second depth DT2 may be equal to or less than the first depth DT1 (DT1≥DT2). It is preferable that the second depth DT2 is substantially equal to the first depth DT1 (DT1=DT2).

The second trench gate structure 70 includes a first side wall 71 on one side, a second side wall 72 on the other side, and a bottom wall 73 which connects the first side wall 71 and the second side wall 72. Hereinafter, the first side wall 71, the second side wall 72, and the bottom wall 73 may be collectively referred to as "an inner wall" or "an outer wall."

An absolute value of an angle (taper angel) formed between the first side wall 71 and the first main surface 3 inside the semiconductor layer 2 may be in excess of 90° and not more than 95° (for example, approximately 91°). The absolute value of an angle (taper angel) formed between the second side wall 72 and the first main surface 3 inside the semiconductor layer 2 may be in excess of 90° and not more than 95° (for example, approximately 91°). The second trench gate structure 70 may be formed in a shape (tapered shape) that the second width WT2 is made narrow from the first main surface 3 side to the bottom wall 73 side in sectional view.

The bottom wall 73 of the second trench gate structure 70 is positioned in a region at the first main surface 3 side with respect to the bottom portion of the drift region 54. The bottom wall 73 of the second trench gate structure 70 is formed in a convex curved shape (U letter shape) toward the bottom portion of the drift region 54.

The bottom wall 73 of the second trench gate structure 70 is positioned in a region at the first main surface 3 side with a second interval IT2 of not less than 1 μm to not more than 10 μm from the bottom portion of the drift region 54. The second interval IT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second interval IT2 is preferably from not less than 1 μm to not more than 5 μm.

Cell regions 75 are each defined in regions between the plurality of first trench gate structures 60 and the plurality of second trench gate structures 70. The plurality of cell regions 75 are arrayed at intervals along the first direction X, and extend in a band shape along the second direction Y, respectively, in plan view. The plurality of cell regions 75 extend along the same direction as the first trench gate structure 60 and the second trench gate structure 70. The plurality of cell regions 75 are formed in a stripe shape as a whole in plan view.

A first depletion layer spreads inside the drift region 54 from an outer wall of the first trench gate structure 60. The first depletion layer spreads toward a direction along the first main surface 3 from the outer wall of the first trench gate structure 60 and toward the normal direction Z. Similarly, a second depletion layer spreads inside the drift region 54 from the outer wall of the second trench gate structure 70. The second depletion layer spreads toward a direction along the first main surface 3 from the outer wall of the second trench gate structure 70 and toward the normal direction Z.

The second trench gate structure 70 is arrayed at an interval from the first trench gate structure 60 in a manner that the second depletion layer overlaps with the first depletion layer. That is, the second depletion layer overlaps with the first depletion layer in a region at the first main surface 3 side with respect to the bottom wall 73 of the second trench gate structure 70 in the cell region 75. According to the above-described structure, since it is possible to suppress an electric field concentration on the first trench gate structure 60 and the second trench gate structure 70, it is possible to suppress a reduction in breakdown voltage.

It is preferable that the second depletion layer overlaps with the first depletion layer in a region at the bottom portion side of the drift region 54 with respect to the bottom wall 73 of the second trench gate structure 70. According to the above-described structure, since it is possible to suppress an electric field concentration in the bottom wall 63 of the first trench gate structure 60 and the bottom wall 73 of the second trench gate structure 70, it is possible to appropriately suppress a reduction in breakdown voltage.

A pitch PS between a side wall of the first trench gate structure 60 and that of the second trench gate structure 70 may be from not less than 0.2 μm to not more than 2 μm. The pitch PS is a distance in a direction (first direction X) orthogonal to a direction (second direction Y) in which the first trench gate structure 60 and the second trench gate structure 70 extend between the first side wall 61 (second side wall 62) of the first trench gate structure 60 and the second side wall 72 (first side wall 71) of the second trench gate structure 70.

The pitch PS may be from not less than 0.2 μm to not more than 0.4 μm, from not less than 0.4 μm to not more than 0.6 μm, from not less than 0.6 μm to not more than 0.8 μm, from not less than 0.8 μm to not more than 1.0 μm, from not less than 1.0 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2.0 μm. The pitch PS is preferably from not less than 0.3 μm to not more than 1.5 μm.

A pitch PC between a central portion of the first trench gate structure 60 and that of the second trench gate structure 70 may be from not less than 1 μm to not more than 7 μm. The pitch PC is a distance in a direction (the first direction X) orthogonal to a direction (the second direction Y) in which the first trench gate structure 60 and the second trench gate structure 70 extend between the central portion of the first trench gate structure 60 and the central portion of the second trench gate structure 70.

The pitch PC may be from not less than 1 μm to not more than 2 μm, from not less than 2 μm to not more than 3 μm, from not less than 3 μm to not more than 4 μm, from not less than 4 μm to not more than 5 μm, from not less than 5 μm to not more than 6 μm, or from not less than 6 μm to not more than 7 μm. The pitch PC is preferably from not less than 1 μm to not more than 3 μm.

With reference to FIG. 9 and FIG. 10, specifically, the first trench gate structure 60 includes a first gate trench 81, a first insulation layer 82, and a first electrode 83. The first gate trench 81 is formed by digging down the first main surface 3 toward the second main surface 4 side.

The first gate trench 81 defines the first side wall 61, the second side wall 62, and the bottom wall 63 of the first trench gate structure 60. Hereinafter, the first side wall 61, the second side wall 62, and the bottom wall 63 of the first trench gate structure 60 shall also be referred to as the first side wall 61, the second side wall 62, and the bottom wall 63 of the first gate trench 81.

The first insulation layer 82 is formed in a film shape along an inner wall of the first gate trench 81. The first insulation layer 82 defines a concave space inside the first gate trench 81. A portion which covers the bottom wall 63 of the first gate trench 81 in the first insulation layer 82 is conformally formed along the bottom wall 63 of the first gate trench 81. Thereby, the first insulation layer 82 defines a U letter space which is recessed in a U letter shape inside the first gate trench 81.

The first insulation layer 82 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the first insulation layer 82 has a single layer structure composed of an $SiO_2$ layer.

The first insulation layer 82 includes a first bottom-side insulation layer 84 and a first opening-side insulation layer 85 which are formed in this order from the bottom wall 63 side of the first gate trench 81 to the first main surface 3 side.

The first bottom-side insulation layer 84 covers the inner wall of the first gate trench 81 at the bottom wall 63 side. Specifically, the first bottom-side insulation layer 84 covers the inner wall of the first gate trench 81 at the bottom wall 63 side with respect to the bottom portion of the body region 55. The first bottom-side insulation layer 84 defines a U letter space at the bottom wall 63 side of the first gate trench 81. The first bottom-side insulation layer 84 has a smooth inner wall surface which defines the U letter space. The first bottom-side insulation layer 84 is in contact with the drift region 54. A part of the first bottom-side insulation layer 84 may be in contact with the body region 55.

The first opening-side insulation layer 85 covers the inner wall of the first gate trench 81 at the opening side. Specifically, the first opening-side insulation layer 85 covers the first side wall 61 and the second side wall 62 of the first gate trench 81 in a region at the opening side of the first gate trench 81 with respect to the bottom portion of the body region 55. The first opening-side insulation layer 85 is in contact with the body region 55. A part of the first opening-side insulation layer 85 may be in contact with the drift region 54.

The first bottom-side insulation layer 84 has a first thickness T1. The first opening-side insulation layer 85 has a second thickness T2 less than the first thickness T1 (T2<T1). The first thickness T1 is a thickness of the first bottom-side insulation layer 84 along a normal direction of the inner wall of the first gate trench 81. The second thickness T2 is a thickness of the first opening-side insulation layer 85 along the normal direction of the inner wall of the first gate trench 81.

A first ratio T1/WT1 of the first thickness T1 with respect to the first width WT1 of the first gate trench 81 may be from not less than 0.1 to not more than 0.4. The first ratio T1/WT1 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The first ratio T1/WT1 is preferably from not less than 0.25 to not more than 0.35.

The first thickness T1 of the first bottom-side insulation layer 84 may be from not less than 1500 Å to not more than 4000 Å. The first thickness T1 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The first thickness T1 is preferably from not less than 1800 Å to not more than 3500 Å.

The first thickness T1 may be adjusted to a range from not less than 4000 Å to not more than 12000 Å according to the first width WT1 of the first gate trench 81. The first thickness T1 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the first bottom-side insulation layer 84, it becomes possible to increase a withstand voltage of the semiconductor device 1.

The second thickness T2 of the first opening-side insulation layer 85 may be from not less than 1/100 to not more than 1/10 of the first thickness T1 of the first bottom-side insulation layer 84. The second thickness T2 may be from not less than 100 Å to not more than 500 Å. The second thickness T2 may be from not less than 100 Å to not more than 200 Å, from not less than 200 Å to not more than 300 Å, from not less than 300 Å to not more than 400 Å, or from not less than 400 Å to not more than 500 Å. The second thickness T2 is preferably from not less than 200 Å to not more than 400 Å.

The first bottom-side insulation layer 84 is formed in a manner that the first thickness T1 is reduced from a part which covers the first side wall 61 and the second side wall 62 of the first gate trench 81 toward a part which covers the bottom wall 63 of the first gate trench 81.

The part which covers the bottom wall 63 of the first gate trench 81 in the first bottom-side insulation layer 84 is smaller in thickness than the part which covers the first side wall 61 and the second side wall 62 of the first gate trench 81 in the first bottom-side insulation layer 84. An opening width of the U letter space in the bottom wall side defined by the first bottom-side insulation layer 84 is expanded by an amount of a reduction in the first thickness T1. Thereby, the U letter space is suppressed from being tapered. The above-described U letter space is formed, for example, by an etching method (for example, a wet etching method) to the inner wall of the first bottom-side insulation layer 84.

The first electrode 83 is embedded in the first gate trench 81 across the first insulation layer 82. First gate control signals (first control signals) including an ON signal Von and an OFF signal Voff are applied to the first electrode 83. In this embodiment, the first electrode 83 has an insulated-separation type split electrode structure including a first bottom-side electrode 86, a first opening-side electrode 87, and a first intermediate insulation layer 88.

The first bottom-side electrode 86 is embedded in the bottom wall 63 side of the first gate trench 81 across the first insulation layer 82. Specifically, the first bottom-side electrode 86 is embedded in the bottom wall 63 side of the first gate trench 81 across the first bottom-side insulation layer 84. The first bottom-side electrode 86 faces the drift region 54 across the first bottom-side insulation layer 84. A part of the first bottom-side electrode 86 may face the body region 55 across the first bottom-side insulation layer 84.

The first bottom-side electrode 86 includes a first upper end portion 86A, a first lower end portion 86B, and a first wall portion 86C. The first upper end portion 86A is positioned at the opening side of the first gate trench 81. The first lower end portion 86B is positioned at the bottom wall 63 side of the first gate trench 81. The first wall portion 86C connects the first upper end portion 86A and the first lower end portion 86B and extends in a wall shape along the inner wall of the first gate trench 81.

The first upper end portion 86A is exposed from the first bottom-side insulation layer 84. The first upper end portion 86A protrudes to the first main surface 3 side with respect to the first bottom-side insulation layer 84. Thereby, the first bottom-side electrode 86 defines an inverted concave recess in sectional view between the first bottom-side insulation layer 84 and the first opening-side insulation layer 85 at the opening side of the first gate trench 81. A width of the first upper end portion 86A is less than a width of the first wall portion 86C.

The first lower end portion 86B is formed in a convex curved shape toward the bottom wall 63 of the first gate trench 81. Specifically, the first lower end portion 86B is conformally formed along the bottom wall of the U letter space defined by the first bottom-side insulation layer 84 and formed in a smooth convex curved shape toward the bottom wall 63 of the first gate trench 81.

According to the above-described structure, since it is possible to suppress a local electric field concentration on the first bottom-side electrode 86, it is possible to suppress a reduction in breakdown voltage. In particular, by embedding the first bottom-side electrode 86 into an expanded U letter space of the first bottom-side insulation layer 84, it becomes possible to appropriately suppress the first bottom-side electrode 86 from being tapered from the first upper end portion 86A to the first lower end portion 86B. Thereby, it is possible to appropriately suppress a local electric field concentration on the first lower end portion 86B of the first bottom-side electrode 86.

The first bottom-side electrode 86 may include at least any one of conductive polysilicon, tungsten, aluminum, copper, an aluminum alloy, and a copper alloy. In this embodiment, the first bottom-side electrode 86 includes conductive polysilicon. The conductive polysilicon may include an n-type impurity or a p-type impurity. The conductive polysilicon preferably includes an n-type impurity.

The first opening-side electrode 87 is embedded into the opening side of the first gate trench 81 across the first insulation layer 82. Specifically, the first opening-side electrode 87 is embedded in the inverted concave recess defined at the opening side of the first gate trench 81 across the first opening-side insulation layer 85. The first opening-side electrode 87 faces the body region 55 across the first opening-side insulation layer 85. A part of the first opening-side electrode 87 may face the drift region 54 across the first opening-side insulation layer 85.

The first opening-side electrode 87 may include at least any one of conductive polysilicon, tungsten, aluminum, copper, an aluminum alloy, and a copper alloy. The first opening-side electrode 87 preferably includes the same type of conductive material as the first bottom-side electrode 86. In this embodiment, the first opening-side electrode 87 includes conductive polysilicon. The conductive polysilicon may include an n-type impurity or a p-type impurity. The conductive polysilicon preferably includes an n-type impurity.

The first intermediate insulation layer 88 is interposed between the first bottom-side electrode 86 and the first opening-side electrode 87 to electrically insulate the first bottom-side electrode 86 and the first opening-side electrode 87. Specifically, the first intermediate insulation layer 88 covers the first bottom-side electrode 86 exposed from the first bottom-side insulation layer 84 in a region between the first bottom-side electrode 86 and the first opening-side electrode 87. The first intermediate insulation layer 88 covers the first upper end portion 86A (specifically, protruded portion) of the first bottom-side electrode 86. The first intermediate insulation layer 88 is continuous with the first insulation layer 82 (first bottom-side insulation layer 84).

The first intermediate insulation layer 88 has a third thickness T3. The third thickness T3 is less than the first thickness T1 of the first bottom-side insulation layer 84 (T3<T1). The third thickness T3 may be from not less than 1/100 to not more than 1/10 of the thickness T1. The third thickness T3 may be from not less than 100 Å to not more than 500 Å. The third thickness T3 may be from not less than 100 Å to not more than 200 Å, from not less than 200 Å to not more than 300 Å, from not less than 300 Å to not more than 400 Å, or from not less than 400 Å to not more than 500 Å. The third thickness T3 is preferably from not less than 200 Å to not more than 400 Å.

The first intermediate insulation layer 88 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the first intermediate insulation layer 88 has a single layer structure composed of an $SiO_2$ layer.

In this embodiment, an exposed portion which is exposed from the first gate trench 81 in the first opening-side electrode 87 is positioned at the bottom wall 63 side of the first gate trench 81 with respect to the first main surface 3. The exposed portion of the first opening-side electrode 87 is formed in a curved shape toward the bottom wall 63 of the first gate trench 81.

The exposed portion of the first opening-side electrode 87 is covered by a first cap insulation layer 89 formed in a film shape. The first cap insulation layer 89 is continuous with the first insulation layer 82 (first opening-side insulation layer 85) inside the first gate trench 81. The first cap insulation layer 89 may include silicon oxide ($SiO_2$).

Each of the first FET structures 58 further includes a p-type first channel region 91 (first channel). The first channel region 91 is formed in a region which faces the first electrode 83 (first opening-side electrode 87) across the first insulation layer 82 (first opening-side insulation layer 85) in the body region 55.

The first channel region 91 is formed along the first side wall 61 or the second side wall 62 of the first trench gate structure 60, or along the first side wall 61 and the second side wall 62 thereof. In this embodiment, the first channel region 91 is formed along the first side wall 61 and the second side wall 62 of the first trench gate structure 60.

Each of the first FET structure 58 further includes an $n^+$-type first source region 92 formed in a surface layer portion of the body region 55. The first source region 92 demarcates the first channel region 91 with the drift region 54 inside the body region 55. An n-type impurity concentration of the first source region 92 is in excess of an n-type impurity concentration of the drift region 54. The n-type impurity concentration of the first source region 92 may be from not less than $1\times10^{19}$ $cm^{-3}$ to not more than $1\times10^{21}$ $cm^{-3}$.

In this embodiment, each of the first FET structures 58 includes the plurality of first source regions 92. The plurality of first source regions 92 are formed in the surface layer portion of the body region 55 at an interval along the first trench gate structure 60. Specifically, the plurality of first source regions 92 are formed along the first side wall 61 or the second side wall 62 of the first trench gate structure 60, or along the first side wall 61 and the second side wall 62 thereof. In this embodiment, the plurality of first source regions 92 are formed at an interval along the first side wall 61 and the second side wall 62 of the first trench gate structure 60.

The bottom portions of the plurality of first source regions 92 are positioned in a region at the first main surface 3 side with respect to the bottom portion of the body region 55. Thereby, the plurality of first source regions 92 face the first electrode 83 (first opening-side electrode 87) across the first insulation layer 82 (first opening-side insulation layer 85). Thus, the first channel region 91 of the first MISFET 56 is formed in a region which is held between the plurality of first source regions 92 and the drift region 54 in the body region 55.

A thickness of the first source region 92 may be from not less than 0.01 μm to not more than 1.5 μm. The thickness of the first source region 92 may be from not less than 0.01 μm to not more than 0.05 μm, from not less than 0.05 μm to not more than 0.1 μm, from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm.

Each of the first FET structures 58 further includes a $p^+$-type first contact region 93 formed in the surface layer portion of the body region 55. A p-type impurity concentration of the first contact region 93 is in excess of a p-type impurity concentration of the body region 55. The p-type impurity concentration of the first contact region 93 may be from not less than $1\times10^{19}$ $cm^{-3}$ to not more than $1\times10^{21}$ $cm^{-3}$.

In this embodiment, each of the first FET structure 58 includes a plurality of first contact regions 93. The plurality of first contact regions 93 are formed in the surface layer portion of the body region 55 at an interval along the first trench gate structure 60. Specifically, the plurality of first contact regions 93 are formed along the first side wall 61 or the second side wall 62 of the first trench gate structure 60, or along the first side wall 61 and the second side wall 62 thereof.

In this embodiment, the plurality of first contact regions 93 are formed at an interval along the first side wall 61 and the second side wall 62 of the first trench gate structure 60. Specifically, the plurality of first contact regions 93 are formed in the surface layer portion of the body region 55 in a manner that the plurality of first contact regions 93 are alternately arrayed with the plurality of first source regions 92. The bottom portions of the plurality of first contact regions 93 are positioned in a region at the first main surface 3 side with respect to the bottom portion of the body region 55.

A thickness of the first contact region 93 may be from not less than 0.01 μm to not more than 1.5 μm. The thickness of the first contact region 93 may be from not less than 0.01 μm to not more than 0.05 μm, from not less than 0.05 μm to not more than 0.1 μm, from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm.

With reference to FIG. 9 and FIG. 11, the second trench gate structure 70 includes a second gate trench 101, a second insulation layer 102, and a second electrode 103. The second gate trench 101 is formed by digging down the first main surface 3 toward the second main surface 4 side.

The second gate trench 101 defines the first side wall 71, the second side wall 72, and the bottom wall 73 of the second trench gate structure 70. Hereinafter, the first side wall 71, the second side wall 72, and the bottom wall 73 of the second trench gate structure 70 are also referred to as the first side wall 71, the second side wall 72, and the bottom wall 73 of the second gate trench 101.

The second insulation layer 102 is formed in a film shape along an inner wall of the second gate trench 101. The second insulation layer 102 defines a concave space inside the second gate trench 101. A part which covers the bottom wall 73 of the second gate trench 101 in the second insulation layer 102 is conformally formed along the bottom wall 73 of the second gate trench 101. Thereby, the second insulation layer 102 defines a U letter space recessed in a U letter shape inside the second gate trench 101.

The second insulation layer 102 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the second insulation layer 102 has a single layer structure composed of an $SiO_2$ layer.

The second insulation layer 102 includes a second bottom-side insulation layer 104 and a second opening-side insulation layer 105 which are formed in this order from the bottom wall 73 side of the second gate trench 101 to the first main surface 3 side.

The second bottom-side insulation layer 104 covers the inner wall of the second gate trench 101 at the bottom wall 73 side. Specifically, the second bottom-side insulation layer 104 covers the inner wall of the second gate trench 101 at the bottom wall 73 side with respect to the bottom portion of the body region 55. The second bottom-side insulation layer 104 defines a U letter space at the bottom wall 73 side of the second gate trench 101. The second bottom-side insulation layer 104 has a smooth inner wall surface which defines the U letter space. The second bottom-side insulation layer 104 is in contact with the drift region 54. A part of the second bottom-side insulation layer 104 may be in contact with the body region 55.

The second opening-side insulation layer 105 covers the inner wall of the second gate trench 101 at the opening side. Specifically, the second opening-side insulation layer 105 covers the first side wall 71 and the second side wall 72 of the second gate trench 101 in a region of the second gate trench 101 at the opening side with respect to the bottom portion of the body region 55. The second opening-side insulation layer 105 is in contact with the body region 55. A part of the second opening-side insulation layer 105 may be in contact with the drift region 54.

The second bottom-side insulation layer 104 has a fourth thickness T4. The second opening-side insulation layer 105 has a fifth thickness T5 less than the fourth thickness T4 (T5<T4). The fourth thickness T4 is a thickness of the second bottom-side insulation layer 104 along a normal direction of the inner wall of the second gate trench 101. The fifth thickness T5 is a thickness of the second opening-side insulation layer 105 along the normal direction of the inner wall of the second gate trench 101.

A second ratio T4/WT2 of the fourth thickness T4 with respect to the second width WT2 of the second gate trench 101, may be from not less than 0.1 to not more than 0.4. The second ratio T4/WT2 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The second ratio T4/WT2 is preferably from not less than 0.25 to not more than 0.35.

The second ratio T4/WT2 may be equal to or less than the first ratio T1/WT1 (T4/WT2≤T1/WT1). The second ratio T4/WT2 may be equal to or more than the first ratio T1/WT1 (T4/WT2≥T1/WT1). The second ratio T4/WT2 may be equal to the first ratio T1/WT1 (T4/WT2=T1/WT1).

The fourth thickness T4 of the second bottom-side insulation layer 104 may be from not less than 1500 Å to not more than 4000 Å. The fourth thickness T4 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The fourth thickness T4 is preferably from not less than 1800 Å to not more than 3500 Å.

The fourth thickness T4 may be from not less than 4000 Å to not more than 12000 Å according to the second width WT2 of the second gate trench 101. The fourth thickness T4 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the second bottom-side insulation layer 104, it becomes possible to increase a withstand voltage of the semiconductor device 1.

The fourth thickness T4 may be equal to or less than the first thickness T1 (T4≤T1). The fourth thickness T4 may be equal to or more than the first thickness T1 (T4≥T1). The fourth thickness T4 may be equal to the first thickness T1 (T4=T1).

The fifth thickness T5 of the second opening-side insulation layer 105 is less than the fourth thickness T4 of the second bottom-side insulation layer 104 (T5<T4). The fifth thickness T5 may be from not less than 1/100 of the fourth thickness T4 to not more than 1/10. The fifth thickness T5 may be from not less than 100 Å to not more than 500 Å. The fifth thickness T5 may be from not less than 100 Å to not more than 200 Å, from not less than 200 Å to not more than 300 Å, from not less than 300 Å to not more than 400 Å, or from not less than 400 Å to not more than 500 Å. The fifth thickness T5 is preferably from not less than 200 Å to not more than 400 Å.

The fifth thickness T5 may be equal to or less than the second thickness T2 (T5≤T2). The fifth thickness T5 may be equal to or more than the second thickness T2 (T5≥T2). The fifth thickness T5 may be equal to the second thickness T2 (T5=T2).

The second bottom-side insulation layer 104 is formed in a manner that the fourth thickness T4 is reduced from a part which covers the first side wall 71 and the second side wall 72 of the second gate trench 101 toward a part which covers the bottom wall 73 of the second gate trench 101.

The part which covers the bottom wall 73 of the second gate trench 101 in the second bottom-side insulation layer 104 is smaller in thickness than the part which covers the first side wall 71 and the second side wall 72 of the second gate trench 101 in the second bottom-side insulation layer 104. An opening width of the U letter space defined by the second bottom-side insulation layer 104 at the bottom wall side is expanded by an amount of a reduction in the fourth thickness T4. Thereby, the U letter space is suppressed from being tapered. The above-described U letter space is formed, for example, by an etching method (for example, a wet etching method) to the inner wall of the second bottom-side insulation layer 104.

The second electrode 103 is embedded in the second gate trench 101 across the second insulation layer 102. Second gate control signals (second control signals) including an ON signal Von and an OFF signal Voff are applied to the second electrode 103.

In this embodiment, the second electrode 103 has an insulated-separation type split electrode structure including a second bottom-side electrode 106, a second opening-side electrode 107, and a second intermediate insulation layer 108. In this embodiment, the second bottom-side electrode 106 is electrically connected to the first bottom-side electrode 86. The second opening-side electrode 107 is electrically insulated from the first opening-side electrode 87.

The second bottom-side electrode 106 is embedded in the bottom wall 73 side of the second gate trench 101 across the second insulation layer 102. Specifically, the second bottom-side electrode 106 is embedded in the bottom wall 73 side of the second gate trench 101 across the second bottom-side insulation layer 104. The second bottom-side electrode 106 faces the drift region 54 across the second bottom-side insulation layer 104. A part of the second bottom-side electrode 106 may face the body region 55 across the second bottom-side insulation layer 104.

The second bottom-side electrode 106 includes a second upper end portion 106A, a second lower end portion 106B, and a second wall portion 106C. The second upper end portion 106A is positioned at an opening side of the second gate trench 101. The second lower end portion 106B is positioned at the bottom wall 73 side of the second gate trench 101. The second wall portion 106C connects the second upper end portion 106A and the second lower end portion 106B and extends in a wall shape along the inner wall of the second gate trench 101.

The second upper end portion 106A is exposed from the second bottom-side insulation layer 104. The second upper end portion 106A protrudes to the first main surface 3 side with respect to the second bottom-side insulation layer 104. Thereby, the second bottom-side electrode 106 defines an inverted concave recess in sectional view between the second bottom-side insulation layer 104 and the second opening-side insulation layer 105 at the opening side of the second gate trench 101. A width of the second upper end portion 106A is less than a width of the second wall portion 106C.

The second lower end portion 106B is formed in a convex curved shape toward the bottom wall 73 of the second gate trench 101. Specifically, the second lower end portion 106B is conformally formed along a bottom wall of the U letter space defined by the second bottom-side insulation layer 104 and formed in a smooth convex curved shape toward the bottom wall 73 of the second gate trench 101.

According to the above-described structure, since it is possible to suppress a local electric field concentration on the second bottom-side electrode 106, it is possible to suppress a reduction in breakdown voltage. In particular, by embedding the second bottom-side electrode 106 into the U letter space expanded by the second bottom-side insulation layer 104, it becomes possible to appropriately suppress the second bottom-side electrode 106 from being tapered from the second upper end portion 106A to the second lower end portion 106B. Thereby, it is possible to appropriately suppress a local electric field concentration at the second lower end portion 106B of the second bottom-side electrode 106.

The second bottom-side electrode 106 may include at least any one of conductive polysilicon, tungsten, aluminum, copper, an aluminum alloy, and a copper alloy. In this embodiment, the second bottom-side electrode 106 includes conductive polysilicon. The conductive polysilicon may include an n-type impurity or a p-type impurity. The conductive polysilicon preferably includes an n-type impurity.

The second opening-side electrode 107 is embedded in the opening side of the second gate trench 101 across the second insulation layer 102. Specifically, the second opening-side electrode 107 is embedded in the inverted concave recess defined at the opening side of the second gate trench 101 across the second opening-side insulation layer 105. The second opening-side electrode 107 faces the body region 55 across the second opening-side insulation layer 105. A part of the second opening-side electrode 107 may face the drift region 54 across the second opening-side insulation layer 105.

The second opening-side electrode 107 may include at least any one of conductive polysilicon, tungsten, aluminum, copper, an aluminum alloy, and a copper alloy. The second opening-side electrode 107 preferably includes the same type of conductive material as the second bottom-side electrode 106. In this embodiment, the second opening-side electrode 107 includes conductive polysilicon. The conductive polysilicon may include an n-type impurity or a p-type impurity. The conductive polysilicon preferably includes an n-type impurity.

The second intermediate insulation layer 108 is interposed between the second bottom-side electrode 106 and the second opening-side electrode 107 to electrically insulate the second bottom-side electrode 106 and the second opening-side electrode 107. Specifically, the second intermediate insulation layer 108 covers the second bottom-side electrode 106 exposed from the second bottom-side insulation layer 104 in a region between the second bottom-side electrode 106 and the second opening-side electrode 107. The second intermediate insulation layer 108 covers the second upper end portion 106A of the second bottom-side electrode 106 (specifically, a protruded portion). The second intermediate insulation layer 108 is continuous with the second insulation layer 102 (second bottom-side insulation layer 104).

The second intermediate insulation layer 108 has a sixth thickness T6. The sixth thickness T6 is less than the fourth thickness T4 of the second bottom-side insulation layer 104 (T6<T4). The sixth thickness T6 may be from not less than 1/100 of the fourth thickness T4 to not more than 1/10. The sixth thickness T6 may be from not less than 100 Å to not more than 500 Å. The sixth thickness T6 may be from not less than 100 Å to not more than 200 Å, from not less than 200 Å to not more than 300 Å, from not less than 300 Å to not more than 400 Å, or from not less than 400 Å to not more than 500 Å. The sixth thickness T6 is preferably from not less than 200 Å to not more than 400 Å.

The sixth thickness T6 may be equal to or less than the third thickness T3 (T6≤T3). The sixth thickness T6 may be equal to or more than the third thickness T3 (T6≥T3). The sixth thickness T6 may be equal to the third thickness T3 (T6=T3).

The second intermediate insulation layer 108 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the second intermediate insulation layer 108 has a single layer structure composed of an $SiO_2$ layer.

In this embodiment, an exposed portion which is exposed from the second gate trench 101 in the second opening-side electrode 107 is positioned at the bottom wall 73 side of the second gate trench 101 with respect to the first main surface 3. The exposed portion of the second opening-side electrode 107 is formed in a curved shape toward the bottom wall 73 of the second gate trench 101.

The exposed portion of the second opening-side electrode 107 is covered by a second cap insulation layer 109 formed in a film shape. The second cap insulation layer 109 is continuous with the second insulation layer 102 (second opening-side insulation layer 105) inside the second gate trench 101. The second cap insulation layer 109 may include silicon oxide ($SiO_2$).

Each of the second FET structures 68 further includes a p-type second channel region 111 (second channel). Specifically, the second channel region 111 is formed in a region which faces the second electrode 103 (second opening-side electrode 107) across the second insulation layer 102 (second opening-side insulation layer 105) in the body region 55.

Specifically, the second channel region 111 is formed along the first side wall 71 or the second side wall 72 of the second trench gate structure 70, or along the first side wall 71 and the second side wall 72 thereof. In this embodiment, the second channel region 111 is formed along the first side wall 71 and the second side wall 72 of the second trench gate structure 70.

Each of the second FET structures 68 further includes an $n^+$-type second source region 112 formed in the surface layer portion of the body region 55. The second source region 112 demarcates the second channel region 111 with the drift region 54 inside the body region 55.

An n-type impurity concentration of the second source region 112 is in excess of an n-type impurity concentration of the drift region 54. The n-type impurity concentration of the second source region 112 may be from not less than $1\times10^{19}$ $cm^{-3}$ to not more than $1\times10^{21}$ $cm^{-3}$. It is preferable that the n-type impurity concentration of the second source region 112 is substantially equal to the n-type impurity concentration of the first source region 92.

In this embodiment, each of the second FET structures 68 includes the plurality of second source regions 112. The plurality of second source regions 112 are formed in the surface layer portion of the body region 55 at an interval along the second trench gate structure 70. Specifically, the plurality of second source regions 112 are formed along the first side wall 71 or the second side wall 72 of the second trench gate structure 70, or along the first side wall 71 and the second side wall 72 thereof. In this embodiment, the plurality of second source regions 112 are formed at an interval along the first side wall 71 and the second side wall 72 of the second trench gate structure 70.

In this embodiment, each of the second source regions 112 faces each of the first source regions 92 along the first direction X. Each of the second source regions 112 is integrally formed with each of the first source regions 92. FIG. 7 and FIG. 8 show that the first source region 92 and the second source region 112 are distinguished from each other by a boundary line. However, in actuality, there is no clear boundary line in a region between the first source region 92 and the second source region 112.

The second source regions 112 may be each formed such as to be shifted from each of the first source regions 92 in the second direction Y such as not to face some of or all of the first source regions 92 along the first direction X. That is, the plurality of first source regions 92 and the plurality of second source regions 112 may be arrayed in a staggered manner in plan view.

The bottom portions of the plurality of second source regions 112 are positioned in a region at the first main surface 3 side with respect to the bottom portion of the body region 55. Thereby, the plurality of second source regions 112 face the second electrode 103 (second opening-side electrode 107) across the second insulation layer 102 (second opening-side insulation layer 105). Thus, the second channel region 111 of the second MISFET 57 is formed in a region held between the plurality of second source regions 112 and the drift region 54 in the body region 55.

A thickness of the second source region 112 may be from not less than 0.01 μm to not more than 1.5 μm. The thickness of the second source region 112 may be from not less than 0.01 μm to not more than 0.05 μm, from not less than 0.05 μm to not more than 0.1 μm, from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm.

Each of the second FET structures 68 further includes a $p^+$-type second contact region 113 formed in the surface layer portion of the body region 55. A p-type impurity concentration of the second contact region 113 is in excess of a p-type impurity concentration of the body region 55. The p-type impurity concentration of the second contact region 113 may be from not less than $1\times10^{19}$ $cm^{-3}$ to not more than $1\times10^{21}$ $cm^{-3}$. It is preferable that the p-type impurity concentration of the second contact region 113 is substantially equal to the p-type impurity concentration of the first contact region 93.

In this embodiment, each of the second FET structures 68 includes the plurality of second contact regions 113. The plurality of second contact regions 113 are formed in the surface layer portion of the body region 55 at an interval along the second trench gate structure 70. Specifically, the plurality of second contact regions 113 are formed along the first side wall 71 or the second side wall 72 of the second trench gate structure 70, or along the first side wall 71 and the second side wall 72 thereof. The bottom portions of the plurality of second contact regions 113 are positioned in a region in the first main surface 3 side with respect to the bottom portion of the body region 55.

In this embodiment, the plurality of second contact regions 113 are formed at an interval along the first side wall 71 and the second side wall 72 of the second trench gate structure 70. Specifically, the plurality of second contact regions 113 are formed in the surface layer portion of the body region 55 in a manner that the plurality of second contact regions 113 are arrayed alternately with the plurality of second source regions 112.

A thickness of the second contact region 113 may be from not less than 0.01 μm to not more than 1.5 μm. The thickness of the second contact region 113 may be from not less than 0.01 μm to not more than 0.05 μm, from not less than 0.05 μm to not more than 0.1 μm, from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm.

With reference to FIG. 7 and FIG. 8, in this embodiment, each of the second contact regions 113 faces each of the first contact regions 93 along the first direction X. Each of the second contact regions 113 is integrally formed with each of the first contact regions 93.

In FIG. 7, in order to distinguish the first contact region 93 and the second contact region 113 from the first source region 92 and the second source region 112, the first contact region 93 and the second contact region 113 are collectively indicated by a reference sign of "$p^+$." Further, in FIG. 8, it is shown that the first contact region 93 is distinguished from the second contact region 113 by a boundary line. However, in actuality, there is no clear boundary line in a region between the first contact region 93 and the second contact region 113.

Each of the second contact regions 113 may be formed such as to be shifted from each of the first contact regions 93 in the second direction Y such as not to face some of or all of the first contact regions 93 along the first direction X. That is, the plurality of first contact regions 93 and the plurality of second contact regions 113 may be arrayed in a staggered manner in plan view.

With reference to FIG. 7 and FIG. 8, in this embodiment, the body region 55 is exposed from a region between one end portion of the first trench gate structure 60 and one end portion of the second trench gate structure 70 in the first main surface 3 of the semiconductor layer 2. Any of the first source region 92, the first contact region 93, the second source region 112, and the second contact region 113 is not formed in the region held between one end portion of the first trench gate structure 60 and one end portion of the second trench gate structure 70 in the first main surface 3.

Similarly, although not shown in the drawings, in this embodiment, the body region 55 is exposed from a region between the other end portion of the first trench gate structure 60 and the other end portion of the second trench gate structure 70 in the first main surface 3 of the semiconductor layer 2. Any of the first source region 92, the first contact region 93, the second source region 112, and the second contact region 113 is not formed in the region held between the other end portion of the first trench gate structure 60 and the other end portion of the second trench gate structure 70.

With reference to FIG. 5 to FIG. 8, a plurality of (in this embodiment, two) trench contact structures 120 are formed in the first main surface 3 of the semiconductor layer 2. The plurality of trench contact structures 120 include a trench contact structure 120 at one side and a trench contact structure 120 at the other side.

The trench contact structure 120 at one side is positioned in a region at the side of one end portion of the first trench gate structure 60 and one end portion of the second trench gate structure 70. The trench contact structure 120 at the other side is positioned in a region at the side of the other end portion of the first trench gate structure 60 and at the other end portion of the second trench gate structure 70.

The trench contact structure 120 at the other side is substantially similar in structure to the trench contact structure 120 at one side. Hereinafter, a structure of the trench contact structure 120 at one side shall be described as an example, and a specific description of a structure of the trench contact structure 120 at the other side shall be omitted.

The trench contact structure 120 is connected to one end portion of the first trench gate structure 60 and one end portion of the second trench gate structure 70. In this embodiment, the trench contact structure 120 extends in a band shape along the first direction X in plan view.

A width WTC of the trench contact structure 120 may be from not less than 0.5 μm to not more than 5 μm. The width WTC is a width in a direction (second direction Y) orthogonal to a direction (first direction X) in which the trench contact structure 120 extends.

The width WTC may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The width WTC is preferably from not less than 0.8 μm to not more than 1.2 μm.

It is preferable that the width WTC is substantially equal to the first width WT1 of the first trench gate structure 60 (WTC=WT1). It is preferable that the width WTC is substantially equal to the second width WT2 of the second trench gate structure 70 (WTC=WT2).

The trench contact structure 120 penetrates through the body region 55 and reaches the drift region 54. A depth DTC of the trench contact structure 120 may be from not less than 1 μm to not more than 10 μm. The depth DTC may be from may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DTC is preferably from not less than 2 μm to not more than 6 μm.

It is preferable that the depth DTC is substantially equal to the first depth DT1 of the first trench gate structure 60 (DTC=DT1). It is preferable that the depth DTC is substantially equal to the second depth DT2 of the second trench gate structure 70 (DTC=DT2).

The trench contact structure 120 includes a first side wall 121 on one side, a second side wall 122 on the other side, and a bottom wall 123 which connects the first side wall 121 and the second side wall 122. Hereinafter, the first side wall 121, the second side wall 122, and the bottom wall 123 may be collectively referred to as "an inner wall." The first side wall 121 is a connection surface which is connected to the first trench gate structure 60 and the second trench gate structure 70.

The first side wall 121, the second side wall 122, and the bottom wall 123 are positioned inside the drift region 54. The first side wall 121 and the second side wall 122 extend along the normal direction Z. The first side wall 121 and the second side wall 122 may be formed perpendicularly to the first main surface 3.

An absolute value of an angle (taper angel) formed between the first side wall 121 and the first main surface 3 inside semiconductor layer 2 may be in excess of 90° and not more than 95° (for example, approximately 91°). The absolute value of an angle (taper angel) formed between the second side wall 122 and the first main surface 3 inside the semiconductor layer 2 may be in excess of 90° and not more than 95° (for example, approximately 91°). The trench contact structure 120 may be formed in a shape (tapered shape) that the width WTC is made narrow from the first main surface 3 side of the semiconductor layer 2 to the bottom wall 123 side in sectional view.

The bottom wall 123 is positioned in a region at the first main surface 3 side with respect to the bottom portion of the drift region 54. The bottom wall 123 is formed in a convex curved shape toward the bottom portion of the drift region 54. The bottom wall 123 is positioned in a region at the first main surface 3 side with an interval ITC of not less than 1 μm to not more than 10 μm from the bottom portion of the drift region 54. The interval ITC may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The interval ITC is preferably from not less than 1 μm to not more than 5 μm.

It is preferable that the interval ITC is substantially equal to the first interval IT1 of the first trench gate structure 60 (ITC=IT1). It is preferable that the interval ITC is substantially equal to the second interval IT2 of the second trench gate structure 70 (ITC=IT2).

The trench contact structure 120 includes a contact trench 131, a contact insulation layer 132, and a contact electrode 133. The contact trench 131 is formed by digging down the first main surface 3 of the semiconductor layer 2 toward the second main surface 4 side.

The contact trench 131 defines the first side wall 121, the second side wall 122, and the bottom wall 123 of the trench contact structure 120. Hereinafter, the first side wall 121, the second side wall 122, and the bottom wall 123 of the trench contact structure 120 are also referred to as the first side wall 121, the second side wall 122, and the bottom wall 123 of the contact trench 131.

The first side wall 121 of the contact trench 131 communicates with the first side wall 61 and the second side wall 62 of the first gate trench 81. The first side wall 121 of the contact trench 131 communicates with the first side wall 71 and the second side wall 72 of the second gate trench 101. The contact trench 131 forms one trench with the first gate trench 81 and the second gate trench 101.

The contact insulation layer 132 is formed in a film shape along an inner wall of the contact trench 131. The contact insulation layer 132 defines a concave space inside the contact trench 131. A part which covers the bottom wall 123 of the contact trench 131 in the contact insulation layer 132 is conformally formed along the bottom wall 123 of the contact trench 131.

The contact insulation layer 132 defines a U letter space recessed in a U letter shape inside the contact trench 131 in a manner similar to the first bottom-side insulation layer 84 (second bottom-side insulation layer 104). That is, the contact insulation layer 132 defines a U letter space in which a region of the contact trench 131 at the bottom wall 123 side is expanded and suppressed from being tapered. The above-described U letter space is formed, for example, by an etching method (for example, a wet etching method) to the inner wall of the contact insulation layer 132.

The contact insulation layer 132 has a seventh thickness T7. The seventh thickness T7 may be from not less than 1500 Å to not more than 4000 Å. The seventh thickness T7 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The seventh thickness T7 is preferably from not less than 1800 Å to not more than 3500 Å.

The seventh thickness T7 may be from not less than 4000 Å to not more than 12000 Å according to the width WTC of the trench contact structure 120. The seventh thickness T7 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the contact insulation layer 132, it becomes possible to increase a withstand voltage of the semiconductor device 1.

It is preferable that the seventh thickness T7 is substantially equal to the first thickness T1 of the first bottom-side insulation layer 84 (T7=T1). It is preferable that the seventh thickness T7 is substantially equal to the fourth thickness T4 of the second bottom-side insulation layer 104 (T7=T4).

The contact insulation layer 132 includes at least any one of silicon oxide ($SiO_2$), silicon nitride (SiN), aluminum oxide ($Al_2O_3$), zirconium oxide ($ZrO_2$), and tantalum oxide ($Ta_2O_3$). The contact insulation layer 132 is preferably composed of the same insulating material as the first insulation layer 82 (second insulation layer 102). In this embodiment, the contact insulation layer 132 has a single layer structure composed of an $SiO_2$ layer.

The contact insulation layer 132 is integrally formed with the first insulation layer 82 in a communication portion between the first gate trench 81 and the contact trench 131. The contact insulation layer 132 is integrally formed with the second insulation layer 102 in a communication portion between the second gate trench 101 and the contact trench 131.

In this embodiment, the contact insulation layer 132 has a lead-out insulation layer 132A which is led out to one end portion of the first gate trench 81 and one end portion of the second gate trench 101. The lead-out insulation layer 132A crosses the communication portion to cover an inner wall of one end portion of the first gate trench 81. The lead-out insulation layer 132A crosses the communication portion to cover an inner wall of one end portion of the second gate trench 101.

The lead-out insulation layer 132A is integrally formed with the first bottom-side insulation layer 84 and the first opening-side insulation layer 85 inside the first gate trench 81. The lead-out insulation layer 132A defines a U letter space together with the first bottom-side insulation layer 84 at the inner wall of one end portion of the first gate trench 81.

The lead-out insulation layer 132A is integrally formed with the second bottom-side insulation layer 104 and the second opening-side insulation layer 105 inside the second gate trench 101. The lead-out insulation layer 132A defines the U letter space together with the second bottom-side insulation layer 104 at the inner wall of one end portion of the second gate trench 101.

The contact electrode 133 is embedded in the contact trench 131 across the contact insulation layer 132. The contact electrode 133 is embedded in the contact trench 131 as an integrated member unlike the first electrode 83 and the second electrode 103. The contact electrode 133 has an upper end portion exposed from the contact trench 131 and a lower end portion in contact with the contact insulation layer 132.

The lower end portion of the contact electrode 133 is formed in a convex curved shape toward the bottom wall 123 of the contact trench 131 in a manner similar to the first bottom-side electrode 86 (second bottom-side electrode 106). Specifically, the lower end portion of the contact electrode 133 is conformally formed along the bottom wall of the U letter space defined by the contact insulation layer 132 and formed in a smooth convex curved shape toward the bottom wall 123.

According to the above-described structure, since it is possible to suppress a local electric field concentration on the contact electrode 133, it is possible to suppress a reduction in breakdown voltage. In particular, by embedding the contact electrode 133 into the expanded U letter space of the contact insulation layer 132, it becomes possible to appropriately suppress the contact electrode 133 from being tapered from the upper end portion to the lower end portion. Thereby, it is possible to appropriately suppress a local electric field concentration on the lower end portion of the contact insulation layer 132.

The contact electrode 133 is electrically connected to the first bottom-side electrode 86 at the connection portion between the first gate trench 81 and the contact trench 131. The contact electrode 133 is electrically connected to the second bottom-side electrode 106 at the connection portion between the second gate trench 101 and the contact trench 131. Thereby, the second bottom-side electrode 106 is electrically connected to the first bottom-side electrode 86.

Specifically, the contact electrode 133 has a lead-out electrode 133A which is led out to one end portion of the first gate trench 81 and one end portion of the second gate trench 101. The lead-out electrode 133A crosses the communication portion between the first gate trench 81 and the contact trench 131 and is positioned inside the first gate trench 81. The lead-out electrode 133A also crosses the communication portion between the second gate trench 101 and the contact trench 131 and is positioned inside the second gate trench 101.

The lead-out electrode 133A is embedded in a U letter space defined by the contact insulation layer 132 inside the first gate trench 81. The lead-out electrode 133A is integrally formed with the first bottom-side electrode 86 inside the first gate trench 81. Thereby, the contact electrode 133 is electrically connected to the first bottom-side electrode 86.

The first intermediate insulation layer 88 is interposed between the contact electrode 133 and the first opening-side electrode 87 inside the first gate trench 81. Thereby, the contact electrode 133 is electrically insulated from the first opening-side electrode 87 inside the first gate trench 81.

The lead-out electrode 133A is embedded in the U letter space defined by the contact insulation layer 132 inside the second gate trench 101. The lead-out electrode 133A is integrally formed with the second bottom-side electrode 106 inside the second gate trench 101. Thereby, the contact electrode 133 is electrically connected to the second bottom-side electrode 106.

The second intermediate insulation layer 108 is interposed between the contact electrode 133 and the second opening-side electrode 107 inside the second gate trench 101. Thereby, the contact electrode 133 is electrically insulated from the second opening-side electrode 107 inside the second gate trench 101.

The contact electrode 133 may include at least any one of conductive polysilicon, tungsten, aluminum, copper, an aluminum alloy, and a copper alloy. In this embodiment, the contact electrode 133 may include conductive polysilicon. The conductive polysilicon may include an n-type impurity or a p-type impurity. The conductive polysilicon preferably includes an n-type impurity. It is preferable that the contact electrode 133 includes the same conductive material as the first bottom-side electrode 86 and the second bottom-side electrode 106.

In this embodiment, an exposed portion which is exposed from the contact trench 131 in the contact electrode 133 is positioned at the bottom wall 123 side of the contact trench 131 with respect to the first main surface 3. The exposed portion of the contact electrode 133 is formed in a curved shape toward the bottom wall 123 of the contact trench 131.

The exposed portion of the contact electrode 133 is covered by a third cap insulation layer 139 which is formed in a film shape. The third cap insulation layer 139 is continuous with the contact insulation layer 132 inside the contact trench 131. The third cap insulation layer 139 may include silicon oxide ($SiO_2$).

With reference to FIG. 5 to FIG. 11, the semiconductor device 1 includes a main surface insulation layer 141 which is formed on the first main surface 3 of the semiconductor layer 2. The main surface insulation layer 141 selectively covers the first main surface 3. The main surface insulation layer 141 is continuous with the first insulation layer 82, the second insulation layer 102, and the contact insulation layer 132. The main surface insulation layer 141 includes at least any one of silicon oxide ($SiO_2$), silicon nitride (SiN), aluminum oxide ($Al_2O_3$), zirconium oxide ($ZrO_2$), and tantalum oxide ($Ta_2O_3$). The main surface insulation layer 141 is preferably composed of the same insulating material as the first insulation layer 82, the second insulation layer 102, and the contact insulation layer 132. In this embodiment, the main surface insulation layer 141 has a single layer structure composed of an $SiO_2$ layer.

The semiconductor device 1 includes an interlayer insulation layer 142 is formed on the main surface insulation layer 141. The interlayer insulation layer 142 may have a thickness in excess of a thickness of the main surface insulation layer 141. The interlayer insulation layer 142 covers a substantially entire region of the main surface insulation layer 141. The interlayer insulation layer 142 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

In this embodiment, the interlayer insulation layer 142 includes a USG (Undoped Silica Glass) layer as an example of silicon oxide. The interlayer insulation layer 142 may have a single layer structure composed of a USG layer. The interlayer insulation layer 142 may have a flattened main surface. The main surface of the interlayer insulation layer 142 may be a ground surface which is ground by a CMP (Chemical Mechanical Polishing) method.

The interlayer insulation layer 142 may include PSG (Phosphor Silicate Glass) and/or BPSG (Boron Phosphor Silicate Glass) as an example of silicon oxide. The interlayer insulation layer 142 may have a laminated structure which includes a PSG layer and a BPSG layer which are laminated in this order from the semiconductor layer 2 side. The interlayer insulation layer 142 may have a laminated structure including a BPSG layer and a PSG layer which are laminated in this order from the first main surface 3 side.

With reference to FIG. 5 and FIG. 6, a first plug electrode 143, a second plug electrode 144, a third plug electrode 145, and a fourth plug electrode 146 are embedded in the interlayer insulation layer 142 in the output region 6. In this embodiment, the plurality of first plug electrodes 143, the plurality of second plug electrodes 144, the plurality of third plug electrodes 145, and the plurality of fourth plug electrodes 146 are embedded in the interlayer insulation layer 142. The first plug electrode 143, the second plug electrode 144, the third plug electrode 145, and the fourth plug electrode 146 may each include tungsten.

The plurality of first plug electrodes 143 are each embedded in a part which covers the first opening-side electrode 87 of the first trench gate structure 60 in the interlayer insulation layer 142. In this embodiment, the plurality of first plug electrodes 143 penetrate through the interlayer insulation layer 142 in a region of the first trench gate structure 60 at one end portion side and are connected to the plurality of first opening-side electrodes 87 in a one-to-one correspondence.

As a matter of course, the plurality of first plug electrodes 143 may be connected to one first opening-side electrode 87. Although not shown in the drawing, the plurality of first plug electrodes 143 are also embedded in a part which covers a region of the first trench gate structure 60 at the other end portion side of the interlayer insulation layer 142 in a manner similar to a region thereof at one end portion side.

In this embodiment, the plurality of first plug electrodes 143 are arrayed on a line at an interval along the first direction X. Each of the first plug electrodes 143 may be formed in a polygonal shape such as a triangular shape, a rectangular shape, a pentagonal shape, a hexagonal shape, etc., or in a circular shape or an elliptical shape in plan view. In this embodiment, each of the first plug electrodes 143 is formed in a rectangular shape in plan view.

The plurality of second plug electrodes 144 are each embedded in a part which covers the second opening-side electrode 107 of the second trench gate structure 70 in the interlayer insulation layer 142. In this embodiment, the plurality of second plug electrodes 144 penetrate through the interlayer insulation layer 142 in a region of the second trench gate structure 70 at one end portion side and are connected to the plurality of second opening-side electrodes 107 in a one-to-one correspondence.

As a matter of course, the plurality of second plug electrodes 144 may be connected to one second opening-side electrode 107. Although not shown in the drawing, the plurality of second plug electrodes 144 are also embedded in a part which covers a region of the second trench gate structure 70 at the other end portion side of the interlayer insulation layer 142 in a manner similar to a region thereof at one end portion side.

In this embodiment, the plurality of second plug electrodes 144 are arrayed on a line at an interval along the first direction X. Each of the second plug electrodes 144 may be formed in a polygonal shape such as a triangular shape, a rectangular shape, a pentagonal shape, a hexagonal shape, etc., or in a circular shape or an elliptical shape in plan view. In this embodiment, the second plug electrode 144 is formed in a rectangular shape in plan view.

The plurality of third plug electrodes 145 are each embedded in a part which covers the contact electrode 133 in the interlayer insulation layer 142. The plurality of third plug electrodes 145 penetrate through the interlayer insulation layer 142 and are connected to the contact electrode 133.

Although not shown in the drawing, the plurality of third plug electrodes 145 are also embedded in a part which covers the contact electrode 133 of the trench contact structure 120 at the other side of the interlayer insulation layer 142 in a manner similar to a region thereof at one end portion side.

In this embodiment, the plurality of third plug electrodes 145 are arrayed on a line at an interval along the first direction X. Each of the third plug electrodes 145 may be formed in a polygonal shape such as a triangular shape, a rectangular shape, a pentagonal shape, a hexagonal shape, etc., or in a circular shape or an elliptical shape in plan view. In this embodiment, each of the third plug electrodes 145 is formed in a rectangular shape in plan view.

The plurality of fourth plug electrodes 146 are each embedded in parts which cover the plurality of cell regions 75 in the interlayer insulation layer 142. Each of the fourth plug electrodes 146 penetrates through the interlayer insulation layer 142 and is connected to each of the cell regions 75. Specifically, each of the fourth plug electrodes 146 is electrically connected to the first source region 92, the first contact region 93, the second source region 112, and the second contact region 113 in each of the cell regions 75.

Each of the fourth plug electrodes 146 is formed in a band shape extending along the each of the cell regions 75 in plan view. A length of each fourth plug electrode 146 in the second direction Y may be less than a length of each cell region 75 in the second direction Y.

As a matter of course, the plurality of fourth plug electrodes 146 may be connected to each of the cell regions 75. In this case, the plurality of fourth plug electrodes 146 are formed at an interval along each of the cell regions 75. Further, in this case, each of the fourth plug electrodes 146 may be formed in a polygonal shape such as a triangular shape, a rectangular shape, a pentagonal shape, a hexagonal shape, etc., or in a circular shape or an elliptical shape in plan view.

The source electrode 12 and the gate control wiring 17 aforementioned are formed on the interlayer insulation layer 142 in the output region 6. The source electrode 12 is electrically connected to the plurality of fourth plug electrodes 146 collectively on the interlayer insulation layer 142. The reference voltage (for example, the ground voltage) is applied to the source electrode 12. The reference voltage is transmitted to the first source region 92, the first contact region 93, the second source region 112, and the second contact region 113 through the plurality of fourth plug electrodes 146.

The first gate control wiring 17A of the gate control wiring 17 is electrically connected to the plurality of first plug electrodes 143 on the interlayer insulation layer 142. The gate control signal from the control IC 10 is input to the first gate control wiring 17A. The gate control signal is transmitted to the first opening-side electrode 87 through the first gate control wiring 17A and the plurality of first plug electrodes 143.

The second gate control wiring 17B of the gate control wiring 17 is electrically connected to the plurality of second plug electrodes 144 on the interlayer insulation layer 142. The gate control signal from the control IC 10 is input to the second gate control wiring 17B. The gate control signal is transmitted to the second opening-side electrode 107 through the second gate control wiring 17B and the plurality of second plug electrodes 144.

The third gate control wiring 17C of the gate control wiring 17 is electrically connected to the plurality of third plug electrodes 145 on the interlayer insulation layer 142. The gate control signal from the control IC 10 is input to the third gate control wiring 17C. The gate control signal is transmitted to the contact electrode 133 through the third gate control wiring 17C and the plurality of third plug electrodes 145. That is, the gate control signal from the control IC 10 is transmitted to the first bottom-side electrode 86 and the second bottom-side electrode 106 through the contact electrode 133.

In a case where the first MISFET 56 (first trench gate structure 60) and the second MISFET 57 (second trench gate structure 70) are both controlled to be in the OFF states, the first channel region 91 and the second channel region 111 are both controlled to be in the OFF states.

In a case where the first MISFET 56 and the second MISFET 57 are both controlled to be in the ON states, the first channel region 91 and the second channel region 111 are both controlled to be in the ON states (Full-ON control).

In a case where the first MISFET 56 is controlled to be in the ON state while the second MISFET 57 is controlled to be in the OFF state, the first channel region 91 is controlled to be in the ON state and the second channel region 111 is controlled to be in the OFF state (first Half-ON control).

In a case where the first MISFET 56 is controlled to be in the OFF state while the second MISFET 57 is controlled to be in the ON state, the first channel region 91 is controlled to be in the OFF state and the second channel region 111 is controlled to be in the ON state (second Half-ON control).

As described above, in the power MISFET 9, the first MISFET 56 and the second MISFET 57 formed in one output region 6 are used to realize plural types of control including Full-ON control, first Half-ON control, and second Half-ON control.

When the first MISFET 56 is driven (that is, when the gate is controlled to be in the ON state), the ON signal Von may be applied to the first bottom-side electrode 86 and the ON signal Von may be applied to the first opening-side electrode 87. In this case, the first bottom-side electrode 86 and the first opening-side electrode 87 each function as a gate electrode.

Thereby, it is possible to suppress a voltage drop between the first bottom-side electrode 86 and the first opening-side electrode 87 and therefore it is possible to suppress an electric field concentration between the first bottom-side electrode 86 and the first opening-side electrode 87. It is also possible to reduce an ON resistance of the semiconductor layer 2 and therefore it is thereby possible to reduce electricity consumption.

When the first MISFET 56 is driven (that is, when the gate is controlled to be in the ON state), the OFF signal Voff (for example, the reference voltage) may be applied to the first bottom-side electrode 86 and the ON signal Von may be applied to the first opening-side electrode 87. In this case, while the first bottom-side electrode 86 functions as a field electrode, the first opening-side electrode 87 functions as a gate electrode. Thereby, it is possible to reduce a parasitic capacitance and therefore it is possible to improve a switching speed.

When the second MISFET 57 is driven (that is, when the gate is controlled to be in the ON state), the ON signal Von may be applied to the second bottom-side electrode 106 and the ON signal Von may be applied to the second opening-side electrode 107. In this case, the second bottom-side electrode 106 and the second opening-side electrode 107 each function as a gate electrode.

Thereby, it is possible to suppress a voltage drop between the second bottom-side electrode 106 and the second opening-side electrode 107 and therefore it is possible to suppress an electric field concentration between the second bottom-side electrode 106 and the second opening-side electrode 107. It is also possible to reduce an ON resistance of the semiconductor layer 2 and therefore it is possible to reduce electricity consumption.

When the second MISFET 57 is driven (that is, when the gate is controlled to be in the ON state), the OFF signal Voff (reference voltage) may be applied to the second bottom-side electrode 106 and the ON signal Von may be applied to the second opening-side electrode 107. In this case, while the second bottom-side electrode 106 functions as a field electrode, the second opening-side electrode 107 functions as a gate electrode. Thereby, it is possible to reduce a parasitic capacitance and therefore it is possible to improve a switching speed.

With reference to FIG. 7 and FIG. 8, the first channel region 91 is formed in each of the cell regions 75 at a first channel area S1. The first channel area Si is defined by a total planar area of the plurality of first source regions 92 formed in each of the cell regions 75.

The first channel region 91 is formed in each of the cell regions 75 at a first channel rate R1 (first rate). The first channel rate R1 is a rate which is occupied by the first channel area Si in each of the cell regions 75 when a planar area of each cell region 75 is given as 100%.

The first channel rate R1 is adjusted to a range from not less than 0% to not more than 50%. The first channel rate R1 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The first channel rate R1 is preferably from not less than 10% to not more than 35%.

In a case where the first channel rate R1 is 50%, the first source region 92 is formed in a substantially entire region of the first side wall 61 and the second side wall 62 of the first trench gate structure 60. In this case, no first contact region 93 is formed at the first side wall 61 side or the second side wall 62 side of the first trench gate structure 60. The first channel rate R1 is preferably less than 50%.

In a case where the first channel rate R1 is 0%, no first source region 92 is formed in the first side wall 61 side or the second side wall 62 side of the first trench gate structure 60. In this case, only the body region 55 and/or the first contact region 93 are formed in the first side wall 61 side and the second side wall 62 side of the first trench gate structure 60. The first channel rate R1 is preferably in excess of 0%. In this embodiment, an example in which the first channel rate R1 is 25% is shown.

The second channel region 111 is formed in each of the cell regions 75 at a second channel area S2. The second channel area S2 is defined by a total planar area of the plurality of second source regions 112 formed in each of the cell regions 75.

The second channel region 111 is formed in each of the cell regions 75 at a second channel rate R2 (second rate). The second channel rate R2 is a rate which is occupied by the second channel area S2 in each of the cell regions 75 when a planar area of each of the cell regions 75 is given as 100%.

The second channel rate R2 is adjusted to a range from not less than 0% to not more than 50%. The second channel rate R2 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The second channel rate R2 is preferably from not less than 10% to not more than 35%.

In a case where the second channel rate R2 is 50%, the second source region 112 is formed in a substantially entire region of the first side wall 71 side and the second side wall 72 side of the second trench gate structure 70. In this case, no second contact region 113 is formed in the first side wall 71 side or the second side wall 72 side of the second trench gate structure 70. The second channel rate R2 is preferably less than 50%.

In a case where the second channel rate R2 is 0%, no second source region 112 is formed in the first side wall 71 side or the second side wall 72 side of the second trench gate structure 70. In this case, only the body region 55 and/or the second contact region 113 are formed in the first side wall 71 side and the second side wall 72 side of the second trench gate structure 70. The second channel rate R2 is preferably in excess of 0%. In this embodiment, an example in which the second channel rate R2 is 25% is shown.

As described above, the first channel region 91 and the second channel region 111 are formed in each of the cell regions 75 at a total channel rate RT (RT=R1+R2) from not less than 0% to not more than 100% (preferably in excess of 0% to less than 100%).

In this embodiment, the total channel rate RT in each of the cell regions 75 is 50%. In this embodiment, the total channel rates RT are all set at a substantially equal value. Therefore, an average channel rate RAV inside the output region 6 (unit area) is given as 50%. The average channel rate RAV is such that a sum of all of the total channel rates RT is divided by a total number of the total channel rates RT.

Figure 12A:
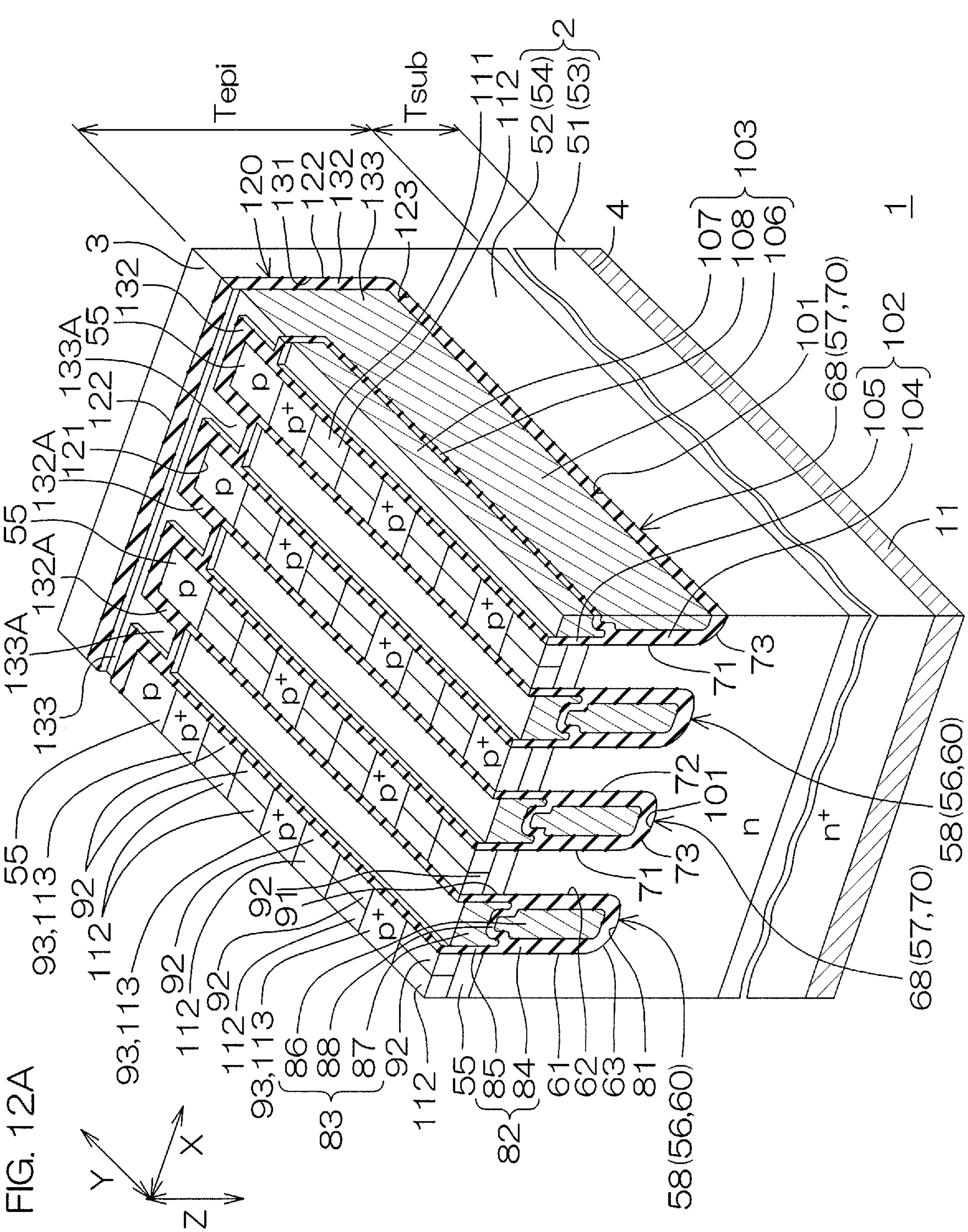
FIG. 12A is a sectional perspective view of a region corresponding to FIG. 7 and is a sectional perspective view which shows a configuration including a channel structure according to a second configuration example.
Figure 12B:
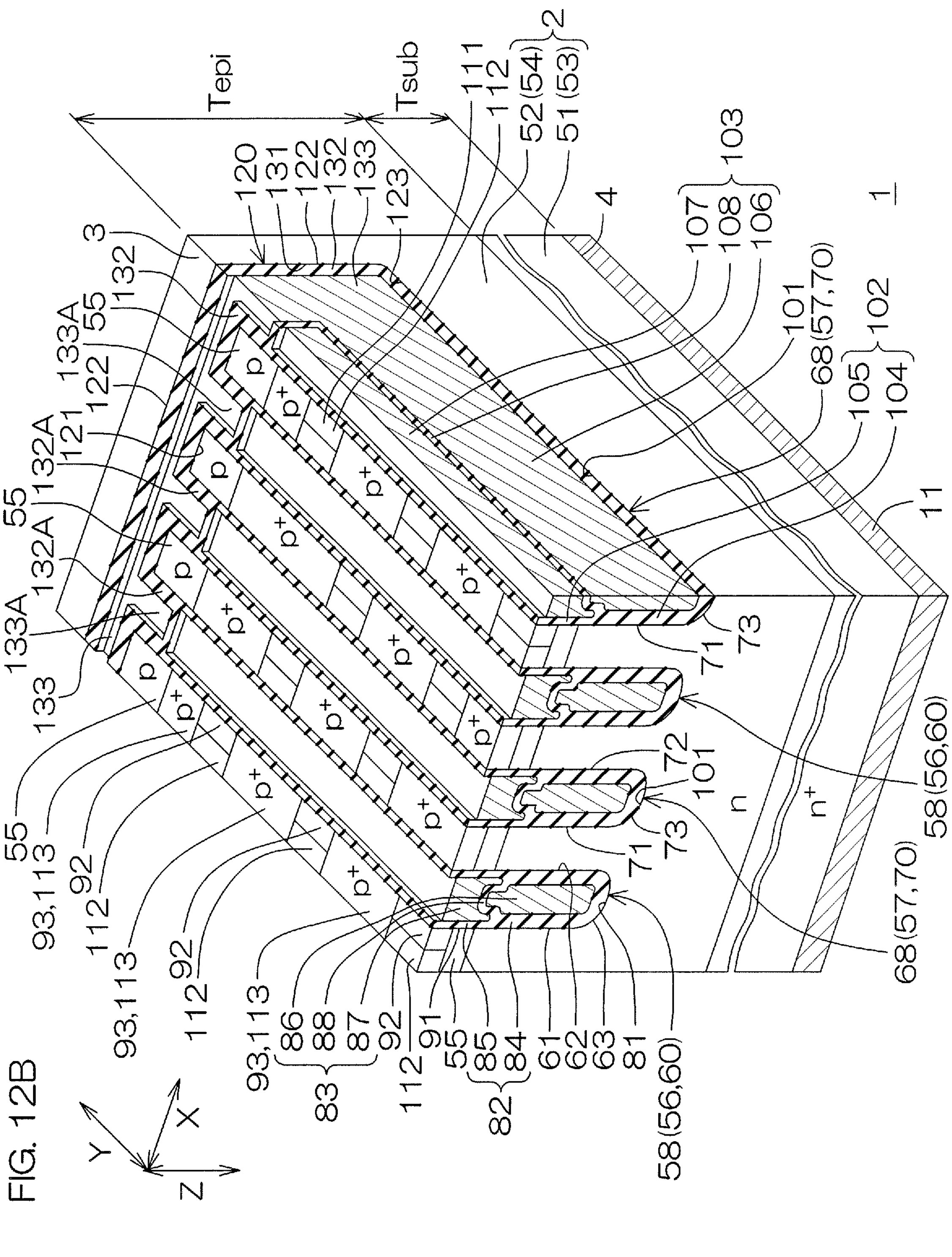
FIG. 12B is a sectional perspective view of a region corresponding to FIG. 7 and is a sectional perspective view which shows a configuration including a channel structure according to a third configuration example.

Hereinafter, in FIG. 12A and FIG. 12B, a configuration example in which the average channel rate RAV is adjusted is shown. FIG. 12A is a sectional perspective view of a region corresponding to FIG. 7 and is a sectional perspective view which shows a configuration including a channel structure according to a second configuration example. FIG. 12B is a sectional perspective view of a region corresponding to FIG. 7 and is a sectional perspective view which shows a configuration including a channel structure according to a third configuration example.

In FIG. 12A, a configuration example in which the average channel rate RAV is adjusted to approximately 66% is shown. The total channel rate RT of each of the cell regions 75 is approximately 66%. In FIG. 12B, a configuration example in which the average channel rate RAV is adjusted to 33% is shown. The total channel rate RT of each of the cell regions 75 is 33%.

The total channel rate RT may be adjusted for each cell region 75. That is, the plurality of total channel rates RT different in value from each other may be each applied to each of the cell regions 75. The total channel rate RT relates to a temperature rise of the semiconductor layer 2. For example, an increase in the total channel rate RT causes a temperature rise of the semiconductor layer 2 to occur easily. On the other hand, a reduction in the total channel rate RT causes a temperature rise of the semiconductor layer 2 not to occur easily.

By using the above, the total channel rate RT may be adjusted according to a temperature distribution of the semiconductor layer 2. For example, the total channel rate RT of a region in which a temperature rise easily occurs in the semiconductor layer 2 may be made relatively small, and the total channel rate RT of a region in which a temperature rise does not easily occur in the semiconductor layer 2 may be made relatively large.

A central portion of the output region 6 can be given as an example of a region in which a temperature rise easily occurs in the semiconductor layer 2. A peripheral portion of the output region 6 can be given as an example of a region in which a temperature rise does not easily occur in the semiconductor layer 2. As a matter of course, the average channel rate RAV may be adjusted while the total channel rate RT is adjusted according to a temperature distribution of the semiconductor layer 2.

The plurality of cell regions 75 having the total channel rate RT of not less than 20% to not more than 40% (for example, 25%) may be concentrated at a region in which a temperature rise easily occurs (for example, a central portion). The plurality of cell regions 75 having the total channel rate RT of not less than 60% to not more than 80% (for example, 75%) may be concentrated at a region in which a temperature rise does not easily occur (for example, a peripheral portion). The plurality of cell regions 75 having the total channel rate RT in excess of 40% and less than 60% (for example, 50%) may be concentrated between a region in which a temperature rise easily occurs and a region in which a temperature rise does not easily occur.

Further, the total channel rate RT of not less than 20% to not more than 40%, the total channel rate RT of not less than 40% to not more than 60%, and the total channel rate RT of not less than 60% to not more than 80% may be applied to the plurality of cell regions 75 in a regular arrangement.

As an example, three types of total channel rates RT which sequentially repeat in a pattern of 25% (low)→50% (middle)→75% (high) may be applied to the plurality of cell regions 75. In this case, the average channel rate RAV may be adjusted to 50%. In the case of the above-described structure, it is possible to suppress, with a relatively simple design, a biased temperature distribution in the semiconductor layer 2 to be formed. A specific configuration to which the above structure is applied is shown in the next preferred embodiment.

Figure 13:
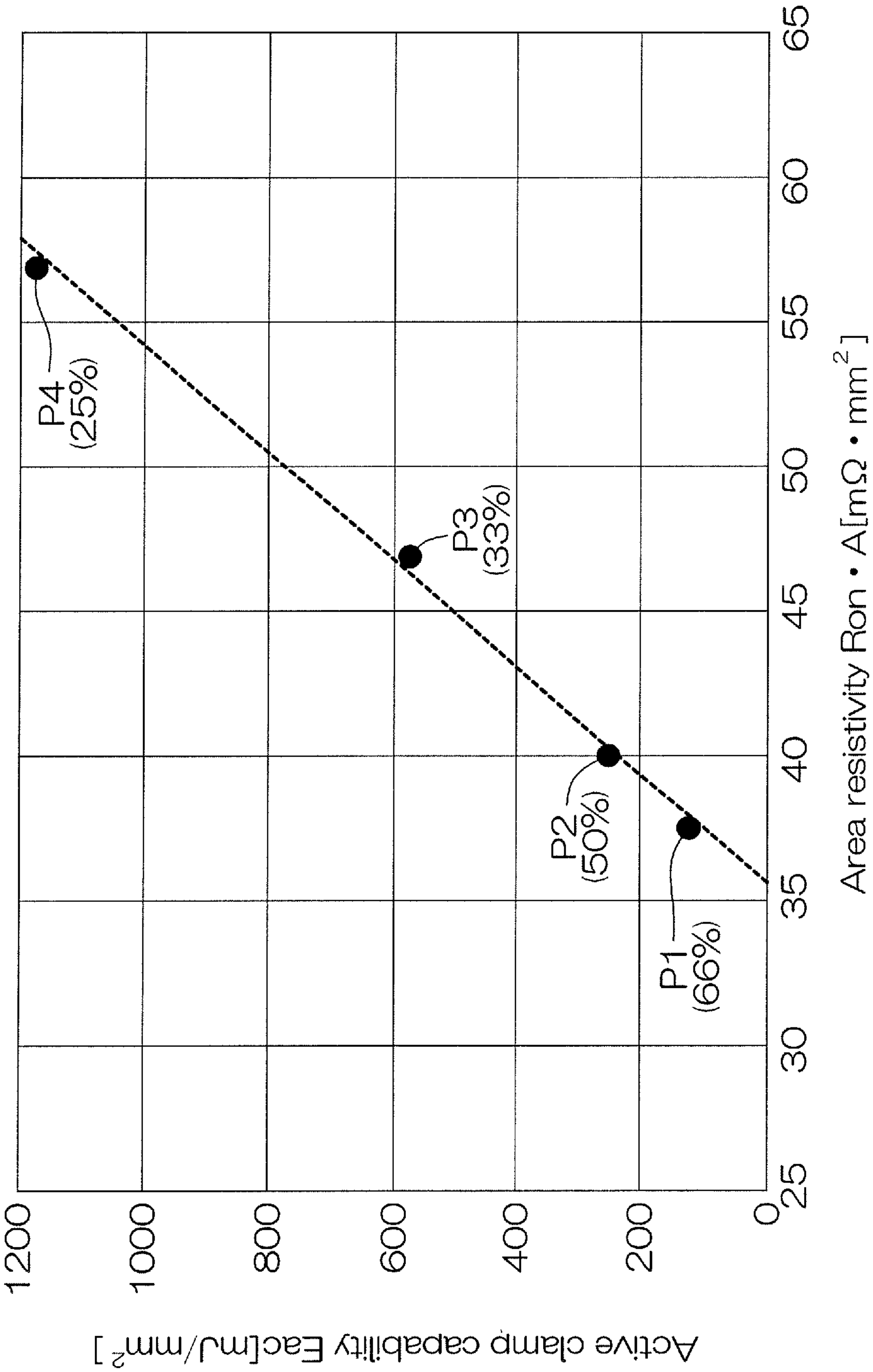
FIG. 13 is a graph which is obtained by an actual measurement of a relationship between an active clamp capability and an area resistivity.

FIG. 13 is a graph which is obtained by an actual measurement of a relationship between the active clamp capability Eac and an area resistivity Ron·A. The graph of FIG. 13 shows the characteristics where the first MISFET 56 and the second MISFET 57 are simultaneously controlled to be in the ON states and to be in the OFF states.

In FIG. 13, the vertical axis indicates the active clamp capability Eac [$mJ/mm^2$], while the horizontal axis indicates the area resistivity Ron·A [$m\Omega \cdot mm^2$]. As has been described in FIG. 3, the active clamp capability Eac is the capability with respect to the counter electromotive force. The area resistivity Ron·A expresses the ON resistance inside the semiconductor layer 2 in the normal operation.

A first plot point P1, a second plot point P2, a third plot point P3, and a fourth plot point P4 are shown in FIG. 13. The first plot point P1, the second plot point P2, the third plot point P3, and the fourth plot point P4 show the respective characteristics where the average channel rate RAV (that is, a total channel rate RT occupied in each of the cell regions 75) is adjusted to 66%, 50%, 33%, and 25%.

In a case where the average channel rate RAV was increased, the area resistivity Ron·A was reduced in the normal operation and the active clamp capability Eac was reduced in the active clamp operation. In contrast thereto, where the average channel rate RAV was reduced, the area resistivity Ron·A was increased in the normal operation and the active clamp capability Eac was improved in the active clamp operation.

In view of the area resistivity Ron·A, the average channel rate RAV is preferably not less than 33% (specifically, from not less than 33% to less than 100%). In view of the active clamp capability Eac, the average channel rate RAV is preferably less than 33% (specifically, in excess of 0% and less than 33%).

The area resistivity Ron·A was reduced due to an increase in the average channel rate RAV, and this is because of an increase in current path. The active clamp capability Eac was reduced due to an increase in the average channel rate RAV, and this is because of a sharp temperature rise due to the counter electromotive force.

In particular, in a case where the average channel rate RAV (total channel rate RT) is relatively large, it is more likely that a local and sharp temperature rise may occur in a region between the first trench gate structure 60 and the second trench gate structure 70 which are adjacent to each other. It is considered that the active clamp capability Eac was reduced due to this type of temperature rise.

On the other hand, the area resistivity Ron·A was increased due to a reduction in the average channel rate RAV, and this is because of shrinkage of the current path. The active clamp capability Eac was improved due to a reduction in the average channel rate RAV, and this is considered to be because the average channel rate RAV (total channel rate RT) was made relatively small and a local and sharp temperature rise was suppressed.

From the results of the graph of FIG. 13, it is found that an adjustment method based on the average channel rate RAV (total channel rate RT) has a trade-off relationship and therefore there is a difficulty in realizing an excellent area resistivity Ron·A and an excellent active clamp capability Eac at the same time independently of the trade-off relationship.

On the other hand, from the results of the graph of FIG. 13, it is found that, by making the power MISFET 9 operate such as to approach the first plot point P1 (RAV=66%) in the normal operation and operate such as to approach the fourth plot point P4 (RAV=25%) in the active clamp operation, it is possible to realize an excellent area resistivity Ron·A and an excellent active clamp capability Eac at the same time. Thus, in this embodiment, the following control is performed.

Figure 14A:
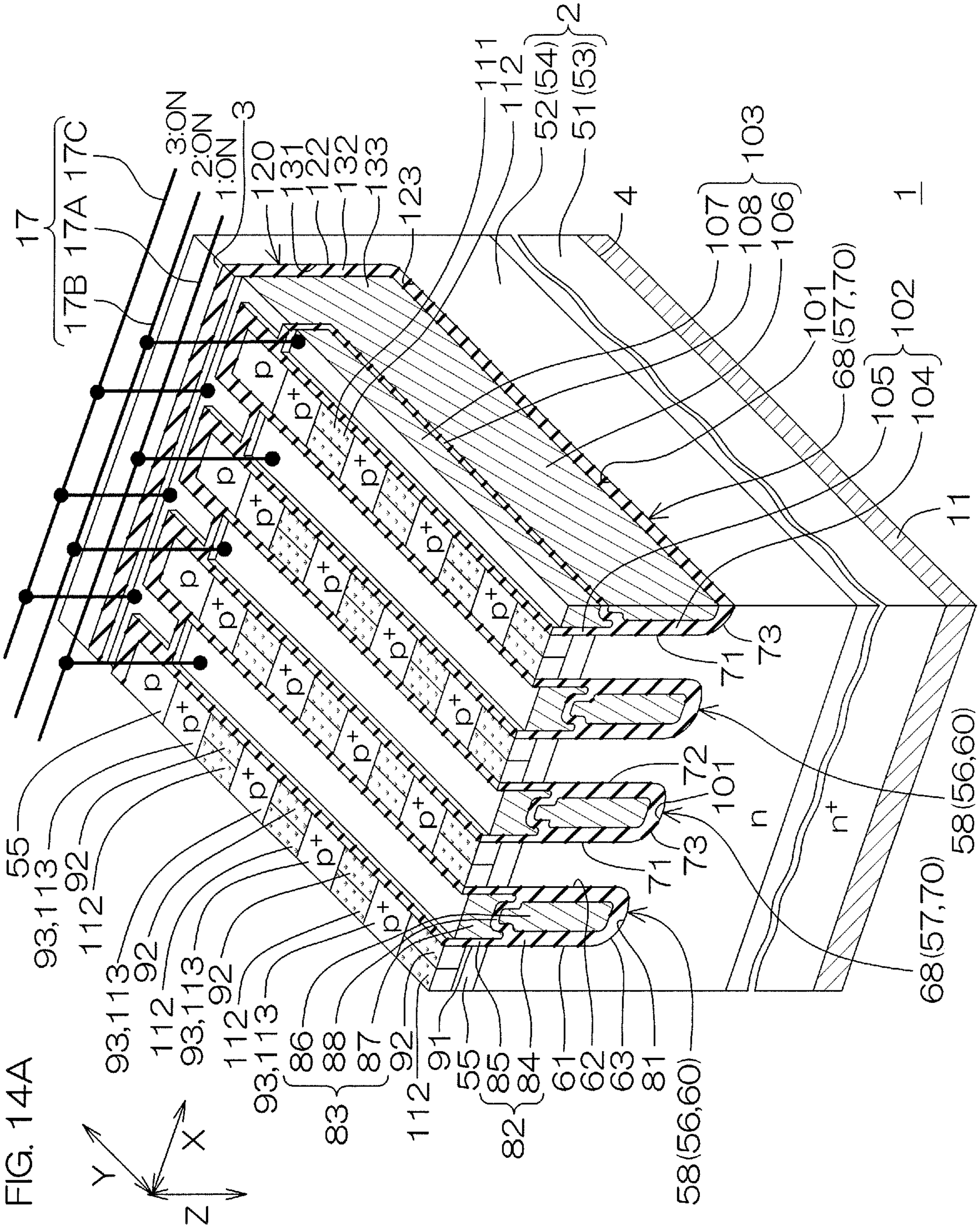
FIG. 14A is a sectional perspective view for describing a normal operation according to a first control example of the semiconductor device shown in FIG. 1.
Figure 14B:
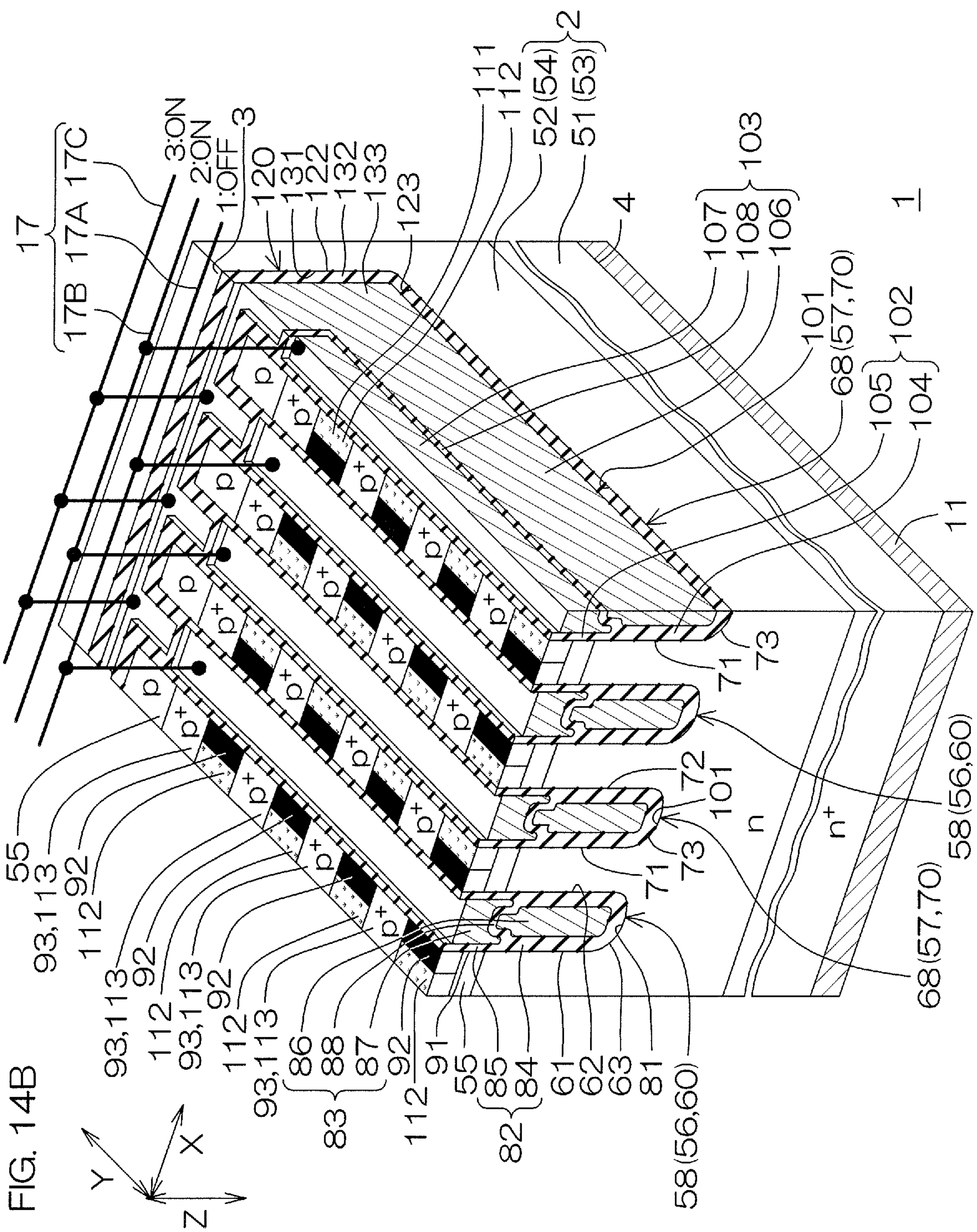
FIG. 14B is a sectional perspective view for describing an active clamp operation according to the first control example of the semiconductor device shown in FIG. 1.

FIG. 14A is a sectional perspective view for describing the normal operation according to a first control example of the semiconductor device 1 shown in FIG. 1. FIG. 14B is a sectional perspective view for describing the active clamp operation according to the first control example of the semiconductor device 1 shown in FIG. 1. In FIG. 14A and FIG. 14B, for convenience of description, structures in the first main surface 3 are omitted and the gate control wiring 17 is simplified.

With reference to FIG. 14A, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have a substantially equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 14A, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. The channel utilization rate RU is a rate of the first channel region 91 and the second channel region 111 which are controlled in the ON state, of the first channel region 91 and the second channel region 111.

The characteristics channel rate RC is a value obtained by multiplying the average channel rate RAV by a channel utilization rate RU (RC=RAV×RU). The characteristics (the area resistivity Ron·A and the active clamp capability Eac) of the power MISFET 9 are determined based on the characteristics channel rate RC. Thereby, the area resistivity Ron·A approaches the area resistivity Ron·A indicated by the second plot point P2 in the graph of FIG. 13.

On the other hand, with reference to FIG. 14B, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have a substantially equal voltage. The first clamp ON signal VCon1 and the second clamp ON signal VCon2 may have a voltage not more than or less than a voltage in the normal operation.

In this case, the first opening-side electrode 87 is put into the OFF state, and the first bottom-side electrode 86, the second bottom-side electrode 106, and the second opening-side electrode 107 are each put into the ON state. Thereby, the first channel region 91 is controlled to be in the OFF state, and the second channel region 111 is controlled to be in the ON state. In FIG. 14B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In the first control example, a description has been given of an example in which the second Half-ON control is applied in the active clamp operation. However, the first Half-ON control may be applied in the active clamp operation.

Figure 15A:
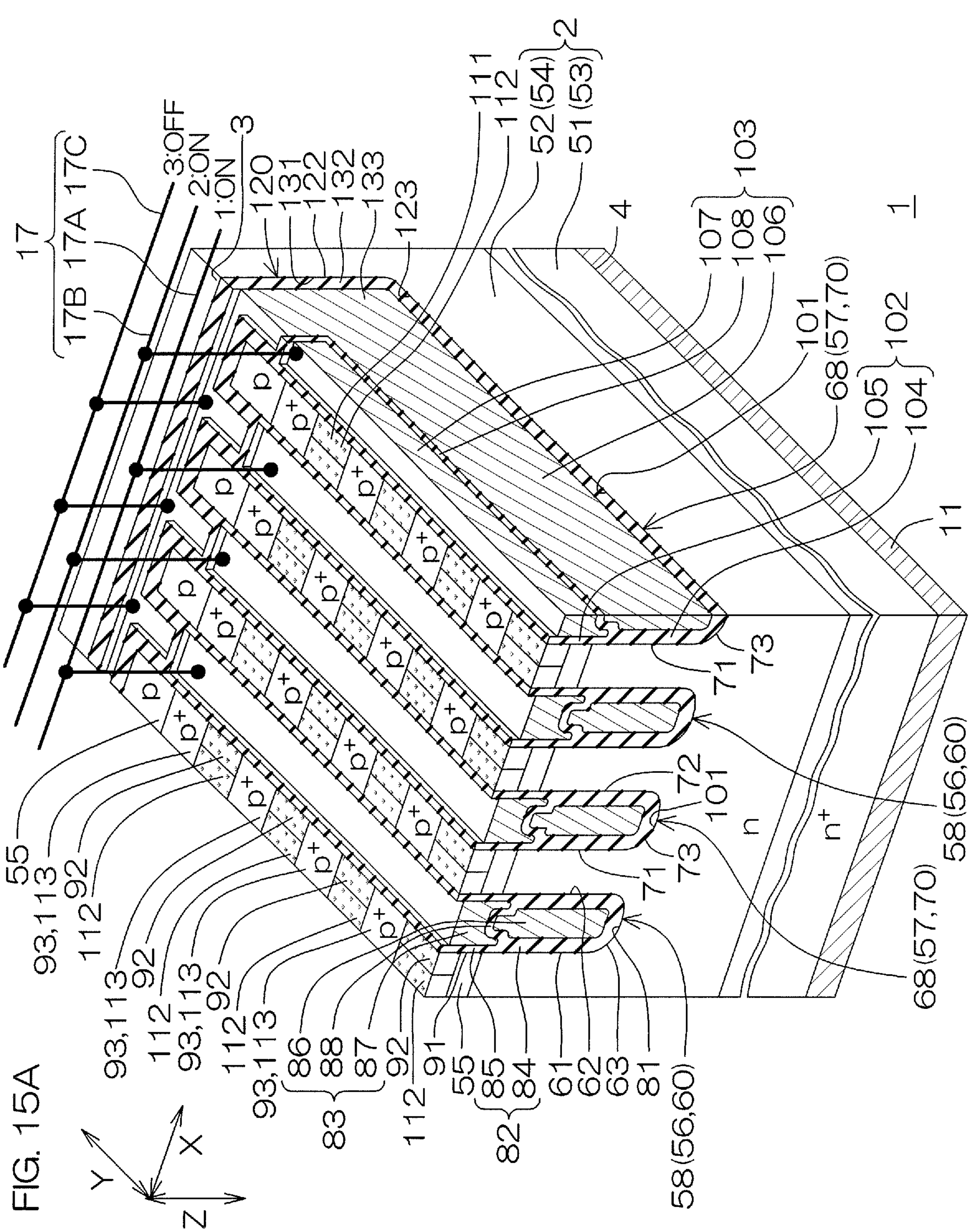
FIG. 15A is a sectional perspective view for describing a normal operation according to a second control example of the semiconductor device shown in FIG. 1.
Figure 15B:
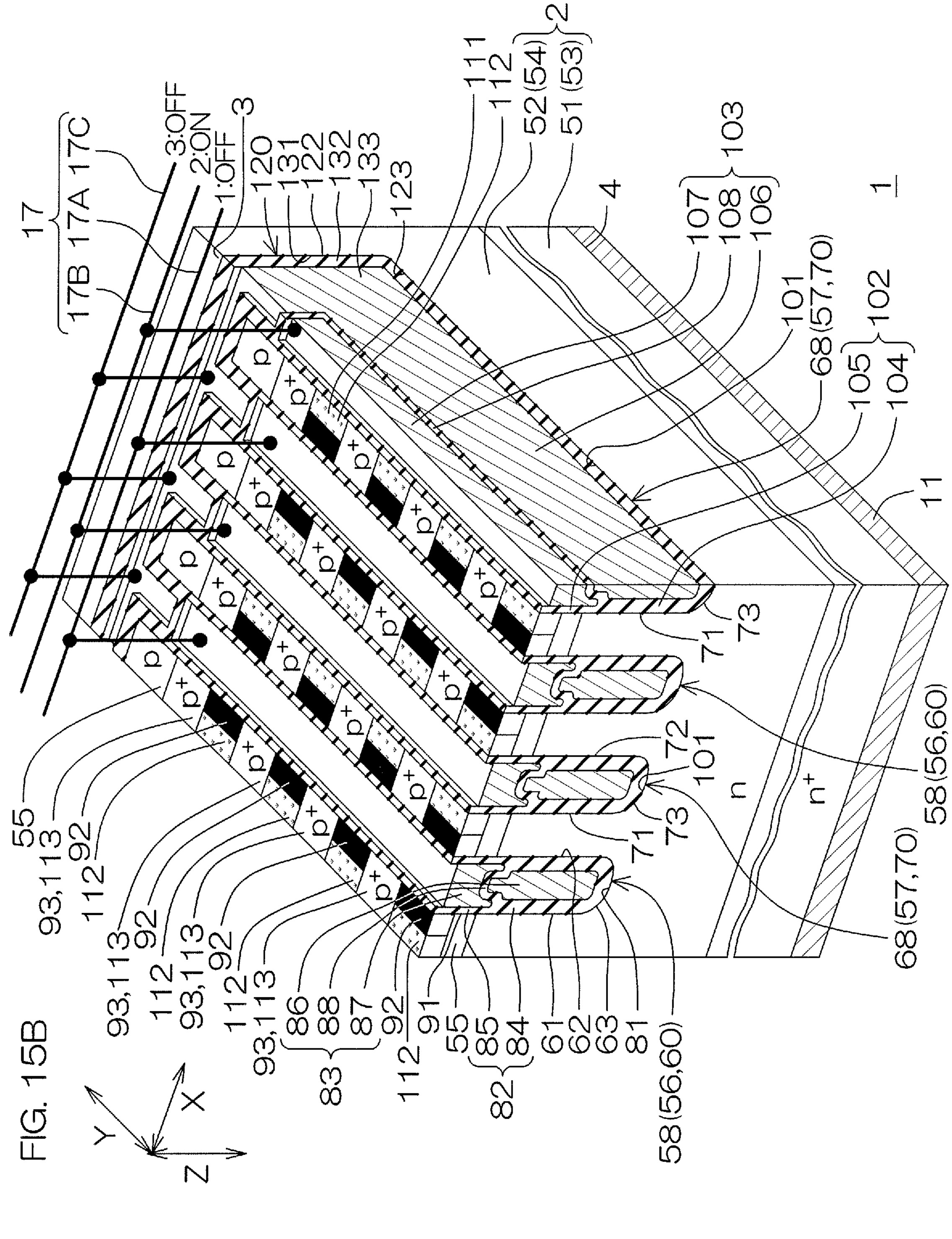
FIG. 15B is a sectional perspective view for describing an active clamp operation according to the second control example of the semiconductor device shown in FIG. 1.

FIG. 15A is a sectional perspective view for describing the normal operation according to a second control example of the semiconductor device 1 shown in FIG. 1. FIG. 15B is a sectional perspective view for describing the active clamp operation according to the second control example of the semiconductor device 1 shown in FIG. 1. In FIG. 15A and FIG. 15B, for convenience of description, structures in the first main surface 3 are omitted and the gate control wiring 17 is simplified.

With reference to FIG. 15A, when the power MISFET 9 is in the normal operation, a first ON signal Von1 is input to the first gate control wiring 17A, a second ON signal Von2 is input to the second gate control wiring 17B, and the OFF signal Voff is input to the third gate control wiring 17C.

The first ON signal Von1, the second ON signal Von2, and the OFF signal Voff are each input from the control IC 10. The first ON signal Von1 and the second ON signal Von2 each have a voltage not less than the gate threshold voltage Vth. The first ON signal Von1 and the second ON signal Von2 may each have a substantially equal voltage. The OFF signal Voff has a voltage less than the gate threshold voltage Vth (for example, the reference voltage).

In this case, the first opening-side electrode 87 and the second opening-side electrode 107 are each put into the ON state, and the first bottom-side electrode 86 and the second bottom-side electrode 106 are each put into the OFF state. That is, while the first opening-side electrode 87 and the second opening-side electrode 107 each function as a gate electrode, the first bottom-side electrode 86 and the second bottom-side electrode 106 each function as a field electrode.

Thereby, the first channel region 91 and the second channel region 111 are both controlled to be in the ON states. In FIG. 15A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 15B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 has a voltage value less than the gate threshold voltage Vth (for example, the reference voltage).

In this case, the first opening-side electrode 87, the first bottom-side electrode 86, and the second bottom-side electrode 106 are each put into the OFF state, and the second opening-side electrode 107 is put into the ON state. Thereby, the first channel region 91 is controlled to be in the OFF state, and the second channel region 111 is controlled to be in the ON state. In FIG. 15B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In the second control example, a description has been given of an example in which the second Half-ON control in the active clamp operation is applied. However, in the active clamp operation, the first Half-ON control may be applied.

Figure 16:
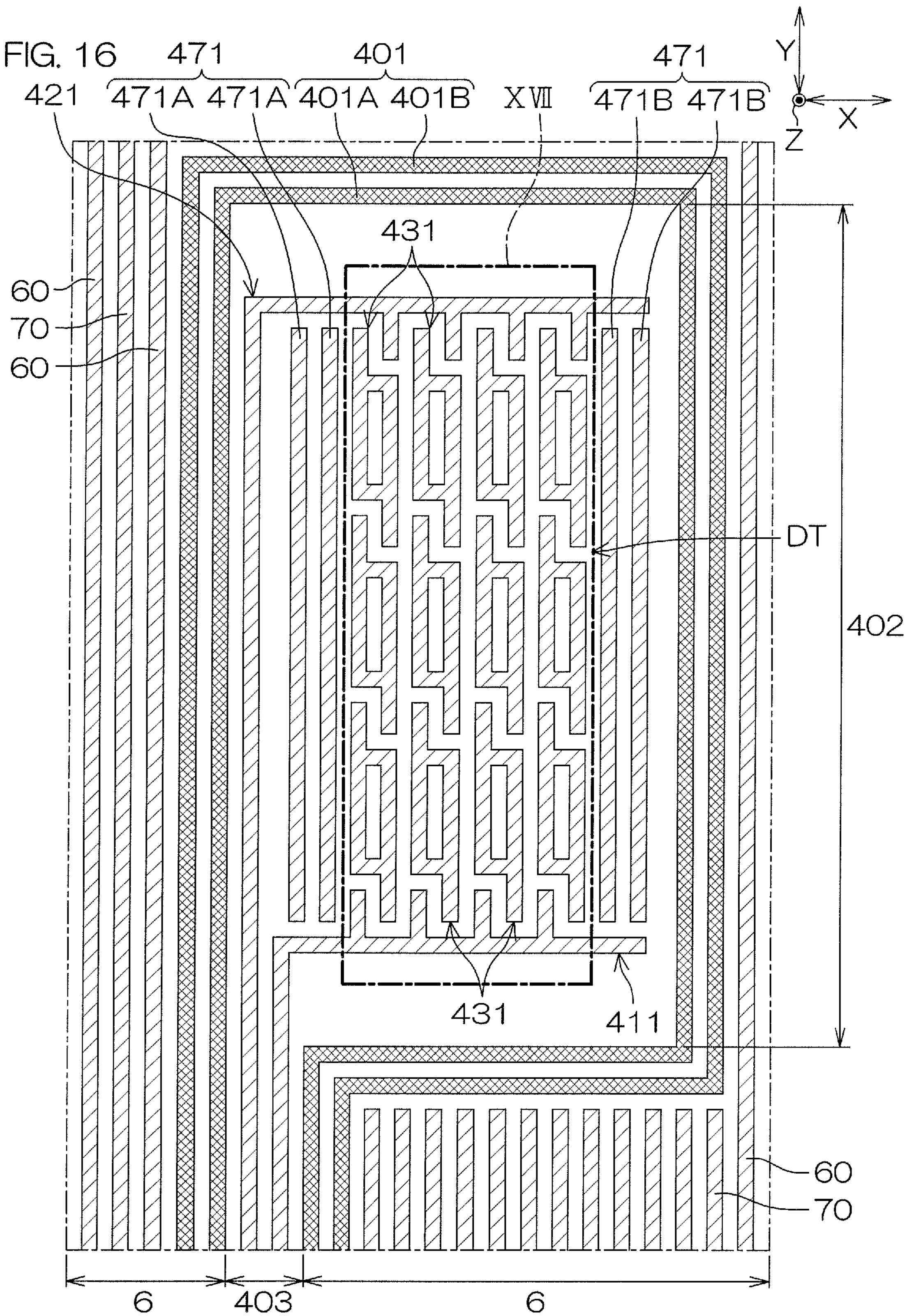
FIG. 16 is a plan view which shows an internal structure of a region XVI shown in FIG. 1.
Figure 17:
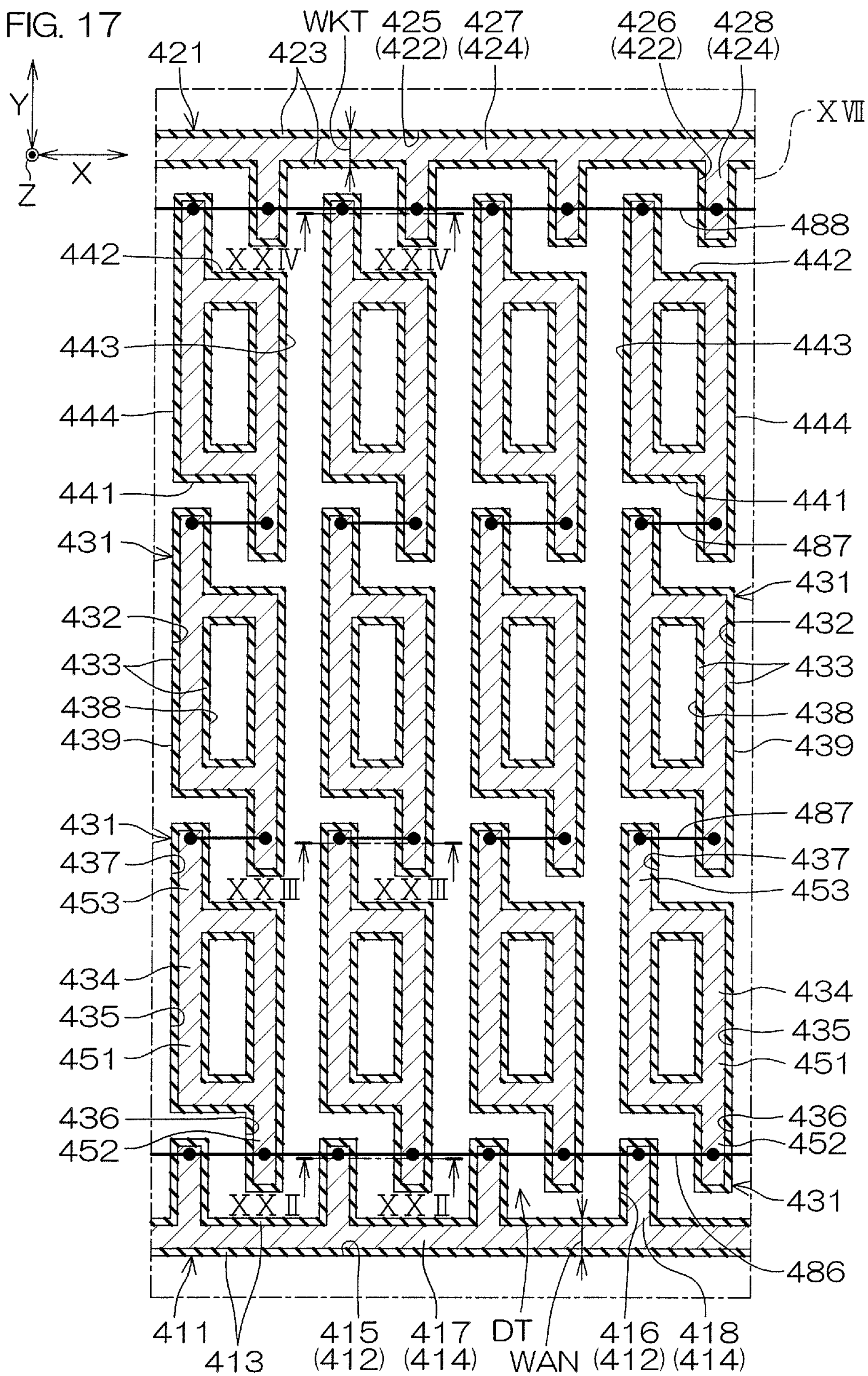
FIG. 17 is an enlarged view of a region XVII shown in FIG. 16.
Figure 18:
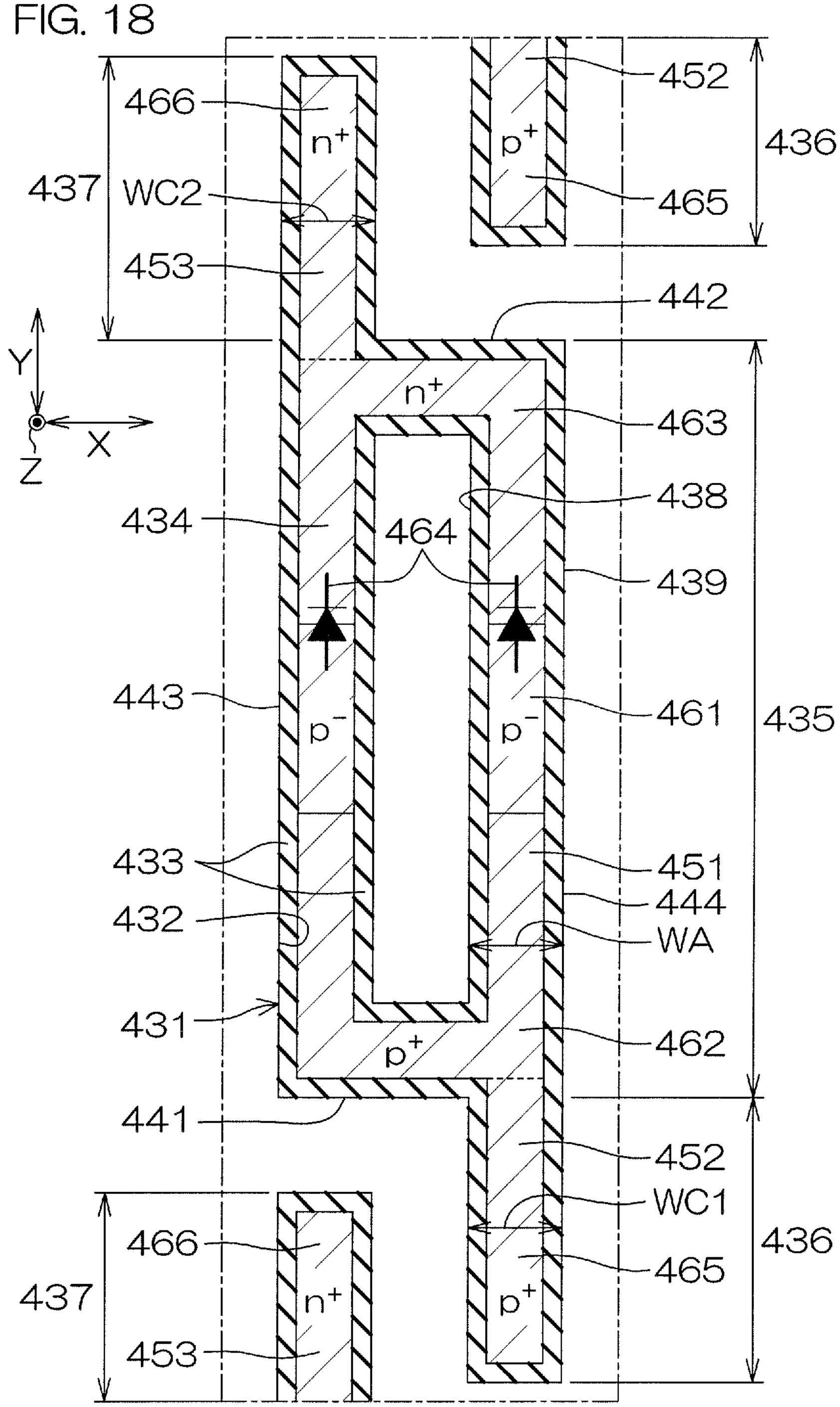
FIG. 18 is an enlarged view which shows one temperature-sensitive diode structure taken out from FIG. 16.
Figure 19:
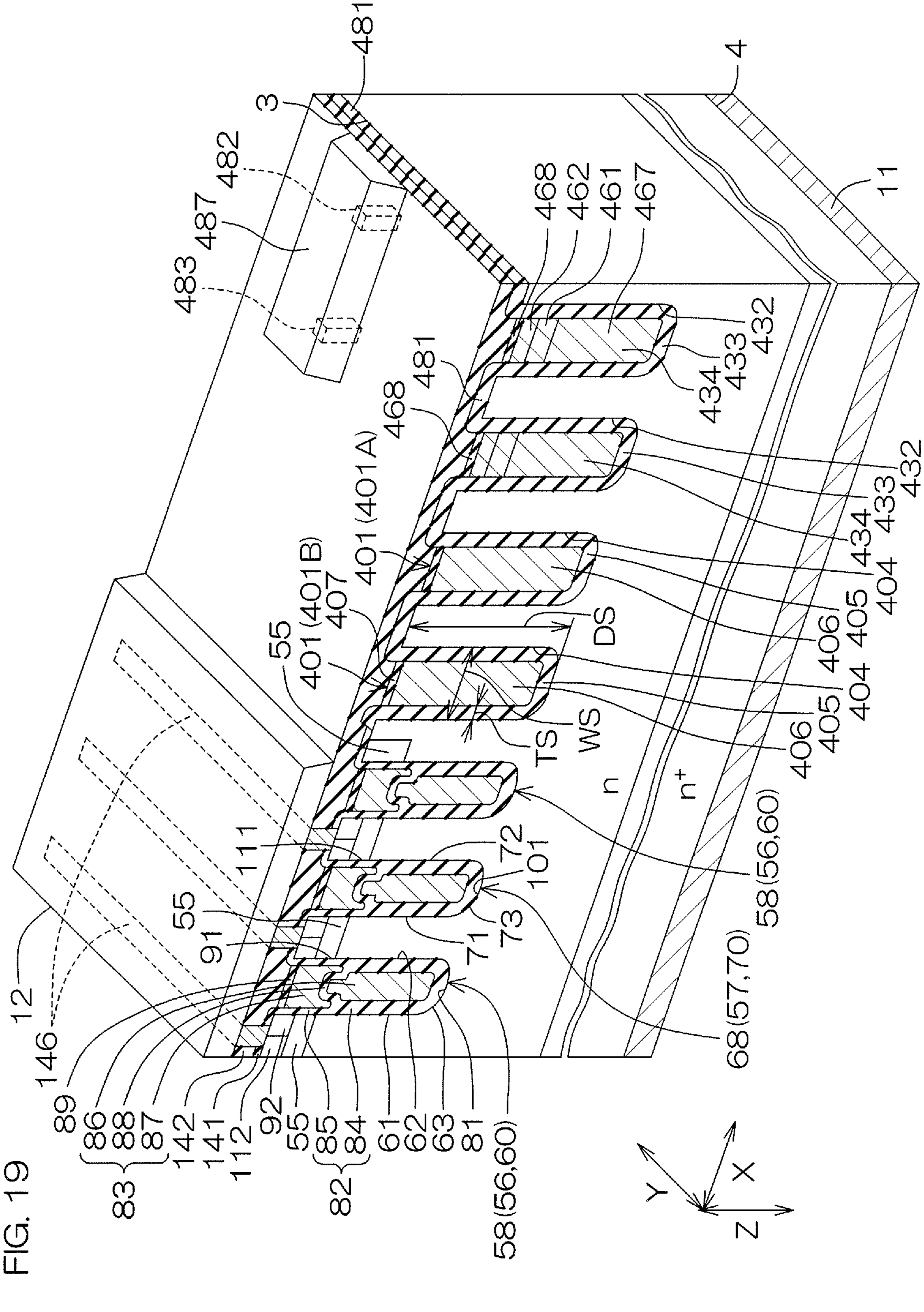
FIG. 19 is a perspective view which shows a temperature-sensitive diode structure, together with a region separation structure and a trench gate structure.

FIG. 16 is a plan view which shows an internal structure of a region XVI shown in FIG. 1. FIG. 17 is an enlarged view of a region XVII shown in FIG. 16. FIG. 18 is an enlarged view which shows one temperature-sensitive diode structure 431 taken out from FIG. 16. FIG. 19 is a perspective view in which a temperature-sensitive diode structure 431 is shown together with a region separation structure 401 and a first trench gate structure 60 (second trench gate structure 70).

Figure 20:
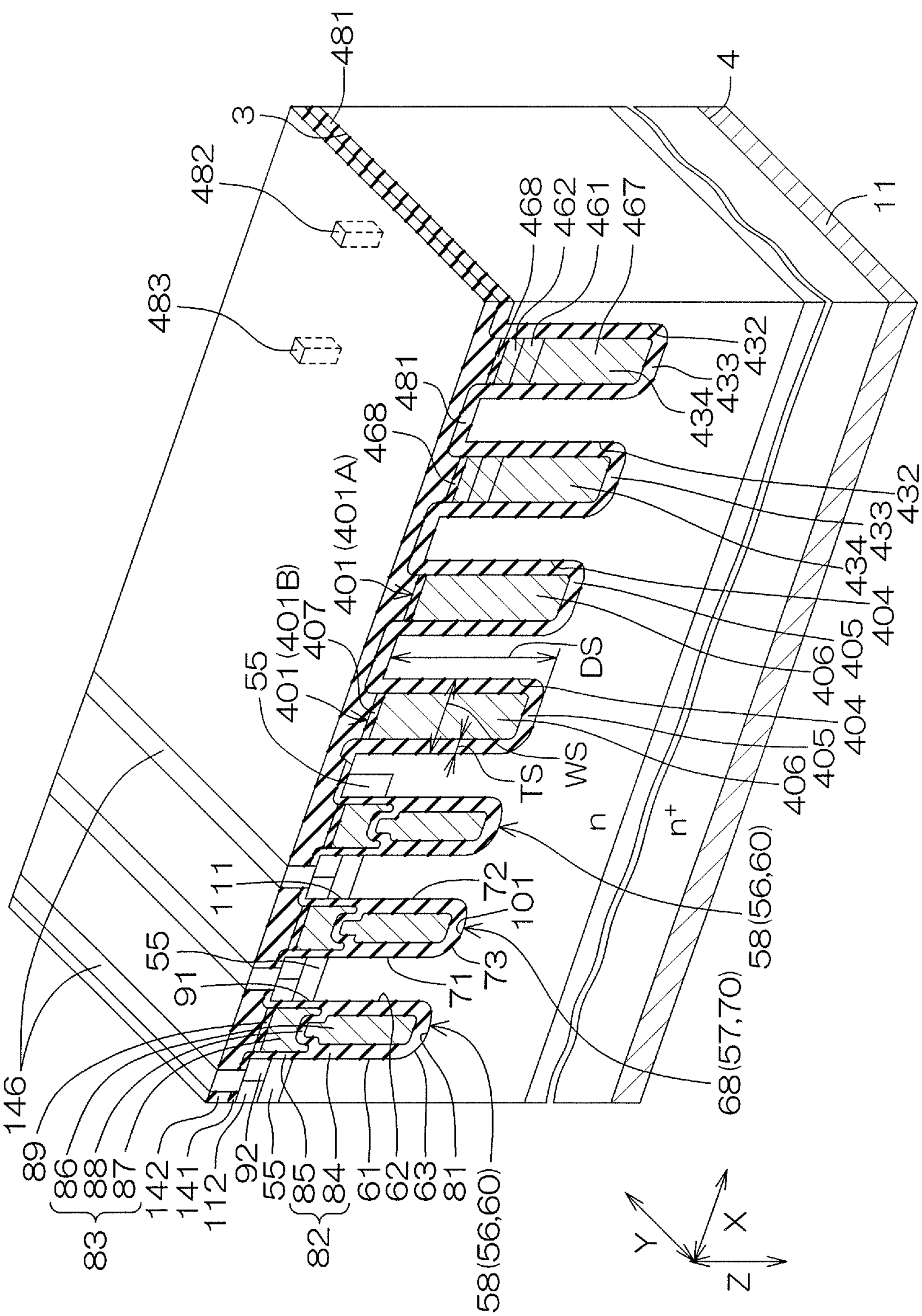
FIG. 20 is a sectional perspective view in which structures on an interlayer insulation layer are removed from FIG. 19.
Figure 21:
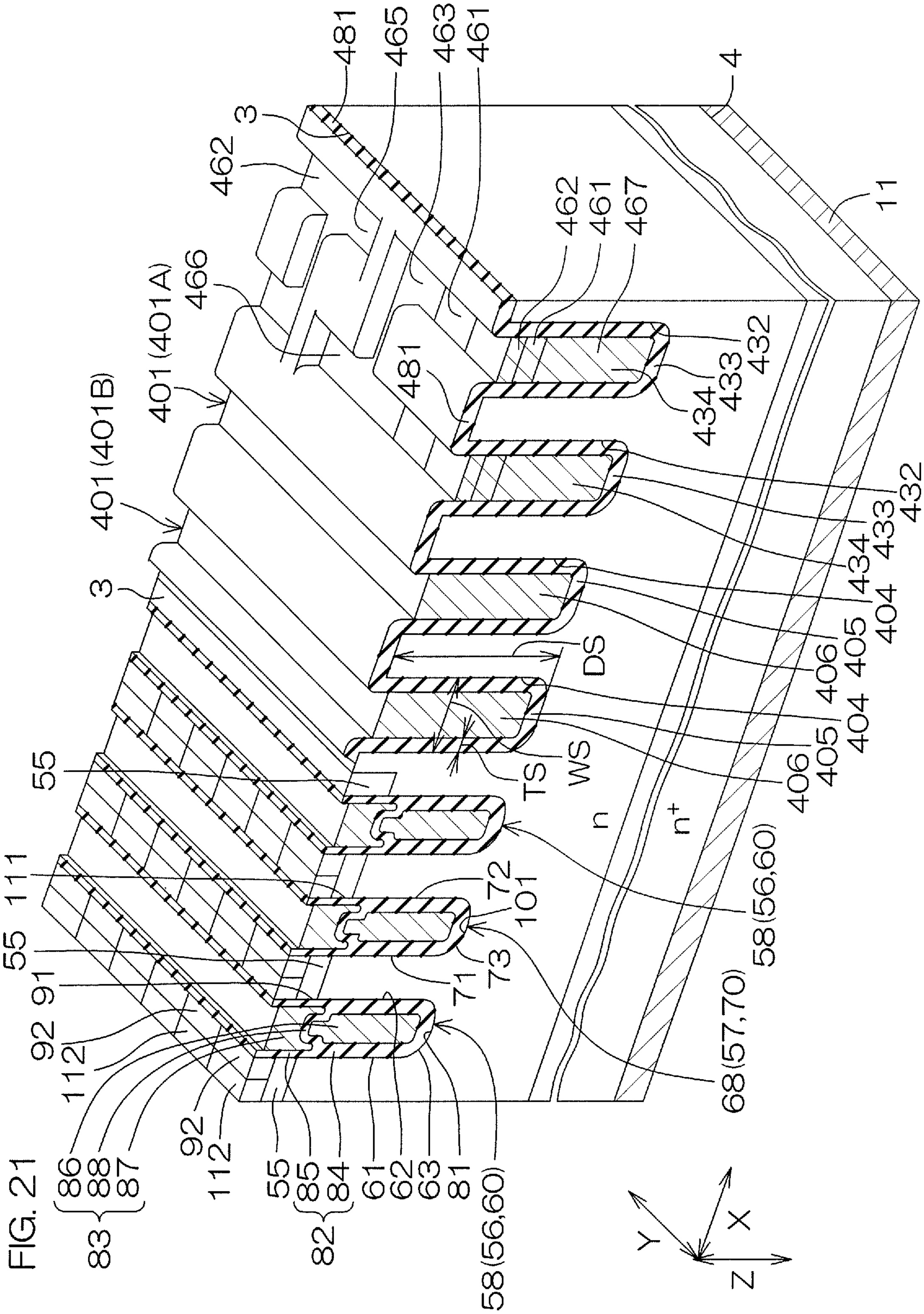
FIG. 21 is a sectional perspective view in which structures on the semiconductor layer are removed from FIG. 19.
Figure 22:
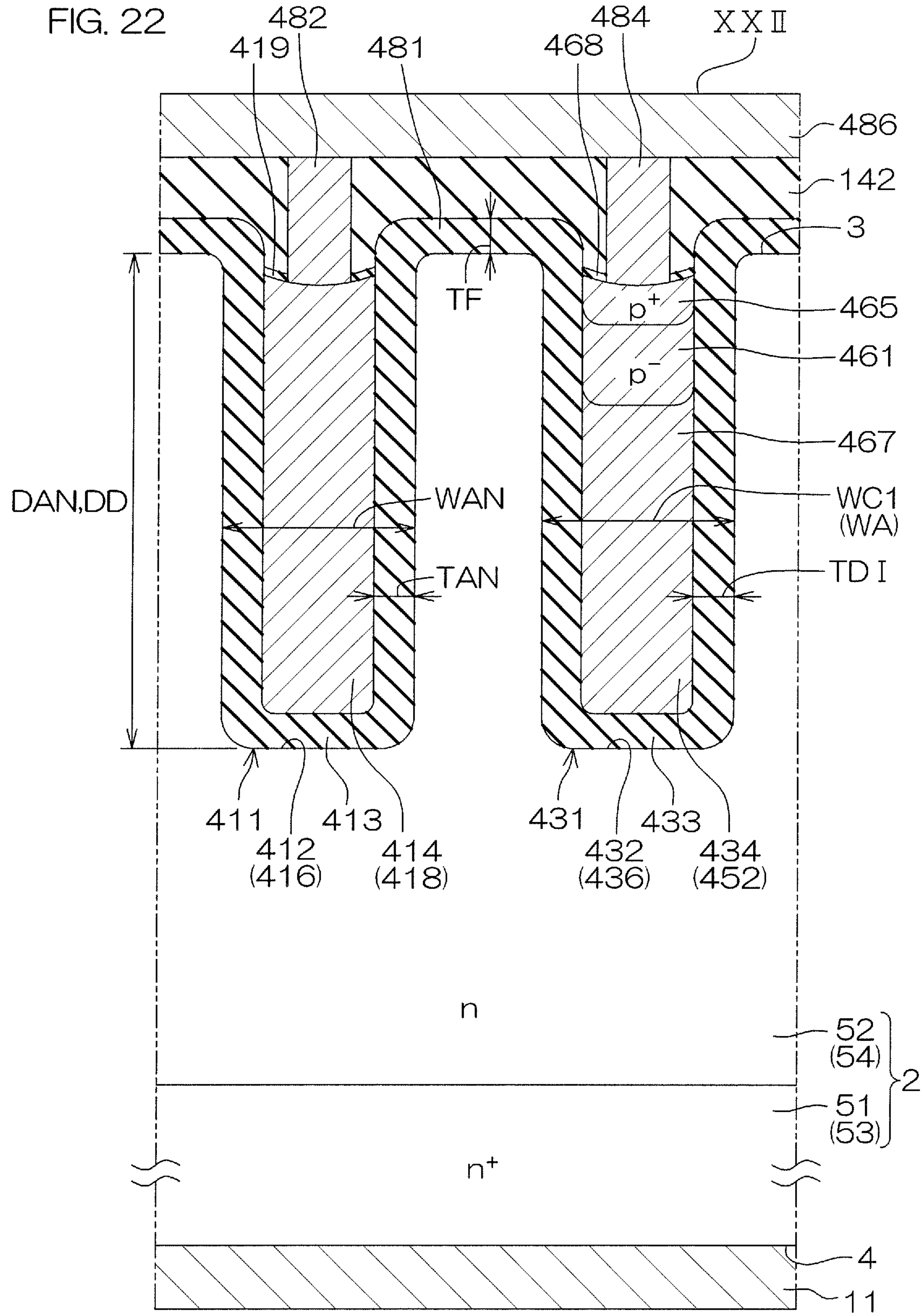
FIG. 22 is a sectional view taken along line XXII-XXII shown in FIG. 16.
Figure 23:
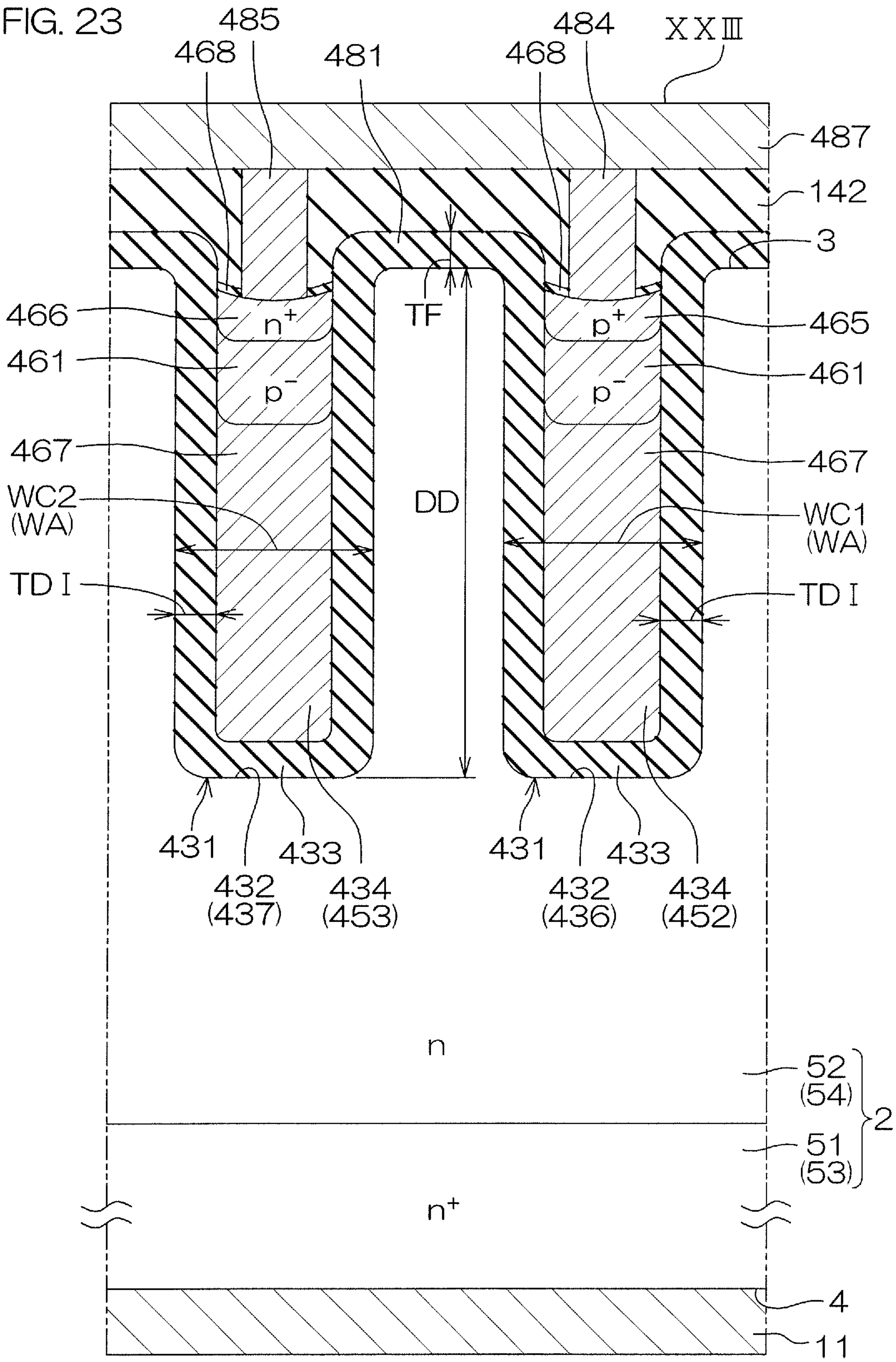
FIG. 23 is a sectional view taken along line XXIII-XXIII shown in FIG. 16.
Figure 24:
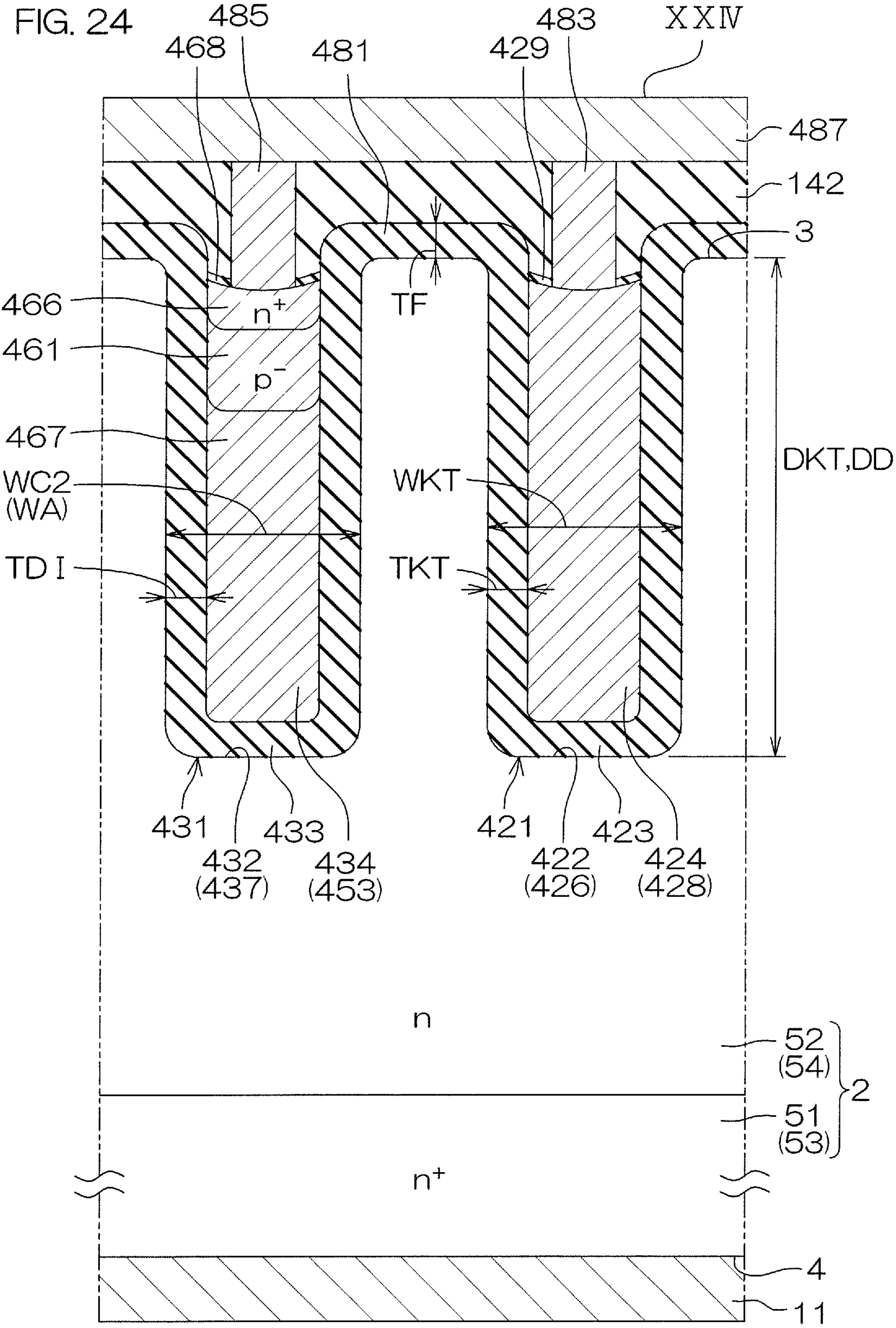
FIG. 24 is a sectional view taken along line XXIV-XXIV shown in FIG. 16.

FIG. 20 is a sectional perspective view in which structures on the interlayer insulation layer 142 are removed from FIG. 19. FIG. 21 is a sectional perspective view in which structures on the semiconductor layer 2 are removed from FIG. 19. FIG. 22 is a sectional view taken along line XXII-XXII shown in FIG. 16. FIG. 23 is a sectional view taken along line XXIII-XXIII shown in FIG. 16. FIG. 24 is a sectional view taken along line XXIV-XXIV shown in FIG. 16.

FIG. 20 to FIG. 22 are each a schematic view which collectively shows the temperature-sensitive diode structure 431, the region separation structure 401, and the first trench gate structure 60 (second trench gate structure 70) and which is not a sectional perspective view showing a particular site.

With reference to FIG. 1 and FIG. 16 to FIG. 25, the semiconductor device 1 includes one or the plurality (in this embodiment, two) of region separation structures 401 formed in the first main surface 3 of the semiconductor layer 2. The region separation structure 401 is formed by a part of the region separation structure 8 aforementioned. The number of the region separation structure 401 is arbitrary. The three or more region separation structures 401 may be formed.

The region separation structure 401 defines a temperature sensitive device region 402 and an output region 6 in the first main surface 3. In this embodiment, the temperature sensitive device region 402 is defined inside the output region 6. The temperature sensitive device region 402 is a region in which the temperature-sensitive diode DT of the overheat protection circuit 36 aforementioned is formed.

The region separation structure 401 also defines a wiring passage region 403 in the output region 6. The wiring passage region 403 extends from the input region 7 to the inside of the output region 6 to connect the input region 7 and the temperature sensitive device region 402. The temperature sensitive device region 402 and the wiring passage region 403 are also regions where a partial region of the input region 7 is expanded into the output region 6.

The region separation structure 401 includes a first region separation structure 401A and a second region separation structure 401B. The first region separation structure 401A extends from the input region 7 to the output region 6 in plan view to define the temperature sensitive device region 402 and the wiring passage region 403 inside the output region 6. The second region separation structure 401B defines the temperature sensitive device region 402 and the wiring passage region 403 from the outside of the first region separation structure 401A in plan view. The second region separation structure 401B is formed at an interval from the first region separation structure 401A and extends in parallel to the first region separation structure 401A.

The plurality of region separation structures 401 each include a separation trench 404, a separation insulation layer 405, and a separation electrode 406. The separation trench 404 is formed by digging down the first main surface 3 toward the second main surface 4. The separation trench 404 is formed in the epitaxial layer 52.

A width WS of the separation trench 404 is in excess of a width WT1 of the first gate trench 81 (WT1<WS). The width WS is a width in a direction orthogonal to a direction in which the separation trench 404 extends. The width WS may be from not less than 1 μm to not more than 2 μm. The width WS may be from not less than 1 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2 μm. The width WS is preferably from not less than 1.2 μm to not more than 1.8 μm.

A depth DS of the separation trench 404 may be equal to or more than a first depth DT1 of the first gate trench 81 (DT1≤DS). The depth DS may be equal to or less than the first depth DT1 (DS≤DT1). It is preferable that the depth DS is substantially equal to the first depth DT1 (DS=DT1).

The depth DS may be from not less than 1 μm to not more than 10 μm. The depth DS may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DS is preferably from not less than 2 μm to not more than 6 μm.

The separation insulation layer 405 is formed on an inner wall of the separation trench 404. The separation insulation layer 405 is formed in a film shape along the inner wall of the separation trench 404. Thereby, the separation insulation layer 405 defines a recess space inside the separation trench 404.

The separation insulation layer 405 has a uniform thickness TS. The thickness TS is a thickness of the inner wall of the separation trench 404 along a normal direction. The thickness TS is in excess of the second thickness T2 of the first opening-side insulation layer 85 (T2<TS). It is preferable that the thickness TS is substantially equal to the first thickness T1 of the first bottom-side insulation layer 84 (TS=T1).

The thickness TS may be from not less than 1500 Å to not more than 4000 Å. The thickness TS may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The thickness TS is preferably from not less than 1800 Å to not more than 3500 Å.

The separation insulation layer 405 includes at least any one of silicon oxide ($SiO_2$), silicon nitride (SiN), aluminum oxide ($Al_2O_3$), zirconium oxide ($ZrO_2$), and tantalum oxide ($Ta_2O_3$). The separation insulation layer 405 is preferably composed of the same insulating material as the first insulation layer 82. In this embodiment, the separation insulation layer 405 has a single layer structure composed of an $SiO_2$ layer.

The separation electrode 406 is embedded in the separation trench 404 across the separation insulation layer 405. Specifically, the separation electrode 406 is embedded in a recess space which is defined by the separation insulation layer 405 inside the separation trench 404.

The separation electrode 406 may include at least any one of conductive polysilicon, tungsten, aluminum, copper, an aluminum alloy, and a copper alloy. In this embodiment, the separation electrode 406 includes a conductive polysilicon layer. The conductive polysilicon layer may include an n-type impurity or a p-type impurity. The conductive polysilicon layer preferably includes an n-type impurity.

In this embodiment, an exposed portion which is exposed from the separation trench 404 in the separation electrode 406 is positioned at a bottom wall side of the separation trench 404 with respect to the first main surface 3. The exposed portion of the separation electrode 406 may be formed in a curved shape toward the bottom wall of the separation trench 404.

The exposed portion of the separation electrode 406 is covered by a fourth cap insulation layer 407 formed in a film shape. The fourth cap insulation layer 407 is continuous with the separation insulation layer 405 inside the separation trench 404. The fourth cap insulation layer 407 may include silicon oxide ($SiO_2$).

The semiconductor device 1 includes an anode wiring structure 411 which is formed in the first main surface 3 of the semiconductor layer 2. The anode wiring structure 411 forms one wiring of the overheat protection circuit 36 to transmit an anode voltage to the temperature-sensitive diode DT. The anode wiring structure 411 passes through the wiring passage region 403 from the input region 7 and is laid around in the temperature sensitive device region 402.

The anode wiring structure 411 includes an anode trench 412, an anode insulation layer 413, and an anode wiring electrode 414. The anode trench 412 is formed by digging down the first main surface 3 toward the second main surface 4. The anode trench 412 is formed in the epitaxial layer 52.

A width WAN of the anode trench 412 is in excess of the width WT1 of the first gate trench 81 (WT1<WAN). The width WAN is a width in a direction orthogonal to a direction in which the anode trench 412 extends. It is preferable that the width WAN is substantially equal to the width WS of the separation trench 404 (WAN=WS).

The width WAN may be from not less than 1 μm to not more than 2 μm. The width WAN may be from not less than 1 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2 μm. The width WAN is preferably from not less than 1.2 μm to not more than 1.8 μm.

A depth DAN of the anode trench 412 may be equal to or more than a first depth DT1 of the first gate trench 81 (DT1≤DAN). The depth DAN may be equal to or less than the first depth DT1 (DAN≤DT1). It is preferable that the depth DAN is substantially equal to the first depth DT1 (DT1=DAN). It is preferable that the depth DAN is substantially equal to the depth DS of the separation trench 404 (DAN=DS).

The depth DAN may be from not less than 1 μm to not more than 10 μm. The depth DAN may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DAN is preferably from not less than 2 μm to not more than 6 μm.

The anode trench 412 includes an anode wiring trench 415 and an anode connection trench 416 in the temperature sensitive device region 402. In this embodiment, the anode trench 412 includes the plurality (four) of anode connection trenches 416. The number of the anode connection trenches

416 is adjusted according to the number of temperature-sensitive diode structures 431 to be described later.

The anode wiring trench 415 is formed in a band shape extending along the first direction X. The plurality of anode connection trenches 416 are each led out in a band shape from the anode wiring trench 415 to the inside of the temperature sensitive device region 402. The plurality of anode connection trenches 416 are formed in a band shape along the second direction Y. The anode connection trench 416 may be led out in any given amount.

The anode insulation layer 413 is formed on an inner wall of the anode trench 412. The anode insulation layer 413 is formed in a film shape along the inner wall of the anode trench 412. Thereby, the anode insulation layer 413 defines a recess space inside the anode trench 412.

The anode insulation layer 413 has a uniform thickness TAN. The thickness TAN is a thickness of the inner wall of the anode trench 412 along a normal direction. The thickness TAN is in excess of the second thickness T2 of the first opening-side insulation layer 85 (T2<TAN). It is preferable that the thickness TAN is substantially equal to the first thickness T1 of the first bottom-side insulation layer 84 (T1=TAN). It is preferable that the thickness of the anode insulation layer 413 is substantially equal to the thickness TS of the separation insulation layer 405 (T1=TS).

The thickness TAN may be from not less than 1500 Å to not more than 4000 Å. The thickness TAN may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The thickness TAN is preferably from not less than 1800 Å to not more than 3500 Å.

The anode insulation layer 413 includes at least any one of silicon oxide ($SiO_2$), silicon nitride (SiN), aluminum oxide ($Al_2O_3$), zirconium oxide ($ZrO_2$), and tantalum oxide ($Ta_2O_3$). The anode insulation layer 413 is preferably composed of the same insulating material as the first insulation layer 82. In this embodiment, the anode insulation layer 413 has a single layer structure composed of an $SiO_2$ layer.

The anode wiring electrode 414 is embedded in the anode trench 412 across the anode insulation layer 413. Specifically, the anode wiring electrode 414 is embedded in a recess space which is defined by the anode insulation layer 413 inside the anode trench 412.

The anode wiring electrode 414 includes an anode wiring portion 417 and an anode wiring connection portion 418. The anode wiring portion 417 is positioned inside the anode wiring trench 415. The anode wiring connection portion 418 is positioned inside the anode connection trench 416.

The anode wiring electrode 414 may include at least any one of conductive polysilicon, tungsten, aluminum, copper, an aluminum alloy, and a copper alloy. In this embodiment, the anode wiring electrode 414 includes a conductive polysilicon layer. The conductive polysilicon layer may include an n-type impurity or a p-type impurity. The conductive polysilicon layer preferably includes an n-type impurity.

In this embodiment, an exposed portion which is exposed from the anode trench 412 in the anode wiring electrode 414 is positioned at a bottom wall side of the anode trench 412 with respect to the first main surface 3. The exposed portion of the anode wiring electrode 414 may be formed in a curved shape toward the bottom wall of the anode trench 412.

The exposed portion of the anode wiring electrode 414 is covered by a fifth cap insulation layer 419 formed in a film shape. The fifth cap insulation layer 419 is continuous with the anode insulation layer 413 inside the anode trench 412. The fifth cap insulation layer 419 may include silicon oxide ($SiO_2$).

The semiconductor device 1 includes a cathode wiring structure 421 formed in the first main surface 3 of the semiconductor layer 2. The cathode wiring structure 421 forms one wiring of the overheat protection circuit 36 to transmit a cathode voltage to the temperature-sensitive diode DT. The cathode wiring structure 421 passes through the wiring passage region 403 from the input region 7 and is laid around in the temperature sensitive device region 402.

The cathode wiring structure 421 includes a cathode trench 422, a cathode insulation layer 423, and a cathode wiring electrode 424. The cathode trench 422 is formed by digging down the first main surface 3 toward the second main surface 4. The cathode trench 422 is formed in the epitaxial layer 52.

A width WKT of the cathode trench 422 is in excess of the width WT1 of the first gate trench 81 (WT1<WKT). The width WKT is a width in a direction orthogonal to a direction in which the cathode trench 422 extends. It is preferable that the width WKT is substantially equal to the width WAN of the anode trench 412 (WKT=WAN). It is preferable that the width WKT is substantially equal to the width WS of the separation trench 404 (WKT=WS).

The width WKT may be from not less than 1 μm to not more than 2 μm. The width WKT may be from not less than 1 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2 μm. The width WKT is preferably from not less than 1.2 μm to not more than 1.8 μm.

A depth DKT of the cathode trench 422 may be equal to or more than the first depth DT1 of the first gate trench 81 (DT1≤DKT). The depth DKT may be equal to or less than the first depth DT1 (DKT≤DT1). It is preferable that the depth DKT is substantially equal to the first depth DT1 (DT1=DKT). It is preferable that the depth DKT is substantially equal to the depth DAN of the anode trench 412 (DKT=DAN).

The depth DKT may be from not less than 1 μm to not more than 10 μm. The depth DKT may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DKT is preferably from not less than 2 μm to not more than 6 μm.

The cathode trench 422 includes a cathode wiring trench 425 and a cathode connection trench 426 in the temperature sensitive device region 402. In this embodiment, the cathode trench 422 includes the plurality (four) of cathode connection trenches 426. The number of the cathode connection trenches 426 is adjusted according to the number of temperature-sensitive diode structures 431 to be described later.

The cathode wiring trench 425 is formed at an interval in the second direction Y from the anode wiring trench 415 (anode connection trench 416) and formed in a band shape extending along the first direction X. The plurality of cathode connection trenches 426 are each led out in a band shape from the cathode wiring trench 425 to the inside of the temperature sensitive device region 402.

Specifically, the plurality of cathode connection trenches 426 are led out from the cathode wiring trench 425 toward the anode wiring trench 415. The plurality of cathode connection trenches 426 are formed in a band shape along the second direction Y. The plurality of cathode connection trench 426 are formed such as to be shifted in the first direction X from an extension line of the anode connection trench 416 in plan view. The cathode connection trench 426 can be led out in any given amount.

The cathode insulation layer 423 is formed on an inner wall of the cathode trench 422. The cathode insulation layer 423 is formed in a film shape along the inner wall of the cathode trench 422. Thereby, the cathode insulation layer 423 defines a recess space inside the cathode trench 422.

The cathode insulation layer 423 has a uniform thickness TKT. The thickness TKT is a thickness of the inner wall of the cathode trench 422 along the normal direction. The thickness TKT is in excess of the second thickness T2 of the first opening-side insulation layer 85 (T2<TKT). It is preferable that the thickness TKT is substantially equal to the first thickness T1 of the first bottom-side insulation layer 84 (T1=TKT). It is preferable that the thickness TKT is substantially equal to the thickness TS of the separation insulation layer 405 (TKT=TS). It is preferable that the thickness TKT is substantially equal to the thickness TAN of the anode insulation layer 413 (TKT=TAN).

The thickness TKT may be from not less than 1500 Å to not more than 4000 Å. The thickness TKT may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The thickness TKT is preferably from not less than 1800 Å to not more than 3500 Å.

The cathode insulation layer 423 includes at least any one of silicon oxide ($SiO_2$), silicon nitride (SiN), aluminum oxide ($Al_2O_3$), zirconium oxide ($ZrO_2$), and tantalum oxide ($Ta_2O_3$). It is preferable that the cathode insulation layer 423 is composed of the same insulating material as the first insulation layer 82. In this embodiment, the cathode insulation layer 423 has a single layer structure composed of an $SiO_2$ layer.

The cathode wiring electrode 424 is embedded in the cathode trench 422 across the cathode insulation layer 423. Specifically, the cathode wiring electrode 424 is embedded in a recess space which is defined by the cathode insulation layer 423 inside the cathode trench 422.

The cathode wiring electrode 424 includes a cathode wiring portion 427 and a cathode wiring connection portion 428. The cathode wiring portion 427 is positioned inside the cathode wiring trench 425. The cathode wiring connection portion 428 is positioned inside the cathode connection trench 426.

The cathode wiring electrode 424 may include at least any one of conductive polysilicon, tungsten, aluminum, copper, an aluminum alloy, and a copper alloy. In this embodiment, the cathode wiring electrode 424 includes a conductive polysilicon layer. The conductive polysilicon layer may include an n-type impurity or a p-type impurity. The conductive polysilicon layer preferably includes an n-type impurity.

In this embodiment, an exposed portion which is exposed from the cathode trench 422 in the cathode wiring electrode 424 is positioned at a bottom wall side of the cathode trench 422 with respect to the first main surface 3. The exposed portion of the cathode wiring electrode 424 is formed in a curved shape toward the bottom wall of the cathode trench 422.

The exposed portion of the cathode wiring electrode 424 is covered by a sixth cap insulation layer 429 formed in a film shape. The sixth cap insulation layer 429 is continuous with the cathode insulation layer 423 inside the cathode trench 422. The sixth cap insulation layer 429 may include silicon oxide ($SiO_2$).

The semiconductor device 1 includes a temperature-sensitive diode DT formed in the temperature sensitive device region 402. The temperature-sensitive diode DT is surrounded by the power MISFET 9 across the region separation structure 401. The temperature sensitive device region 402 is electrically insulated from the power MISFET 9 by the region separation structure 401. By forming the temperature-sensitive diode DT inside the output region 6, it becomes possible to appropriately monitor a temperature of the power MISFET 9.

The temperature-sensitive diode DT is formed in a region held between the anode wiring trench 415 and the cathode wiring trench 425 in the temperature sensitive device region 402. The temperature-sensitive diode DT includes one or a plurality (in this embodiment, twelve) of temperature-sensitive diode structures 431 formed in the first main surface 3 of the semiconductor layer 2.

The plurality of temperature-sensitive diode structures 431 are formed at intervals in the first direction X and the second direction Y in plan view. In this embodiment, the plurality of temperature-sensitive diode structures 431 are arrayed in a matrix composed of three rows and four columns in plan view. The plurality of temperature-sensitive diode structures 431 are arrayed at a substantially equal pitch in a row direction (first direction X). The plurality of temperature-sensitive diode structures 431 are arrayed at a substantially equal pitch in a column direction (second direction Y).

A first row, a second row, and a third row of the plurality of temperature-sensitive diode structures 431 are defined in this order from the cathode wiring trench 425 to the anode wiring trench 415. A first column, a second column, a third column, and a fourth column of the plurality of temperature-sensitive diode structures 431 are defined in this order from a base end portion of the anode wiring trench 415 (cathode wiring trench 425) to a leading end portion thereof. The base end portion of the anode wiring trench 415 (cathode wiring trench 425) is an end portion of the wiring passage region 403 side in a portion extending in the first direction X.

The plurality of temperature-sensitive diode structures 431 are each similar in structure. Hereinafter, one temperature-sensitive diode structure 431 shall be described as an example. The temperature-sensitive diode structure 431 includes a diode trench 432, a diode insulation layer 433, and a polysilicon layer 434. The diode trench 432 is formed by digging down the first main surface 3 toward the second main surface 4. The diode trench 432 is formed in the epitaxial layer 52.

A depth DD of the diode trench 432 may be equal to or more than the first depth DT1 of the first gate trench 81 (DT1≤DD). The depth DD may be equal to or less than the first depth DT1 (DD≤DT1). It is preferable that the depth DD is substantially equal to the first depth DT1 (DD=DT1). It is preferable that the depth DD is substantially equal to the depth DS of the separation trench 404 (DS=DD). It is preferable that the depth DD is substantially equal to the depth DAN of the anode trench 412 (DD=DAN). It is preferable that the depth DD is substantially equal to the depth DKT of the cathode trench 422 (DD=DKT).

The depth DD may be from not less than 1 μm to not more than 10 μm. The depth DD may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DD is preferably from not less than 2 μm to not more than 6 μm.

Specifically, the diode trench 432 includes an annular trench 435, a first connection trench 436, and a second connection trench 437. In this embodiment, the annular trench 435 is formed in a rectangular annular shape in plan view. Specifically, the annular trench 435 is formed in a rectangular annular shape extending along the second direction Y in plan view. The planar shape of the annular trench 435 is arbitrary. The annular trench 435 may be formed in a circular annular shape, an elongated-oval annular shape, or an elliptic annular shape in plan view.

The annular trench 435 includes an inner circumferential side wall 438 and an outer circumferential side wall 439. The annular trench 435 includes a first trench portion 441, a second trench portion 442, a third trench portion 443, and a fourth trench portion 444. The inner circumferential side wall 438 and the outer circumferential side wall 439 of the annular trench 435 are formed by the first trench portion 441, the second trench portion 442, the third trench portion 443, and the fourth trench portion 444.

The first trench portion 441 and the second trench portion 442 extend along the first direction X and face in the second direction Y in plan view. The first trench portion 441 and the second trench portion 442 form a short side of the annular trench 435. The third trench portion 443 and the fourth trench portion 444 extend along the second direction Y and face in the first direction X in plan view. The third trench portion 443 and the fourth trench portion 444 form a long side of the annular trench 435.

A width WA of the annular trench 435 is in excess of the width WT1 of the first gate trench 81 (WT1<WA). The width WA is a width in a direction orthogonal to a direction in which the annular trench 435 extends. It is preferable that the width WA is substantially equal to the width WS of the separation trench 404 (WA=WS). It is preferable that the width WA is substantially equal to the width WAN of the anode trench 412 (WA=WAN). It is preferable that the width WA is substantially equal to the width WKT of the cathode trench 422 (WA=WKT).

The width WA may be from not less than 1 μm to not more than 2 μm. The width WA may be from not less than 1 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2 μm. The width WA is preferably from not less than 1.2 μm to not more than 1.8 μm.

The first connection trench 436 communicates with the outer circumferential side wall 439 of the annular trench 435. Specifically, the first connection trench 436 communicates with the outer circumferential side wall 439 of the first trench portion 441. The first connection trench 436 extends in a direction intersecting the first trench portion 441 from the outer circumferential side wall 439 of the first trench portion 441 in plan view. The first connection trench 436 is led out in a band shape along the second direction Y in plan view.

The first connection trench 436 is formed on the same straight line as the third trench portion 443 in plan view. That is, the first connection trench 436 forms one straight-line-shaped trench with the third trench portion 443. The length of the first connection trench 436 is arbitrary. The length of the first connection trench 436 may be less than that of the third trench portion 443.

A width WC1 of the first connection trench 436 is in excess of the width WT1 of the first gate trench 81 (WT1<WC1). The width WC1 is a width in a direction orthogonal to a direction in which the first connection trench 436 extends. It is preferable that the width WC1 is substantially equal to the width WA of the annular trench 435 (WC1=WA).

The width WC1 may be from not less than 1 μm to not more than 2 μm. The width WC1 may be from not less than 1 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2 μm. The width WC1 is preferably from not less than 1.2 μm to not more than 1.8 μm.

The second connection trench 437 communicates with the outer circumferential side wall 439 of the annular trench 435 at a position different from that of the first connection trench 436. Specifically, the second connection trench 437 communicates with the outer circumferential side wall 439 of the second trench portion 442. The second connection trench 437 extends in a direction which intersects the second trench portion 442 from the outer circumferential side wall 439 of the second trench portion 442 in plan view. The second connection trench 437 is led out in a band shape along the second direction Y in plan view.

The second connection trench 437 is formed such as to be shifted in the first direction X from an extension line of the first connection trench 436 in plan view. The second connection trench 437 is formed on the same straight line as the fourth trench portion 444 in plan view. That is, the second connection trench 437 forms one straight-line-shaped trench with the fourth trench portion 444. The length of the second connection trench 437 is arbitrary. The length of the second connection trench 437 may be less than that of the fourth trench portion 444.

A width WC2 of the second connection trench 437 is in excess of the width WT1 of the first gate trench 81 (WT1<WC2). The width WC2 is a width in a direction orthogonal to a direction in which the second connection trench 437 extends. It is preferable that the width WC2 is substantially equal to the width WA of the annular trench 435 (WC2=WA).

The width WC2 may be from not less than 1 μm to not more than 2 μm. The width WC2 may be from not less than 1 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2 μm. The width WC2 is preferably from not less than 1.2 μm to not more than 1.8 μm.

The diode insulation layer 433 is formed on an inner wall of the diode trench 432. The diode insulation layer 433 is formed in a film shape along the inner wall of the diode trench 432. Thereby, the diode insulation layer 433 defines a recess space inside the diode trench 432.

The diode insulation layer 433 has a uniform thickness TDI. The thickness TDI is a thickness of the inner wall of the diode trench 432 along the normal direction. The thickness TDI is in excess of the second thickness T2 of the first opening-side insulation layer 85 (T2<TDI). It is preferable that the thickness TDI is substantially equal to the first thickness T1 of the first bottom-side insulation layer 84 (TDI=T1). It is preferable that the thickness TDI is substantially equal to the thickness TS of the separation insulation layer 405 (TDI=TS).

The thickness TDI may be from not less than 1500 Å to not more than 4000 Å. The thickness TDI may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The thickness TDI is preferably from not less than 1800 Å to not more than 3500 Å.

The diode insulation layer 433 includes at least any one of silicon oxide ($SiO_2$), silicon nitride (SiN), aluminum oxide ($Al_2O_3$), zirconium oxide ($ZrO_2$), and tantalum oxide ($Ta_2O_3$). It is preferable that the diode insulation layer 433 is composed of the same insulating material as the first insulation layer 82. In this embodiment, the diode insulation layer 433 has a single layer structure composed of an $SiO_2$ layer.

The polysilicon layer 434 is embedded in the diode trench 432 across the diode insulation layer 433. Specifically, the polysilicon layer 434 is embedded in a recess space which is defined by the diode insulation layer 433 inside the diode trench 432.

The polysilicon layer 434 includes an annular portion 451, a first connection portion 452, and a second connection portion 453. The annular portion 451 is positioned inside the annular trench 435. The first connection portion 452 is positioned inside the first connection trench 436. The second connection portion 453 is positioned inside the second connection trench 437.

In this embodiment, an exposed portion which is exposed from the diode trench 432 in the polysilicon layer 434 is positioned at the bottom wall side of the diode trench 432 with respect to the first main surface 3. The exposed portion of the polysilicon layer 434 may be formed in a curved shape toward the bottom wall of the diode trench 432.

The temperature-sensitive diode structure 431 includes a pn junction structure formed in the polysilicon layer 434. The pn junction structure includes a p-type well region 461, a $p^+$-type anode region 462, and an $n^+$-type cathode region 463 formed in the polysilicon layer 434.

The well region 461 is formed in a surface layer portion of the polysilicon layer 434. Specifically, the well region 461 is formed in the surface layer portion of the polysilicon layer 434 in its entirety. That is, the well region 461 is formed in a surface layer portion of the annular portion 451, a surface layer portion of the first connection portion 452, and a surface layer portion of the second connection portion 453. The well region 461 is formed at an interval from a bottom portion of the polysilicon layer 434.

A p-type impurity concentration of the well region 461 may be from not less than $1\times10^{16}$ $cm^{-3}$ to not more than $1\times10^{18}$ $cm^{-3}$. It is preferable that the p-type impurity concentration of the well region 461 is substantially equal to the p-type impurity concentration of the body region 55.

It is preferable that a thickness of the well region 461 is substantially equal to the thickness of the body region 55. The thickness of the well region 461 may be from not less than 0.5 μm to not more than 2 μm. The thickness of the well region 461 may be from not less than 0.5 μm to not more than 1 μm, from not less than 1 μm to not more than 1.5 μm, or from not less than 1.5 μm to not more than 2 μm.

The anode region 462 is formed in the surface layer portion of the polysilicon layer 434. The anode region 462 is formed at an interval from the bottom portion of the polysilicon layer 434. Specifically, the anode region 462 is formed in the surface layer portion of the well region 461. The bottom portion of the anode region 462 is positioned at the exposed portion side of the polysilicon layer 434 with respect to the bottom portion of the well region 461.

The anode region 462 is formed in a partial region of the annular portion 451 such as to expose the well region 461 in plan view. Specifically, the anode region 462 is formed in a part which is positioned in the first trench portion 441 of the annular portion 451.

Further, the anode region 462 is led out from the first trench portion 441 to one or both of the third trench portion 443 and the fourth trench portion 444. In this embodiment, the anode region 462 is led out from the first trench portion 441 to the third trench portion 443 and the fourth trench portion 444.

Parts which are positioned at the third trench portion 443 and the fourth trench portion 444 in the anode region 462 are formed at intervals from the second trench portion 442 to the first trench portion 441 side. Thereby, the anode region 462 exposes the well region 461 in the annular portion 451 of the polysilicon layer 434.

A p-type impurity concentration of the anode region 462 may be from not less than $1\times10^{19}$ $cm^{-3}$ to not more than $1\times10^{21}$ $cm^{-3}$. It is preferable that the p-type impurity concentration of the anode region 462 is substantially equal to the p-type impurity concentration of the first contact region 93. It is preferable that the p-type impurity concentration of the anode region 462 is substantially equal to a p-type impurity concentration of the second contact region 113.

A thickness of the anode region 462 may be from not less than 0.01 μm to not more than 1.5 μm. The thickness of the anode region 462 may be from not less than 0.01 μm to not more than 0.05 μm, from not less than 0.05 μm to not more than 0.1 μm, from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm.

The cathode region 463 is formed in the surface layer portion of the polysilicon layer 434. The cathode region 463 is formed at an interval from the bottom portion of the polysilicon layer 434. Specifically, the cathode region 463 is formed in the surface layer portion of the well region 461. The bottom portion of the cathode region 463 is positioned at the exposed portion side of the polysilicon layer 434 with respect to the bottom portion of the well region 461.

The cathode region 463 is formed in a partial region of the annular portion 451 such as to expose the well region 461 in plan view. The cathode region 463 is formed at an interval from the anode region 462. Specifically, the cathode region 463 is formed in a part which is positioned in the second trench portion 442 of the annular portion 451.

Further, the cathode region 463 is led out from the second trench portion 442 to one or both of the third trench portion 443 and the fourth trench portion 444. In this embodiment, the cathode region 463 is led out from the second trench portion 442 to the third trench portion 443 and the fourth trench portion 444.

Parts which are positioned at the third trench portion 443 and the fourth trench portion 444 in the cathode region 463 are formed at intervals from the first trench portion 441 to the second trench portion 442 side. Thereby, the cathode region 463 exposes the well region 461 at the annular portion 451 of the polysilicon layer 434.

The cathode region 463 faces the anode region 462 across the well region 461 in the annular portion 451. The cathode region 463 is electrically connected to the anode region 462. Specifically, the cathode region 463 is electrically connected to the anode region 462 through the well region 461.

An n-type impurity concentration of the cathode region 463 may be from not less than $1\times10^{19}$ $cm^{-3}$ to not more than $1\times10^{21}$ $cm^{-3}$. It is preferable that the n-type impurity concentration of the cathode region 463 is substantially equal to the n-type impurity concentration of the first source region 92.

It is preferable that a thickness of the cathode region 463 is substantially equal to the thickness of the first source region 92. The thickness of the cathode region 463 may be from not less than 0.01 μm to not more than 1.5 μm. The thickness of the cathode region 463 may be from not less than 0.01 μm to not more than 0.05 μm, from not less than 0.05 μm to not more than 0.1 μm, from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm.

The cathode region 463 forms a pn junction diode 464 with the anode region 462. The pn junction diode 464 includes a pn junction portion between the cathode region 463 and the anode region 462. Specifically, the pn junction diode 464 includes a pn junction portion between the cathode region 463 and the anode region 462, and a pn junction portion between the cathode region 463 and the well region 461.

By forming the well region 461, a depletion layer spreading from the pn junction portion can be appropriately expanded. Thereby, it is possible to increase a withstand voltage. There may be formed the pn junction diode 464 which only includes the pn junction portion between the cathode region 463 and the anode region 462. However, in this case, a depletion layer spreading from the pn junction portion becomes narrow. Therefore, it is preferable that the well region 461 is formed.

The temperature-sensitive diode structure 431 includes a $p^+$-type anode contact region 465 formed in the polysilicon layer 434. The anode contact region 465 is formed in the first connection portion 452 of the polysilicon layer 434. The anode contact region 465 is formed in the surface layer portion of the first connection portion 452.

The anode contact region 465 is formed at an interval from the bottom portion of the polysilicon layer 434. The anode contact region 465 is formed in the surface layer portion of the well region 461. A bottom portion of the anode contact region 465 is positioned at the exposed portion side of the polysilicon layer 434 with respect to the bottom portion of the well region 461.

The anode contact region 465 is integrally formed with the anode region 462 at a communication portion of the annular portion 451 and the first connection portion 452. The anode contact region 465 has a p-type impurity concentration substantially equal to the p-type impurity concentration of the anode region 462. The anode contact region 465 has a thickness substantially equal to the thickness of the anode region 462. The anode contact region 465 is also a part in which the anode region 462 is led out to the first connection portion 452.

The temperature-sensitive diode structure 431 includes an $n^+$-type cathode contact region 466 formed in the polysilicon layer 434. The cathode contact region 466 is formed at the second connection portion 453 of the polysilicon layer 434. The cathode contact region 466 is formed in the surface layer portion of the second connection portion 453.

The cathode contact region 466 is formed at an interval from the bottom portion of the polysilicon layer 434. The cathode contact region 466 is formed in the surface layer portion of the well region 461. A bottom portion of the cathode contact region 466 is positioned at the exposed portion side of the polysilicon layer 434 with respect to the bottom portion of the well region 461.

The cathode contact region 466 is integrally formed with the cathode region 463 at a communication portion of the annular portion 451 and the second connection portion 453. The cathode contact region 466 has an n-type impurity concentration substantially equal to the n-type impurity concentration of the cathode region 463. The cathode contact region 466 has a thickness substantially equal to the thickness of the cathode region 463. The cathode contact region 466 is also a part in which the cathode region 463 is led out to the second connection portion 453.

The temperature-sensitive diode structure 431 includes an impurity-free non-doped region 467 formed in the polysilicon layer 434. The non-doped region 467 is formed in a region at the bottom portion side of the polysilicon layer 434. The non-doped region 467 is formed in a region at the bottom portion side of the annular portion 451, a region at the bottom portion side of the first connection portion 452, and a region at the bottom portion side of the second connection portion 453.

The non-doped region 467 is formed in a region at the bottom portion side of the polysilicon layer 434 with respect to the bottom portion of the anode region 462 and the bottom portion of the cathode region 463. The non-doped region 467 is formed in a region at the bottom portion side of the polysilicon layer 434 with respect to the bottom portion of the anode contact region 465 and the bottom portion of the cathode contact region 466. Specifically, the non-doped region 467 is formed in a region at the bottom portion side of the polysilicon layer 434 with respect to the bottom portion of the well region 461.

A thickness of the non-doped region 467 is preferably in excess of the thickness of the anode region 462 and the thickness of the cathode region 463. It is more preferable that the thickness of the non-doped region 467 is in excess of the thickness of the well region 461. The non-doped region 467 is formed such as to run across an intermediate portion of the polysilicon layer 434 from the bottom portion of the well region 461 with respect to a normal direction Z and reach the bottom portion of the polysilicon layer 434.

The exposed portion of the polysilicon layer 434 is covered by a seventh cap insulation layer 468 which is formed in a film shape. The seventh cap insulation layer 468 is continuous with the diode insulation layer 433 inside the diode trench 432. The seventh cap insulation layer 468 may include silicon oxide ($SiO_2$).

With reference to FIG. 17, the plurality of temperature-sensitive diode structures 431 are arrayed in a matrix at an interval from each other in such an orientation that the anode region 462 of one of the temperature-sensitive diode structures 431 faces the cathode region 463 of the other of the temperature-sensitive diode structures 431.

The plurality of temperature-sensitive diode structures 431 are arrayed in the matrix in a position such that the first connection trench 436 and the second connection trench 437 extend along the second direction Y in plan view. The plurality of temperature-sensitive diode structure 431 are arrayed in the matrix such that the first connection trench 436 and the second connection trench 437 which correspond to each other mutually face in the first direction X.

The second connection trench 437 of the temperature-sensitive diode structure 431 in the first row faces the cathode connection trench 426 in the first direction X in plan view. The second connection trench 437 of the temperature-sensitive diode structure 431 in the second row faces the first connection trench 436 of the temperature-sensitive diode structure 431 in the first row in the first direction X.

The second connection trench 437 of the temperature-sensitive diode structure 431 in the third row faces the first connection trench 436 of the temperature-sensitive diode structure 431 in the second row in the first direction X in plan view. The first connection trench 436 of the temperature-sensitive diode structure 431 in the third row faces the anode connection trench 416 in the first direction X in plan view.

The first connection trenches 436 of the plurality of temperature-sensitive diode structures 431 are positioned on the same straight line in plan view. The first connection trenches 436 of the plurality of temperature-sensitive diode structures 431 are positioned on an extension line of the cathode connection trench 426 in plan view. The second connection trenches 437 of the plurality of temperature-sensitive diode structures 431 are positioned on the same straight line in plan view. The second connection trenches 437 of the plurality of temperature-sensitive diode structures 431 are positioned on an extension line of the anode connection trench 416 in plan view.

The semiconductor device 1 includes a plurality of dummy region separation structures 471 formed in the first main surface 3 in the temperature sensitive device region 402. The plurality of dummy region separation structures 471 are formed in the first main surface 3 at a pitch substantially similar to that of the plurality of temperature-sensitive diode structure 431.

The plurality of dummy region separation structures 471 are formed at one side and the other side to a region in which the temperature-sensitive diodes DT in the first direction X. The plurality of dummy region separation structures 471 surround the region in which the temperature-sensitive diodes DT (the plurality of temperature-sensitive diode structures 431) are formed with the anode wiring structure 411 and the cathode wiring structure 421. Specifically, the plurality of dummy region separation structures 471 include a plurality (in this embodiment, two) of first dummy region separation structures 471A and a plurality (in this embodiment, two) of second dummy region separation structures 471B.

The plurality of first dummy region separation structures 471A are formed in a region between the base end portion of the anode connection trench 416 and the base end portion of the cathode connection trench 426. The plurality of first dummy region separation structures 471A are formed at an interval in the first direction X and extends in a band shape in the second direction Y.

The plurality of second dummy region separation structures 471B are formed in a region between the leading end portion of the anode connection trench 416 and the leading end portion of the cathode connection trench 426. The plurality of second dummy region separation structures 471B are formed at an interval in the first direction X and extends in a band shape along the second direction Y.

As with the region separation structure 401, the plurality of dummy region separation structures 471 include the separation trench 404, the separation insulation layer 405, and the separation electrode 406. A specific description of the plurality of dummy region separation structures 471 shall be omitted.

The plurality of dummy region separation structures 471 are formed to reduce a variation which may occur between the plurality of temperature-sensitive diode structures 431 during manufacturing process. That is, the temperature-sensitive diode structure 431 in the second column faces the temperature-sensitive diode structure 431 in the first column and the temperature-sensitive diode structure 431 in the third column with respect to the first direction X. Similarly, the plurality of temperature-sensitive diode structures 431 in the third column face the temperature-sensitive diode structure 431 in the second column and the temperature-sensitive diode structure 431 in the fourth column with respect to the first direction X.

In contrast thereto, the plurality of temperature-sensitive diode structures 431 in the first column only face the temperature-sensitive diode structure 431 in the second column with respect to the first direction X. Similarly, the plurality of temperature-sensitive diode structures 431 in the fourth column only face the temperature-sensitive diode structure 431 in the third column with respect to the first direction X. Structures around the temperature-sensitive diode structures 431 in the first column and in the fourth column are different from structures around the temperature-sensitive diode structures 431 in the second column and the third column.

Process errors during the manufacturing process include those caused by structures around the temperature-sensitive diode structure 431. The plurality of dummy region separation structures 471 allow the structures around the temperature-sensitive diode structures 431 in the first column and the fourth column to approximate the structures around the temperature-sensitive diode structures 431 in the second column and the third column. Process errors which occur during the manufacturing process can thereby be reduced, and it becomes possible to appropriately form the plurality of temperature-sensitive diode structures 431.

The semiconductor device 1 includes a field insulation layer 481 which covers the temperature sensitive device region 402 and the wiring passage region 403 on the first main surface 3. The field insulation layer 481 is formed integrally with the separation insulation layer 405, the anode insulation layer 413, the cathode insulation layer 423, and the diode insulation layer 433.

The field insulation layer 481 has a uniform thickness TF. The thickness TF is a thickness along the normal direction Z of the first main surface 3. The thickness TF is in excess of the thickness of the main surface insulation layer 141. The thickness TF is in excess of the second thickness T2 of the first opening-side insulation layer 85 (T2<TF). It is preferable that the thickness TF is substantially equal to the first thickness T1 of the first bottom-side insulation layer 84 (TF=T1). It is preferable that the thickness TF is substantially equal to the thickness TS of the separation insulation layer 405 (TF=TS). It is preferable that the thickness TF is substantially equal to the thickness TDI of the diode insulation layer 433 (TF=TDI).

The thickness TF may be from not less than 1500 Å to not more than 4000 Å. The thickness TF may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The thickness TDI is preferably from not less than 1800 Å to not more than 3500 Å.

The field insulation layer 481 includes at least any one of silicon oxide ($SiO_2$), silicon nitride (SiN), aluminum oxide ($Al_2O_3$), zirconium oxide ($ZrO_2$), and tantalum oxide ($Ta_2O_3$). It is preferable that the field insulation layer 481 is composed of the same insulating material as the first insulation layer 82.

In this embodiment, the field insulation layer 481 has a single layer structure composed of an $SiO_2$ layer. It is preferable that the field insulation layer 481, the separation insulation layer 405, the anode insulation layer 413, the cathode insulation layer 423, and the diode insulation layer 433 are formed by one insulation layer having a uniform thickness.

The interlayer insulation layer 142 aforementioned covers the temperature sensitive device region 402 and the wiring passage region 403 on the first main surface 3. The semiconductor device 1 includes a plurality of plug electrodes 482, 483, 484, and 485 (through electrodes) embedded in parts which cover the temperature sensitive device region 402 on the interlayer insulation layer 142. The plurality of plug electrodes 482 to 485 may each include tungsten.

Specifically, the plurality of plug electrodes 482 to 485 include a plurality of anode wiring plug electrodes 482, a plurality of cathode wiring plug electrodes 483, a plurality of anode plug electrodes 484, and a plurality of cathode plug electrodes 485.

The plurality of anode wiring plug electrodes 482 are each embedded in parts which cover the plurality of anode wiring connection portions 418 in the interlayer insulation layer 142. The plurality of anode wiring plug electrodes 482 are each connected to the plurality of anode wiring connection portions 418.

The plurality of cathode wiring plug electrodes 483 are each embedded in parts which cover the plurality of cathode wiring connection portions 428 in the interlayer insulation layer 142. The plurality of cathode wiring plug electrodes 483 are each connected to the plurality of cathode wiring connection portions 428.

The plurality of anode plug electrodes 484 are each embedded in parts which cover the plurality of anode contact regions 465 in the interlayer insulation layer 142. The plurality of anode plug electrodes 484 are each connected to the plurality of anode contact regions 465.

The plurality of cathode plug electrodes 485 are each embedded in parts which cover the plurality of cathode contact regions 466 in the interlayer insulation layer 142. The plurality of cathode plug electrodes 485 are each connected to the plurality of cathode contact regions 466.

The semiconductor device 1 includes a plurality of wirings 486, 487, and 488 formed in a part which covers the temperature sensitive device region 402 in the interlayer insulation layer 142. The plurality of wirings 486 to 488 may each include at least any one of nickel, palladium, aluminum, copper, an aluminum alloy, and a copper alloy.

The plurality of wirings 486 to 488 may each include at least any one of an Al—Si—Cu (aluminum-silicon-copper) alloy, an Al—Si (aluminum-silicon) alloy, and an Al—Cu (aluminum copper) alloy.

Specifically, the plurality of wirings 486 to 488 include one or the plurality of (in this embodiment, one) first wirings 486, the plurality of second wirings 487, and one or the plurality of (in this embodiment, one) third wirings 488.

The first wiring 486 covers the plurality of anode wiring connection portions 418 and the plurality of anode contact regions 465. The first wiring 486 intersects the plurality of anode wiring connection portions 418 and the plurality of anode contact regions 465 in plan view. In this embodiment, the first wiring 486 extends in a band shape extending along the first direction X and intersects the plurality of anode wiring connection portions 418 and the plurality of anode contact regions 465.

The first wiring 486 is connected to the anode wiring plug electrode 482 at an intersecting portion with the anode wiring connection portion 418. The first wiring 486 is connected to the anode plug electrode 484 at an intersecting portion with the anode contact region 465.

Thereby, the first wiring 486 electrically connects the anode wiring electrode 414 and the anode contact region 465 in the third row. That is, the first wiring 486 is formed as an anode-anode wiring.

The plurality of second wirings 487 are formed at an interval along the first direction X and the second direction Y in plan view. The plurality of second wirings 487 each cover a corresponding pair of the anode contact region 465 and the cathode contact region 466. Each of the second wirings 487 covers a cathode contact region 466 and an anode contact region 465 which are adjacent to each other in the first direction X.

Each of the second wirings 487 intersects a corresponding pair of the anode contact region 465 and the cathode contact region 466 in plan view. In this embodiment, each of the second wirings 487 extends in a band shape along the first direction X and intersects a corresponding pair of the anode contact region 465 and the cathode contact region 466.

Each of the second wirings 487 is connected to an anode plug electrode 484 at an intersecting portion with a corresponding anode contact region 465. Each of the second wirings 487 is connected to a cathode plug electrode 485 at an intersecting portion with a corresponding cathode contact region 466.

Thereby, each of the second wirings 487 electrically connects an anode contact region 465 of one of the temperature-sensitive diode structures 431 and a cathode contact region 466 of the other of the temperature-sensitive diode structures 431. That is, the second wiring 487 is formed as an anode-cathode wiring.

The third wiring 488 covers the plurality of cathode wiring connection portions 428 and the plurality of cathode contact regions 466. The third wiring 488 intersects the plurality of cathode wiring connection portions 428 and the plurality of cathode contact regions 466 in plan view. In this embodiment, the third wiring 488 extends in a band shape along the first direction X and intersects the plurality of cathode wiring connection portions 428 and the plurality of cathode contact regions 466.

The third wiring 488 is connected to the cathode wiring plug electrode 483 at an intersecting portion with the cathode wiring connection portion 428. The third wiring 488 is connected to the cathode plug electrode 485 at an intersecting portion with the cathode contact region 466.

Thereby, the third wiring 488 electrically connects the cathode wiring electrode 424 and the cathode contact region 466 in the third row. That is, the third wiring 488 is formed as a cathode-cathode wiring.

Figure 25:
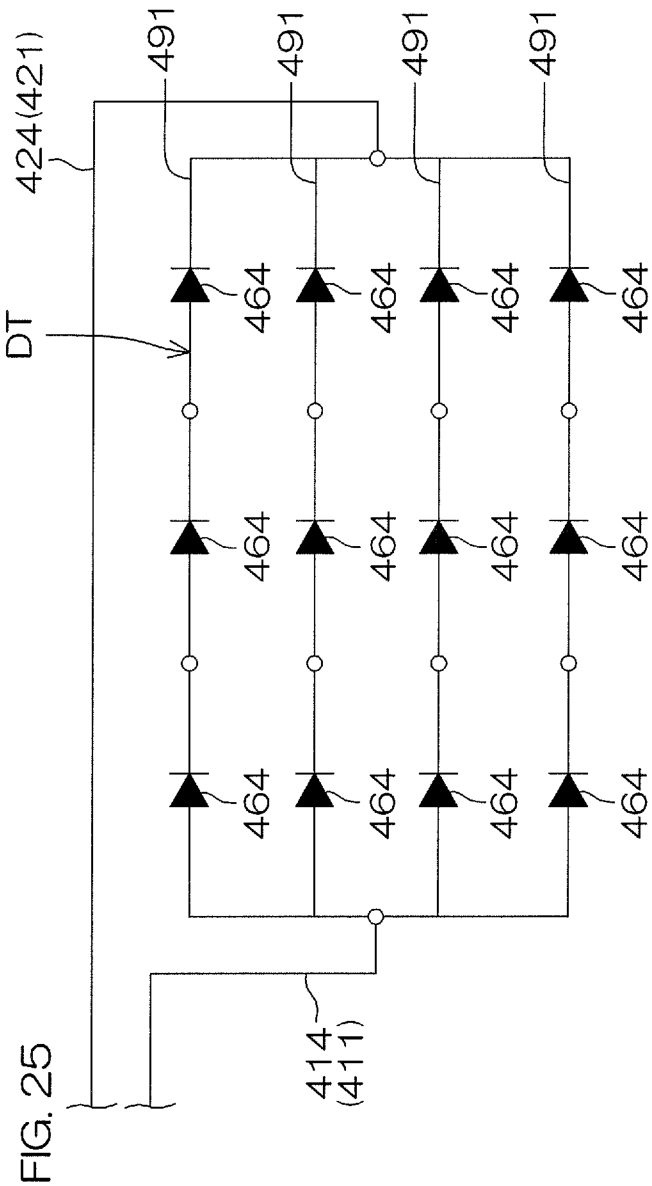
FIG. 25 is a circuit diagram which shows an electrical configuration of the temperature-sensitive diode shown in FIG. 1.

FIG. 25 is a circuit diagram which shows an electrical configuration of the temperature-sensitive diode DT shown in FIG. 1.

With reference to FIG. 25, the temperature-sensitive diode DT is connected between the anode wiring structure 411 (anode wiring electrode 414) and the cathode wiring structure 421 (cathode wiring electrode 424). The temperature-sensitive diode DT has a circuit structure in which a plurality (in this embodiment, four) of series circuits 491 are connected in parallel to each other. Each of the series circuits 491 includes the plurality (in this embodiment, three) of pn junction diodes 464 which are connected in series in a forward direction.

When a voltage not less than a threshold voltage Vth of the temperature-sensitive diode DT is applied between the anode wiring structure 411 and the cathode wiring structure 421, a current flows from the anode wiring structure 411 to the cathode wiring structure 421 through the temperature-sensitive diode DT. The overheat protection circuit 36 generates a predetermined electrical signal based on a current flowing through the temperature-sensitive diode DT to transmit the signal to the current-voltage control circuit 23 aforementioned.

As described above, the semiconductor device 1 includes the IPD (Intelligent Power Device) formed in the semiconductor layer 2. The IPD includes the power MISFET 9 and the control IC 10 which controls the power MISFET 9. Specifically, the power MISFET 9 includes the first MISFET 56 and the second MISFET 57. The control IC 10 controls the first MISFET 56 and the second MISFET 57 individually.

Specifically, the control IC 10 controls the first MISFET 56 and the second MISFET 57 to be in the ON states in (during) the normal operation, and controls the first MISFET 56 to be in the OFF state and the second MISFET 57 to be in the ON state in (during) the active clamp operation.

Therefore, in the normal operation, a current is allowed to flow by using the first MISFET 56 and the second MISFET 57. Thereby, it is possible to reduce the area resistivity Ron·A (ON resistance). Then, it is possible to suppress a temperature rise due to the area resistivity Ron·A (ON resistance).

On the other hand, in the active clamp operation, a current is allowed to flow by using the second MISFET 57 in a state where the first MISFET 56 is stopped. Therefore, the counter electromotive force can be consumed (absorbed) by the second MISFET 57. Thereby, it is possible to suppress a sharp temperature rise due to the counter electromotive force and therefore it is possible to improve the active clamp capability Eac.

Specifically, the semiconductor device 1 has the first MISFET 56 which includes the first FET structure 58 and also the second MISFET 57 which includes the second FET structure 68. The first FET structure 58 includes the first trench gate structure 60 and the first channel region 91. The second FET structure 68 includes the second trench gate structure 70 and the second channel region 111.

In this case, the control IC 10 controls the first MISFET 56 and the second MISFET 57 such that a different characteristics channel rate RC (area of channel) can be applied between the normal operation or the active clamp operation. Specifically, the control IC 10 controls the first MISFET 56 and the second MISFET 57 such that the channel utilization rate RU in the active clamp operation becomes in excess of zero and less than the channel utilization rate RU in the normal operation.

Therefore, the characteristics channel rate RC relatively increases in the normal operation. Thereby, a current path is relatively increased, and it becomes possible to reduce the area resistivity Ron·A (ON resistance). Therefore, it is possible to suppress a temperature rise due to the area resistivity Ron·A (ON resistance). On the other hand, the characteristics channel rate RC relatively reduces in the active clamp operation. Thereby, it is possible to suppress a sharp temperature rise due to the counter electromotive force and therefore it is possible to improve the active clamp capability Eac.

Thus, it is possible to provide the semiconductor device 1 capable of realizing both of an excellent area resistivity Ron·A and an excellent active clamp capability Eac, independently of the trade-off relationship shown in FIG. 13.

Further, according to the semiconductor device 1, the temperature-sensitive diode structure 431 is fabricated into the semiconductor layer 2. Thereby, it is possible to suppress an increase in size of the semiconductor device 1 due to the temperature-sensitive diode structure 431.

Further, according to the semiconductor device 1, the anode wiring structure 411 is fabricated into the semiconductor layer 2. Thereby, it is possible to suppress an increase in size of the semiconductor device 1 due to an anode wiring. Still further, according to the semiconductor device 1, the cathode wiring structure 421 is fabricated into the semiconductor layer 2. Thereby, it is possible to suppress an increase in size of the semiconductor device 1 due to the cathode wiring.

Further, according to the semiconductor device 1, the temperature-sensitive diode DT is formed within the output region 6. Thereby, it is possible to appropriately monitor a temperature of the power MISFET 9. Specifically, as with the first trench gate structure 60 (second trench gate structure 70), the temperature-sensitive diode DT has a trench structure within the output region 6.

The temperature-sensitive diode DT faces the first trench gate structure 60 (second trench gate structure 70) laterally along the first main surface 3 of the semiconductor layer 2. Thereby, it is possible to transmit heat generated in the power MISFET 9 to the temperature-sensitive diode DT through the semiconductor layer 2. As a result, it is possible to more appropriately monitor a temperature of the power MISFET 9.

Also, the temperature-sensitive diode DT includes the region separation structure 401 which defines the output region 6 and the temperature sensitive device region 402. Thereby, it is possible to separate the temperature-sensitive diode DT from the power MISFET 9 in an electrically appropriate manner.

Further, according to the semiconductor device 1, an area of the first channel region 91 and that of the second channel region 111 can be adjusted to suppress a variation in heat generated in the output region 6. Still further, according to the semiconductor device 1, the first MISFET 56 and the second MISFET 57 are individually controlled in the active clamp operation, by which a temperature rise due to the counter electromotive force can be suppressed. Then, the power MISFET 9 and the temperature-sensitive diode structure 431 are able to appropriately cope with a temperature rise occurring in the output region 6.

Further, according to the semiconductor device 1, the plurality of temperature-sensitive diode structures 431 each include the annular trench 435, the first connection trench 436, and the second connection trench 437. The first connection portion 452 (first connection trench 436) of one of the temperature-sensitive diode structures 431 is formed such as to face the second connection portion 453 (second connection trench 437) of the other of the temperature-sensitive diode structures 431 in the first direction X.

The plug electrode (anode plug electrode 484) which penetrates through the interlayer insulation layer 142 is connected to the first connection portion 452. The plug electrode (cathode plug electrode 485) which penetrates through the interlayer insulation layer 142 is connected to the second connection portion 453.

The wiring (second wiring 487) which electrically connects the plug electrode (anode plug electrode 484) at the first connection portion 452 side and the plug electrode (cathode plug electrode 485) at the second connection portion 453 side is formed at the interlayer insulation layer 142. Thereby, in a structure including the annular trench 435, the first connection portion 452 and the second connection portion 453 can be electrically connected by a simple structure while suppressing a wiring resistance.

Specifically, the wiring (second wiring 487) extends in a direction which intersects the first connection portion 452 and the second connection portion 453. More specifically, the wiring (second wiring 487) connects the first connection portion 452 and the second connection portion 453 in the shortest distance. Thereby, it is possible to appropriately suppress the wiring resistance.

In the semiconductor device 1, the anode contact region 465 is formed in the first connection portion 452, and the cathode contact region 466 is formed in the second connection portion 453. Therefore, the plurality of temperature-sensitive diode structures 431 can be electrically connected while suppressing a wiring resistance.

In the semiconductor device 1, the effects similar to those described above are realized between the temperature-sensitive diode structure 431 and the anode wiring structure 411 as well. In the semiconductor device 1, similar effects are realized between the temperature-sensitive diode structure 431 and the cathode wiring structure 421 as well.

Figure 26A:
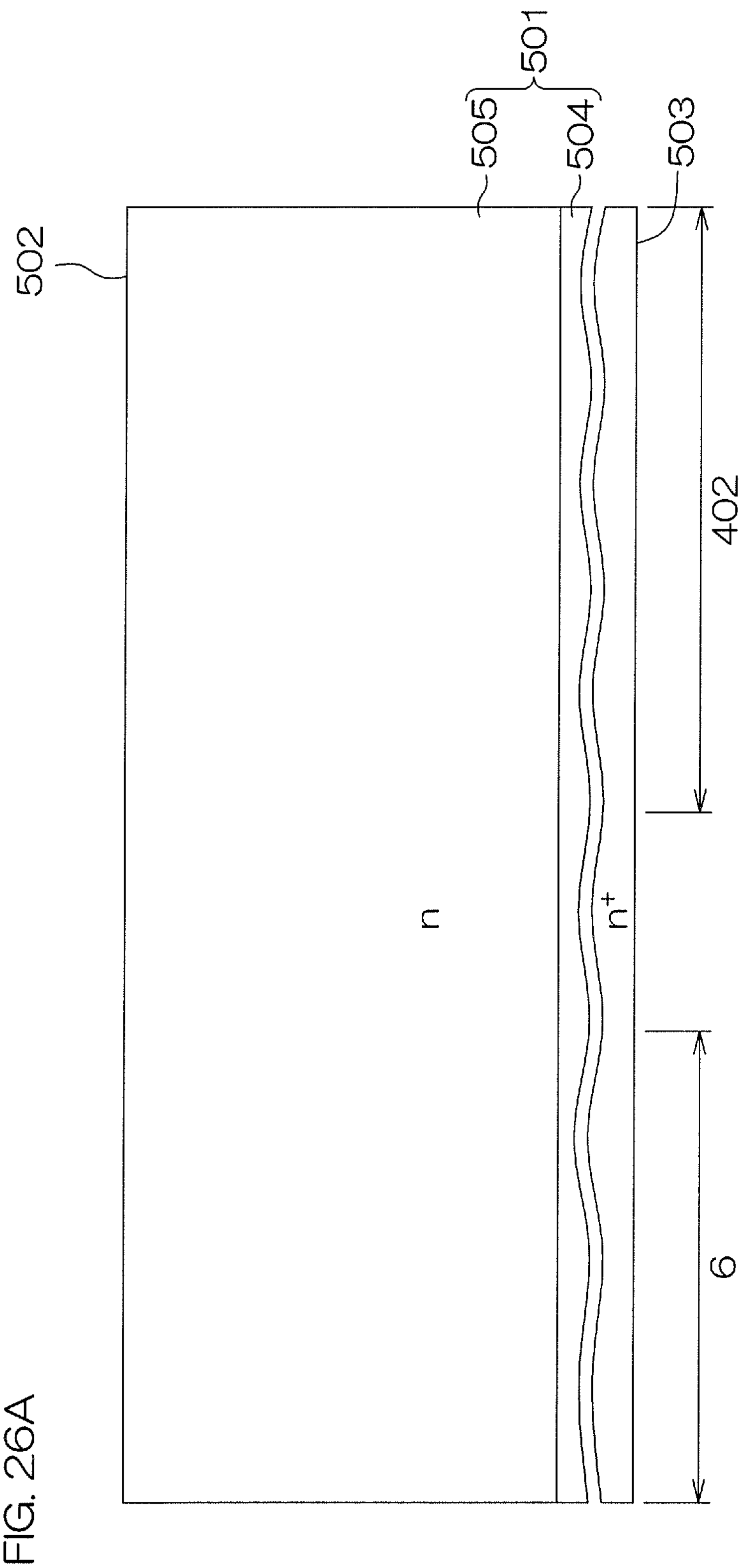
FIG. 26A to 26S are each a sectional view which shows one example of a method for manufacturing the semiconductor device shown in FIG. 1.
Figure 26B:
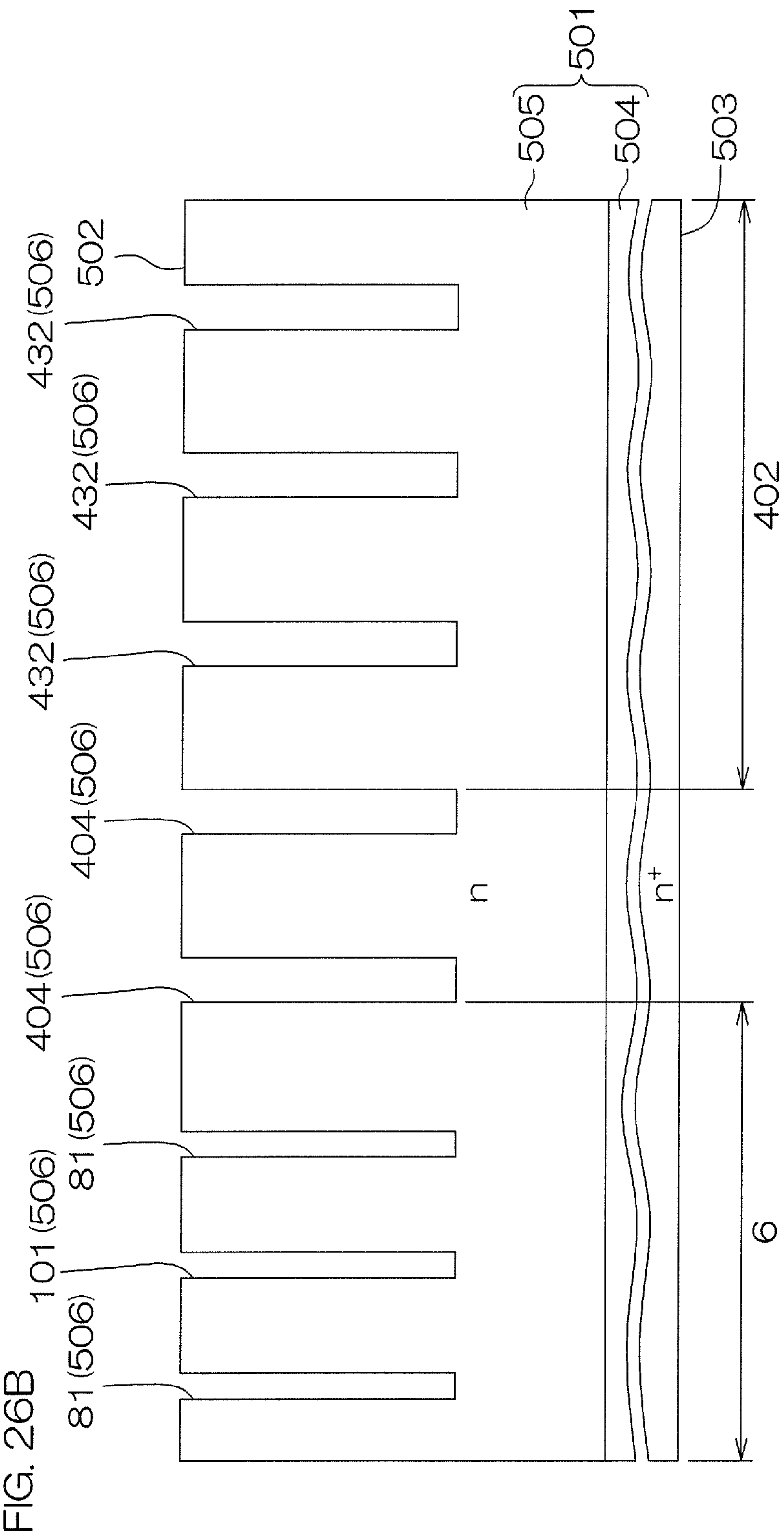
Figure 26C:
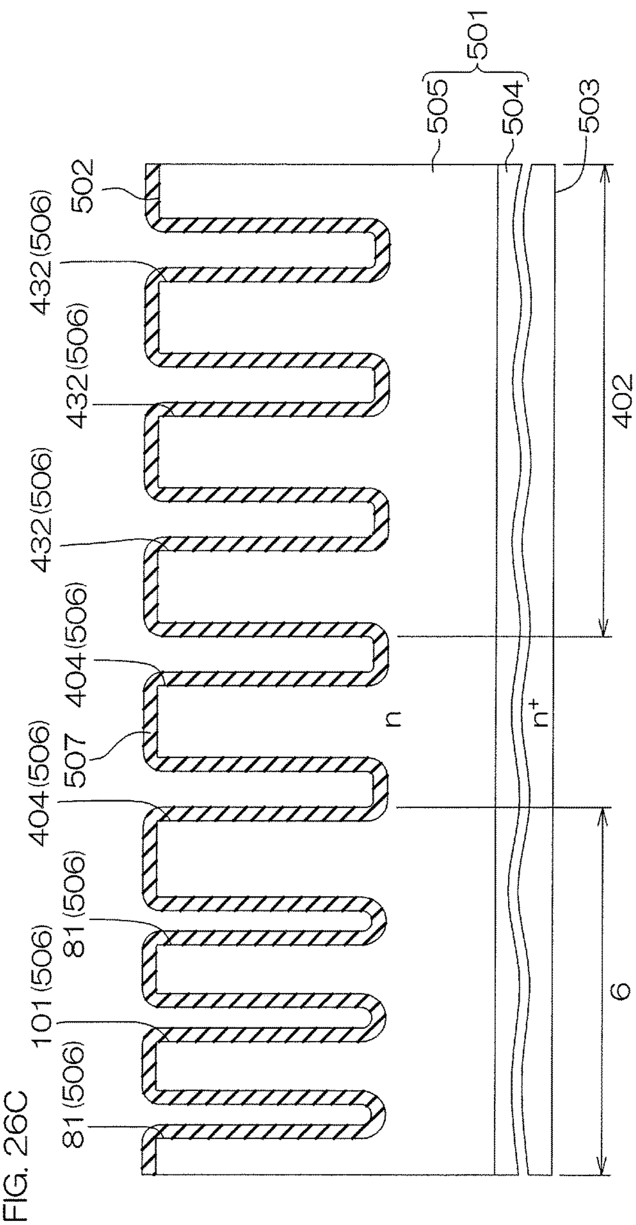
Figure 26D:
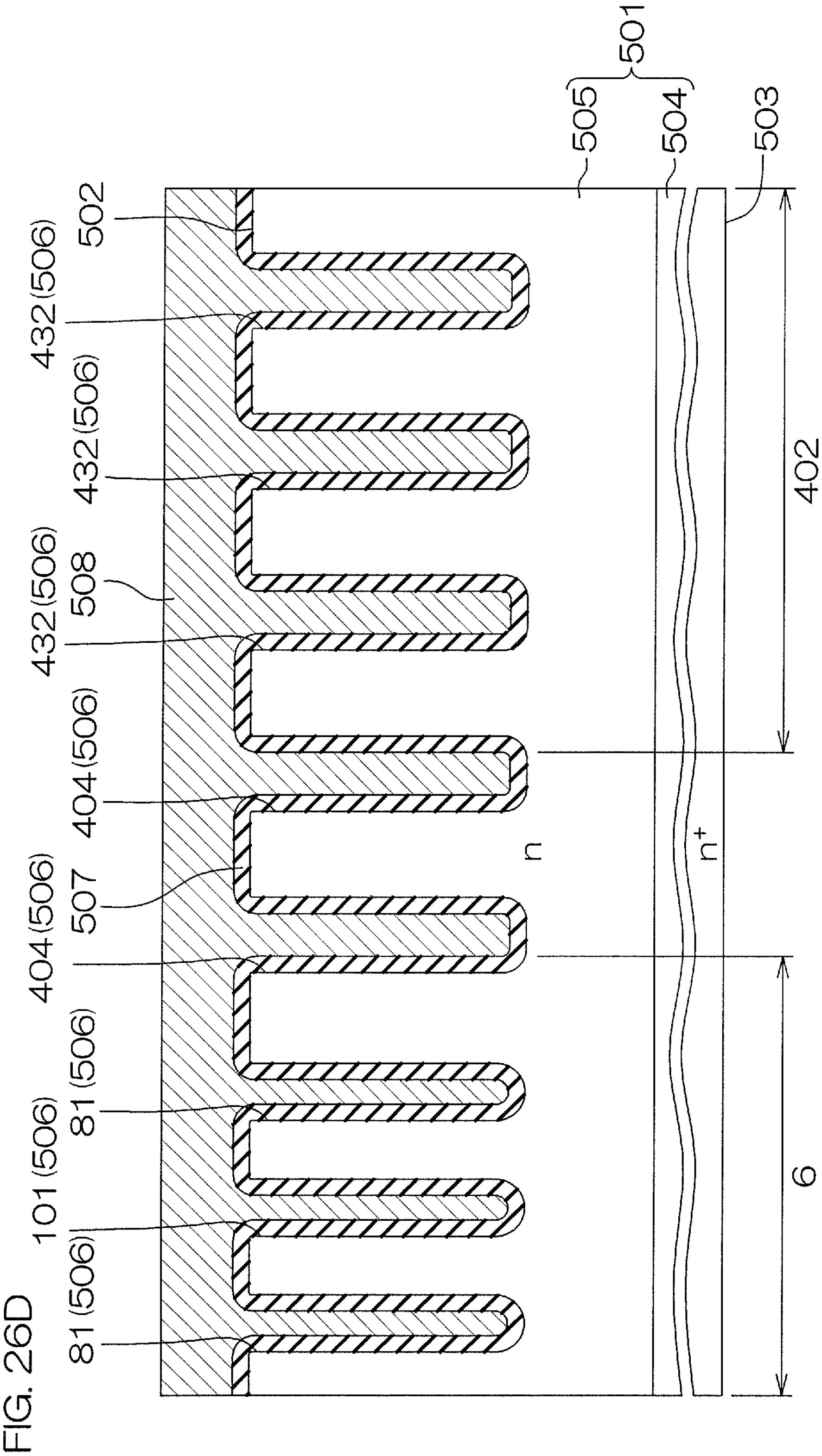
Figure 26E:
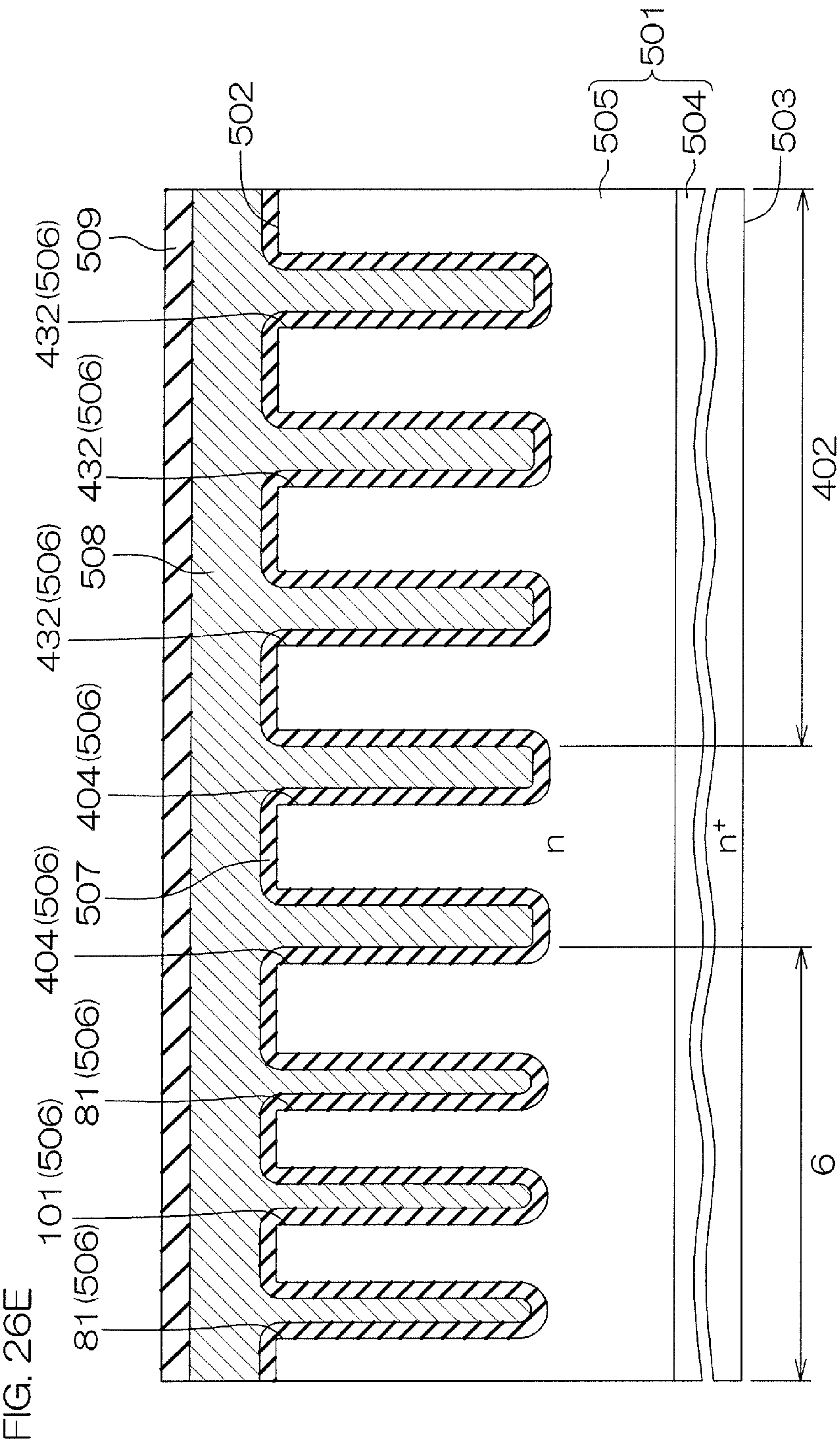
Figure 26F:
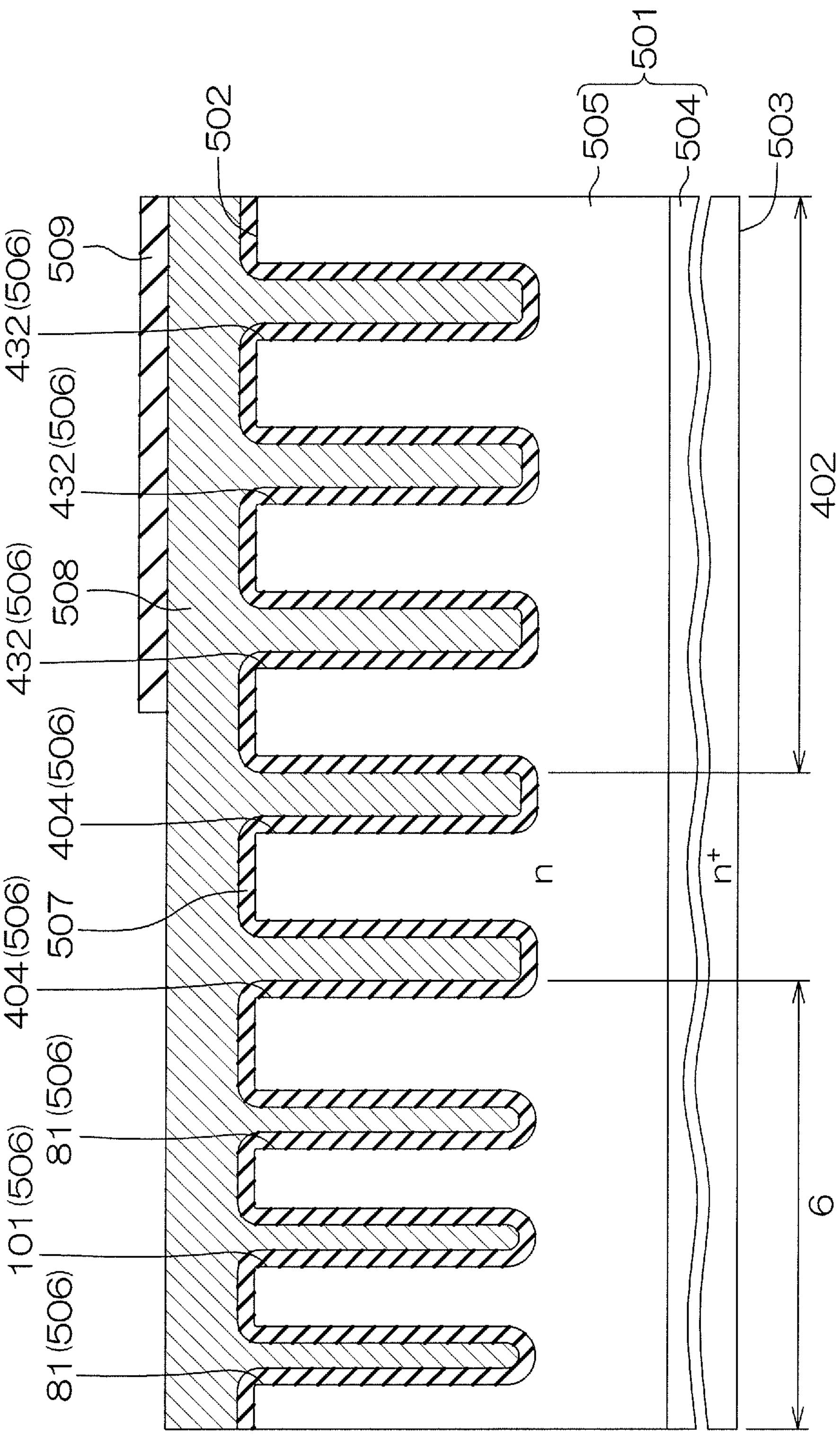
Figure 26G:
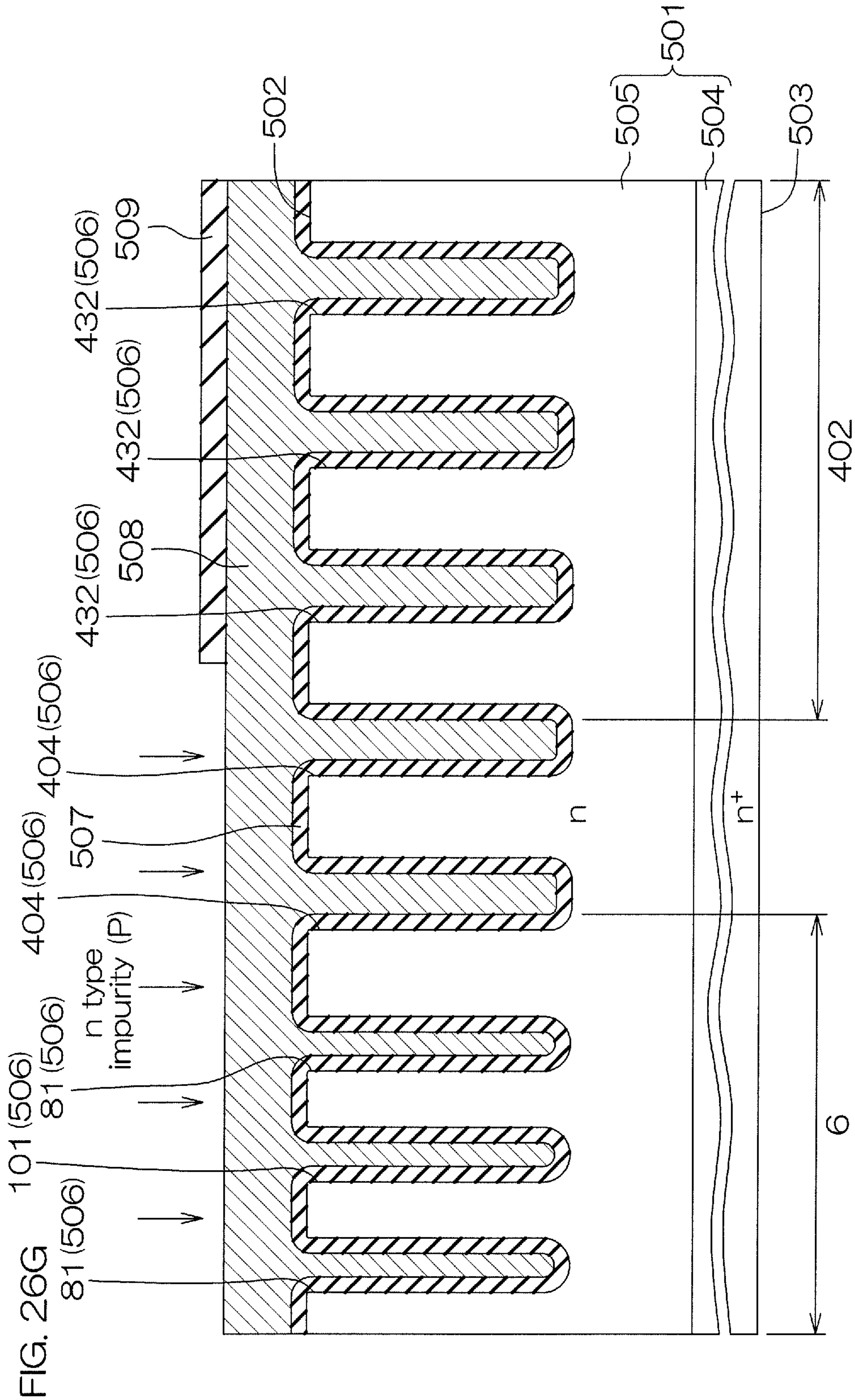
Figure 26H:
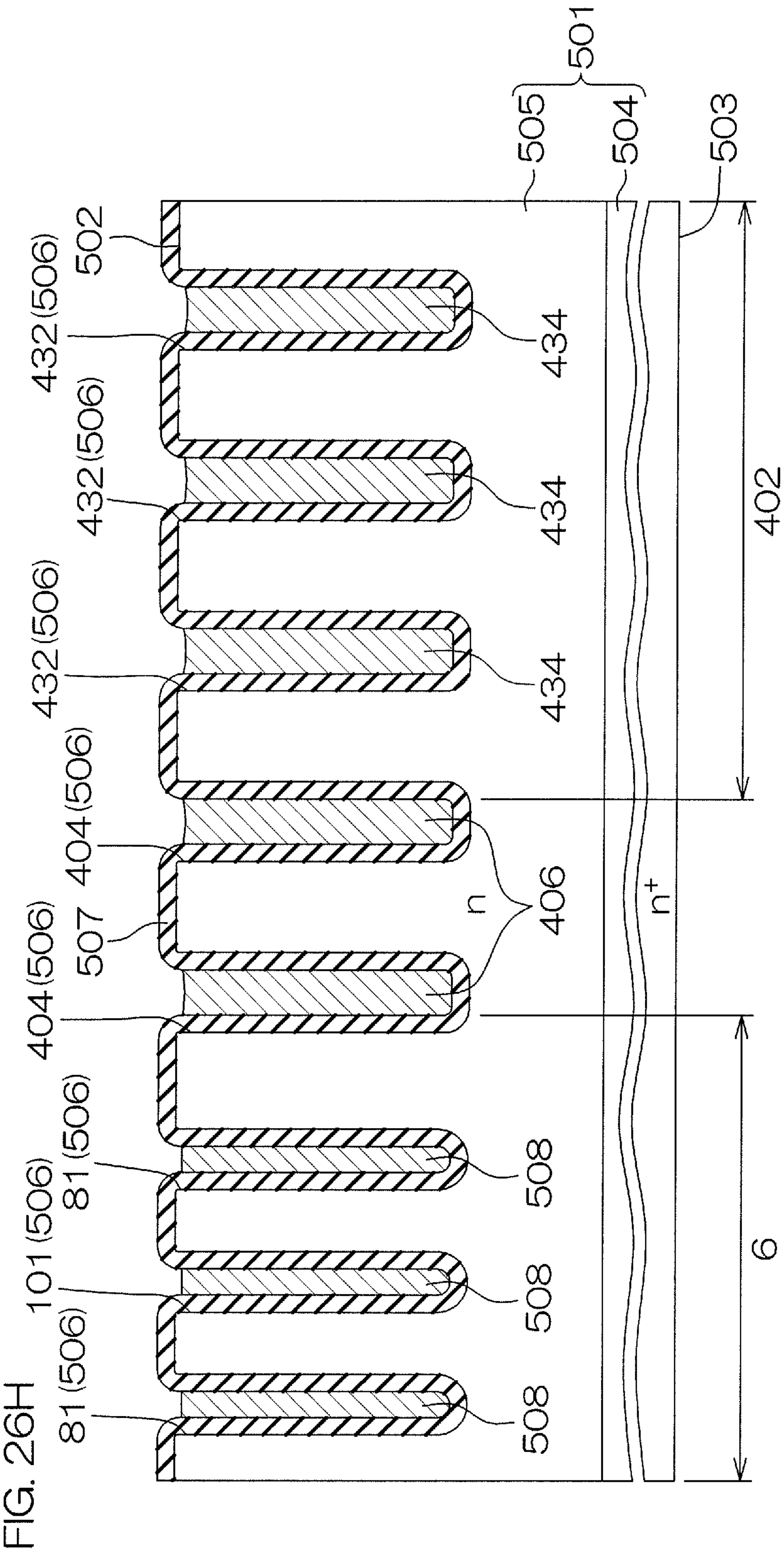
Figure 26:
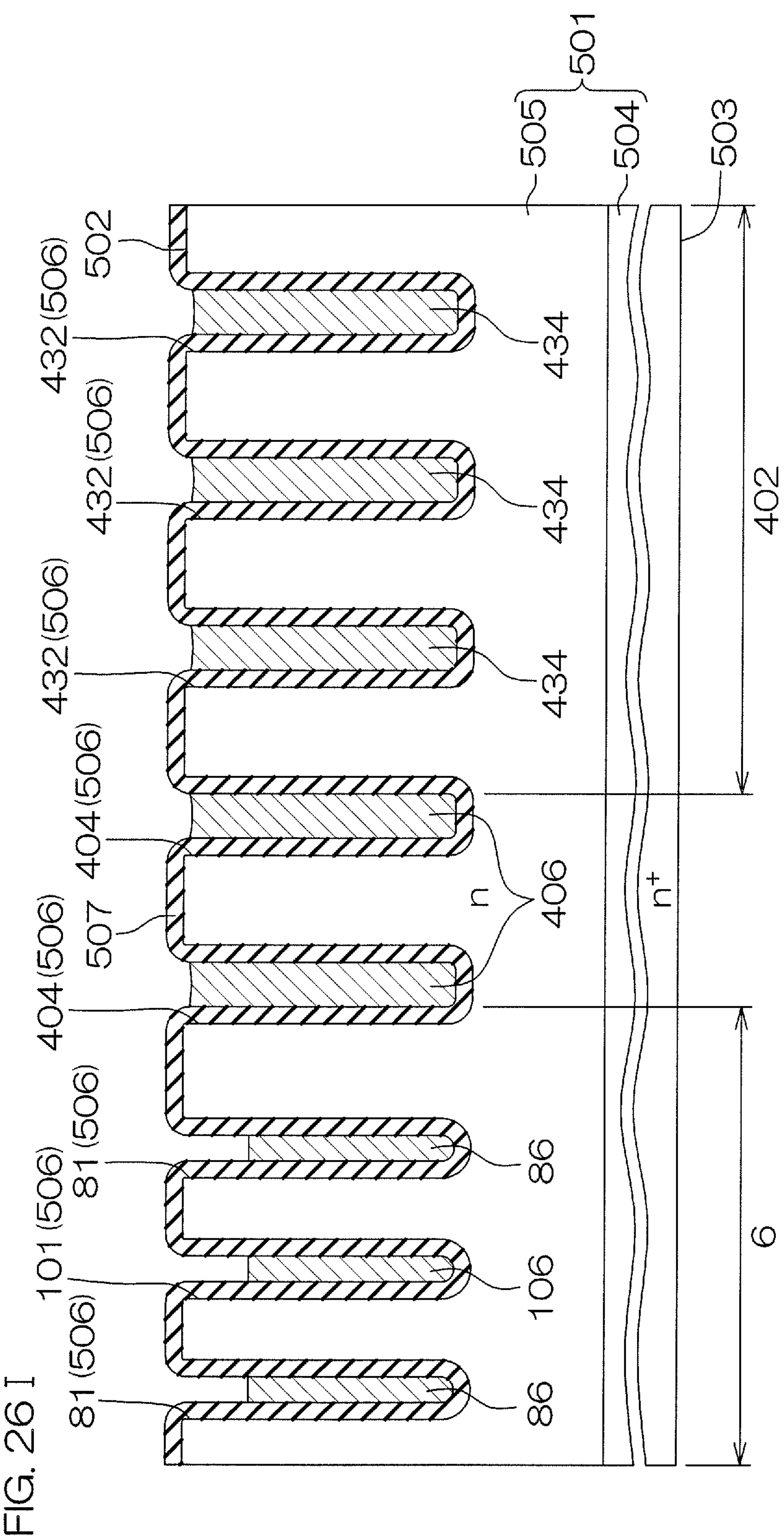
Figure 26J:
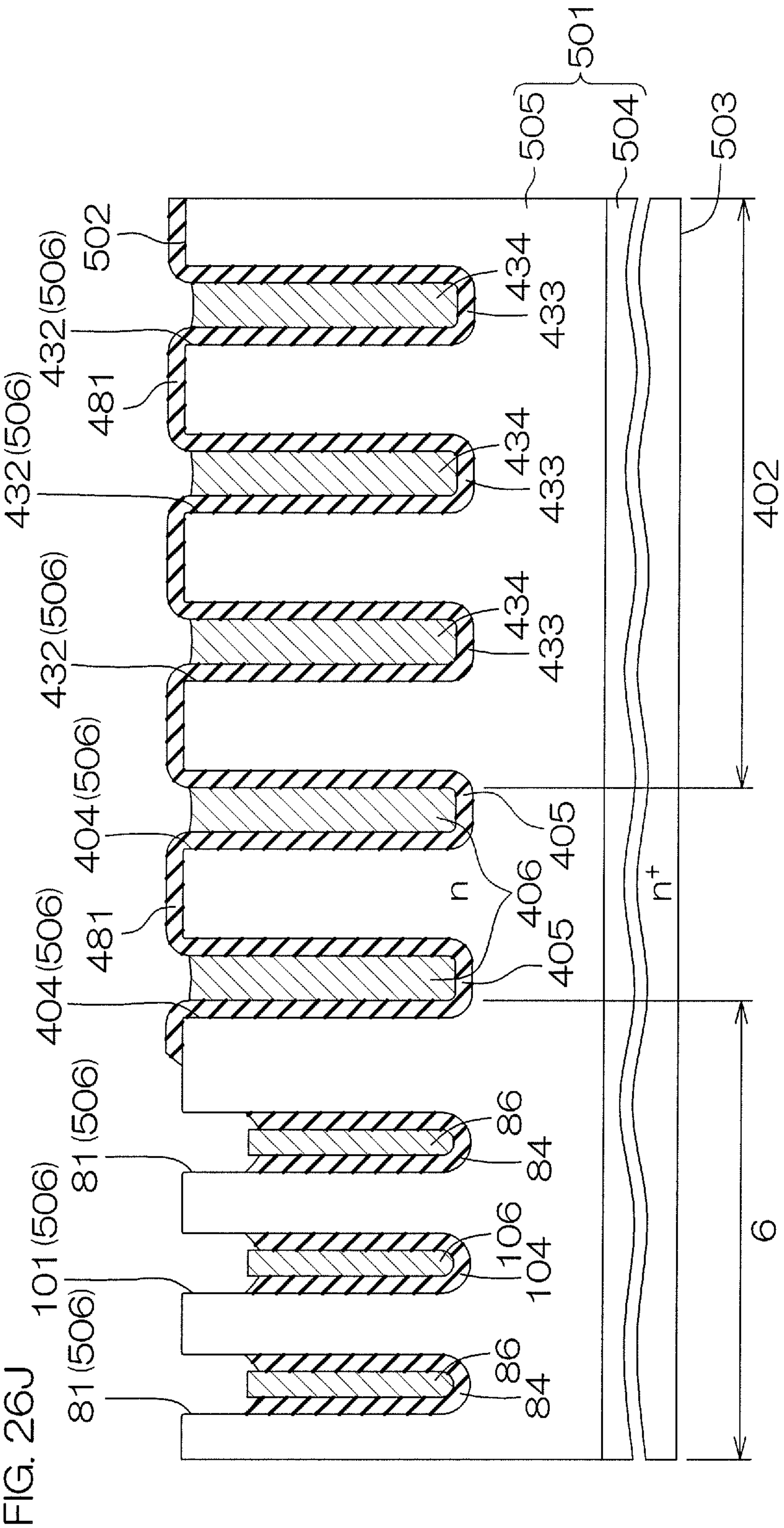
Figure 26K:
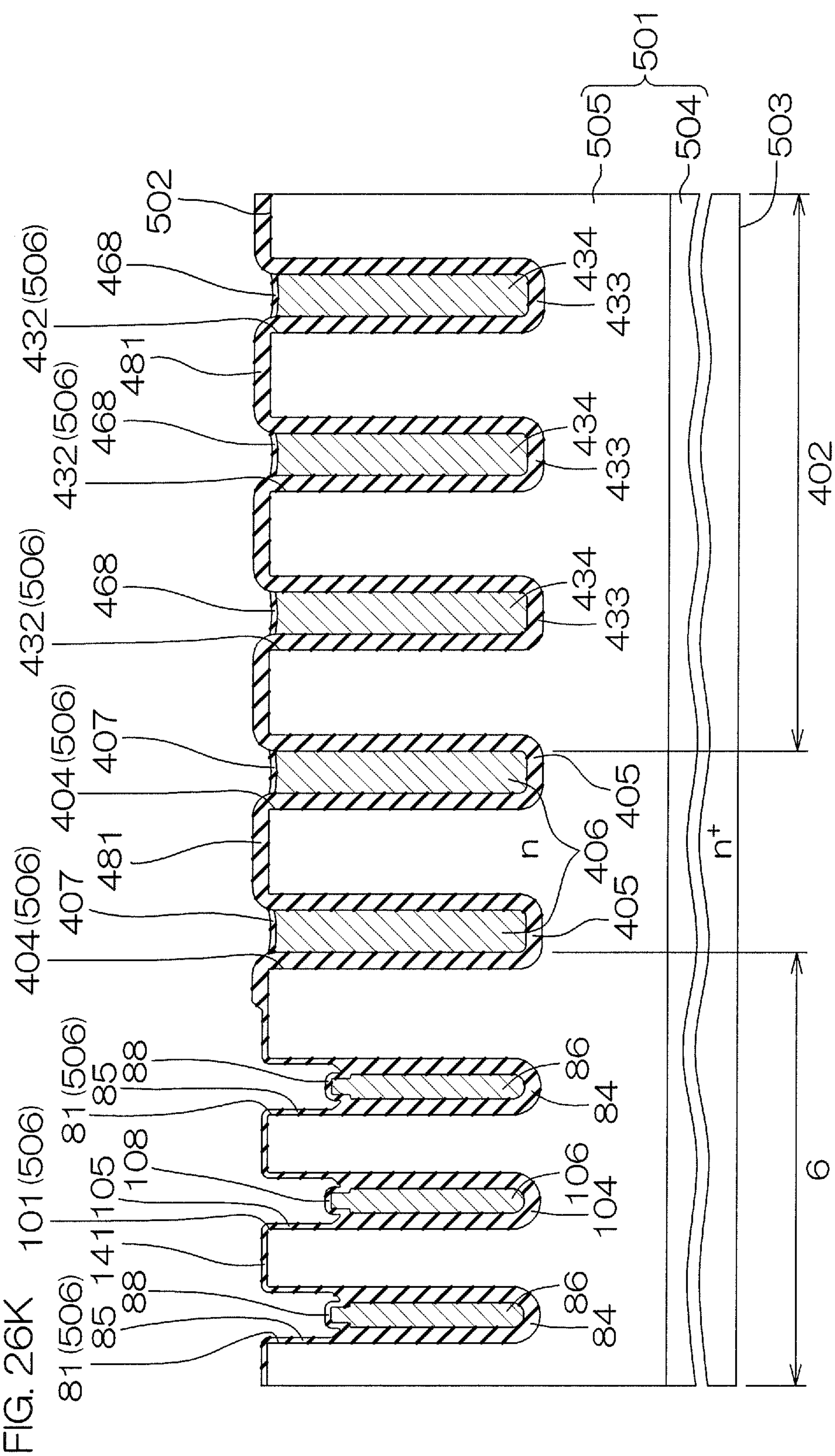
Figure 26L:
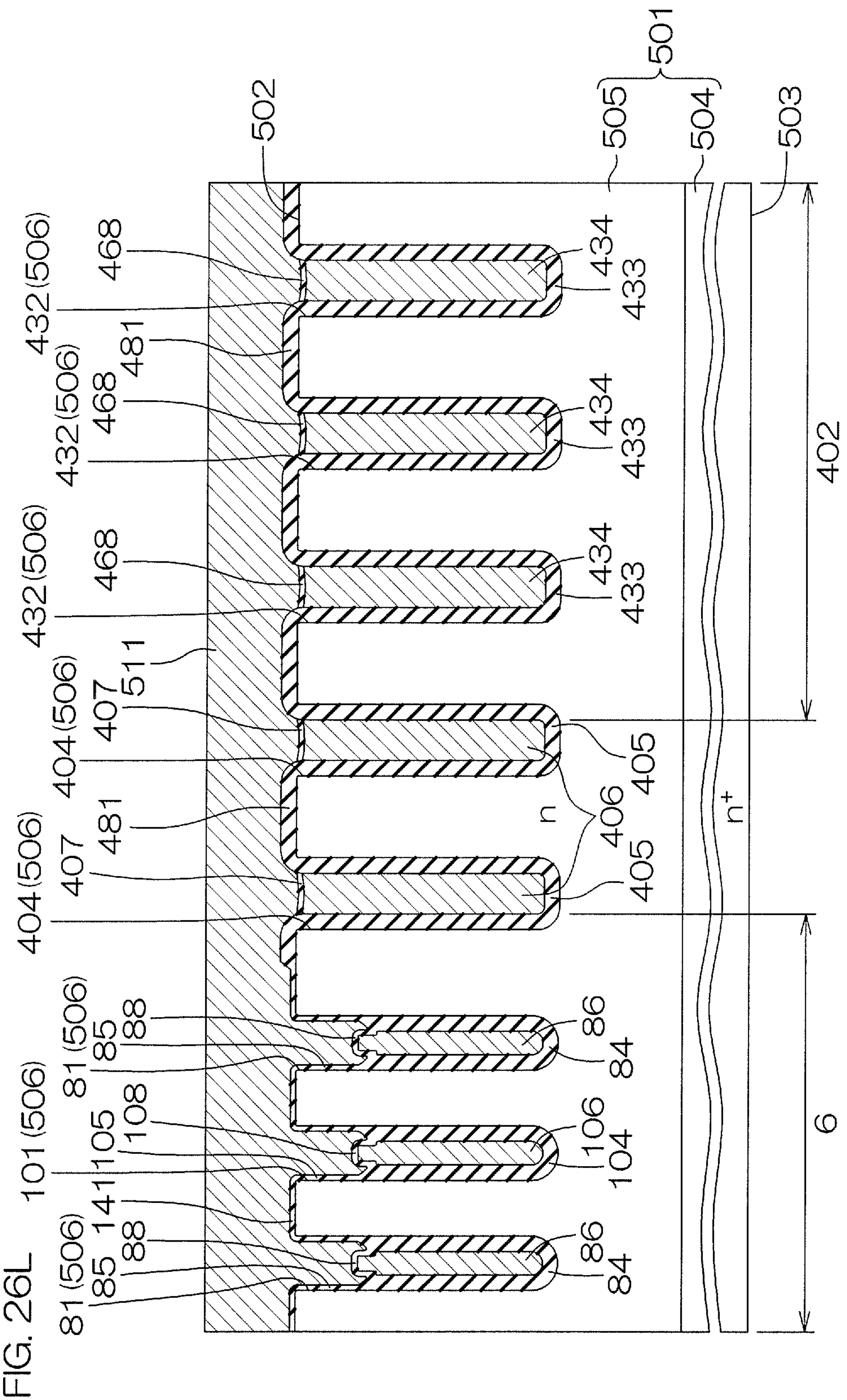
Figure 26M:
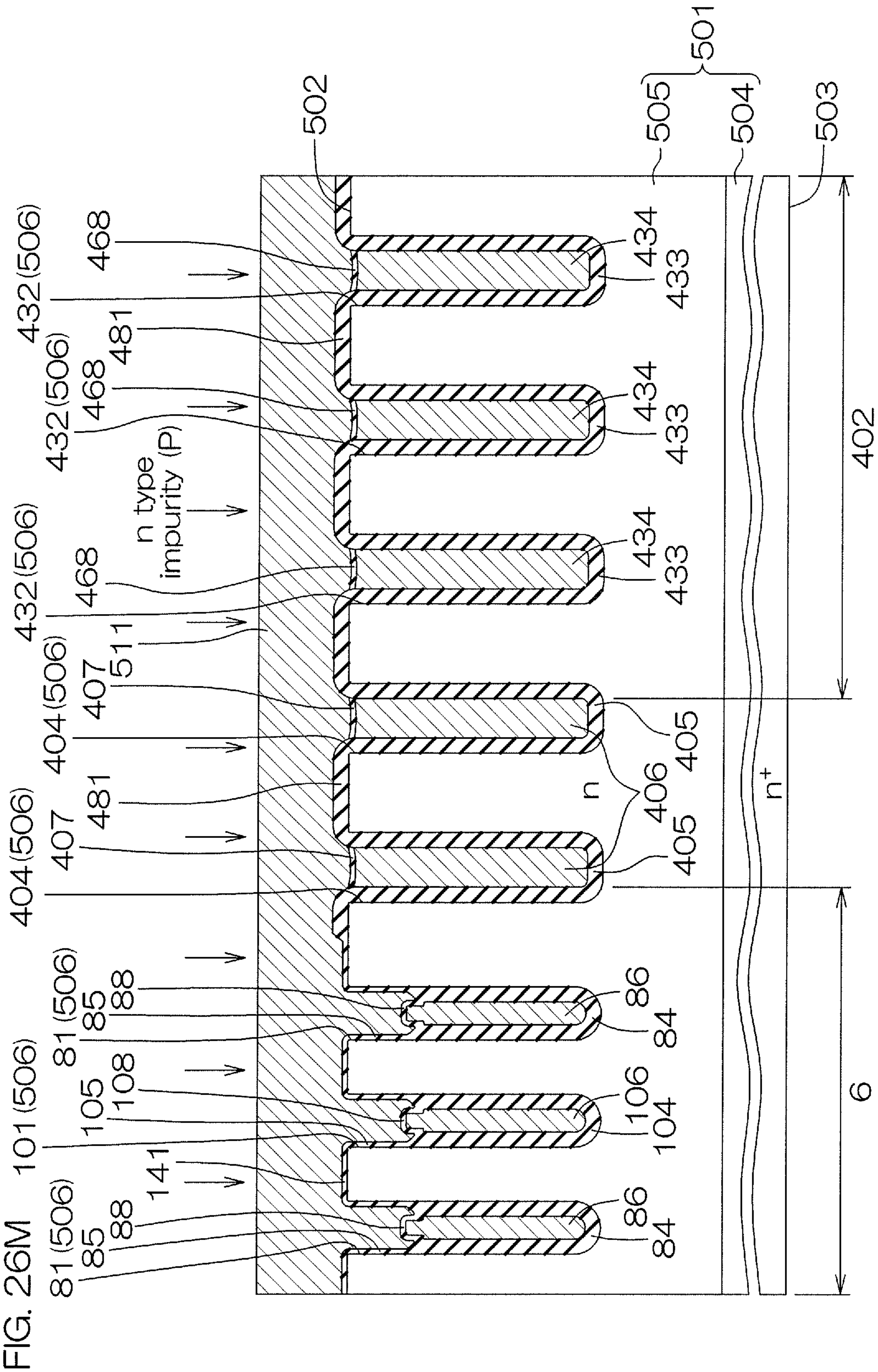
Figure 26N:
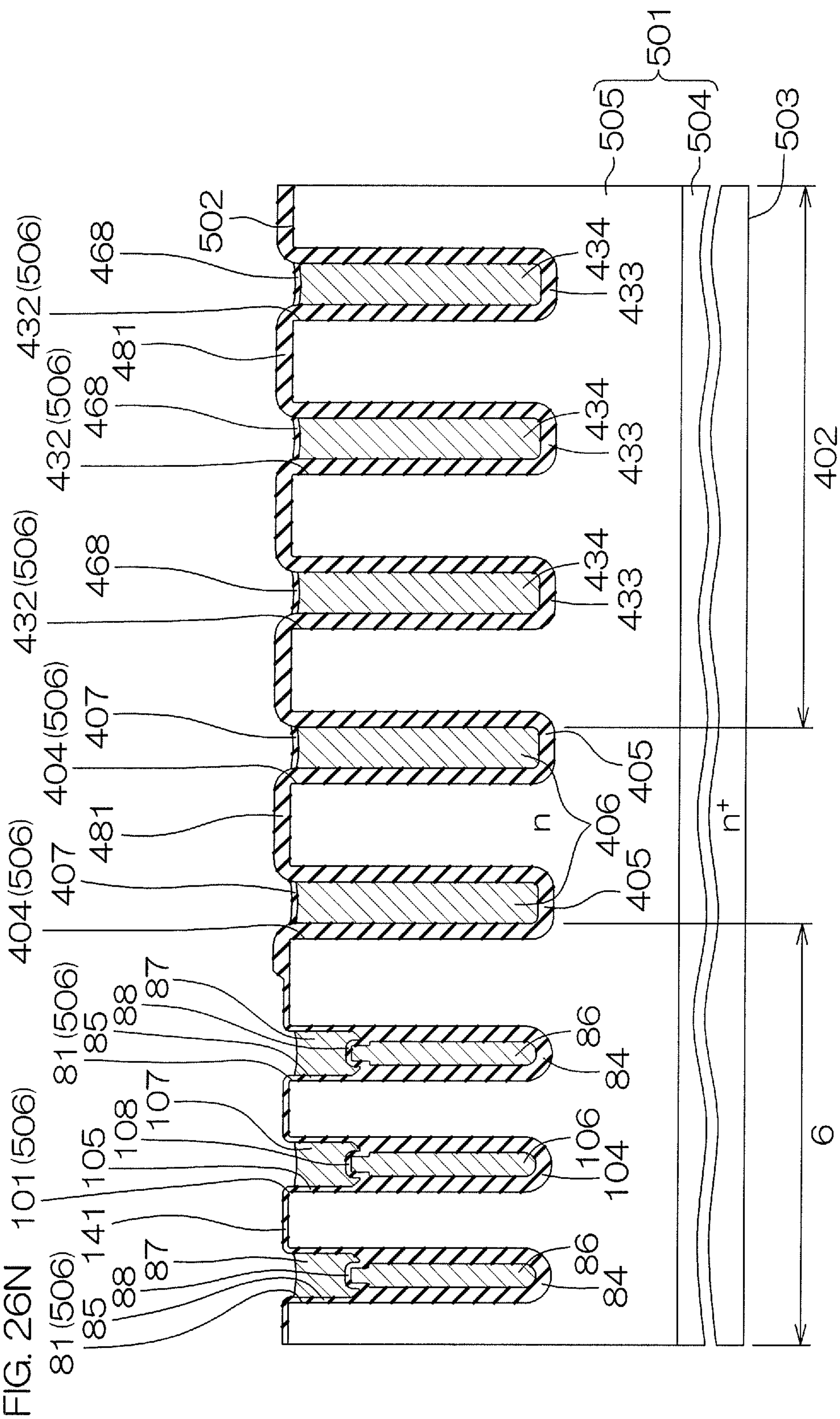
Figure 26O:
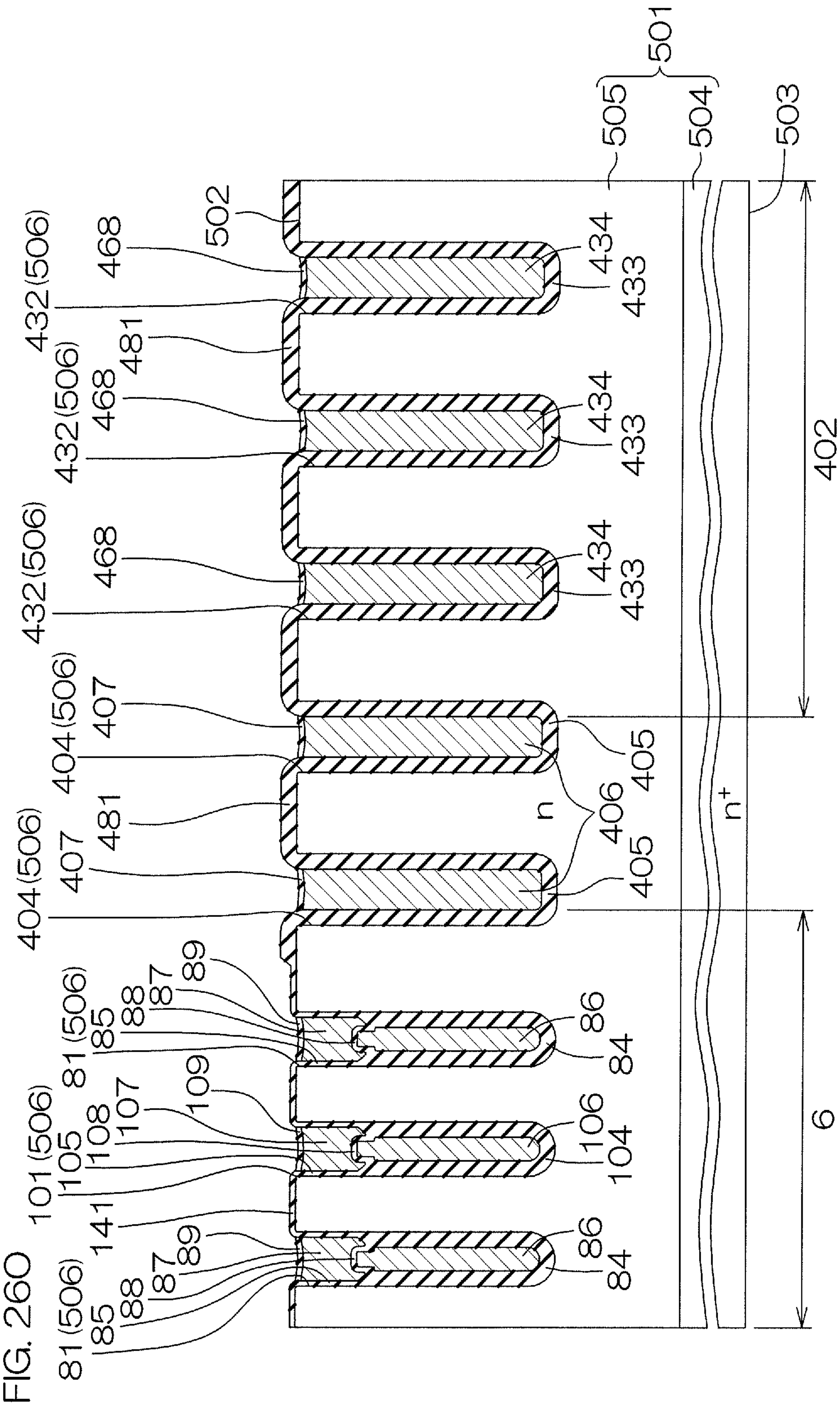
Figure 26P:
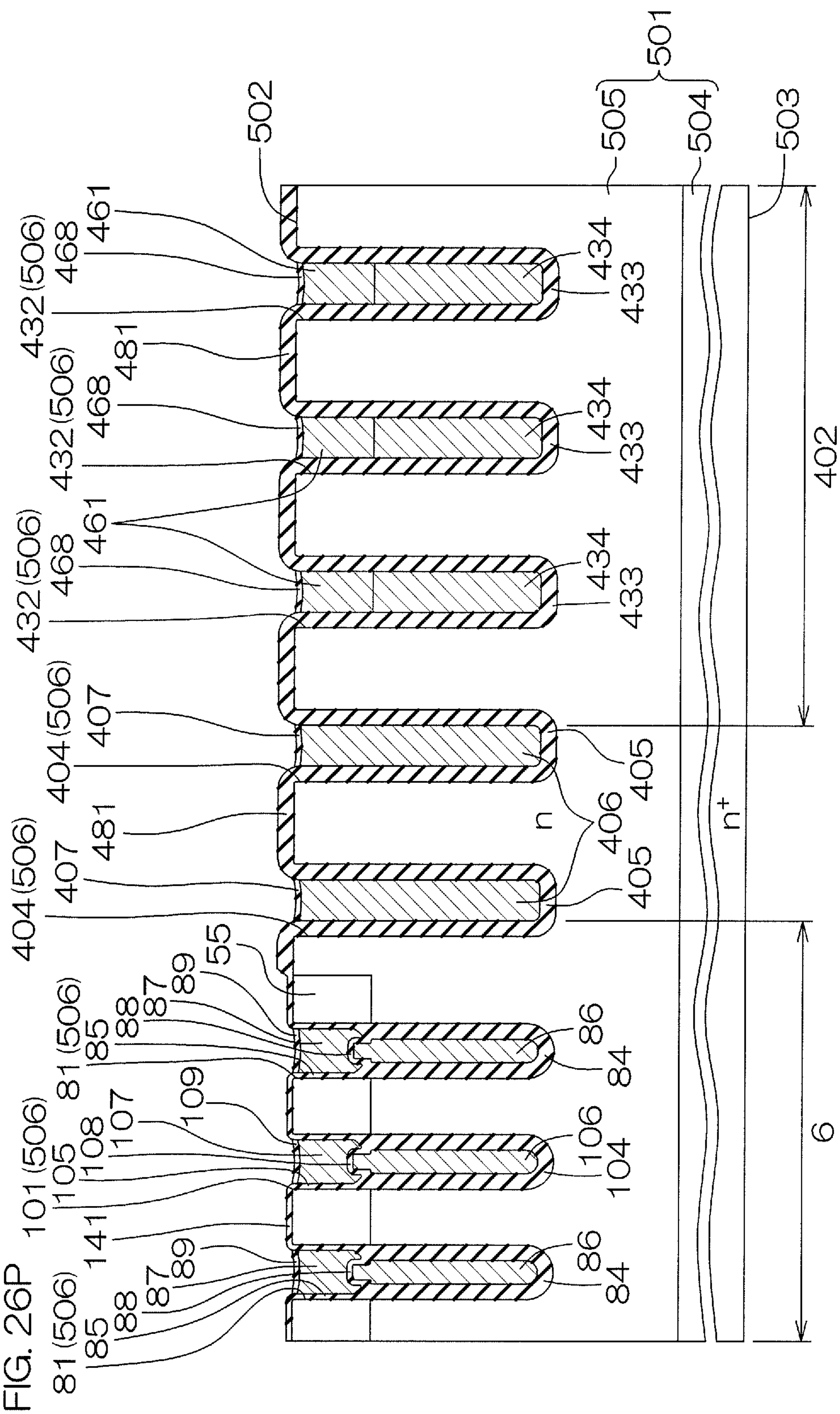
Figure 26Q:
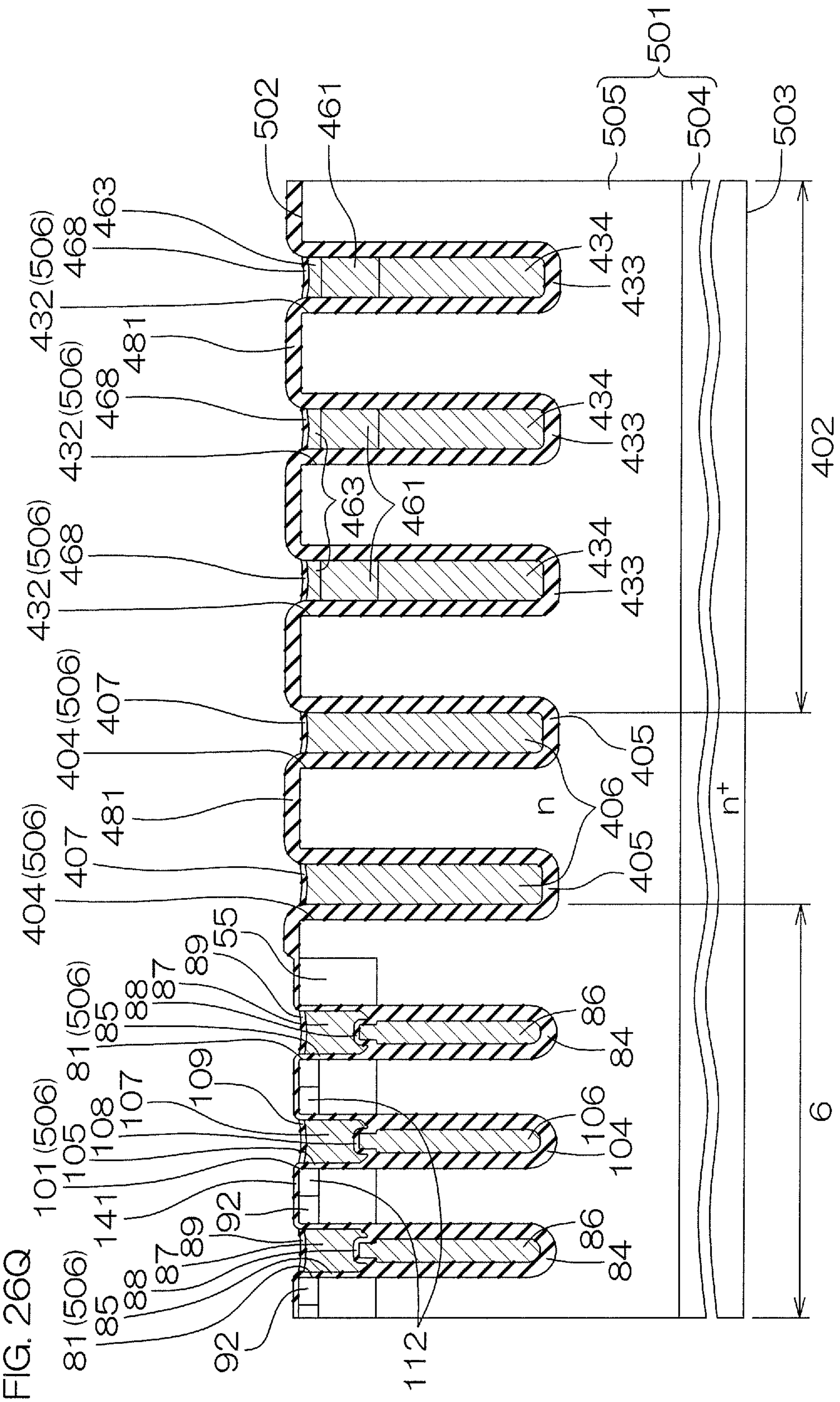
Figure 26R:
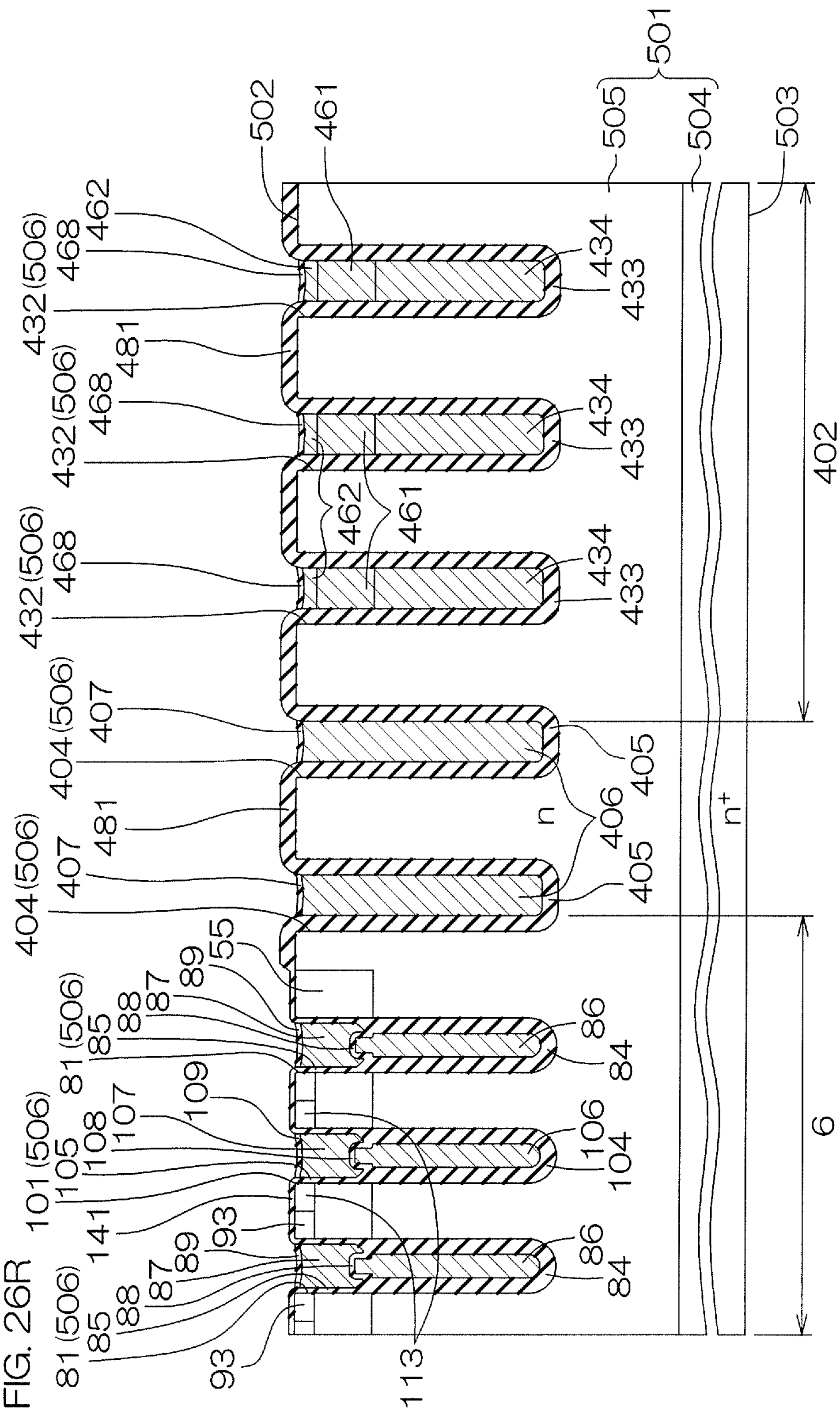
Figure 26S:
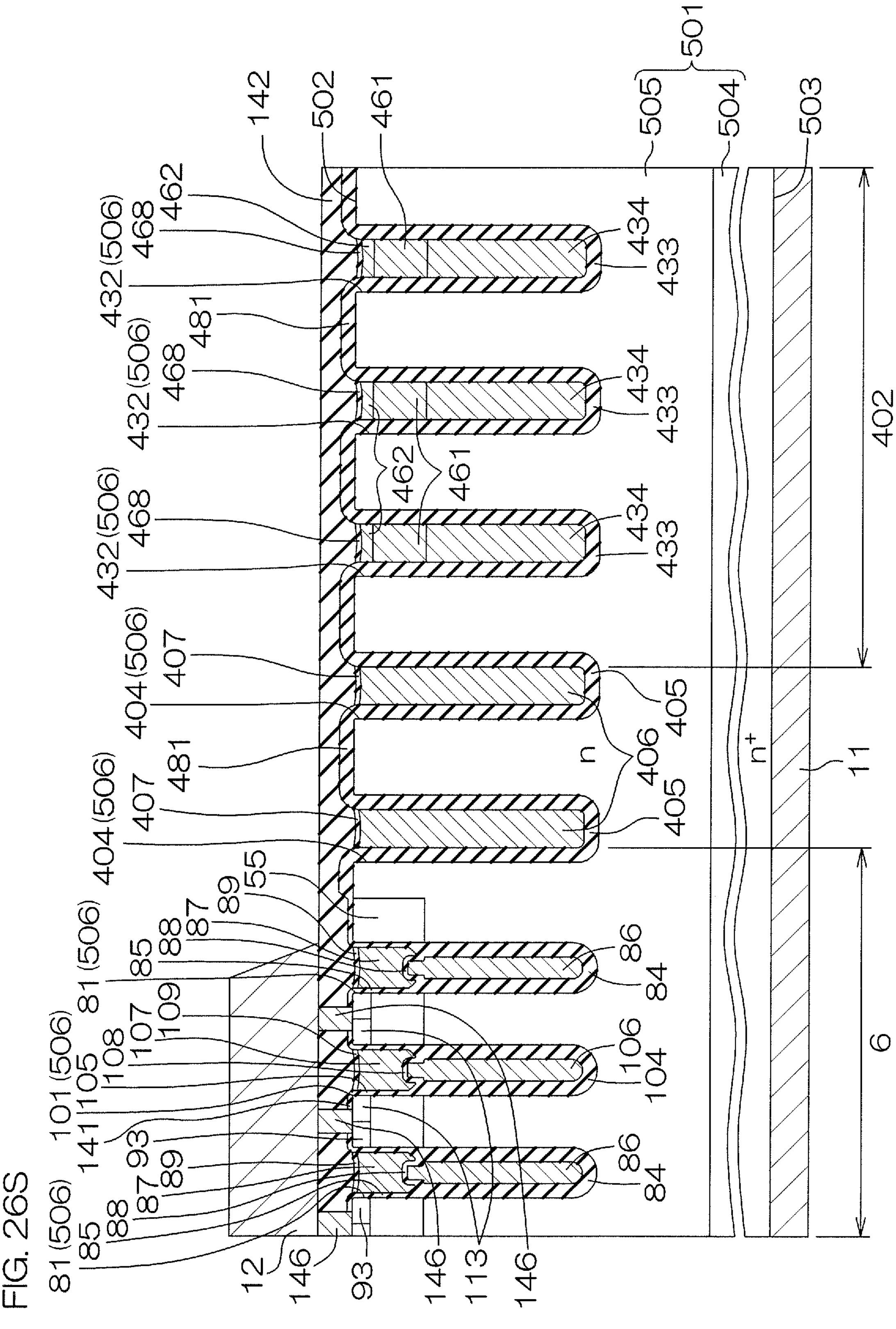

FIG. 26A to FIG. 26S are each a sectional view which shows an example of a method for manufacturing the semiconductor device 1 shown in FIG. 1. FIG. 26A to FIG. 26S are each a schematic view which collectively shows the temperature-sensitive diode structure 431, the region separation structure 401, and the first trench gate structure 60 (second trench gate structure 70) and which is not a sectional view showing a particular site.

With reference to FIG. 26A, a semiconductor wafer layer 501 is prepared. The semiconductor wafer layer 501 includes a first wafer main surface 502 and a second wafer main surface 503. The first wafer main surface 502 and the second wafer main surface 503 correspond respectively to the first main surface 3 and the second main surface 4 of the semiconductor layer 2.

The semiconductor wafer layer 501 has a laminated structure which includes a semiconductor wafer 504 and an epitaxial layer 505. The first wafer main surface 502 is formed by the epitaxial layer 505. The second wafer main surface 503 is formed by the semiconductor wafer 504. The epitaxial layer 505 is formed by epitaxially growing silicon from a main surface of the semiconductor wafer 504. The semiconductor wafer 504 and the epitaxial layer 505 correspond respectively to the semiconductor substrate 51 and the epitaxial layer 52.

With reference to FIG. 26B, a plurality of trenches 506 are formed in the first wafer main surface 502. The plurality of trenches 506 include the first gate trench 81, the second gate trench 101, the contact trench 131, the separation trench 404, the anode trench 412, the cathode trench 422, and the diode trench 432.

The plurality of trenches 506 are formed by removing unnecessary portions of the first wafer main surface 502 by an etching method via a resist mask (not shown). The etching method may be a wet etching method and/or a dry etching method.

With reference to FIG. 26C, a first base insulation layer 507 is formed on the first wafer main surface 502. The first base insulation layer 507 is formed in a film shape along the first wafer main surface 502 and inner walls of the plurality of trenches 506. The first base insulation layer 507 may be formed by a CVD (Chemical Vapor Deposition) method or an oxidation treatment method. In this embodiment, the first base insulation layer 507 is formed by a heat oxidation treatment method.

With reference to FIG. 26D, a first polysilicon layer 508 is formed on the first wafer main surface 502. The first polysilicon layer 508 fills the plurality of trenches 506 to cover the first wafer main surface 502. The first polysilicon layer 508 may be formed by a CVD method.

With reference to FIG. 26E, a hard mask 509 is formed in the first polysilicon layer 508. In this embodiment, the hard mask 509 is composed of silicon oxide (specifically, TEOS). The hard mask 509 may be formed by a CVD method (for example, a plasma CVD method).

With reference to FIG. 26F, the hard mask 509 is patterned in a predetermined shape. The hard mask 509 covers the plurality of diode trenches 432 and exposes other regions. Unnecessary portions of the hard mask 509 may be removed by an etching method via a resist mask (not shown). The etching method may be a wet etching method and/or a dry etching method.

With reference to FIG. 26G, an n-type impurity is introduced to the first polysilicon layer 508. As an example of the n-type impurity, phosphorus may be introduced to the first polysilicon layer 508 by a phosphorus deposition method via the hard mask 509.

Thereby, parts which are embedded into the first gate trench 81, the second gate trench 101, the contact trench 131, the separation trench 404, the anode trench 412, and the cathode trench 422 in the first polysilicon layer 508 are made conductive. On the other hand, a part which is embedded into the diode trench 432 in the first polysilicon layer 508 is kept in a state where no impurity is doped. After the phosphorus deposition method, the hard mask 509 is removed.

With reference to FIG. 26H, unnecessary portions of the first polysilicon layer 508 are removed. The unnecessary portions of the first polysilicon layer 508 may be removed by an etching method. The etching method may be a wet etching method and/or a dry etching method. The unnecessary portions of the first polysilicon layer 508 are removed until the first base insulation layer 507 is exposed.

Thereby, the contact electrode 133 is formed inside the contact trench 131. Also, the separation electrode 406 is formed inside the separation trench 404. Also, the anode wiring electrode 414 is formed inside the anode trench 412. Also, the cathode wiring electrode 424 is formed inside the cathode trench 422. Also, the polysilicon layer 434 is formed inside the diode trench 432.

With reference to FIG. 26I, unnecessary portions of the first polysilicon layer 508 inside the first gate trench 81 and that inside the second gate trench 101 are further removed. The unnecessary portions of the first polysilicon layer 508 may be removed by an etching method via a resist mask (not shown). The etching method may be a wet etching method and/or a dry etching method.

The unnecessary portions of the first polysilicon layer 508 are removed until an etched surface of the first polysilicon layer 508 reaches an intermediate portion of the first gate trench 81 and that of the second gate trench 101 in a depth direction. The first bottom-side electrode 86 is thereby formed inside the first gate trench 81. Further, the second bottom-side electrode 106 is formed inside the second gate trench 101.

With reference to FIG. 26J, unnecessary portions of the first base insulation layer 507 are removed. The unnecessary portion of the first base insulation layer 507 may be removed by an etching method. The etching method may be a wet etching method and/or a dry etching method.

Thereby, the first base insulation layer 507 is divided into the first bottom-side insulation layer 84, the second bottom-side insulation layer 104, the contact insulation layer 132, the separation insulation layer 405, the anode insulation layer 413, the cathode insulation layer 423, the diode insulation layer 433, and the field insulation layer 481.

With reference to FIG. 26K, a plurality of insulation layers 510 are formed. The plurality of insulation layers 510 include the first opening-side insulation layer 85, the first intermediate insulation layer 88, the second opening-side insulation layer 105, the second intermediate insulation layer 108, the third cap insulation layer 139, the main surface insulation layer 141, the fourth cap insulation layer 407, the fifth cap insulation layer 419, the sixth cap insulation layer 429, and the seventh cap insulation layer 468. The plurality of insulation layers 510 may be formed by a CVD method or an oxidation treatment method. The plurality of insulation layers 510 are, in this embodiment, formed by a heat oxidation treatment method.

With reference to FIG. 26L, a second polysilicon layer 511 is formed in the first wafer main surface 502. The second polysilicon layer 511 fills the first gate trench 81 and the second gate trench 101 to cover the first wafer main surface 502. The second polysilicon layer 511 may be formed by a CVD method.

With reference to FIG. 26M, an n-type impurity is introduced to the second polysilicon layer 511. As an example of the n-type impurity, phosphorus may be introduced to the second polysilicon layer 511 by a phosphorus deposition method. Thereby, the second polysilicon layer 511 is made conductive.

With reference to FIG. 26N, unnecessary portions of the second polysilicon layer 511 are removed. The unnecessary portions of the second polysilicon layer 511 may be removed by an etching method. The etching method may be a wet etching method and/or a dry etching method.

The unnecessary portions of the second polysilicon layer 511 are removed until the main surface insulation layer 141 is exposed. Thereby, the first opening-side electrode 87 is formed inside the first gate trench 81. Further, the second opening-side electrode 107 is formed inside the second gate trench 101.

With reference to FIG. 26O, the first cap insulation layer 89 and the second cap insulation layer 109 are formed. The first cap insulation layer 89 and the second cap insulation layer 109 may be formed by a CVD method or an oxidation treatment method. In this embodiment, the first cap insulation layer 89 and the second cap insulation layer 109 are formed by a heat oxidation treatment method.

With reference to FIG. 26P, the body region 55 and the well region 461 are formed. In this embodiment, the body region 55 and the well region 461 are formed at the same time by an ion implantation method via an ion implantation mask (not shown).

The body region 55 is formed by introducing a p-type impurity to a surface layer portion of the first wafer main surface 502 in the output region 6. The well region 461 is formed by introducing a p-type impurity to a surface layer portion of the polysilicon layer 434 inside the diode trench 432. The well region 461 may be formed by a different step by using an ion implantation mask different from that used in the body region 55.

With reference to FIG. 26Q, the first source region 92, the second source region 112, the cathode region 463, and the cathode contact region 466 are formed. In this embodiment, the first source region 92, the second source region 112, the cathode region 463, and the cathode contact region 466 are formed at the same time by an ion implantation method via an ion implantation mask (not shown).

The first source region 92 and the second source region 112 are formed by introducing an n-type impurity to the surface layer portion of the first wafer main surface 502 in the output region 6. The cathode region 463 and the cathode contact region 466 are formed by introducing an n-type impurity to the surface layer portion of the polysilicon layer 434 inside the diode trench 432.

The cathode region 463 and the cathode contact region 466 may be formed by a different step by using an ion implantation mask different from those used in the first source region 92 and the second source region 112.

With reference to FIG. 26R, the first contact region 93, the second contact region 113, the anode region 462, and the anode contact region 465 are formed. In this embodiment, the first contact region 93, the second contact region 113, the anode region 462, and the anode contact region 465 are formed at the same time by an ion implantation method via an ion implantation mask (not shown).

The first contact region 93 and the second contact region 113 are formed by introducing a p-type impurity to the surface layer portion of the first wafer main surface 502 in the output region 6. The anode region 462 and the anode contact region 465 are formed by introducing a p-type impurity to the surface layer portion of the polysilicon layer 434 inside the diode trench 432.

A step of introducing the p-type impurity (refer to FIG. 26R) and a step of introducing the n-type impurity (refer to FIG. 26Q) are performed in an arbitrary order. The step of introducing the p-type impurity may be performed before the step of introducing the n-type impurity. The step of introducing the p-type impurity and the step of introducing the n-type impurity may be performed alternately a plurality of times.

With reference to FIG. 26S, the interlayer insulation layer 142 is formed in the first wafer main surface 502. The interlayer insulation layer 142 may be formed by a CVD method. Next, the first plug electrode 143, the second plug electrode 144, the third plug electrode 145, the fourth plug electrode 146, the cathode wiring plug electrode 483, the anode plug electrode 484, and the cathode plug electrode 485 are embedded in the interlayer insulation layer 142.

In this step, first, in the interlayer insulation layer 142, regions into which the first plug electrode 143, the second plug electrode 144, the third plug electrode 145, the fourth plug electrode 146, the cathode wiring plug electrode 483, the anode plug electrode 484, and the cathode plug electrode 485 are to be embedded are removed. Unnecessary portions of the interlayer insulation layer 142 may be removed by an etching method via a resist mask (not shown). The etching method may be a wet etching method and/or a dry etching method.

Next, tungsten is embedded in a plurality of openings formed in the interlayer insulation layer 142. Thereby, the first plug electrode 143, the second plug electrode 144, the third plug electrode 145, the fourth plug electrode 146, the cathode wiring plug electrode 483, the anode plug electrode 484, and the cathode plug electrode 485 are formed.

Next, the drain electrode 11, the source electrode 12, the input electrode 13, the reference voltage electrode 14, the ENABLE electrode 15, the SENSE electrode 16, the gate control wiring 17, the first wiring 486, the second wiring 487, and the third wiring 488 are formed. The drain electrode 11, the source electrode 12, the input electrode 13, the reference voltage electrode 14, the ENABLE electrode 15, the SENSE electrode 16, the gate control wiring 17, the first wiring 486, the second wiring 487, and the third wiring 488 may be formed by a sputtering method and/or a CVD method.

Thereafter, the semiconductor wafer layer 501 is selectively cut and the plurality of semiconductor devices 1 are cut out. After the steps including the above, the semiconductor device 1 is formed.

Figure 27:
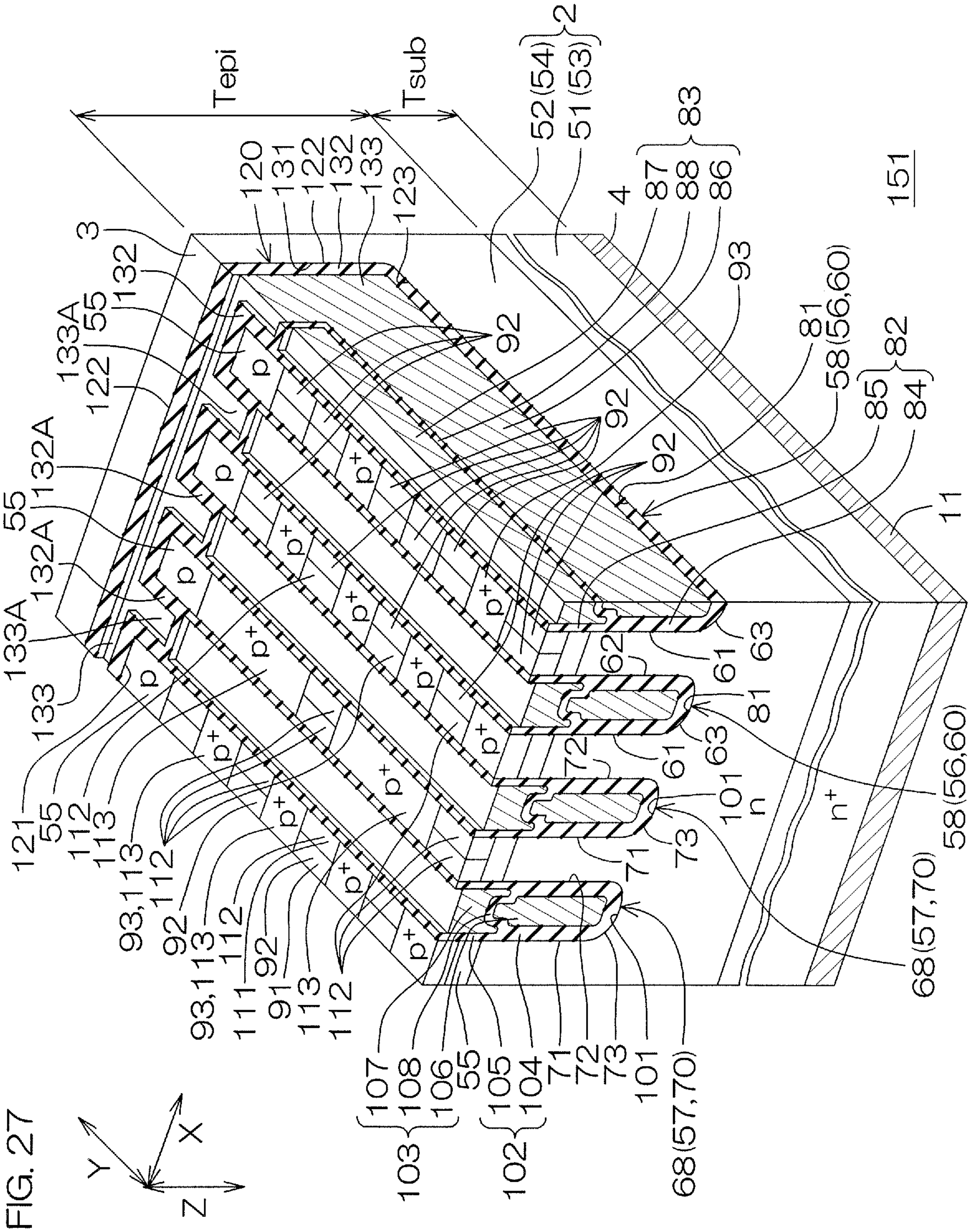
FIG. 27 is a sectional perspective view of a region corresponding to FIG. 7 and is a perspective view which shows a semiconductor device according to a second preferred embodiment of the present invention.

FIG. 27 is a sectional perspective view of a region corresponding to FIG. 7 and is a perspective view which shows a semiconductor device 151 according to the second preferred embodiment of the present invention. Hereinafter, structures corresponding to the structures described for the semiconductor device 1 shall be provided with the same reference symbols and description thereof shall be omitted.

In the semiconductor device 1, the plurality of first FET structures 58 and the plurality of second FET structures 68 are formed in the manner that one first FET structure 58 and one second FET structure 68 are alternately arrayed. In contrast thereto, in the semiconductor device 151, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, in the semiconductor device 1, the second channel rate R2 (second channel area S2) is substantially equal to the first channel rate R1 (first channel area S1). In contrast thereto, in the semiconductor device 151, the second channel rate R2 is different from the first channel rate R1 (R1≠R2). Specifically, the second channel rate R2 is less than the first channel rate R1 (R2<R1). Hereinafter, a specific description will be given of a structure of the semiconductor device 151.

With reference to FIG. 27, in this embodiment, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT which are different in value from each other are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 60% to not more than 80% as an example. In this embodiment, the first total channel rate RT1 is adjusted to 75%. In the first total channel rate RT1, the first channel rate R1 on one side and the first channel rate R1 on the other side are each 37.5%.

The second total channel rate RT2 is applied to the region between one first FET structure 58 and one second FET structure 68 which are adjacent to each other. A first channel region 91 and a second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%. Other structures of the semiconductor device 151 are similar to those of the semiconductor device 1. In this embodiment, control which shall be described hereinafter is performed.

Figure 28A:
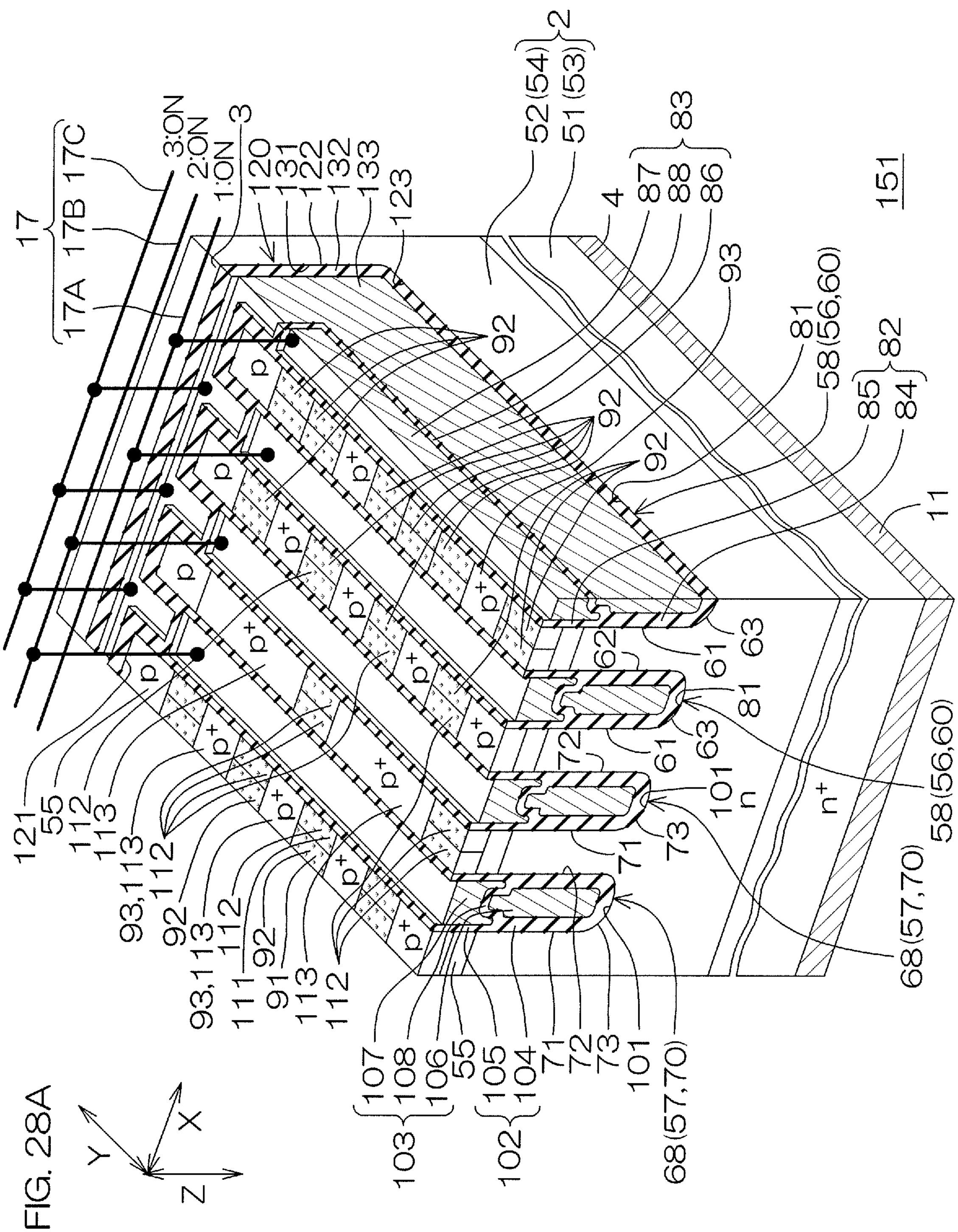
FIG. 28A is a sectional perspective view for describing a normal operation according to a first control example of the semiconductor device shown in FIG. 27.
Figure 28B:
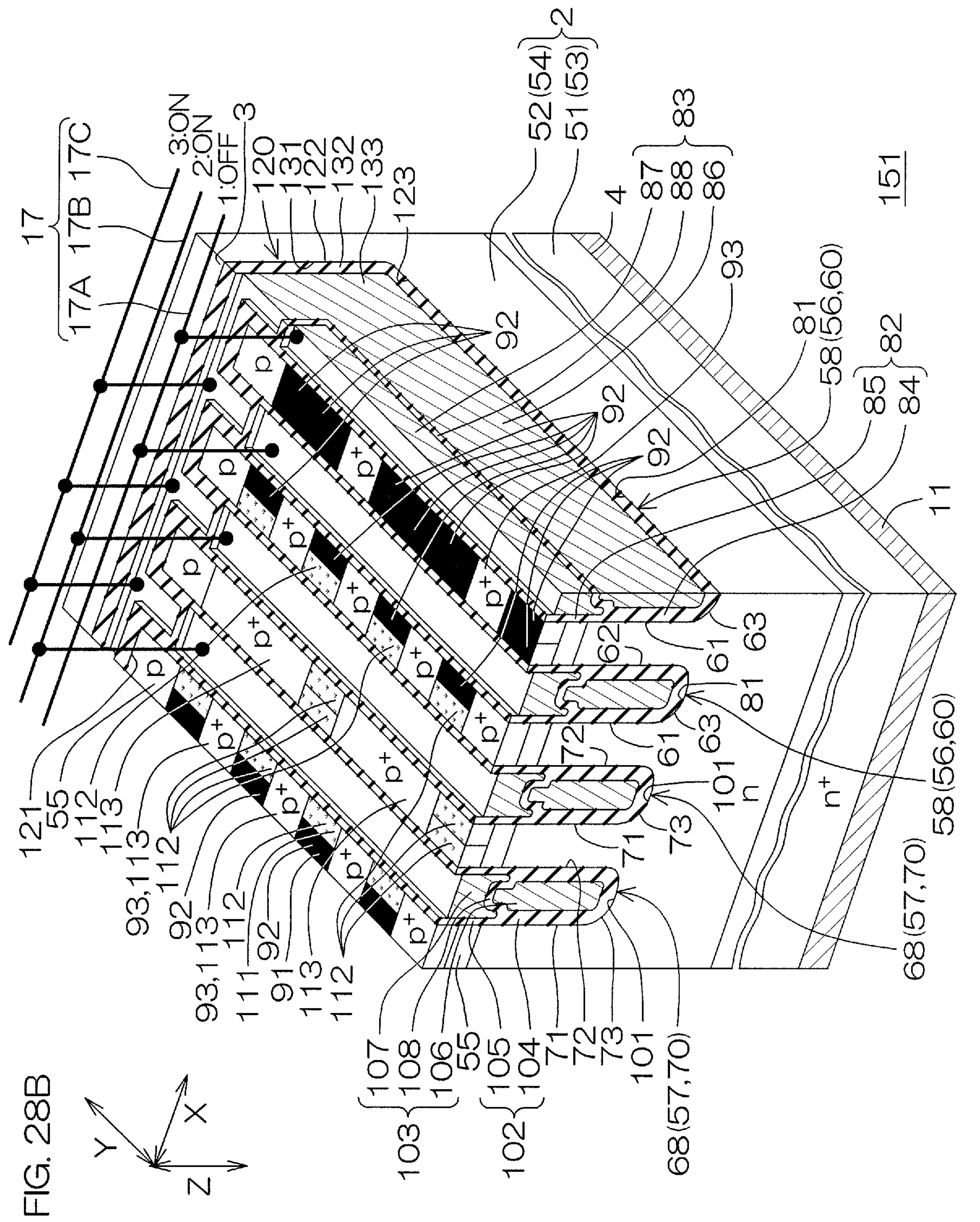
FIG. 28B is a sectional perspective view for describing an active clamp operation according to the first control example of the semiconductor device shown in FIG. 27.

FIG. 28A is a sectional perspective view for describing the normal operation according to a first control example of the semiconductor device 151 shown in FIG. 1. FIG. 28B is a sectional perspective view for describing the active clamp operation according to the first control example of the semiconductor device 151 shown in FIG. 1. In FIG. 28A and FIG. 28B, for convenience of description, structure in the first main surface 3 are omitted to simplify a gate control wiring 17.

With reference to FIG. 28A, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have a substantially equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 28A, the first channel region 91 and the second channel region 111 in the ON states are indicated by dotted hatching.

As a result, a first MISFET 56 and a second MISFET 57 are both driven (Full-ON control). The channel utilization rate Ru in the normal operation is 100%. The characteristics channel rate RC in the normal operation is 50%. Thereby, the area resistivity Ron·A approaches the area resistivity Ron·A shown by a second plot point P2 in the graph of FIG. 13.

On the other hand, with reference to FIG. 28B, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have a substantially equal voltage. The first clamp ON signal VCon1 and the second clamp ON signal VCon2 may each have a voltage not more than or less than a voltage in the normal operation.

In this case, the first opening-side electrode 87 is put into the OFF state, and the second opening-side electrode 107, the first bottom-side electrode 86, and the second bottom-side electrode 106 are put into the ON states. Thereby, the first channel region 91 is controlled to be in the OFF state, and the second channel region 111 is controlled to be in the ON state. In FIG. 28B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the first channel region 91 having the first channel rate R1 (R2<R1) in excess of the second channel rate R2 is controlled to be in the OFF state, and the channel utilization rate RU in the active clamp operation therefore becomes less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 29A:
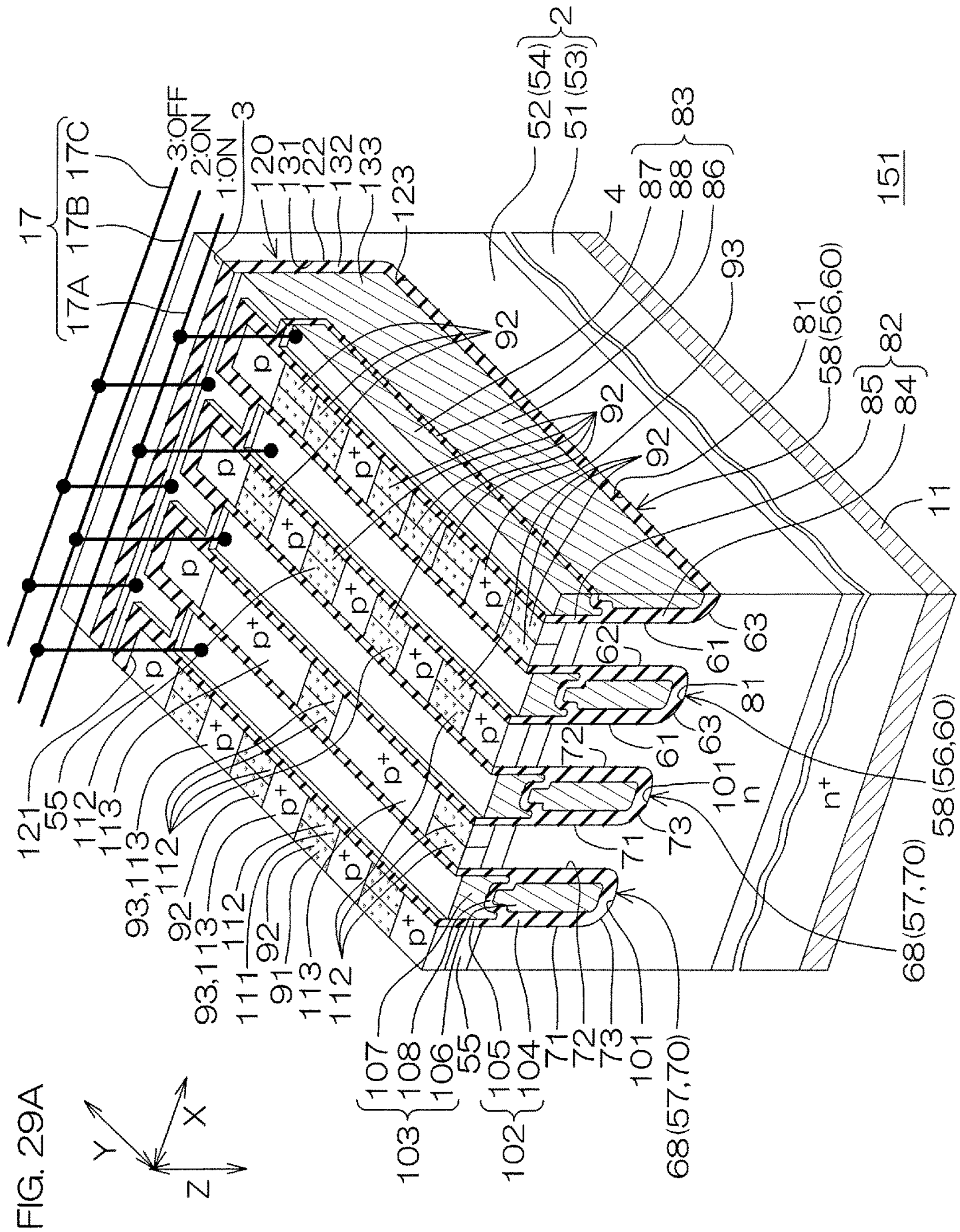
FIG. 29A is a sectional perspective view for describing a normal operation according to a second control example of the semiconductor device shown in FIG. 27.
Figure 29B:
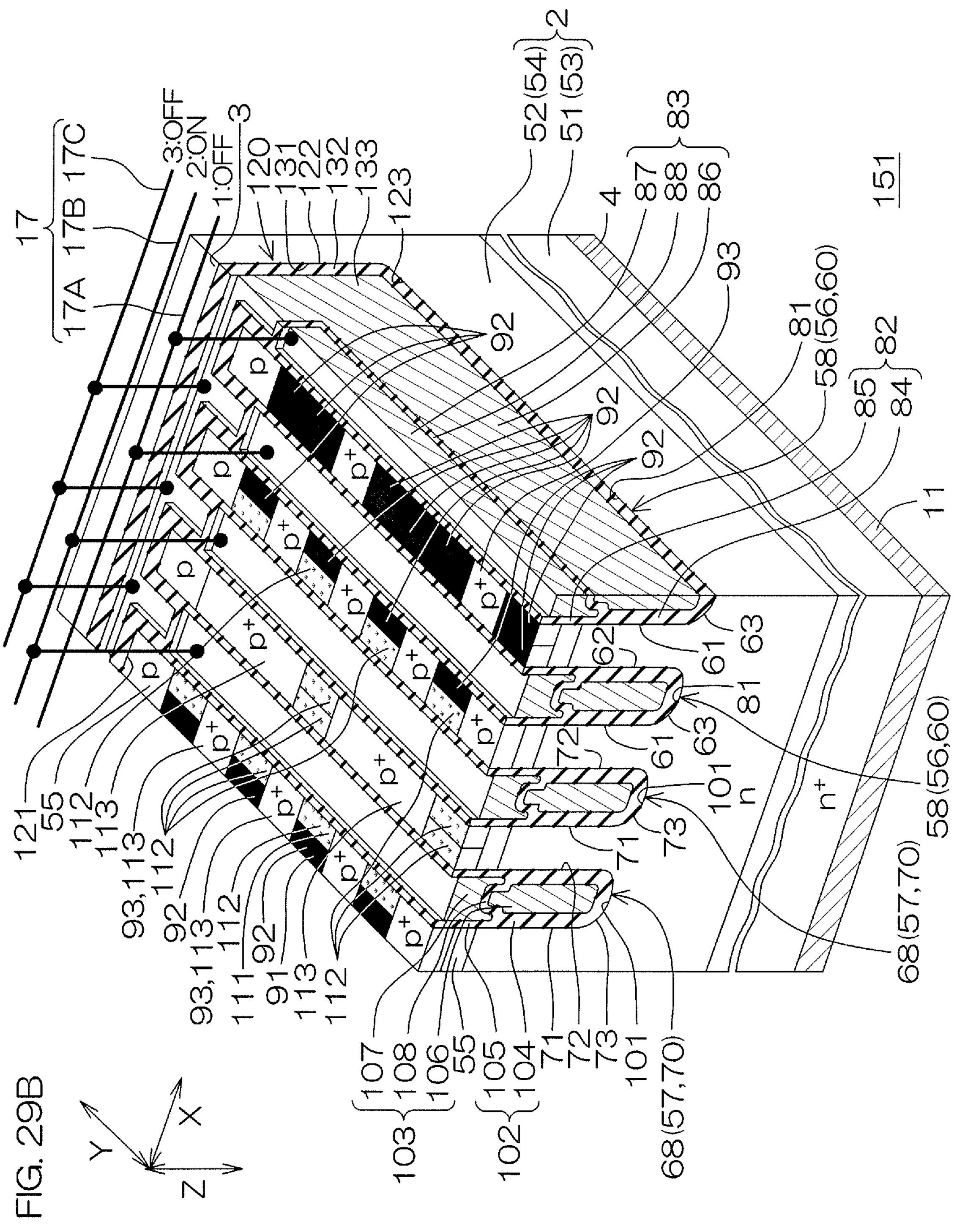
FIG. 29B is a sectional perspective view for describing an active clamp operation according to the second control example of the semiconductor device shown in FIG. 27.

FIG. 29A is a sectional perspective view for describing the normal operation according to a second control example of the semiconductor device 151 shown in FIG. 27. FIG. 29B is a sectional perspective view for describing the active clamp operation according to the second control example of the semiconductor device 151 shown in FIG. 27. In FIG. 29A and FIG. 29B, for convenience of description, structures in the first main surface 3 are omitted to simplify a gate control wiring 17.

With reference to FIG. 29A, when the power MISFET 9 is in the normal operation, a first ON signal Von1 is input to the first gate control wiring 17A, a second ON signal Von2 is input to the second gate control wiring 17B, and the OFF signal Voff is input to the third gate control wiring 17C.

The first ON signal Von1, the second ON signal Von2, and the OFF signal Voff are each input from the control IC 10. The first ON signal Von1 and the second ON signal Von2 each have a voltage not less than the gate threshold voltage Vth. The first ON signal Von1 and the second ON signal Von2 may each have a substantially equal voltage. The OFF signal Voff may be the reference voltage.

In this case, the first opening-side electrode 87 and the second opening-side electrode 107 are each put into the ON state, and the first bottom-side electrode 86 and the second bottom-side electrode 106 are each put into the OFF state. That is, while the first opening-side electrode 87 and the second opening-side electrode 107 each function as a gate electrode, the first bottom-side electrode 86 and the second bottom-side electrode 106 each function as a field electrode.

Thereby, the first channel region 91 and the second channel region 111 are both controlled to be in the ON states. In FIG. 29A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 29B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 may be the reference voltage.

In this case, the first opening-side electrode 87, the first bottom-side electrode 86, and the second bottom-side electrode 106 are each put into the OFF state, and the second opening-side electrode 107 is put into the ON state. Thereby, the first channel region 91 is controlled to be in the OFF state, and the second channel region 111 is controlled to be in the ON state. In FIG. 29B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the first channel region 91 having the first channel rate R1 (R2<R1) in excess of the second channel rate R2 is controlled to be in the OFF state, and the channel utilization rate RU in the active clamp operation therefore becomes less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 30A:
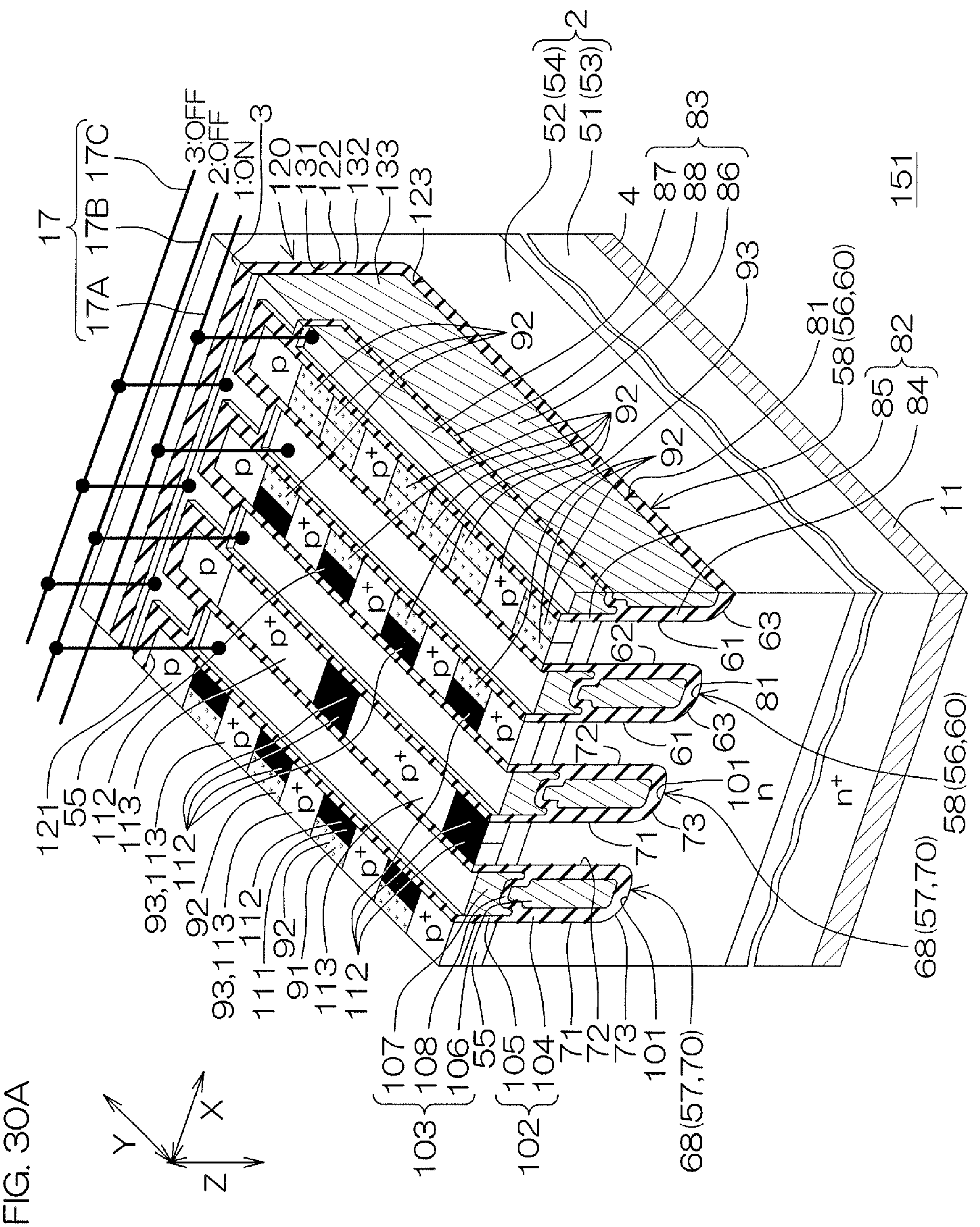
FIG. 30A is a sectional perspective view for describing a normal operation according to a third control example of the semiconductor device shown in FIG. 27.
Figure 30B:
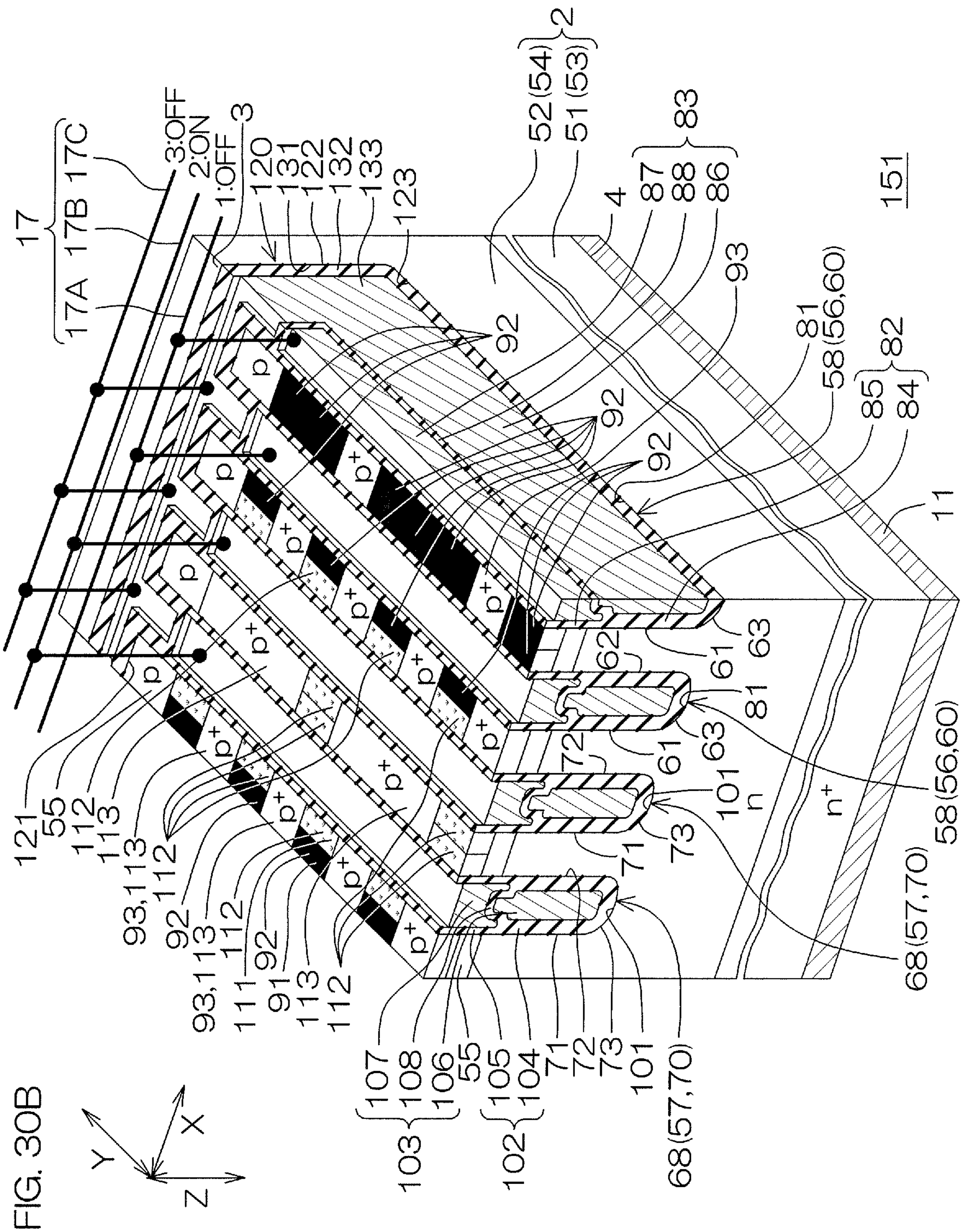
FIG. 30B is a sectional perspective view for describing an active clamp operation according to the third control example of the semiconductor device shown in FIG. 27.

FIG. 30A is a sectional perspective view for describing the normal operation according to a third control example of the semiconductor device 151 shown in FIG. 27. FIG. 30B is a sectional perspective view for describing the active clamp operation according to the third control example of the semiconductor device 151 shown in FIG. 27. In FIG. 30A and FIG. 30B, for convenience of description, structures in the first main surface 3 are omitted to simplify a gate control wiring 17.

With reference to FIG. 30A, when the power MISFET 9 is in the normal operation, an ON signal Von is input to the first gate control wiring 17A, a first OFF signal Voff1 is input to the second gate control wiring 17B, and a second OFF signal Voff2 is input to the third gate control wiring 17C.

The ON signal Von, the first OFF signal Voff1, and the second OFF signal Voff2 are each input from the control IC 10. The ON signal Von has a voltage not less than the gate threshold voltage Vth. The first OFF signal Voff1 and the second OFF signal Voff2 may each have a voltage (for example, reference voltage) less than the gate threshold voltage Vth.

In this case, the first opening-side electrode 87 is put into the ON state, and the first bottom-side electrode 86, the second bottom-side electrode 106, and the second opening-side electrode 107 are each put into the OFF state. That is, while the first opening-side electrode 87 functions as a gate electrode, the first bottom-side electrode 86 and the second bottom-side electrode 106 each function as a field electrode.

Thereby, the first channel region 91 is controlled to be in the ON state, and the second channel region 111 is controlled to be in the OFF state. In FIG. 30A, the first channel region 91 in the ON state is indicated by dotted hatching, and the second channel region 111 in the OFF state is indicated by filled hatching.

As a result, while the first MISFET 56 is controlled to be in the ON state, the second MISFET 57 is controlled to be in the OFF state (first Half-ON control). Thereby, the second channel region 111 having the second channel rate R2 (R2<R1) less than the first channel rate R1 is controlled to be in the OFF state, and the characteristics channel rate RC in the normal operation therefore becomes less than the average channel rate RAV.

The channel utilization rate RU in the normal operation is 62.5%. Further, the characteristics channel rate RC in the normal operation is 31.25%. Thereby, the area resistivity Ron·A approaches the area resistivity Ron·A indicated by the third plot point P3 in the graph of FIG. 13.

On the other hand, with reference to FIG. 30B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 may be the reference voltage.

In this case, the second opening-side electrode 107 is put into the ON state, and the first bottom-side electrode 86, the first opening-side electrode 87, and the second bottom-side electrode 106 are each put into the OFF state. That is, while the second opening-side electrode 107 functions as a gate electrode, the first bottom-side electrode 86 and the second bottom-side electrode 106 each function as a field electrode.

Thereby, the first channel region 91 is controlled to be in the OFF state, and the second channel region 111 is controlled to be in the ON state. In FIG. 30B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the first channel region 91 having the first channel rate R1 (R2<R1) in excess of the second channel rate R2 is controlled to be in the OFF state, and the channel utilization rate RU in the active clamp operation therefore becomes in excess of zero and less than the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the second plot point P2 in the graph of FIG. 13 or exceeds the active clamp capability Eac.

In the third control example, in the normal operation and in the active clamp operation, the OFF signal Voff is input to the third gate control wiring 17C. However, in the normal operation and in the active clamp operation, the ON signal Von may be input to the third gate control wiring 17C.

As described above, the same effects as those described for the semiconductor device 1 can be exhibited as well by the semiconductor device 151. In particular, according to the semiconductor device 151, the second channel rate R2 is different from the first channel rate R1 (R1≠R2). Specifically, the second channel rate R2 is less than the first channel rate R1 (R1>R2).

In the above-described structure, the control IC 10 controls the first MISFET 56 and the second MISFET 57 such that the channel utilization rate RU in the active clamp operation becomes in excess of zero and less than the channel utilization rate RU in the normal operation. Specifically, the control IC 10 controls the first channel region 91 to be in the OFF state and controls the second channel region 111 to be in the ON state in the active clamp operation. Thereby, it is possible to enhance the effects of improving the active clamp capability Eac.

Further, according to the semiconductor device 151, as shown in the third control example, the first Half-ON control can be applied in the normal operation and the second Half-ON control can be applied in the active clamp operation. Further, according to the semiconductor device 151, the second Half-ON control can be applied in the normal operation and the first Half-ON control can be applied in the active clamp operation.

Therefore, according to the semiconductor device 151, by only changing a control pattern, it becomes possible to realize various types of area resistivity Ron·A and active clamp capability Eac, while having the same average channel rate RAV.

Further, in the semiconductor device 151, in a manner that the group of the plurality (in this embodiment, two) of first FET structures 58 and the group of the plurality (in this embodiment, two) of second FET structures 68 are alternately arrayed, the plurality of first FET structures 58 and the plurality of second FET structures 68 are formed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 31:
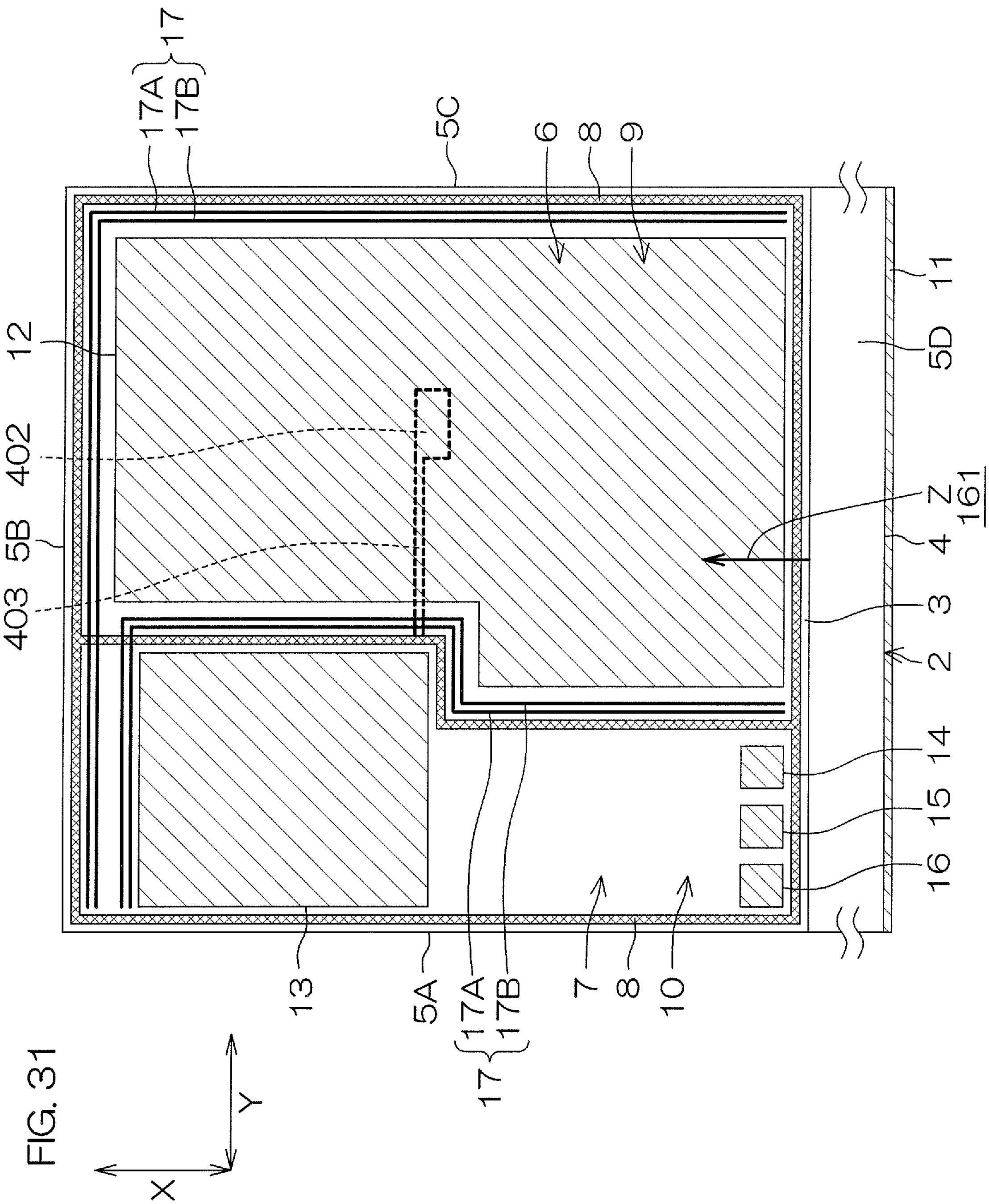
FIG. 31 is a perspective view of the semiconductor device according to the third preferred embodiment of the present invention which is viewed from one direction.
Figure 32:
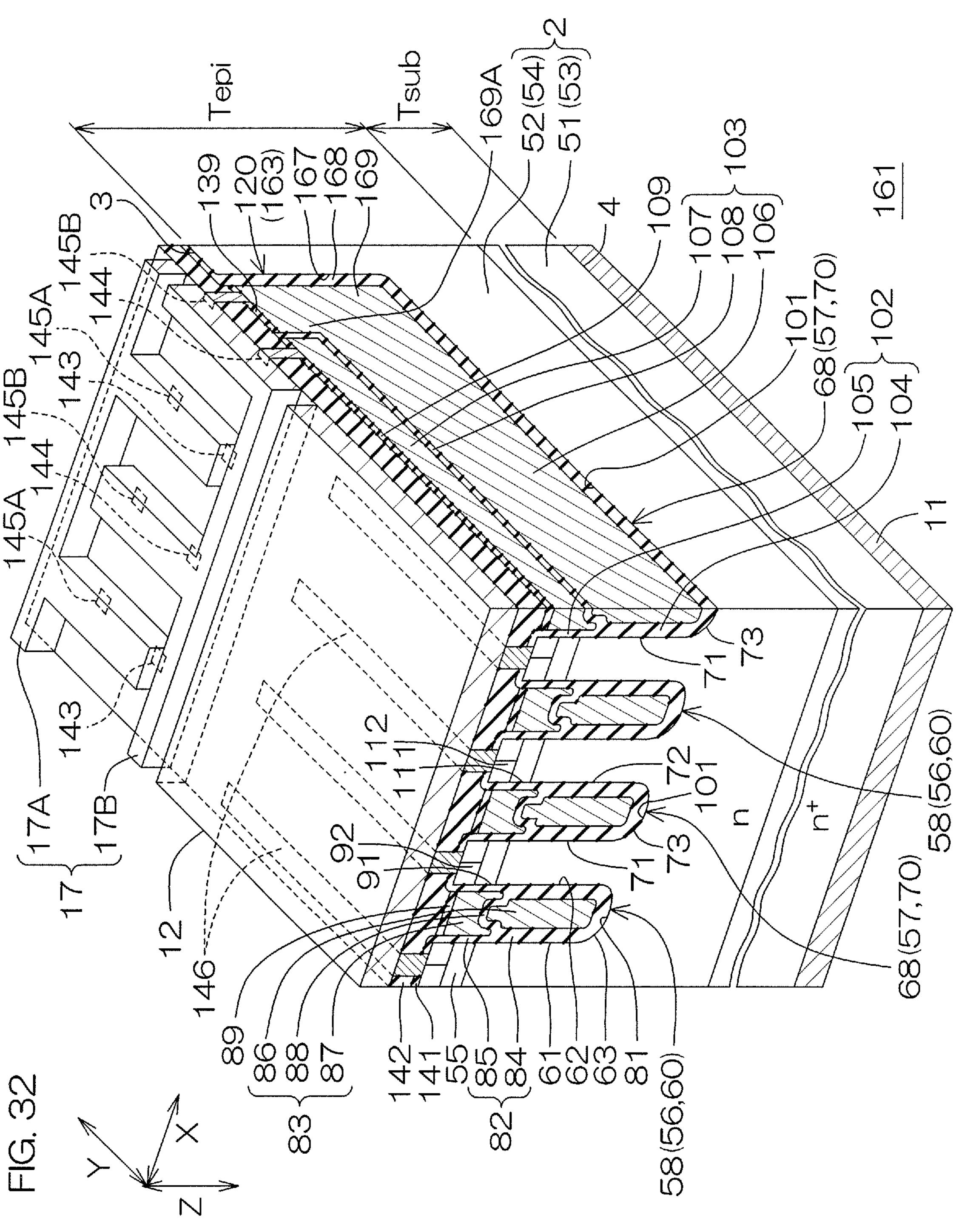
FIG. 32 is a sectional perspective view of a region XXXII shown in FIG. 31.
Figure 33:
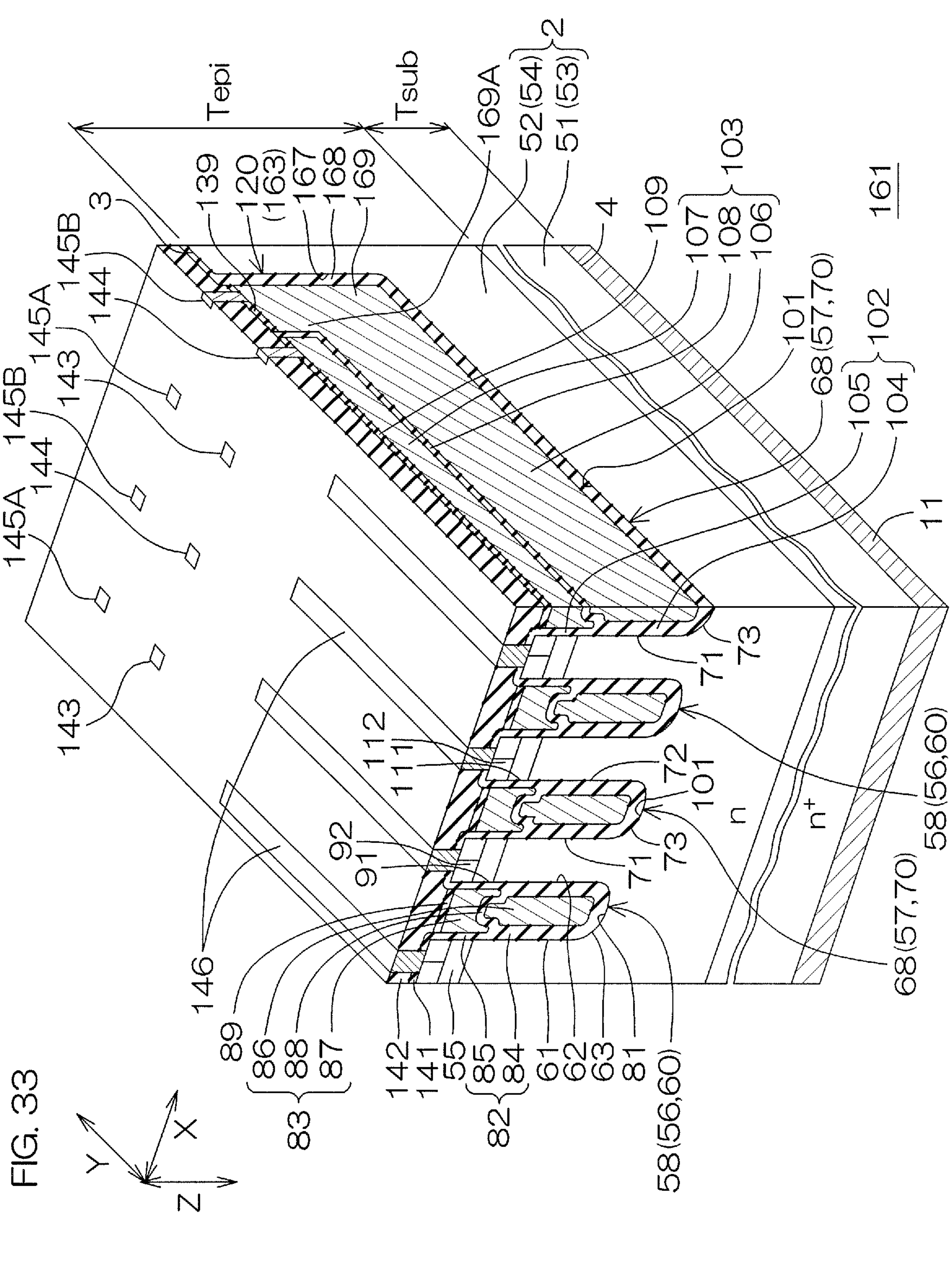
FIG. 33 is a sectional perspective view in which an electrode is removed from FIG. 32.
Figure 34:
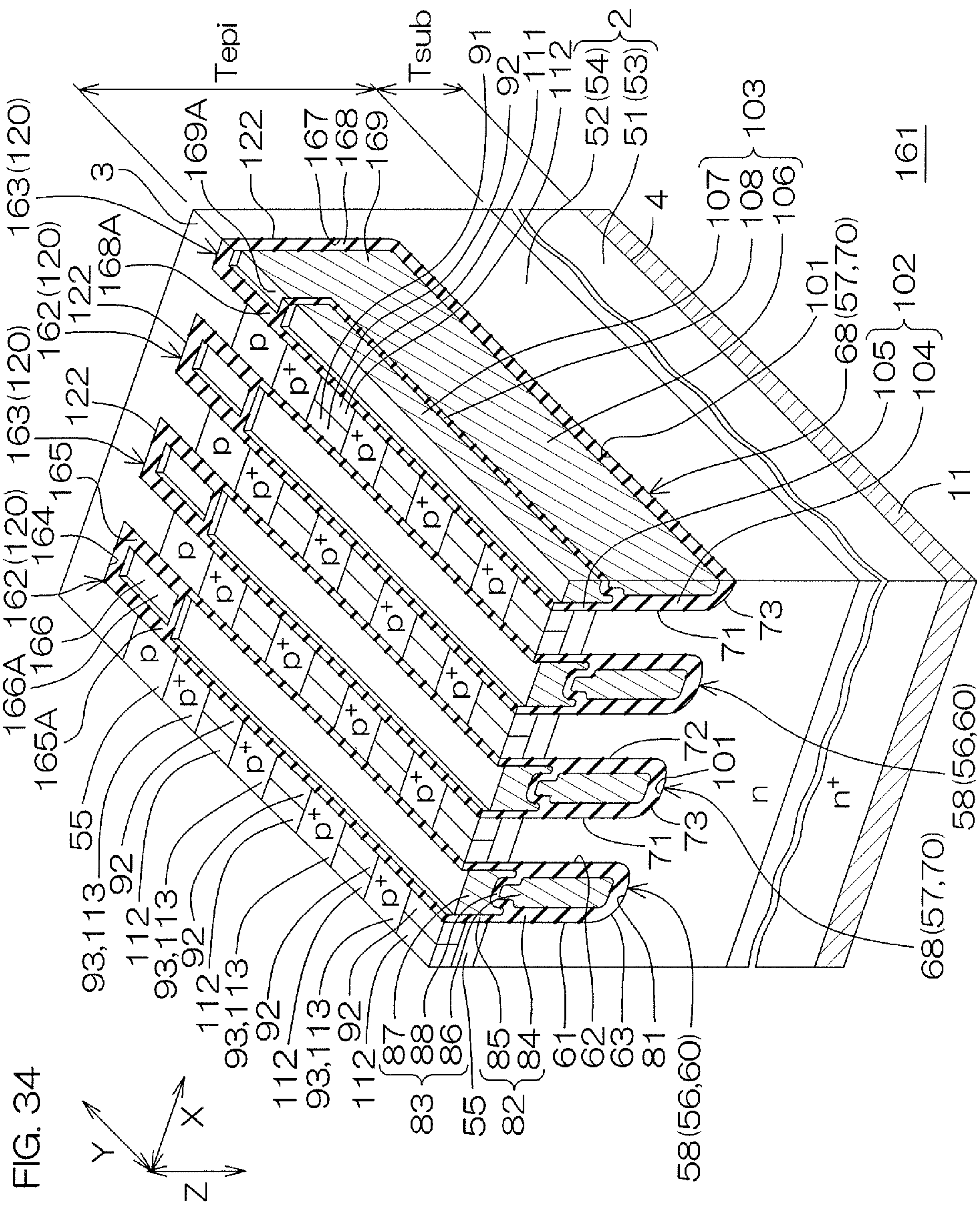
FIG. 34 is a sectional perspective view in which structures on the semiconductor layer are removed from FIG. 33.

FIG. 31 is a perspective view of a semiconductor device 161 according to a third preferred embodiment of the present invention which is viewed from one direction. FIG. 32 is a sectional perspective view of a region XXXII shown in FIG. 31. FIG. 33 is a sectional perspective view in which a source electrode 12 and a gate control wiring 17 are removed from FIG. 32. FIG. 34 is a sectional perspective view in which an interlayer insulation layer 142 is removed from FIG. 33. Hereinafter, structures corresponding to the structures described for the semiconductor device 1 shall be provided with the same reference symbols and description thereof shall be omitted.

In the semiconductor device 1, the gate control wiring 17 includes the first gate control wiring 17A, the second gate control wiring 17B, and the third gate control wiring 17C. In contrast thereto, in the semiconductor device 161, the gate control wiring 17 does not have the third gate control wiring 17C and only has the first gate control wiring 17A and the second gate control wiring 17B.

Further, in the semiconductor device 1, the second bottom-side electrode 106 is electrically connected to the first bottom-side electrode 86. In contrast thereto, in the semiconductor device 161, the second bottom-side electrode 106 is electrically insulated from the first bottom-side electrode 86.

Specifically, the semiconductor device 161 includes a plurality of trench contact structures 120 which are each connected to the first trench gate structure 60 and the second trench gate structure 70 in a manner that the first trench gate structure 60 and the second trench gate structure 70 are electrically insulated from each other.

A region which is at the side of the other end portion side of a first FET structure 58 and at the side of the other end portion side of a second FET structure 68 are similar in structure to a region which is at the side of one end portion of the first FET structure 58 and at the side of one end portion of the second FET structure 68. Hereinafter, a description will be given of the structure of the region which is at the side of one end portion of the first FET structure 58 and at the side of one end portion of the second FET structure 68 as an example, and a description of the structure of the region which is at the side of the other end portion side of a first FET structure 58 and at the side of the other end portion side of a second FET structure 68 shall be omitted.

With reference to FIG. 31 to FIG. 34, the plurality of trench contact structures 120 include a plurality of first trench contact structures 162 and a plurality of second trench contact structures 163. Each of the first trench contact structures 162 is connected to one end portion of corresponding one of the plurality of first trench gate structures 60 at an interval from the plurality of second trench gate structures 70. In this embodiment, the first trench contact structures 162 are connected to the corresponding first trench gate structures 60 in a one-to-one correspondence.

Each of the second trench contact structures 163 is connected to one end portion of corresponding one of the plurality of second trench gate structures 70 at an interval from the plurality of first trench gate structures 60. In this embodiment, the second trench contact structures 163 are connected to the corresponding second trench gate structures 70 in a one-to-one correspondence.

Each of the first trench contact structure 162 includes a first contact trench 164, a first contact insulation layer 165, and a first contact electrode 166. The first contact trench 164, the first contact insulation layer 165, and the first contact electrode 166 correspond respectively to the contact trench 131, the contact insulation layer 132, and the contact electrode 133 aforementioned.

The first contact trench 164 communicates with one end portion of a first gate trench 81. With respect to the first direction X, a width WTC1 of the first contact trench 164 is substantially equal to a first width WT1 of the first gate trench 81 (WTC1=WT1). The first contact trench 164 forms, with the first gate trench 81, one trench which extends along the second direction Y.

The first contact insulation layer 165 is integrally formed with the first insulation layer 82 in a communication portion between the first gate trench 81 and the first contact trench 164. Specifically, the first contact insulation layer 165 includes a lead-out insulation layer 165A which is led out to the inside of the first gate trench 81. The lead-out insulation layer 165A corresponds to the lead-out insulation layer 132A aforementioned. That is, the first contact insulation layer 165 crosses the communication portion and is integrally formed with the first bottom-side insulation layer 84 and the first opening-side insulation layer 85 inside the first gate trench 81.

The first contact electrode 166 is integrally formed with the first bottom-side electrode 86 in the communication portion between the first gate trench 81 and the first contact trench 164. Specifically, the first contact electrode 166 includes a lead-out electrode 166A which is led out to the inside of the first gate trench 81. The lead-out electrode 166A corresponds to the lead-out electrode 133A aforementioned.

That is, the first contact electrode 166 crosses the communication portion and is electrically connected to the first bottom-side electrode 86 inside the first gate trench 81. Inside the first gate trench 81, the first intermediate insulation layer 88 is interposed between the first contact electrode 166 and the first opening-side electrode 87.

Each of the second trench contact structures 163 includes a second contact trench 167, a second contact insulation layer 168, and a second contact electrode 169. The second contact trench 167, the second contact insulation layer 168, and the second contact electrode 169 correspond respectively to the contact trench 131, the contact insulation layer 132, and the contact electrode 133 aforementioned.

The second contact trench 167 communicates with one end portion of the second gate trench 101. With respect to the first direction X, a width WTC2 of the second contact trench 167 is substantially equal to the second width WT2 of the second gate trench 101 (WTC2=WT2). The second contact trench 167 forms, with the second gate trench 101, one trench extending along the second direction Y.

The second contact insulation layer 168 is integrally formed with the second insulation layer 102 in a communication portion between the second gate trench 101 and the second contact trench 167. Specifically, the second contact insulation layer 168 includes a lead-out insulation layer 168A which is led out to the inside of the second gate trench 101. The lead-out insulation layer 168A corresponds to the lead-out insulation layer 132A aforementioned. That is, the second contact insulation layer 168 crosses the communication portion and is formed integrally with the second bottom-side insulation layer 104 and the second opening-side insulation layer 105 inside the second gate trench 101.

The second contact electrode 169 is integrally formed with the second bottom-side electrode 106 in the communication portion between the second gate trench 101 and the second contact trench 167. Specifically, the second contact electrode 169 includes a lead-out electrode 169A which is led out to the inside of the second gate trench 101. The lead-out electrode 169A corresponds to the aforementioned lead-out electrode 133A.

That is, the second contact electrode 169 crosses the communication portion and is electrically connected to the second bottom-side electrode 106 inside the second gate trench 101. Inside the second gate trench 101, the second intermediate insulation layer 108 is interposed between the second contact electrode 169 and the second opening-side electrode 107.

The second contact electrode 169 is electrically insulated from the first contact electrode 166. Thereby, the second bottom-side electrode 106 is electrically insulated from the first bottom-side electrode 86. That is, the first bottom-side electrode 86 and the second bottom-side electrode 106 are configured such as to be independently controlled with each other.

In this embodiment, the plurality of third plug electrodes 145 include a plurality of third plug electrodes 145A and a plurality of third plug electrodes 145B. The plurality of third plug electrodes 145A are each embedded in a part which covers the first contact electrode 166 of the first trench contact structure 162 in an interlayer insulation layer 142. The plurality of third plug electrodes 145A penetrate through the interlayer insulation layer 142 and are connected to the first contact electrode 166.

The plurality of third plug electrodes 145B are each embedded in a part which covers the second contact electrode 169 of the second trench contact structure 163 in the interlayer insulation layer 142. The plurality of third plug electrodes 145B penetrate through the interlayer insulation layer 142 and are connected to the second contact electrode 169.

The first gate control wiring 17A of the gate control wiring 17 is electrically connected to the first bottom-side electrode 86 and the first opening-side electrode 87. Specifically, the first gate control wiring 17A is electrically connected to the plurality of first plug electrodes 143 and the plurality of third plug electrodes 145A in the interlayer insulation layer 142. The wiring pattern of the first gate control wiring 17A is arbitrary.

The gate control signal from the control IC 10 is input to the first gate control wiring 17A. The gate control signal is transmitted to the first bottom-side electrode 86 and the first opening-side electrode 87 through the plurality of first plug electrodes 143 and the plurality of third plug electrodes 145A.

Therefore, in this embodiment, the first bottom-side electrode 86 and the first opening-side electrode 87 are controlled to the same voltage at the same time. Thereby, it is possible to appropriately suppress a potential difference formed between the first bottom-side electrode 86 and the first opening-side electrode 87 and therefore it is possible to appropriately suppress an electric field concentration on the first intermediate insulation layer 88. As a result, it is possible to increase a withstand voltage of the first trench gate structure 60.

The second gate control wiring 17B of the gate control wiring 17 is electrically connected to the second bottom-side electrode 106 and the second opening-side electrode 107. Specifically, the second gate control wiring 17B is electrically connected to the plurality of second plug electrodes 144 and the plurality of third plug electrodes 145B in the interlayer insulation layer 142. The wiring pattern of the second gate control wiring 17B is arbitrary.

The gate control signal from the control IC 10 is input to the second gate control wiring 17B. The gate control signal is transmitted to the second bottom-side electrode 106 and the second opening-side electrode 107 through the plurality of first plug electrodes 143 and the plurality of third plug electrodes 145B.

Therefore, in this embodiment, the second bottom-side electrode 106 and the second opening-side electrode 107 are controlled to the same voltage at the same time. Thereby, it is possible to appropriately suppress a potential difference formed between the second bottom-side electrode 106 and the second opening-side electrode 107 and therefore it is possible to appropriately suppress an electric field concentration on the second intermediate insulation layer 108. As a result, it is possible to increase a withstand voltage of the second trench gate structure 70.

Figure 35A:
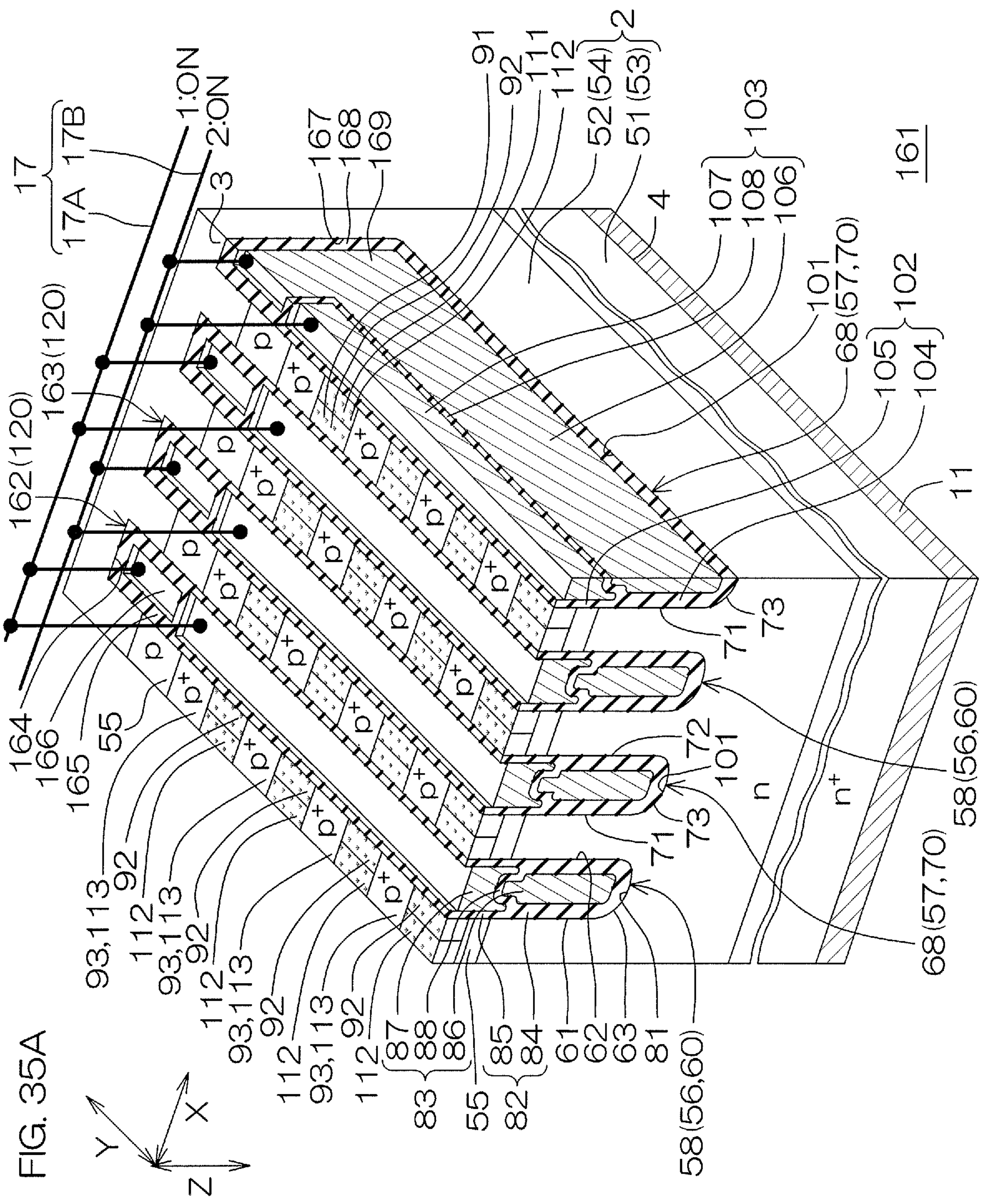
FIG. 35A is a sectional perspective view for describing a normal operation of the semiconductor device shown in FIG. 34.
Figure 35B:
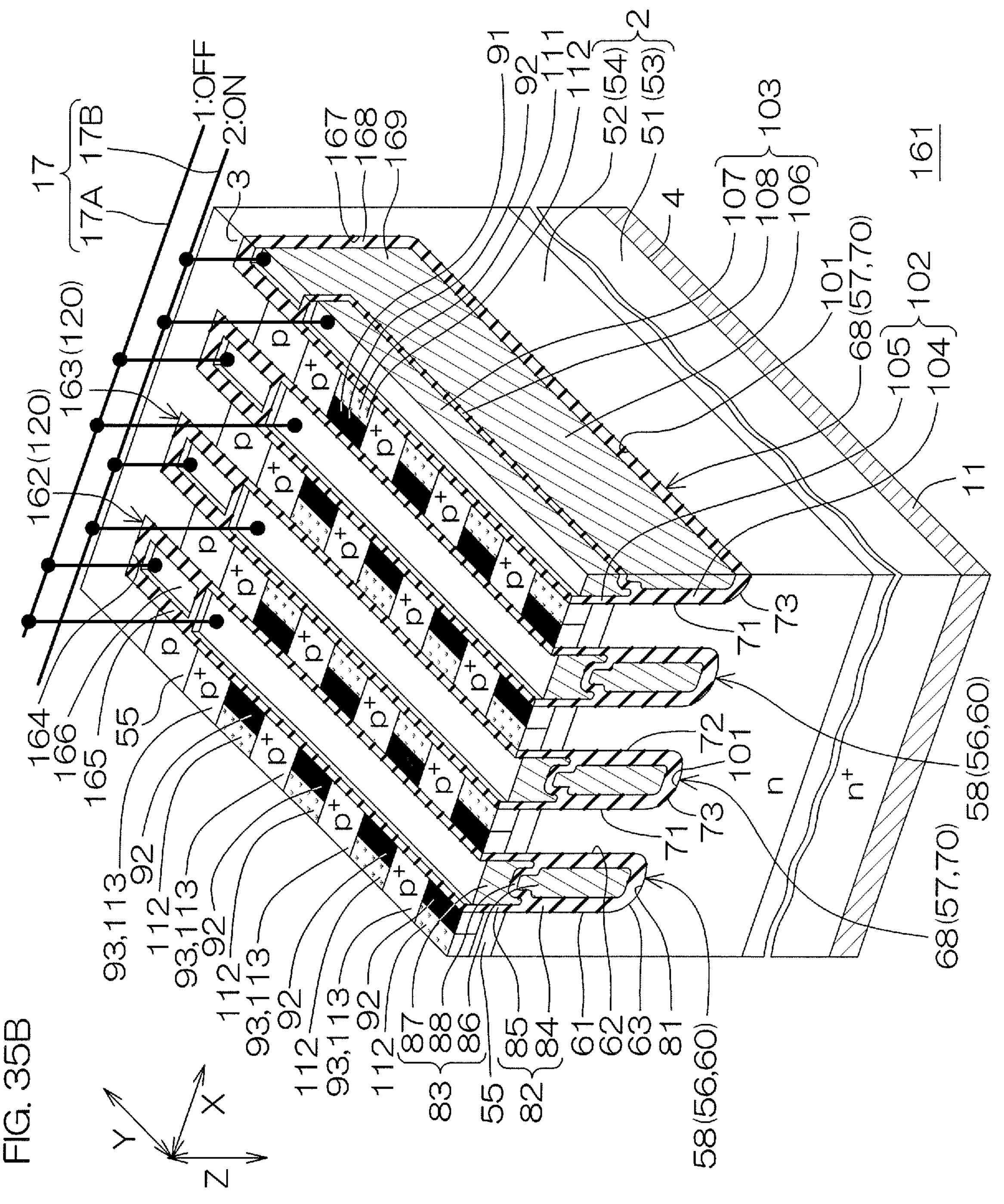
FIG. 35B is a sectional perspective view for describing an active clamp operation of the semiconductor device shown in FIG. 34.

FIG. 35A is a sectional perspective view for describing the normal operation of the semiconductor device 161 shown in FIG. 34. FIG. 35B is a sectional perspective view for describing the active clamp operation of the semiconductor device 161 shown in FIG. 34. In FIG. 35A and FIG. 35B, for convenience of description, structures in the first main surface 3 are omitted to simplify the gate control wiring 17.

With reference to FIG. 35A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have a substantially equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 35A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 35B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 35B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In this control example, a description has been given of an example in which the second Half-ON control is applied in the active clamp operation. However, the first Half-ON control may be applied in the active clamp operation.

As described above, the same effects as those described for the semiconductor device 1 can be exhibited as well by the semiconductor device 161. In particular, according to the semiconductor device 161, the second bottom-side electrode 106 is electrically insulated from the first bottom-side electrode 86, and the second opening-side electrode 107 is electrically insulated from the first opening-side electrode 87.

In the above-described structure, the control IC 10 controls the first bottom-side electrode 86 and the first opening-side electrode 87 of the first MISFET 56 to the same voltage at the same time. Thereby, it is possible to appropriately suppress a potential difference formed between the first bottom-side electrode 86 and the first opening-side electrode 87 in the normal operation and in the active clamp operation. As a result, it is possible to appropriately suppress an electric field concentration on the first intermediate insulation layer 88 and therefore it is possible to increase a withstand voltage of the first trench gate structure 60.

Further, the control IC 10 controls the second bottom-side electrode 106 and the second opening-side electrode 107 of the second MISFET 57 to the same voltage at the same time. Thereby, it is possible to appropriately suppress a potential difference formed between the second bottom-side electrode 106 and the second opening-side electrode 107 in the normal operation and in the active clamp operation. As a result, it is possible to appropriately suppress an electric field concentration on the second intermediate insulation layer 108 and therefore it is possible to increase a withstand voltage of the second trench gate structure 70.

Figure 36:
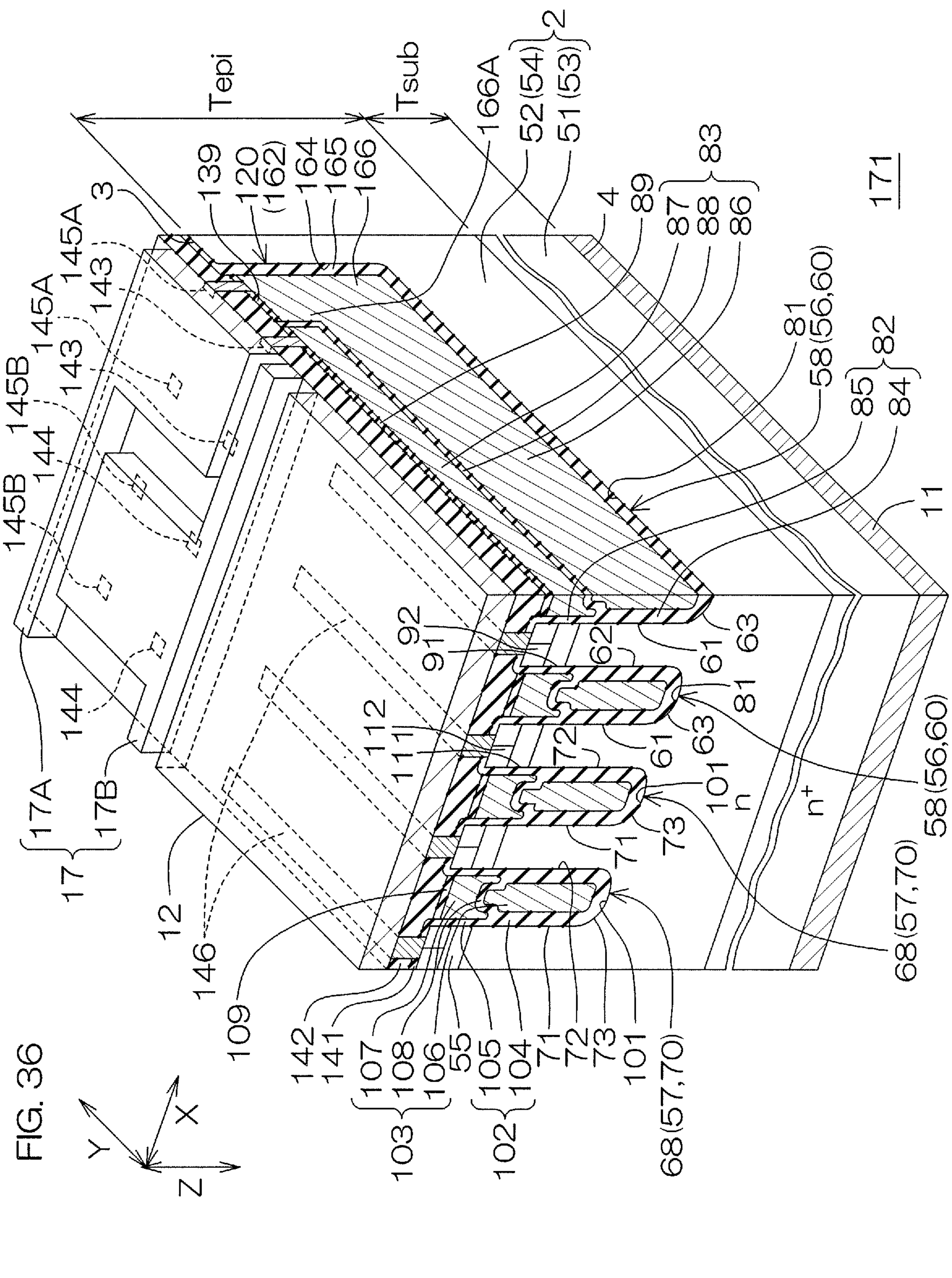
FIG. 36 is a sectional perspective view of a region corresponding to FIG. 32 and is a sectional perspective view which shows a semiconductor device according to a fourth preferred embodiment of the present invention.
Figure 37:
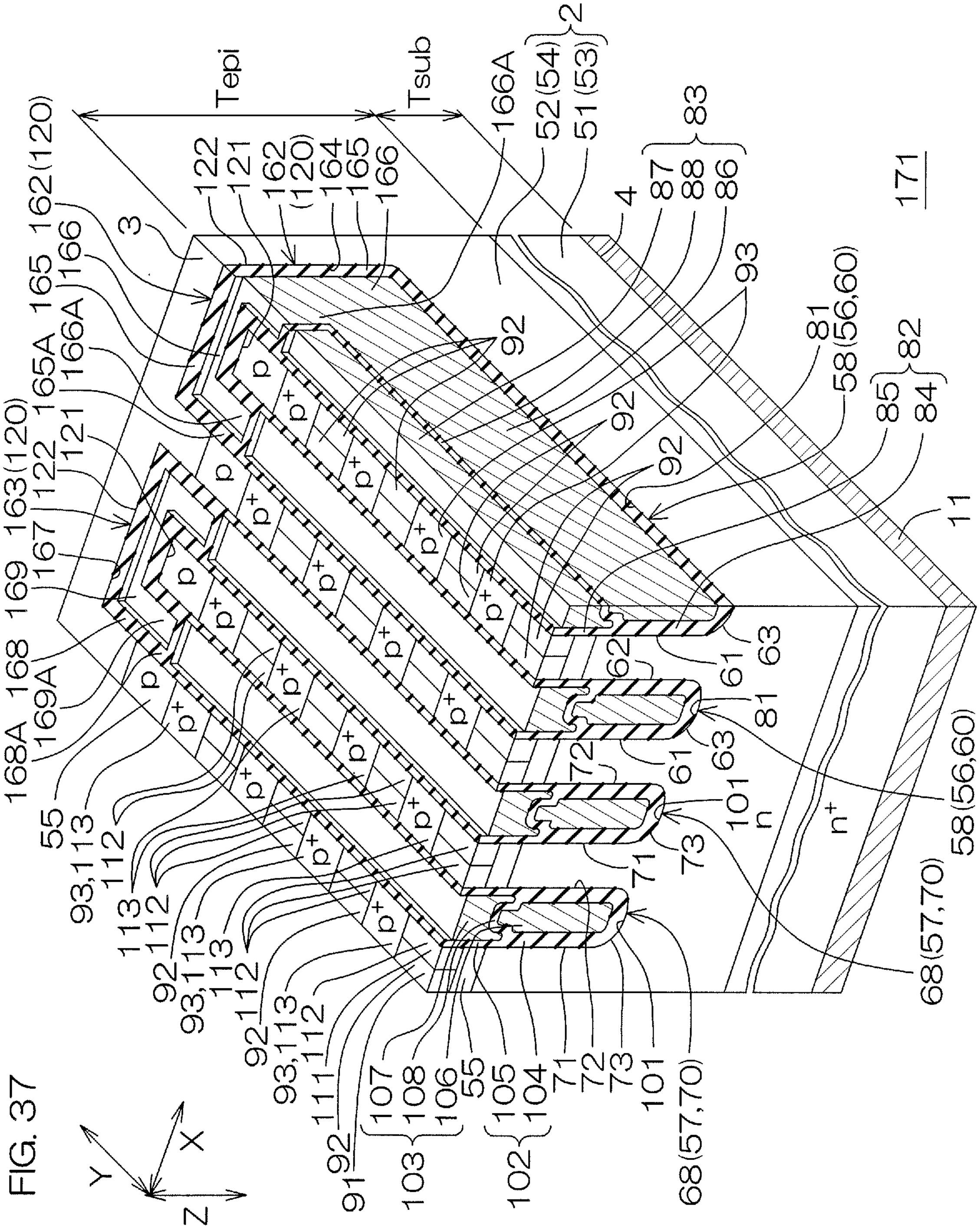
FIG. 37 is a sectional perspective view in which structures on the semiconductor layer are removed from FIG. 36.

FIG. 36 is a sectional perspective view of a region corresponding to FIG. 32 and is a sectional perspective view which shows a semiconductor device 171 according to a fourth preferred embodiment of the present invention. FIG. 37 is a sectional perspective view in which structures in a semiconductor layer 2 are removed from FIG. 36. Hereinafter, structures corresponding to the structures described for the semiconductor device 161 shall be provided with the same reference symbols and description thereof shall be omitted.

Hereinafter, a description will be given of the structure of the region which is at the side of one end portion of the first FET structure 58 and at the side of one end portion of the second FET structure 68 as an example, and a description of the structure of the region which is at the side of the other end portion side of the first FET structure 58 and at the side of the other end portion side of the second FET structure 68 shall be omitted.

In the semiconductor device 161, the plurality of first FET structures 58 and the plurality of second FET structures 68 are formed in a manner that one first FET structure 58 and one second FET structure 68 are alternately arrayed. In contrast thereto, in the semiconductor device 171, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, in the semiconductor device 161, the plurality of first trench contact structures 162 are connected to the corresponding first trench gate structures 60 in a one-to-one correspondence. In contrast thereto, in the semiconductor device 171, the plurality of first trench contact structures 162 are each connected to the group of the plurality (in this embodiment, two) of first trench gate structures 60 which are adjacent to each other. The plurality of first trench contact structures 162 are formed in an arch shape in plan view.

Further, in the semiconductor device 161, the plurality of second trench contact structures 163 are connected to the corresponding second trench gate structures 70 in a one-to-one correspondence. In contrast thereto, in the semiconductor device 171, the plurality of second trench contact structures 163 are each connected to the group of the plurality (in this embodiment, two) of second trench gate structures 70 which are adjacent to each other. The plurality of second trench contact structures 163 are formed in an arch shape in plan view. Hereinafter, a specific description will be given of a structure of the semiconductor device 171.

With reference to FIG. 36 and FIG. 37, in this embodiment, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 0% to not more than 100% (preferably, in excess of 0% and less than 100%). In this embodiment, the first total channel rate RT1 is adjusted to 50%. In the first total channel rate RT1, the first channel rate R1 at one side and the first channel rate R1 at the other side are each 25%.

The second total channel rate RT2 is applied to the region between one first FET structure 58 and one second FET structure 68 which are adjacent to each other. The first channel region 91 and the second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 0% to not more than 100% (preferably in excess of 0% and less than 100%). In this embodiment, the third total channel rate RT3 is adjusted to 50%. In the third total channel rate RT3, the second channel rate R2 on one side and the second channel rate R2 on the other side are each 25%.

The first channel region 91 occupies ½ (50%) of a total channel, and the second channel region 111 occupies ½ (50%) of the total channel. In this embodiment, the average channel rate RAV is 50%.

In each of the first trench contact structures 162, the first contact trench 164 communicates with one end portions of the plurality of first gate trenches 81 which are adjacent to each other. The first contact insulation layer 165 is integrally formed with the first insulation layer 82 at the communication portion between each of the first gate trenches 81 and the first contact trench 164.

Specifically, the first contact insulation layer 165 includes the lead-out insulation layer 165A which is led out to the inside of each of the first gate trenches 81, crosses the communication portion, and is integrally formed with the first bottom-side insulation layer 84 and the first opening-side insulation layer 85 inside each of the first gate trenches 81.

The first contact electrode 166 is integrally formed with the first bottom-side electrode 86 at the communication portion between each of the first gate trenches 81 and the first contact trench 164. Specifically, the first contact electrode 166 includes the lead-out electrode 166A which is led out to the inside of each of the first gate trenches 81, crosses the communication portion, and is electrically connected to the first bottom-side electrode 86 inside each of the first gate trenches 81. Inside each of the first gate trenches 81, the first intermediate insulation layer 88 is interposed between the first contact electrode 166 and the first opening-side electrode 87.

In each of the second trench gate structures 70, the second contact trench 167 communicates with one end portions of the plurality of second gate trenches 101 which are adjacent to each other. The second contact insulation layer 168 is integrally formed with the second insulation layer 102 at the communication portion between each of the second gate trenches 101 and the second contact trench 167.

Specifically, the second contact insulation layer 168 includes the lead-out insulation layer 168A which is led out to the inside of each of the second gate trenches 101, crosses the communication portion, and is integrally formed with the second bottom-side insulation layer 104 and the second opening-side insulation layer 105 inside each of the second gate trenches 101.

The second contact electrode 169 is integrally formed with the second bottom-side electrode 106 at the communication portion between each of the second gate trenches 101 and the second contact trench 167. Specifically, the second contact electrode 169 includes the lead-out electrode 169A which is led out to the inside of each of the second gate trenches 101, crosses the communication portion, and is electrically connected to the second bottom-side electrode 106 inside each of the second gate trenches 101. Inside each of the second gate trenches 101, the second intermediate insulation layer 108 is interposed between the second contact electrode 169 and the second opening-side electrode 107.

Figure 38A:
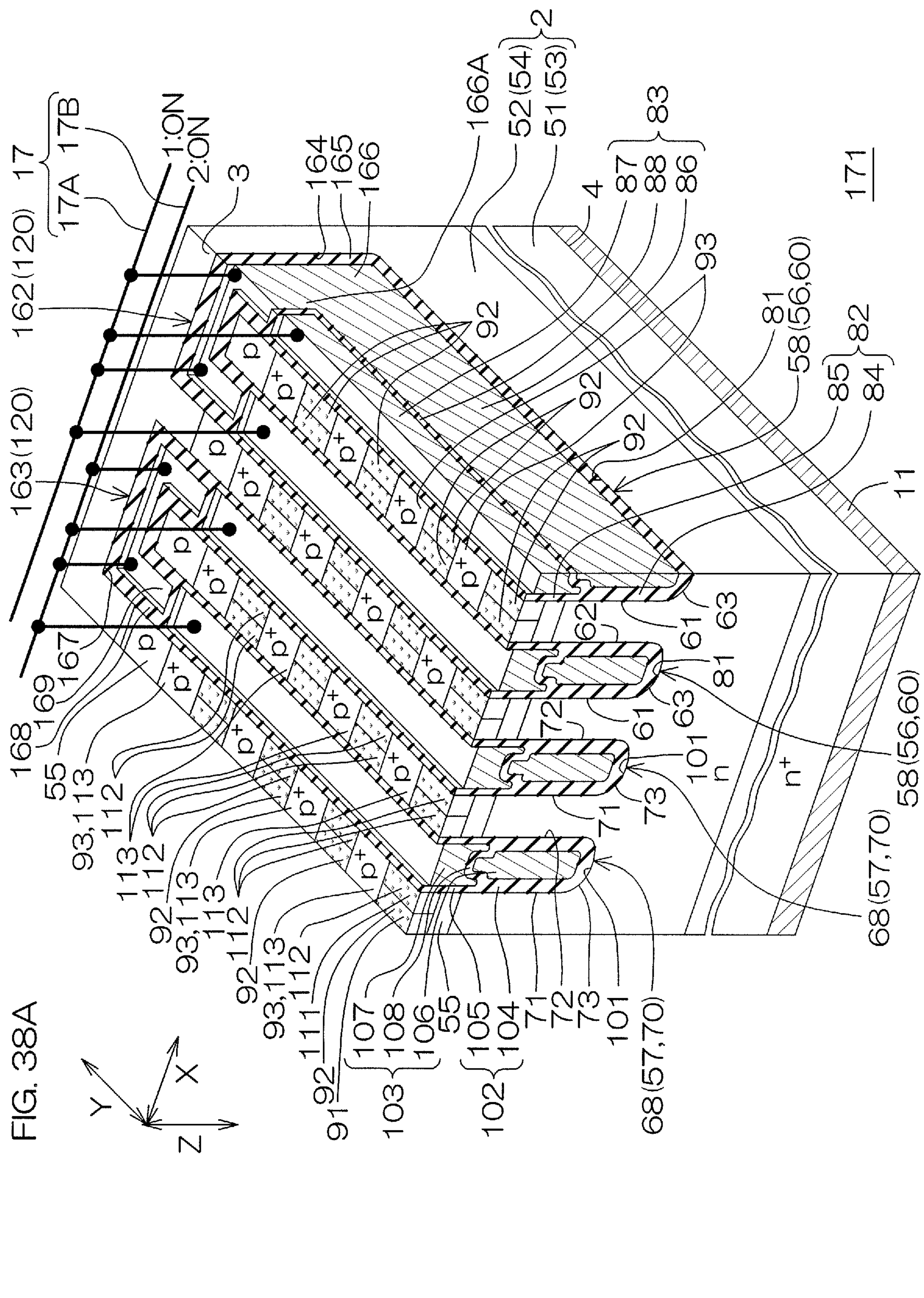
FIG. 38A is a sectional perspective view for describing a normal operation of the semiconductor device shown in FIG. 36.
Figure 38B:
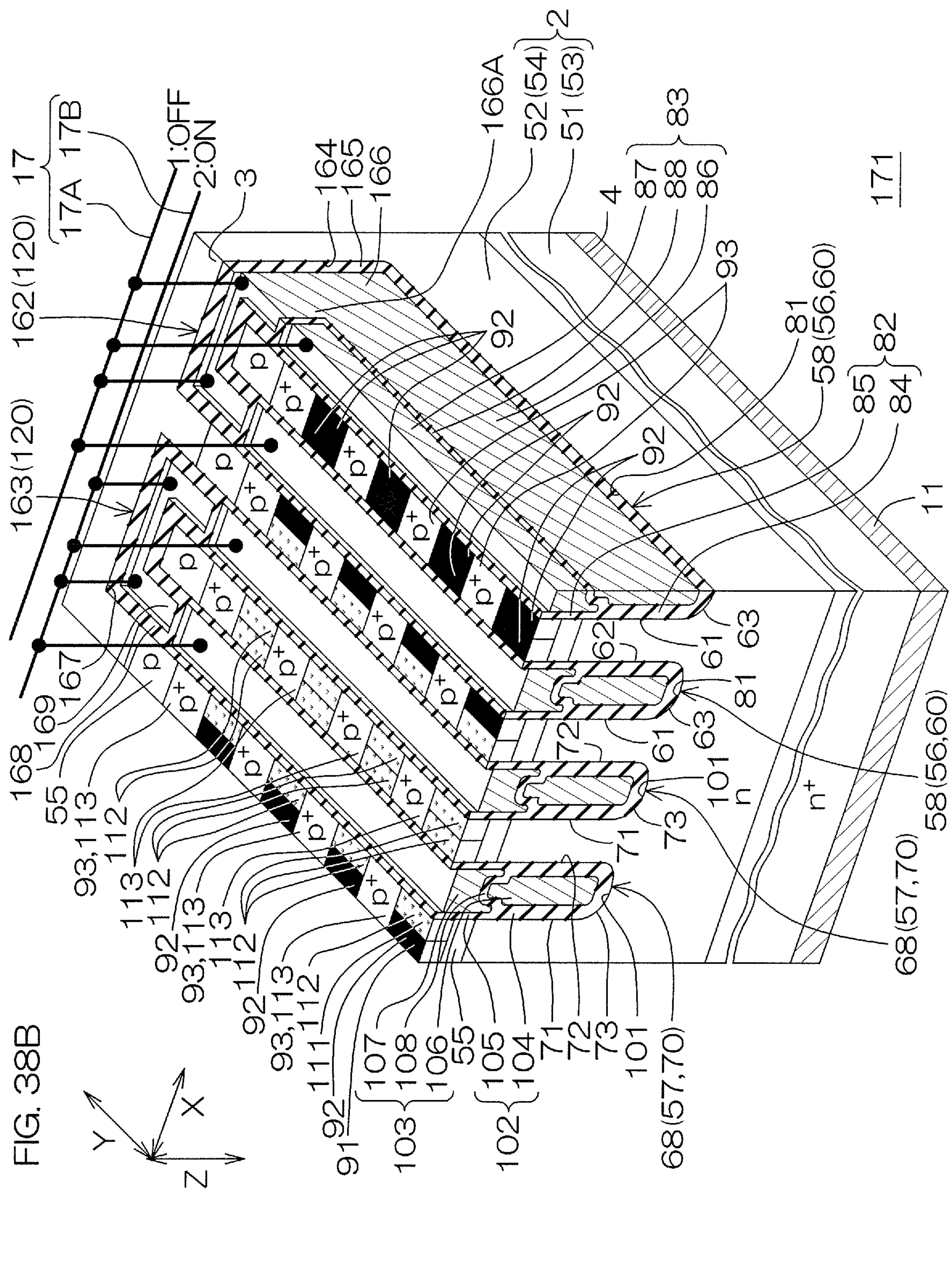
FIG. 38B is a sectional perspective view for describing an active clamp operation of the semiconductor device shown in FIG. 36.

FIG. 38A is a sectional perspective view for describing the normal operation of the semiconductor device 171 shown in FIG. 36. FIG. 38B is a sectional perspective view for describing the active clamp operation of the semiconductor device 171 shown in FIG. 36. In FIG. 38A and FIG. 38B, for convenience of description, structures in the first main surface 3 are omitted to simplify the gate control wiring 17.

With reference to FIG. 38A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have a substantially equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 38A, the first channel region 91 and the second channel region 111 in the ON states are indicated by dotted hatching.

As a result, the first MISFET 56 and the second MISFET 57 are both driven (Full-ON control). The channel utilization rate Ru in the normal operation is 100%. The characteristics channel rate RC in the normal operation is 50%. Thereby, the area resistivity Ron·A approaches the area resistivity Ron·A shown by the second plot point P2 in the graph of FIG. 13.

On the other hand, with reference to FIG. 38B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon is a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 38B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In this control example, a description has been given of an example in which the second Half-ON control is applied in the active clamp operation. However, the first Half-ON control may be applied in the active clamp operation.

As described above, the same effects as those described for the semiconductor device 161 can be exhibited as well by the semiconductor device 171. Further, in the semiconductor device 171, the plurality of first FET structures 58 and the plurality of second FET structures 68 are formed in a manner that the group of the plurality (in this embodiment, two) of first FET structures 58 and the group of the plurality (in this embodiment, two) of second FET structures 68 are alternately arrayed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 39:
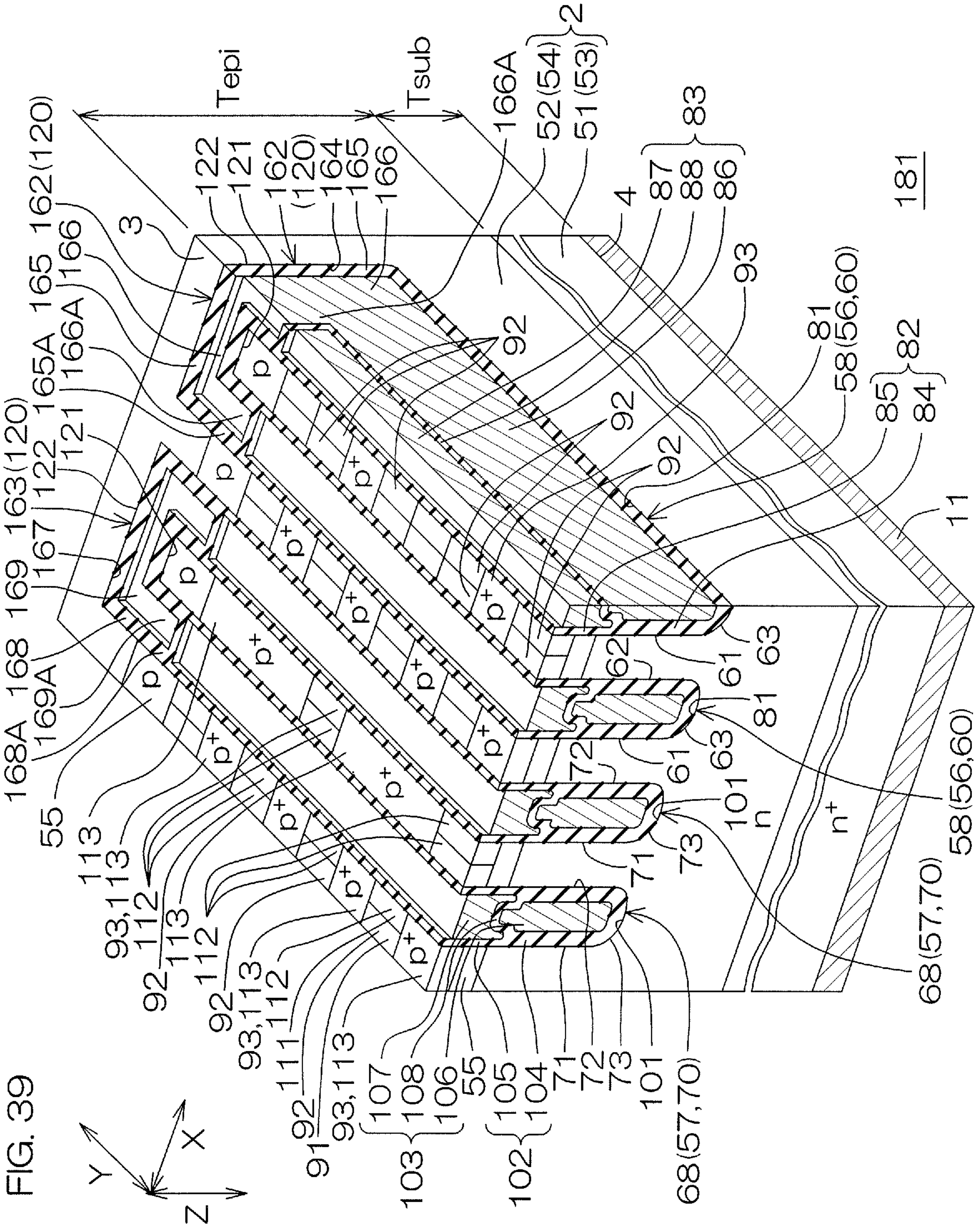
FIG. 39 is a sectional perspective view of a region corresponding to FIG. 36 and is a sectional perspective view which shows a semiconductor device according to a fifth preferred embodiment of the present invention.

FIG. 39 is a sectional perspective view of a region corresponding to FIG. 36 and is a sectional perspective view which shows a semiconductor device 181 according to a fifth preferred embodiment of the present invention. Hereinafter, structures corresponding to the structures described for the semiconductor device 171 shall be provided with the same reference symbols and description thereof shall be omitted.

In this embodiment, the first total channel rate RT1, the second total channel rate RT2, and the third total channel rate RT3, each of which has a different value from each other, are applied to the plurality of cell regions 75.

The first total channel rate RT1 may be adjusted to a range from not less than 60% to not more than 80% as an example. In this embodiment, the first total channel rate RT1 is adjusted to 75%. In the first total channel rate RT1, the first channel rate R1 in one side and the first channel rate R1 in the other side are each 37.5%.

The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%. Other structures of the semiconductor device 181 are similar to those of the semiconductor device 171. In this embodiment, control which shall be described hereinafter is performed.

Figure 40A:
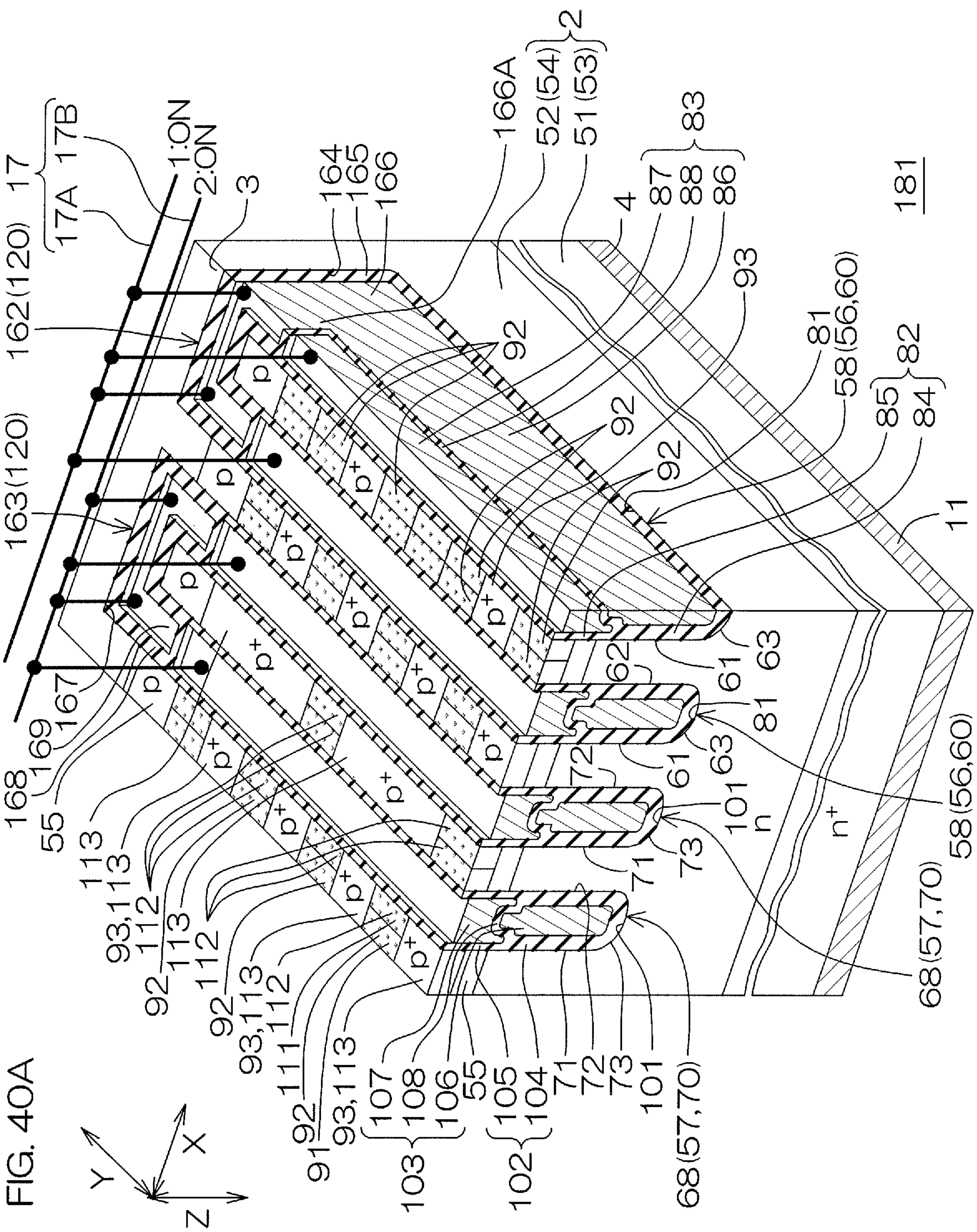
FIG. 40A is a sectional perspective view for describing a normal operation according to a first control example of the semiconductor device shown in FIG. 39.
Figure 40B:
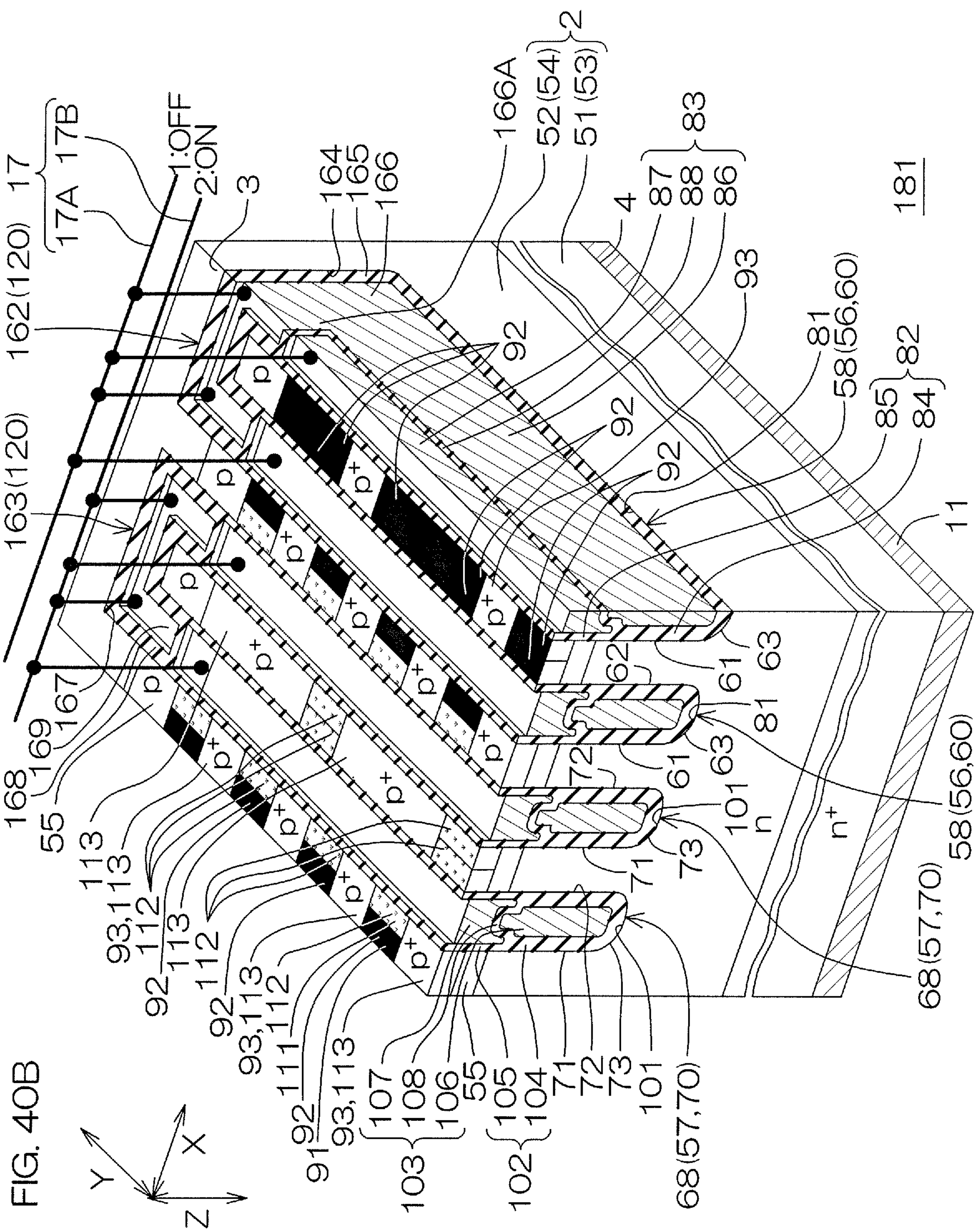
FIG. 40B is a sectional perspective view for describing an active clamp operation according to the first control example of the semiconductor device shown in FIG. 39.

FIG. 40A is a sectional perspective view for describing the normal operation according to a first control example of the semiconductor device 181 shown in FIG. 39. FIG. 40B is a sectional perspective view for describing the active clamp operation according to the first control example of the semiconductor device 181 shown in FIG. 39. In FIG. 40A and FIG. 40B, for convenience of description, structures in the first main surface 3 are omitted to simplify the gate control wiring 17.

With reference to FIG. 40A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have a substantially equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 40A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 40B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon each has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 40B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the channel utilization rate RU in the active clamp operation is less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 41A:
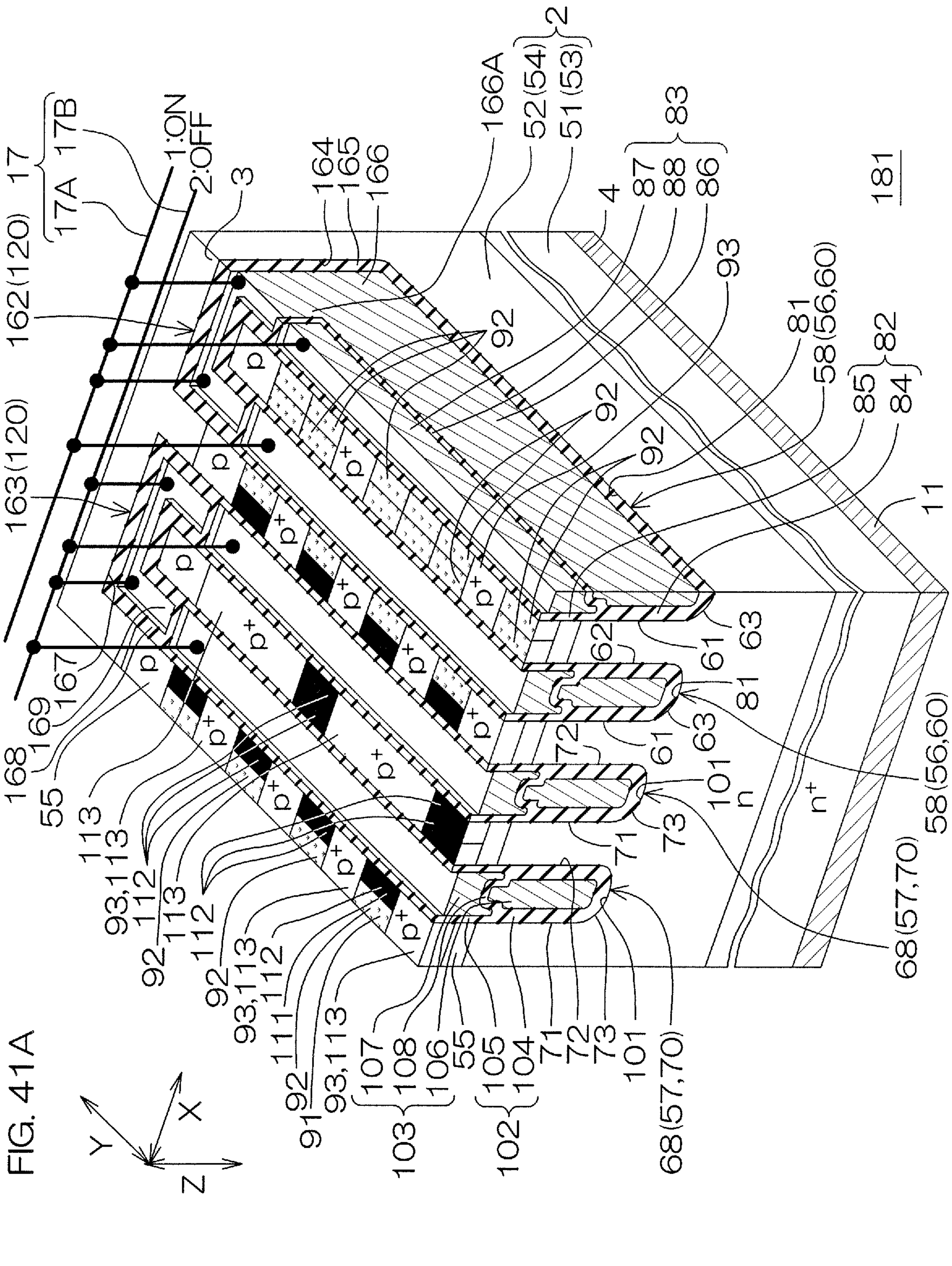
FIG. 41A is a sectional perspective view for describing a normal operation according to a second control example of the semiconductor device shown in FIG. 39.
Figure 41B:
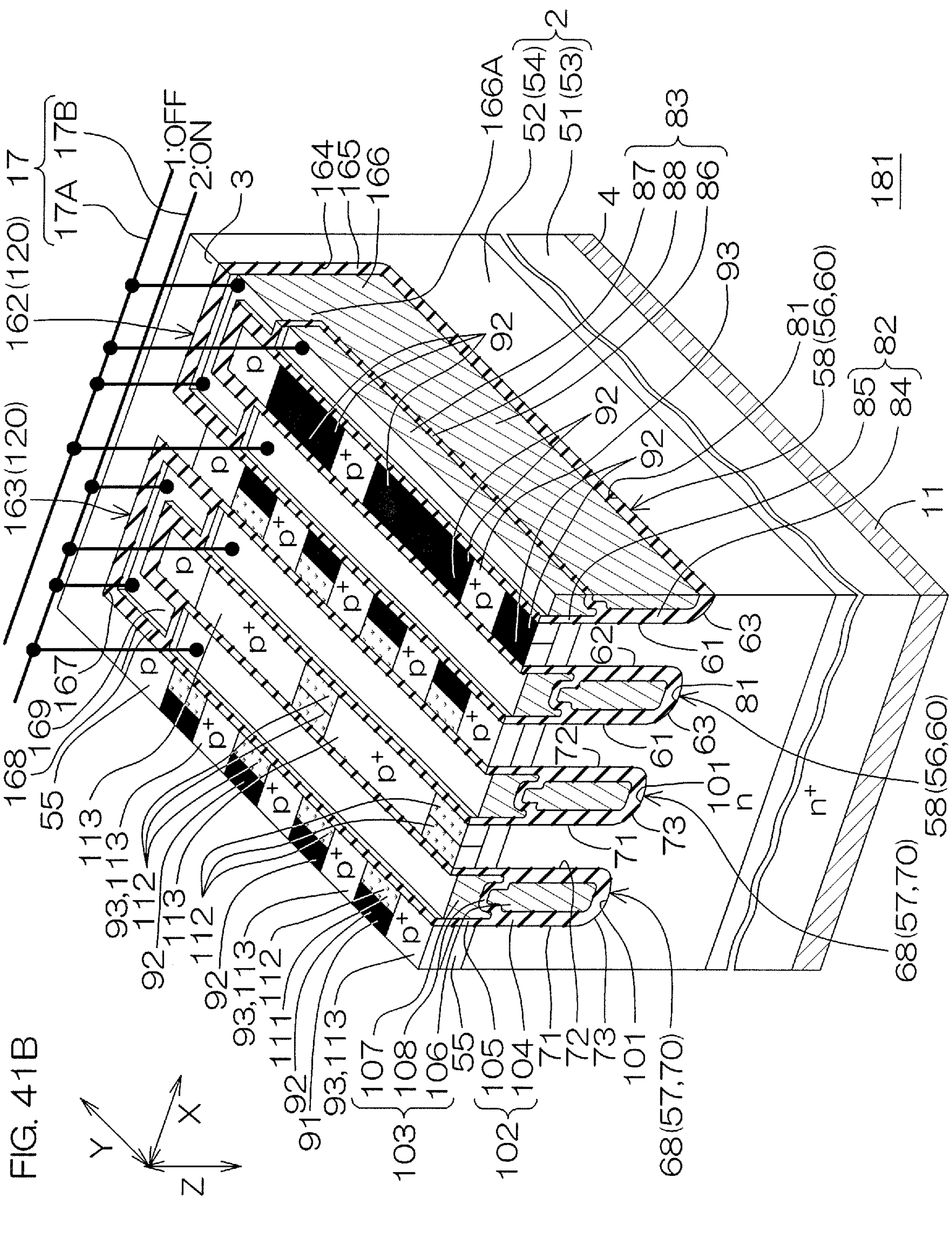
FIG. 41B is a sectional perspective view for describing an active clamp operation according to the second control example of the semiconductor device shown in FIG. 39.

FIG. 41A is a sectional perspective view for describing the normal operation according to a second control example of the semiconductor device 181 shown in FIG. 39. FIG. 41B is a sectional perspective view for describing the active clamp operation according to the second control example of the semiconductor device 181 shown in FIG. 39. In FIG. 41A and FIG. 41B, for convenience of description, structures in the first main surface 3 are omitted to simplify the gate control wiring 17.

With reference to FIG. 41A, when the power MISFET 9 is in the normal operation, an ON signal Von is input to the gate control wiring 17A and an OFF signal Voff is input to the second gate control wiring 17B. The ON signal Von and the OFF signal Voff are each input from the control IC 10. The ON signal Von has a voltage not less than the gate threshold voltage Vth. The OFF signal Voff has a voltage (for example, the reference voltage) less than the gate threshold voltage Vth.

In this case, the first bottom-side electrode 86 and the first opening-side electrode 87 are each put into the ON state, and the second bottom-side electrode 106 and the second opening-side electrode 107 are each put into the OFF state. That is, while the first bottom-side electrode 86 and the first opening-side electrode 87 each function as a gate electrode, the second bottom-side electrode 106 and the second opening-side electrode 107 each function as a field electrode.

Thereby, the first channel region 91 is controlled to be in the ON state and the second channel region 111 is controlled to be in the OFF state. In FIG. 41A, the first channel region 91 in the ON state is indicated by dotted hatching, and the second channel region 111 in the ON state is indicated by filled hatching.

As a result, while the first MISFET 56 is controlled to be in the ON state, the second MISFET 57 is controlled to be in the OFF state (first Half-ON control). Thereby, the second channel region 111 having the second channel rate R2 (R2<R1) less than the first channel rate R1 is controlled to be in the OFF state, and the characteristics channel rate RC in the normal operation therefore becomes less than the average channel rate RAV.

The channel utilization rate RU in the normal operation is 62.5%. Further, the characteristics channel rate RC in the normal operation is 31.25%. Thereby, the area resistivity Ron·A approaches the area resistivity Ron·A indicated by the third plot point P3 in the graph of FIG. 13.

On the other hand, with reference to FIG. 41B, when the power MISFET 9 is in the active clamp operation, an OFF signal Voff is input to the first gate control wiring 17A, and a clamp ON signal VCon is input to the second gate control wiring 17B. The OFF signal Voff and the clamp ON signal VCon are both input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. That is, while the first bottom-side electrode 86 and the first opening-side electrode 87 each function as a field electrode, the second bottom-side electrode 106 and the second opening-side electrode 107 each function as a gate electrode.

Thereby, the first channel region 91 is controlled to be in the OFF state, and the second channel region 111 is controlled to be in the ON state. In FIG. 41B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). The second channel region 111 having the second channel rate R2 less than the first channel rate R1 (R2<R1) is controlled to be in the ON state, and the channel utilization rate RU in the active clamp operation therefore becomes in excess of zero and less than the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the second plot point P2 in the graph of FIG. 13 or exceeds the active clamp capability Eac.

As described above, the same effects as those described for the semiconductor device 171 can be exhibited as well by the semiconductor device 181. In particular, according to the semiconductor device 181, the second channel rate R2 is different from the first channel rate R1 (R1≠R2). Specifically, the second channel rate R2 is less than the first channel rate R1 (R1>R2).

In the above-described structure, the control IC 10 controls the first MISFET 56 and the second MISFET 57 such that the channel utilization rate RU in the active clamp operation becomes in excess of zero and less than the channel utilization rate RU in the normal operation. Thereby, it is possible to enhance the effects of improving the active clamp capability Eac.

Further, according to the semiconductor device 181, as shown in the second control example, the first Half-ON control can be applied in the normal operation and the second Half-ON control can be applied in the active clamp operation. Further, according to the semiconductor device 181, the second Half-ON control can be applied in the normal operation and the first Half-ON control can be applied in the active clamp operation. That is, according to the semiconductor device 181, by only changing a control pattern, it becomes possible to realize various types of area resistivity Ron·A and active clamp capability Eac, while having the same average channel rate RAV.

Figure 42:
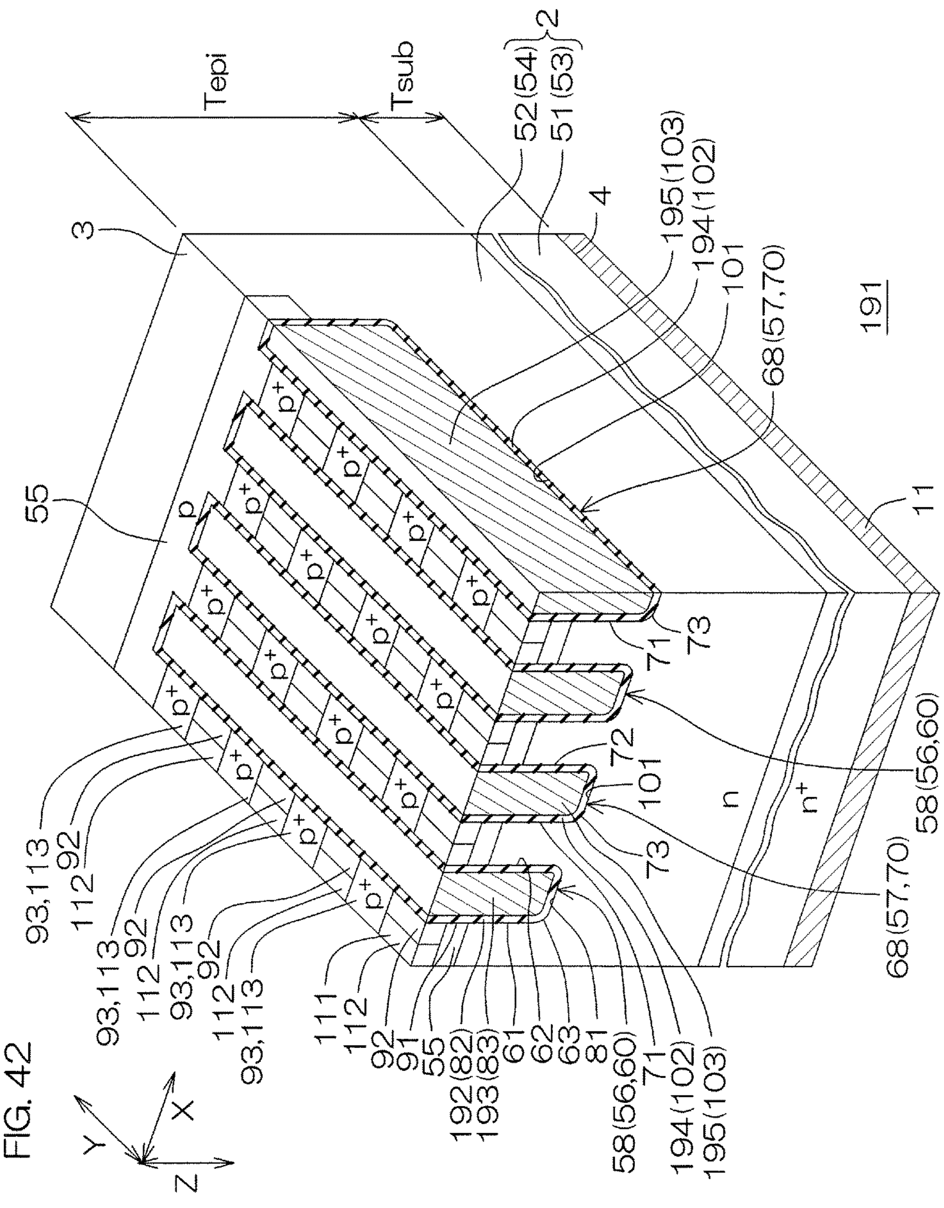
FIG. 42 is a sectional perspective view of a region corresponding to FIG. 7 and is a sectional perspective view for showing a semiconductor device according to a sixth preferred embodiment of the present invention.

FIG. 42 is a sectional perspective view of a region corresponding to FIG. 7 and is a sectional perspective view of a semiconductor device 191 according to a sixth preferred embodiment of the present invention. Hereinafter, structures corresponding to the structures described for the semiconductor device 1 shall be provided with the same reference symbols and description thereof shall be omitted.

According to the semiconductor device 1, the first insulation layer 82 includes the first bottom-side insulation layer 84 and the first opening-side insulation layer 85 in the first trench gate structure 60, and the first electrode 83 includes the first bottom-side electrode 86, the first opening-side electrode 87 and the first intermediate insulation layer 88.

In contrast thereto, in the semiconductor device 191, the first insulation layer 82 does not include the first bottom-side insulation layer 84, and the first electrode 83 does not include the first bottom-side electrode 86 and the first intermediate insulation layer 88. That is, in the semiconductor device 191, the first insulation layer 82 includes a first gate insulation layer 192 which corresponds to the first opening-side insulation layer 85, and the first electrode 83 includes a first gate electrode 193 which corresponds to the first opening-side electrode 87.

Further, according to the semiconductor device 1, the second insulation layer 102 includes the second bottom-side insulation layer 104 and the second opening-side insulation layer 105 in the second trench gate structure 70, and the second electrode 103 includes the second bottom-side electrode 106, the second opening-side electrode 107 and the second intermediate insulation layer 108.

In contrast thereto, in the semiconductor device 191, the second insulation layer 102 does not include the second bottom-side insulation layer 104, and the second electrode 103 does not include the second bottom-side electrode 106 and the second intermediate insulation layer 108. That is, in the semiconductor device 191, the second insulation layer 102 includes a second gate insulation layer 194 which corresponds to the second opening-side insulation layer 105, and the second electrode 103 includes a second gate electrode 195 which corresponds to the second opening-side electrode 107.

Further, the semiconductor device 1 has the trench contact structure 120. In contrast thereto, the semiconductor device 191 does not have the trench contact structure 120. Hereinafter, a specific description will be given of a structure of the semiconductor device 191.

In the first trench gate structure 60, the first gate insulation layer 192 is formed in a film shape along the inner wall of the first gate trench 81. The first gate insulation layer 192 defines a concave space inside the first gate trench 81.

A part which covers the bottom wall 63 of the first gate trench 81 in the first gate insulation layer 192 may be larger in thickness than a part which covers the first side wall 61 and the second side wall 62 of the first gate trench 81 in the first gate insulation layer 192. As a matter of course, the first gate insulation layer 192 may have a uniform thickness.

The first gate electrode 193 is embedded in the first gate trench 81 across the first gate insulation layer 192. Specifically, the first gate electrode 193 is embedded as an integrated member into the concave space defined by the first gate insulation layer 192 in the first gate trench 81. The first gate control signal (first control signal) including the ON signal Von and the OFF signal Voff is applied to the first gate electrode 193.

The first gate electrode 193 may include at least any one of conductive polysilicon, tungsten, aluminum, copper, an aluminum alloy, and a copper alloy. In this embodiment, the first gate electrode 193 includes conductive polysilicon. The conductive polysilicon may include an n-type impurity or a p-type impurity. The conductive polysilicon preferably includes an n-type impurity.

In the second trench gate structure 70, the second gate insulation layer 194 is formed in a film shape along an inner wall of the second gate trench 101. The second gate insulation layer 194 defines a concave space inside the second gate trench 101.

In the second gate insulation layer 194, a part which covers the bottom wall 73 of the second gate trench 101 may be larger in thickness than a part which covers the first side wall 71 and the second side wall 72 in the second gate insulation layer 194. As a matter of course, the second gate insulation layer 194 may have a uniform thickness.

The second gate electrode 195 is embedded in the second gate trench 101 across the second gate insulation layer 194. Specifically, the second gate electrode 195 is embedded as an integrated member into the concave space defined by the second gate insulation layer 194 in the second gate trench 101. The second gate control signal (second control signal) including the ON signal Von and the OFF signal Voff is applied to the second gate electrode 195.

The second gate electrode 195 may include at least any one of conductive polysilicon, tungsten, aluminum, copper, an aluminum alloy, and a copper alloy. It is preferable that the second gate electrode 195 includes the same conductive material as the first gate electrode 193. In this embodiment, the second gate electrode 195 includes conductive polysilicon. The conductive polysilicon may include an n-type impurity or a p-type impurity. The conductive polysilicon preferably includes an n-type impurity. Although not specifically shown in the drawing, the first gate control wiring 17A is electrically connected to the first gate electrode 193, and the second gate control wiring 17B is electrically connected to the second gate electrode 195.

Figure 43A:
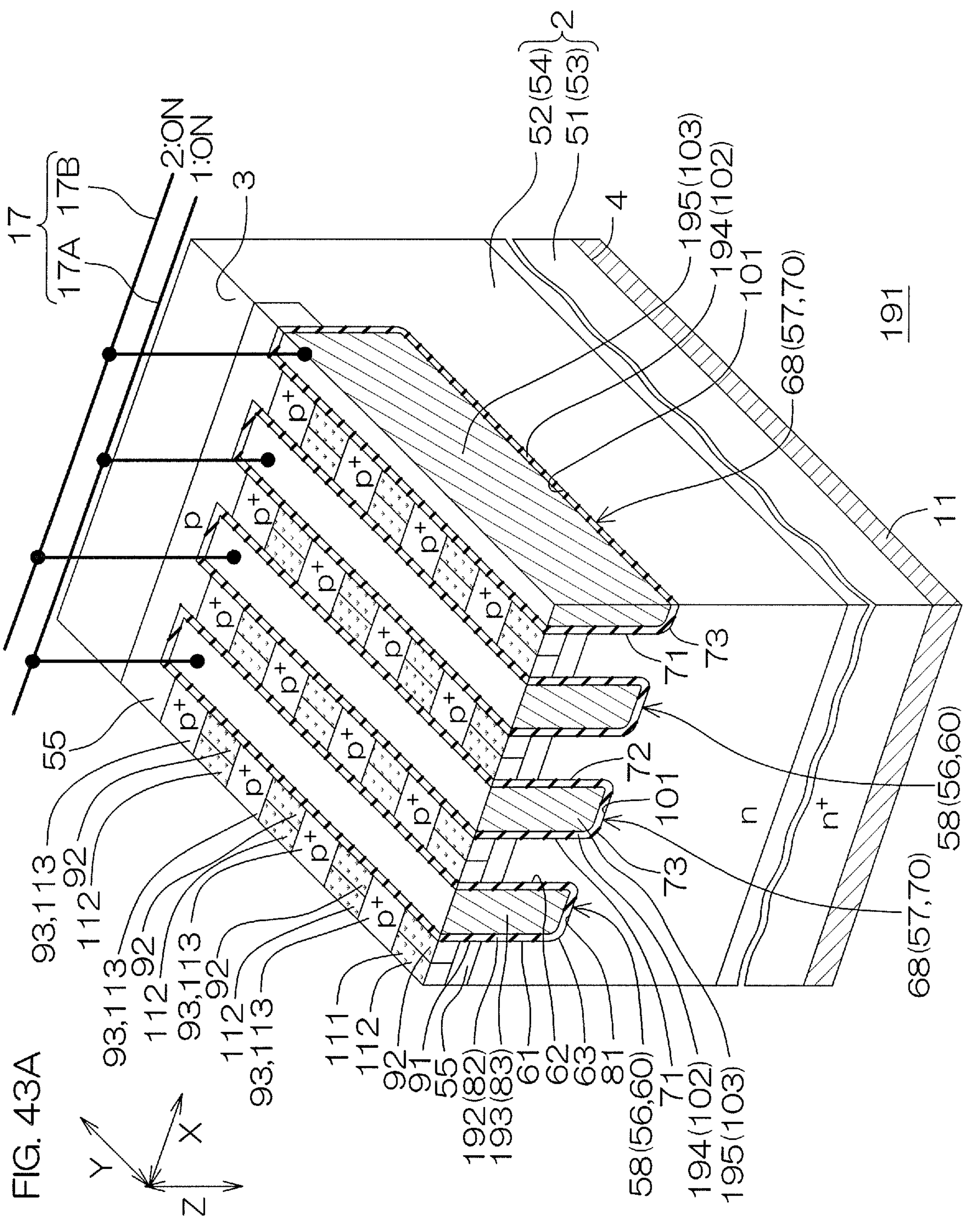
FIG. 43A is a sectional perspective view for describing a normal operation of the semiconductor device shown in FIG. 42.
Figure 43B:
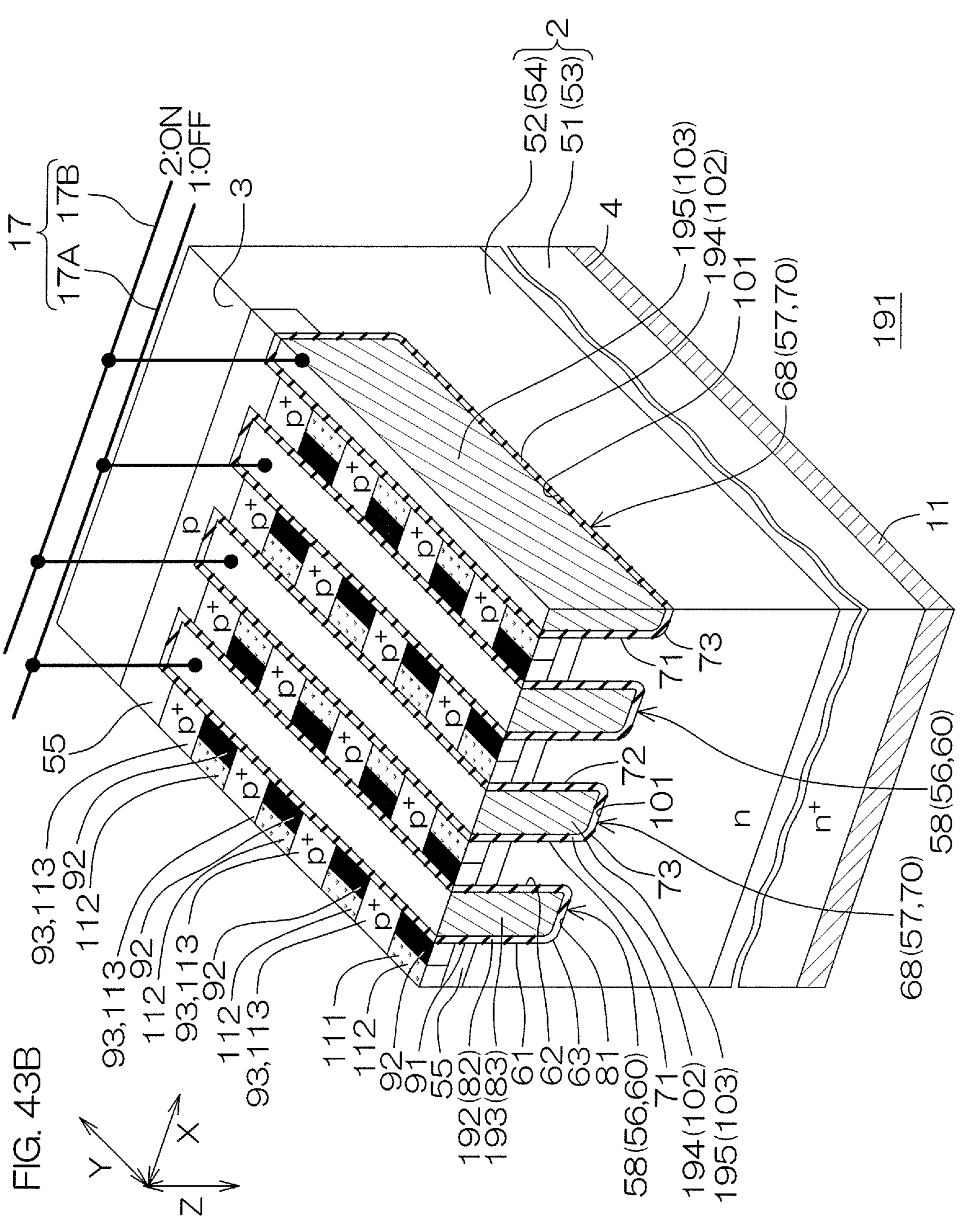
FIG. 43B is a sectional perspective view for describing an active clamp operation of the semiconductor device shown in FIG. 42.

FIG. 43A is a sectional perspective view for describing the normal operation of the semiconductor device 191 shown in FIG. 42. FIG. 43B is a sectional perspective view for describing the active clamp operation of the semiconductor device 191 shown in FIG. 42.

With reference to FIG. 43A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have a substantially equal voltage.

In this case, the first gate electrode 193 and the second gate electrode 195 are each put into the ON state. Thereby, the first channel region 91 and the second channel region 111 are both controlled to be in the ON states. In FIG. 43A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A is lowered as compared with a case where the characteristics channel rate RC is less than 50%.

On the other hand, with reference to FIG. 43B, when the power MISFET 9 is in the active clamp operation, the OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state. In FIG. 43B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. Further, the characteristics channel rate RC in the active clamp operation is 25%. Thereby, the active clamp capability Eac is improved as compared with a case where the characteristics channel rate RC is in excess of 25%.

In this control example, a description has been given of an example in which the second Half-ON control is applied in the active clamp operation. However, the first Half-ON control may be applied in the active clamp operation.

As described above, the same effects as those described for the semiconductor device 1 can be exhibited as well by the semiconductor device 191. In this embodiment, an example is shown in which the second channel rate R2 (second channel area S2) is substantially equal to the first channel rate R1 (first channel area S1). However, the second channel rate R2 may be different from the first channel rate R1 (R1≠R2) as in a case of the second preferred embodiment (refer to FIG. 27). The second channel rate R2 may be less than the first channel rate R1 (R2<R1).

Figure 44:
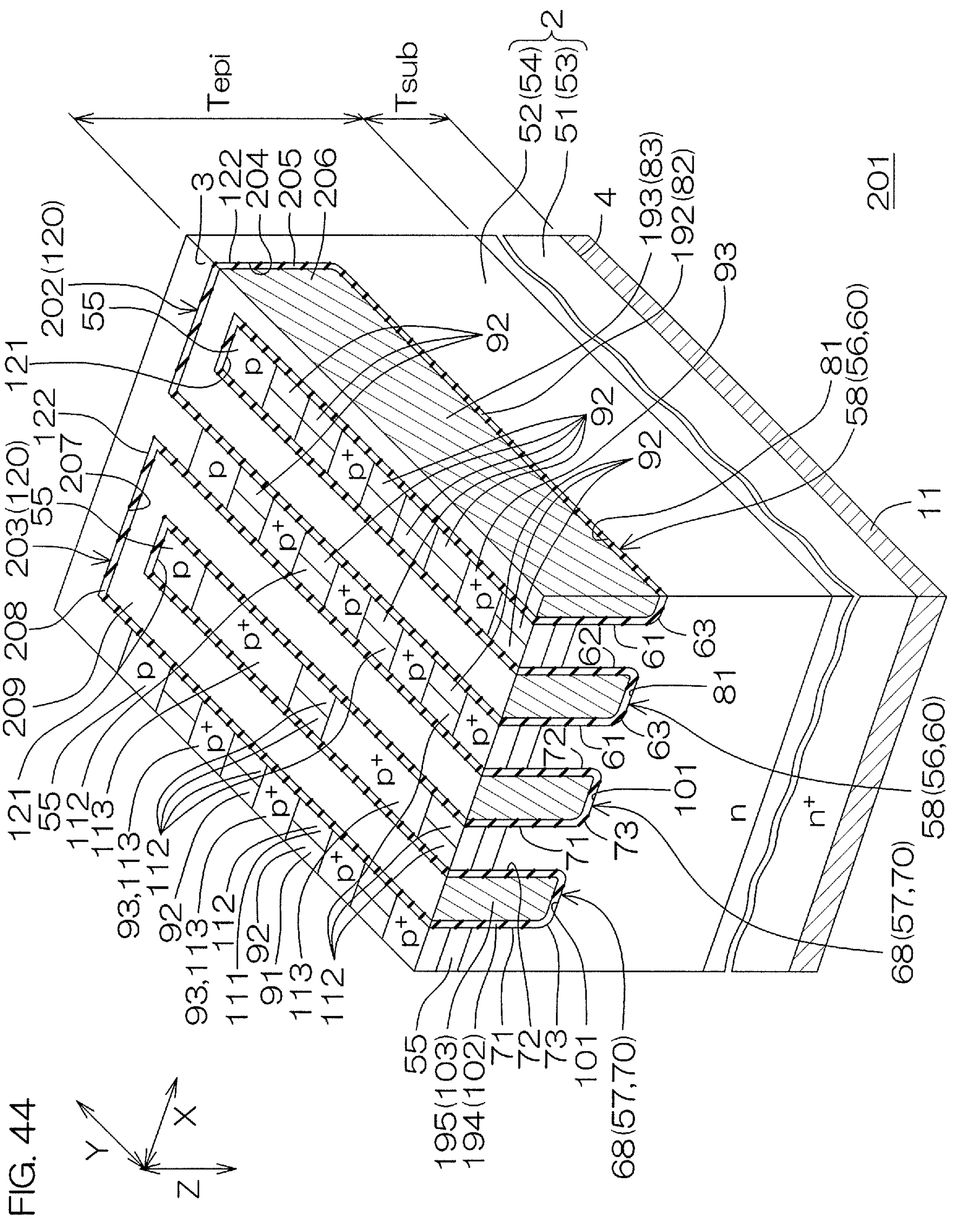
FIG. 44 is a sectional perspective view of a region corresponding to FIG. 7 and is a perspective view which shows a semiconductor device according to a seventh preferred embodiment of the present invention.

FIG. 44 is a sectional perspective view of a region corresponding to FIG. 42 and is a perspective view which shows a semiconductor device 201 according to a seventh preferred embodiment of the present invention. Hereinafter, structures corresponding to the structures described for the semiconductor device 191 shall be provided with the same reference symbols and description thereof shall be omitted.

In the semiconductor device 191, the plurality of first FET structures 58 and the plurality of second FET structures 68 are formed in a manner that one first FET structure 58 and one second FET structure 68 are alternately arrayed. In contrast thereto, in the semiconductor device 201, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, the semiconductor device 191 does not have the trench contact structure 120. In contrast thereto, the semiconductor device 201 has the trench contact structure 120. Specifically, the semiconductor device 201 includes the plurality of trench contact structures 120 which are each connected to the first trench gate structure 60 and the second trench gate structure 70 in a manner that the first trench gate structure 60 and the second trench gate structure 70 are electrically insulated from each other.

Further, in the semiconductor device 191, the second channel rate R2 (second channel area S2) is substantially equal to the first channel rate R1 (first channel area S1). In contrast thereto, in the semiconductor device 201, the second channel rate R2 is different from the first channel rate R1 (R1≠R2). Specifically, the second channel rate R2 is less than the first channel rate R1 (R2<R1). Hereinafter, a specific description will be given of a structure of the semiconductor device 201.

With reference to FIG. 44, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT which are different in value from each other are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 60% to not more than 80% as an example. In this embodiment, the first total channel rate RT1 is adjusted to 75%. In the first total channel rate RT1, the first channel rate R1 on one side and the first channel rate R1 on the other side are each 37.5%.

The second total channel rate RT2 is applied to the region between one first FET structure 58 and one second FET structure 68 which are adjacent to each other. The first channel region 91 and the second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%.

The plurality of trench contact structures 120 include a plurality of first trench contact structures 202 and a plurality of second trench contact structures 203. Each of the first trench contact structures 202 is connected to one end portion of corresponding one of the plurality of first trench gate structures 60 at an interval from the plurality of second trench gate structure 70. The plurality of first trench contact structures 202 are formed in an arch shape in plan view.

Each of the second trench contact structures 203 is connected to one end portion of corresponding one of the plurality of second trench gate structures 70 at an interval from the plurality of first trench gate structures 60. The plurality of second trench contact structures 203 are formed in an arch shape in plan view.

Each of the first trench contact structures 202 includes a first contact trench 204, a first contact insulation layer 205, and a first contact electrode 206. In this embodiment, the first contact trench 204, the first contact insulation layer 205, and the first contact electrode 206 have structures respectively corresponding to the first gate trench 81, the first gate insulation layer 192, and the first gate electrode 193.

In each of the first trench contact structures 202, the first contact trench 204 communicates with one end portions of the plurality of first gate trenches 81 which are adjacent to each other. The first contact insulation layer 205 is integrally formed with the first gate insulation layer 192 at a communication portion between each of the first gate trenches 81 and the first contact trench 204. The first contact electrode 206 is integrally formed with the first gate electrode 193 at the communication portion between each of the first gate trenches 81 and the first contact trench 204.

Each of the second trench contact structures 203 includes a second contact trench 207, a second contact insulation layer 208, and a second contact electrode 209. In this embodiment, the second contact trench 207, the second contact insulation layer 208, and the second contact electrode 209 have structures respectively corresponding to the second gate trench 101, the second gate insulation layer 194, and the second gate electrode 195.

In each of the second trench contact structures 203, the second contact trench 207 communicates with one end portions of the plurality of second gate trenches 101 which are adjacent to each other. The second contact insulation layer 208 is integrally formed with the second gate insulation layer 194 at a communication portion between each of the second gate trenches 101 and the second contact trench 207. The second contact electrode 209 is integrally formed with the second gate electrode 195 at the communication portion between each of the second gate trenches 101 and the second contact trench 207.

Although not specifically shown in the drawing, the first gate control wiring 17A is electrically connected to the first gate electrode 193 and the first contact electrode 206, and the second gate control wiring 17B is electrically connected to the second gate electrode 195 and the second contact electrode 209.

Figure 45A:
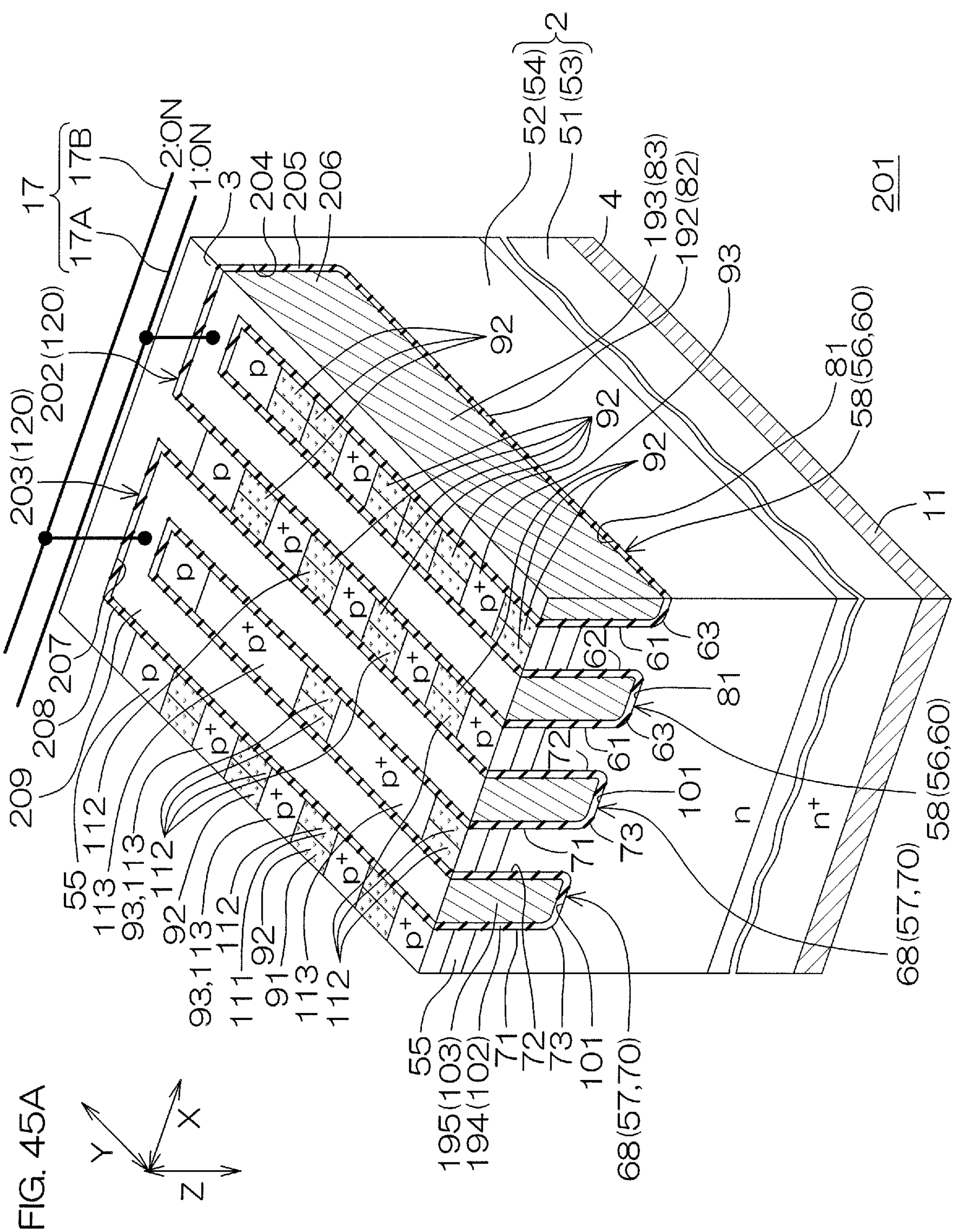
FIG. 45A is a sectional perspective view for describing a normal operation of the semiconductor device shown in FIG. 44.
Figure 45B:
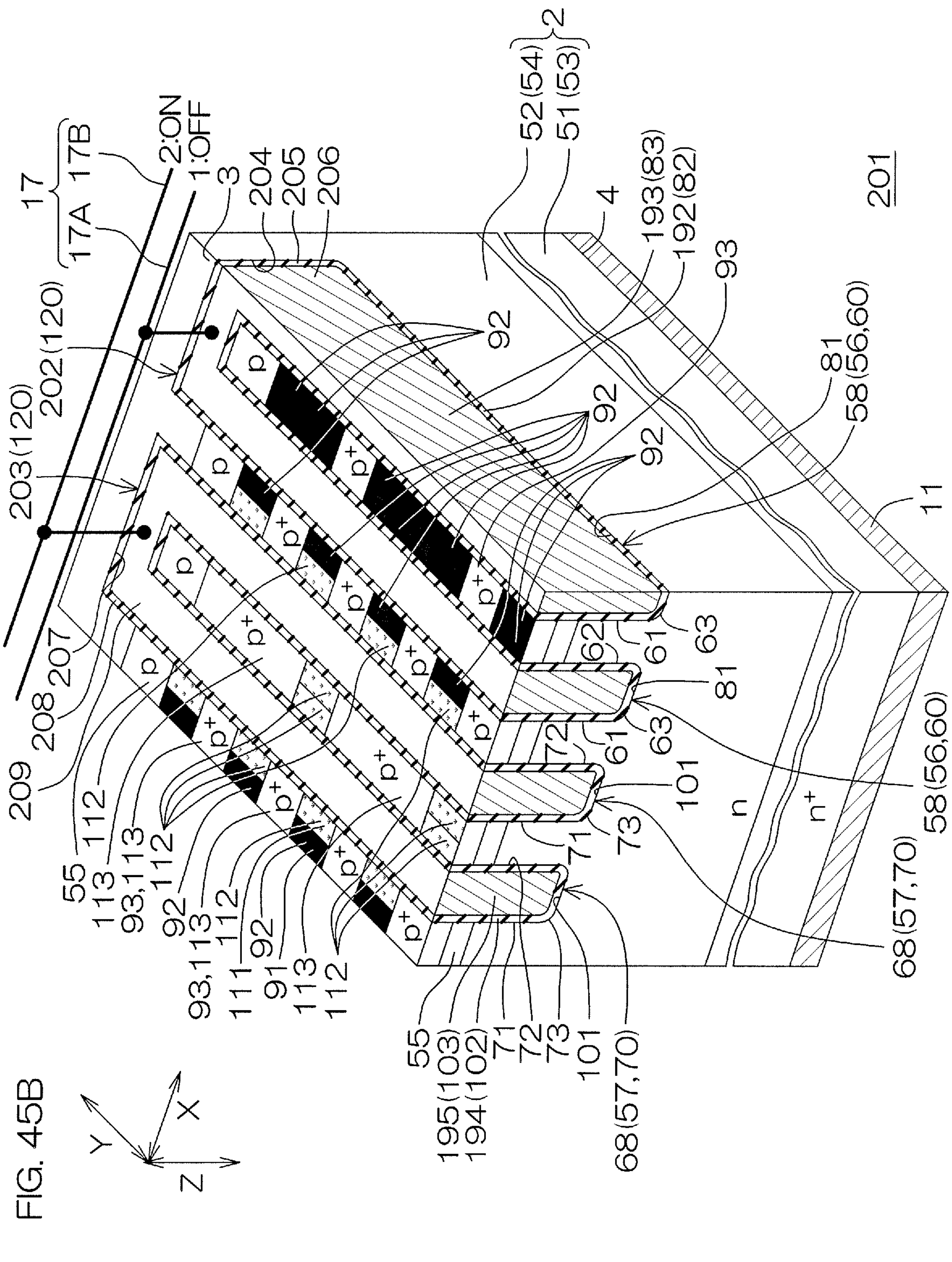
FIG. 45B is a sectional perspective view for describing an active clamp operation of the semiconductor device shown in FIG. 44.

FIG. 45A is a sectional perspective view for describing the normal operation of the semiconductor device 201 shown in FIG. 44. FIG. 45B is a sectional perspective view for describing the active clamp operation of the semiconductor device 201 shown in FIG. 44. In FIG. 45A and FIG. 45B, for convenience of description, structures in the first main surface 3 are omitted to simplify the gate control wiring 17.

With reference to FIG. 45A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have a substantially equal voltage.

In this case, the first gate electrode 193 and the second gate electrode 195 are each put into the ON state. Thereby, the first channel region 91 and the second channel region 111 are both controlled to be in the ON states. In FIG. 45A, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. Thereby, the area resistivity Ron·A is lowered as compared with a case where the characteristics channel rate RC is less than 50%.

On the other hand, with reference to FIG. 45B, when the power MISFET 9 is in the active clamp operation, an OFF signal Voff is input to the first gate control wiring 17A, and a clamp ON signal VCon is input to the second gate control wiring 17B. The OFF signal Voff and the clamp ON signal VCon are each input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state. In FIG. 45B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the channel utilization rate RU in the active clamp operation is less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac is improved as compared with a case where the characteristics channel rate RC exceeds 18.75%.

As described above, the same effects as those described for the semiconductor device 191 can be exhibited as well by the semiconductor device 201. Further, in the semiconductor device 201, the plurality of first FET structures 58 and the plurality of second FET structures 68 are formed in a manner that the group of the plurality (in this embodiment, two) of first FET structures 58 and the group of the plurality (in this embodiment, two) of second FET structures 68 are alternately arrayed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 46:
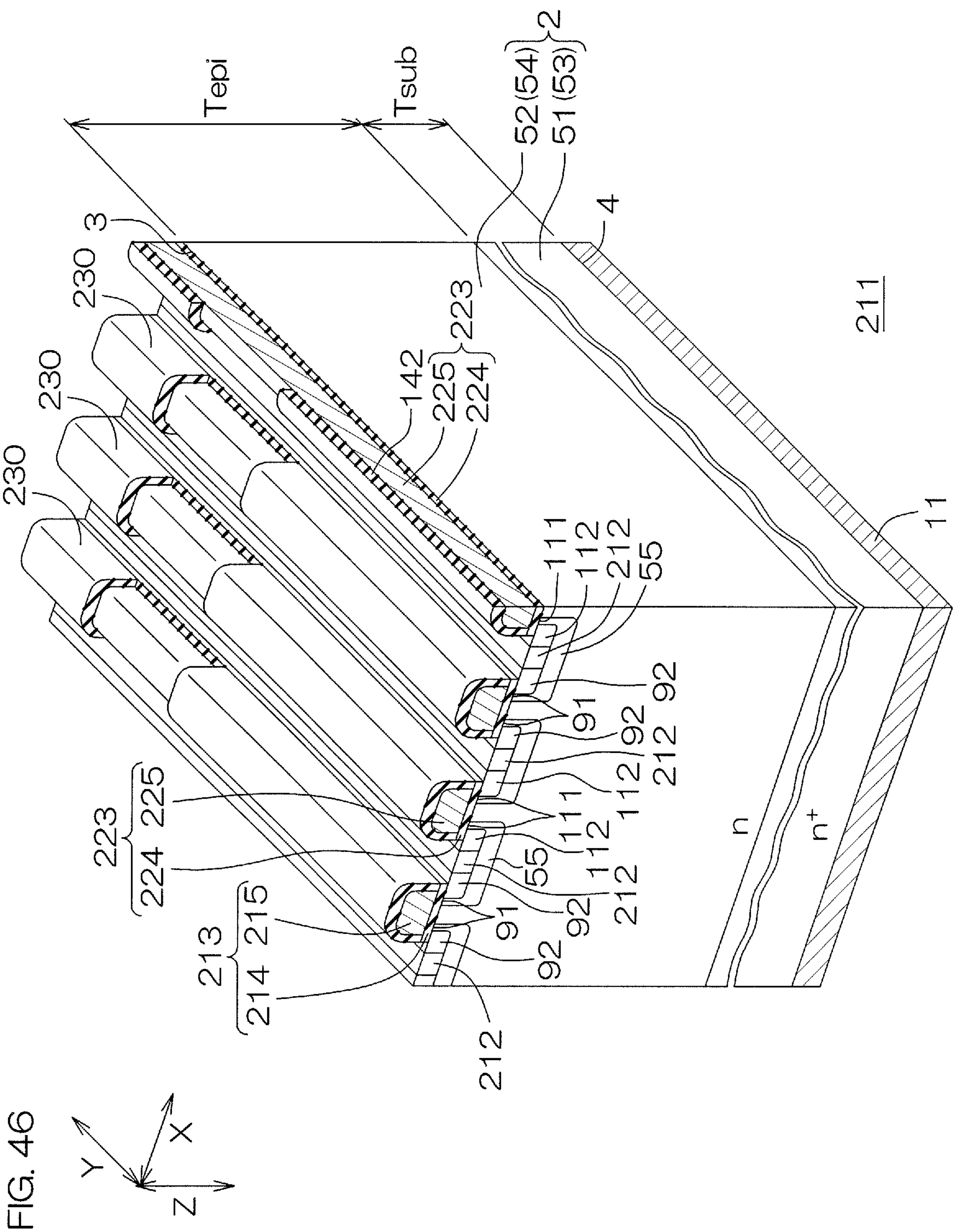
FIG. 46 is a sectional perspective view of a region corresponding to FIG. 7 and is a partially cutaway sectional perspective view which shows a semiconductor device according to an eighth preferred embodiment of the present invention.

FIG. 46 is a sectional perspective view of a region corresponding to FIG. 7 and is a partially cutaway sectional perspective view which shows a semiconductor device 211 according to an eighth preferred embodiment of the present invention. Hereinafter, structures corresponding to the structures described for the semiconductor device 1 shall be provided with the same reference symbols and description thereof shall be omitted.

The semiconductor device 1 includes the trench gate-type first FET structures 58 and the trench-gate type second FET structures 68. In contrast thereto, the semiconductor device 211 includes a planar gate-type first FET structure 58 and a planar gate-type second FET structure 68. Hereinafter, a description will be given of a specific structure of the semiconductor device 211.

With reference to FIG. 46, a plurality of body regions 55 are formed in the surface layer portion of the first main surface 3 of the semiconductor layer 2. The plurality of body regions 55 are regions which serve as bases of the power MISFET 9. The plurality of body regions 55 are formed at intervals along the first direction X, and each extend in a band shape along the second direction Y. The plurality of body regions 55 are formed in a stripe shape as a whole in plan view.

Each of the first FET structures 58 includes the first source region 92 formed in the surface layer portion of each of the body regions 55. The first source region 92 extends in a band shape along the second direction Y. Each of the second FET structures 68 includes the second source region 112 formed in the surface layer portion of each of the body regions 55. Specifically, the second source region 112 is formed with an interval along the first direction X and extends in a band shape along the second direction Y.

Each of the first FET structures 58 and each of the second FET structures 68 include the $p^+$-type contact region 212 formed in the surface layer portion of each of the body regions 55. The contact region 212 is shared by the first FET structure 58 and the second FET structure 68. The contact region 212 is formed in a region between the first source region 92 and the second source region 112. The contact region 212 extends in a band shape along the second direction Y.

The first FET structure 58 includes a first planar gate structure 213 formed on the first main surface 3 of the semiconductor layer 2. The first planar gate structure 213 extends in a band shape along the second direction Y and faces the drift region 54, the body region 55, and the first source region 92.

Specifically, each of the first planar gate structures 213 includes a first gate insulation layer 214 and a first gate electrode 215. The first gate insulation layer 214 is formed on the first main surface 3. The first gate insulation layer 214 covers the drift region 54, the body region 55, and the first source region 92 on the first main surface 3. The first gate electrode 215 faces the drift region 54, the body region 55, and the first source region 92 across the first gate insulation layer 214.

In this embodiment, the first channel region 91 of the first MISFET 56 is formed in a region between the drift region 54 and the first source region 92 in the body region 55. The first channel region 91 faces the first gate electrode 215 across the first gate insulation layer 214.

The second FET structure 68 includes a second planar gate structure 223 formed on the second main surface 4 of the semiconductor layer 2. The second planar gate structure 223 extends in a band shape along the second direction Y and faces the drift region 54, the body region 55, and the second source region 112.

Specifically, each of the second planar gate structures 223 includes a second gate insulation layer 224 and a second gate electrode 225. The second gate insulation layer 224 is formed on the second main surface 4. The second gate insulation layer 224 covers the drift region 54, the body region 55, and the second source region 112 on the second main surface 4. The second gate electrode 225 faces the drift region 54, the body region 55, and the second source region 112 across the second gate insulation layer 224.

In this embodiment, the second channel region 111 of the second MISFET 57 is formed in a region between the drift region 54 and the second source region 112 in the body region 55. The second channel region 111 faces the second gate electrode 225 across the second gate insulation layer 224.

The interlayer insulation layer 142 is formed on the first main surface 3. A plurality of source openings 230 are formed in the interlayer insulation layer 142. The source openings 230 are each formed in a part which covers a region between the first planar gate structure 213 and the second planar gate structure 223 which are adjacent to each other in the interlayer insulation layer 142. The source openings 230 each expose the first source region 92, the second source region 112, and the contact region 212.

Although not specifically shown in the drawing, the source electrode 12 is formed on the interlayer insulation layer 142 in a manner that enters each of the source openings 230. The source electrode 12 is electrically connected to the first source region 92, the second source region 112, and the contact region 212 inside each of the source openings 230. Further, although not specifically shown in the drawing, the first gate control wiring 17A is electrically connected to the first gate electrode 193, and the second gate control wiring 17B is electrically connected to the second gate electrode 195.

Figure 47A:
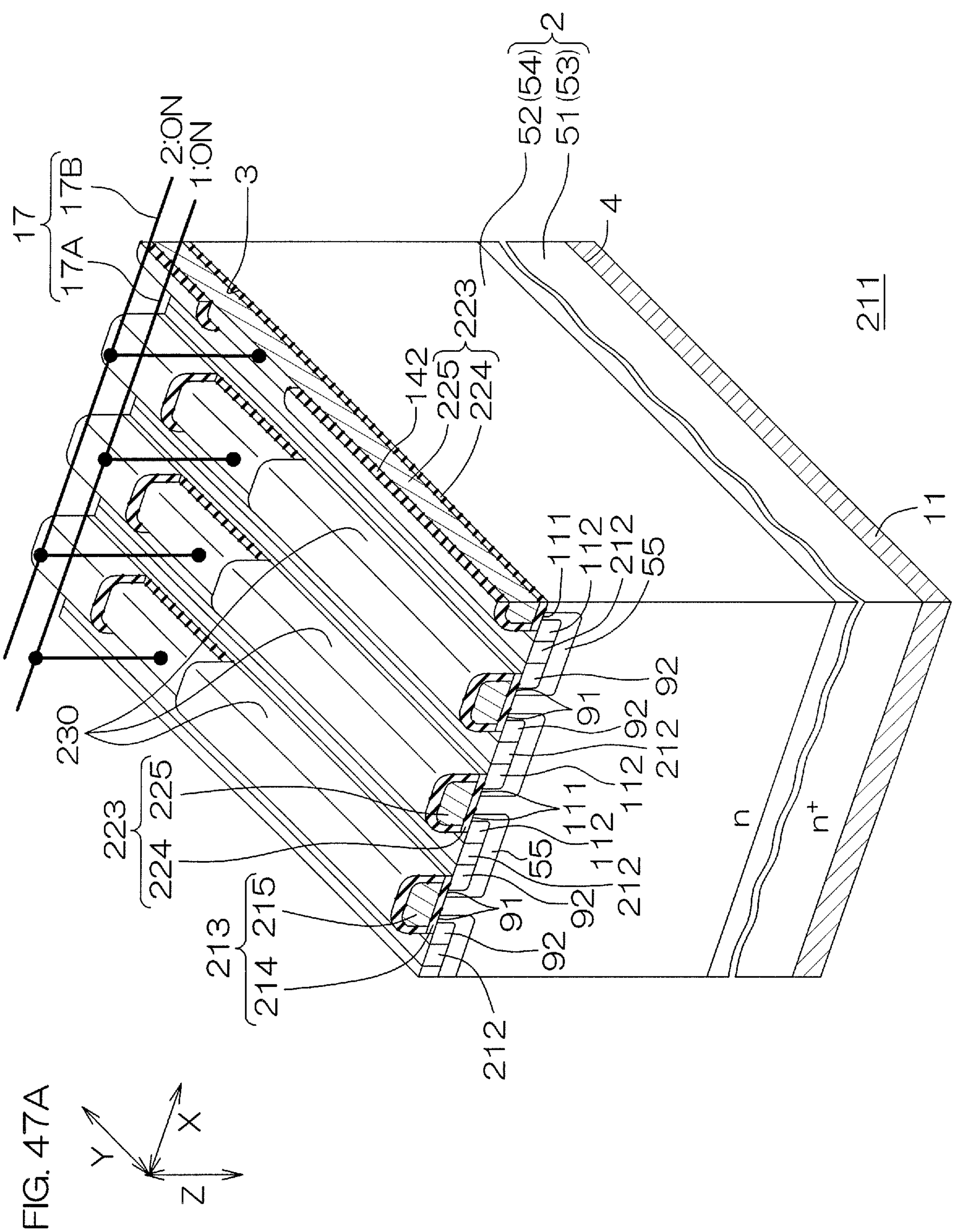
FIG. 47A is a sectional perspective view for describing a normal operation of the semiconductor device shown in FIG. 46.
Figure 47B:
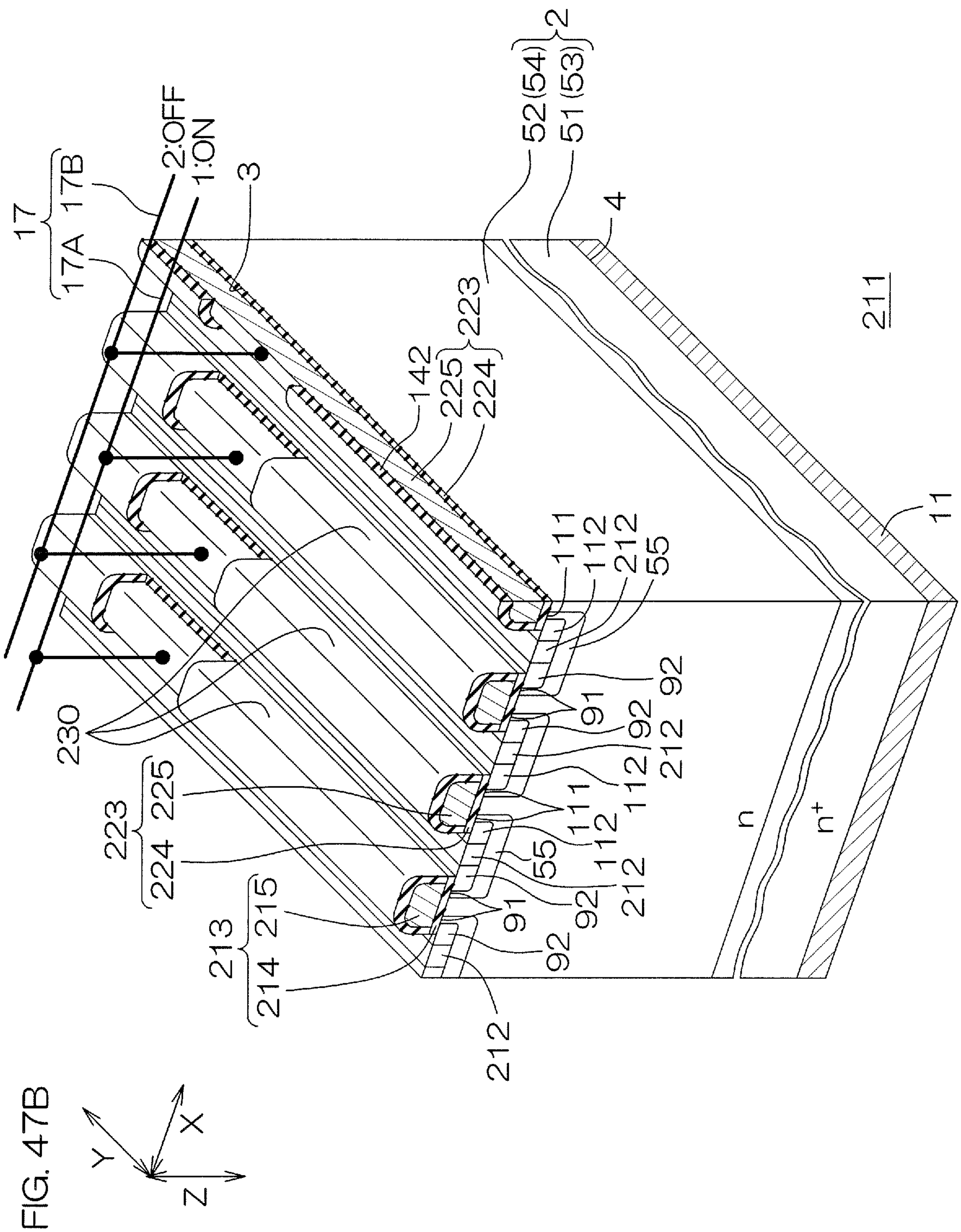
FIG. 47B is a sectional perspective view for describing an active clamp operation of the semiconductor device shown in FIG. 46.

FIG. 47A is a sectional perspective view for describing the normal operation of the semiconductor device 211 shown in FIG. 46. FIG. 47B is a sectional perspective view for describing the active clamp operation of the semiconductor device 211 shown in FIG. 46.

With reference to FIG. 47A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may have a substantially equal voltage.

In this case, the first gate electrode 193 and the second gate electrode 195 are each put into the ON state. Thereby, the first channel region 91 and the second channel region 111 are both controlled to be in the ON states.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A is lowered as compared with a case where the characteristics channel rate RC is less than 50%.

On the other hand, with reference to FIG. 47B, when the power MISFET 9 is in the active clamp operation, the OFF signal Voff is input to the first gate control wiring 17A, and a clamp ON signal VCon is input to the second gate control wiring 17B. The OFF signal Voff and the clamp ON signal VCon are each input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. The channel utilization rate RU in the active clamp operation is 50%. Further, the characteristics channel rate RC in the active clamp operation is 25%. Thereby, the active clamp capability Eac is improved as compared with a case where the characteristics channel rate RC is in excess of 25%.

As described above, the same effects as those described for the semiconductor device 1 can be exhibited as well by the semiconductor device 211.

Figure 48:
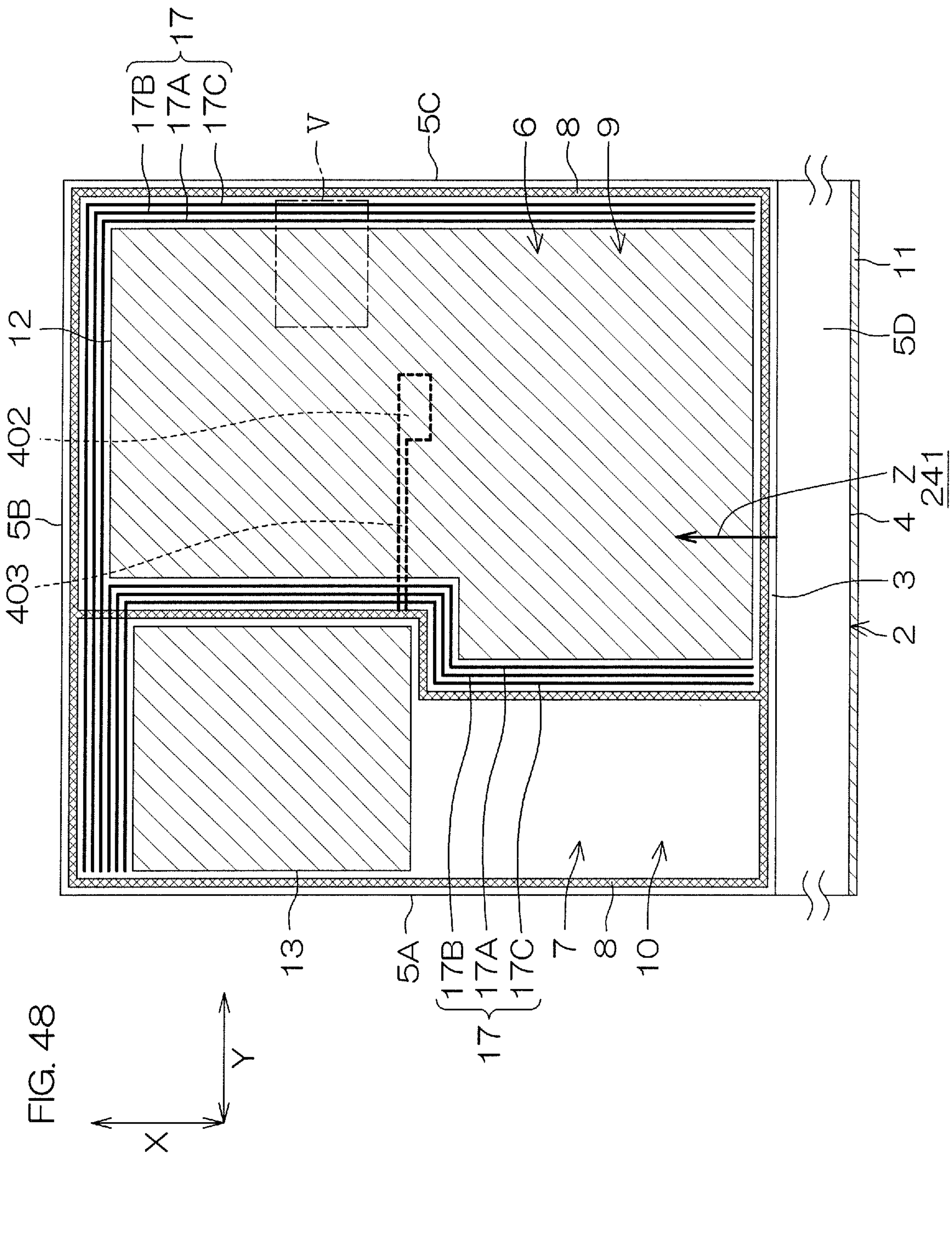
FIG. 48 is a perspective view of a semiconductor device according to a ninth preferred embodiment of the present invention which is viewed from one direction.

FIG. 48 is a perspective view of a semiconductor device 241 according to a ninth preferred embodiment of the present invention which is viewed from one direction. Hereinafter, structures corresponding to the structures described for the semiconductor device 1 shall be provided with the same reference symbols and description thereof shall be omitted.

In the aforementioned first preferred embodiment, a description has been given of a configuration example in which the semiconductor device 1 is the high-side switching device. However, the semiconductor device 1 may be provided as a low-side switching device. Here, a configuration example of the semiconductor device 1 which is manufactured as the low-side switching device shall be described as the semiconductor device 241 according to the ninth preferred embodiment.

As a structure (control example) of the power MISFET 9 which is incorporated into the semiconductor device 241, without being restricted to the structure (control example) of the power MISFET 9 according to the first preferred embodiment, any one of the structures (control examples) of the power MISFETs 9 shown in the second preferred embodiment, third preferred embodiment, fourth preferred embodiment, fifth preferred embodiment, sixth preferred embodiment, seventh preferred embodiment, and eighth preferred embodiment is applied. It shall be deemed that a description of any one of the structures (control examples) of the power MISFETs 9 according to the first to the eighth preferred embodiments is applied with modifications to a description of the structure (control example) of the power MISFET 9 of the semiconductor device 241 and a description thereof shall be omitted.

With reference to FIG. 48, the semiconductor device 241 includes the semiconductor layer 2, as with the first preferred embodiment, etc. The output region 6 and the input region 7 are defined in the semiconductor layer 2, as with the first preferred embodiment, etc. The output region 6 includes the power MISFET 9. The input region 7 includes the control IC 10.

The plurality (in this embodiment, three) of electrodes 11, 12, and 13 are formed on the semiconductor layer 2. In FIG. 48, the plurality of electrode 11 to 13 are shown by hatching. The number, the arrangement, and the planar shape of the plurality of electrodes 11 to 13 are arbitrary, and they are not restricted to the configuration shown in FIG. 48.

The number, the arrangement, and the planar shape of the plurality of electrodes 11 to 13 are adjusted according to the specification of the power MISFET 9 and/or the specification of the control IC 10. In this embodiment, the plurality of electrodes 11 to 13 include the drain electrode 11 (output electrode), the source electrode 12 (reference voltage electrode), and the input electrode 13.

The drain electrode 11 is formed on the second main surface 4 of the semiconductor layer 2, as with the first preferred embodiment, etc. The drain electrode 11 transmits to the outside an electrical signal generated by the power MISFET 9.

The source electrode 12 is formed in the output region 6 on the first main surface 3, as with the first preferred embodiment, etc. The source electrode 12 supplies the reference voltage (for example, the ground voltage) to the power MISFET 9 and/or various functional circuits of the control IC 10.

The input electrode 13 is formed in the input region 7 on the first main surface 3, as with the first preferred embodiment, etc. The input electrode 13 transmits an input voltage for driving the control IC 10.

The gate control wiring 17 as one example of the control wiring is formed on the semiconductor layer 2, as with the first preferred embodiment, etc. In this embodiment, the gate control wiring 17 includes the first gate control wiring 17A, the second gate control wiring 17B, and the third gate control wiring 17C. The gate control wiring 17 is selectively laid around in the output region 6 and the input region 7. The gate control wiring 17 is electrically connected to the gate of the power MISFET 9 in the output region 6 and electrically connected to the control IC 10 in the input region 7.

Figure 49:
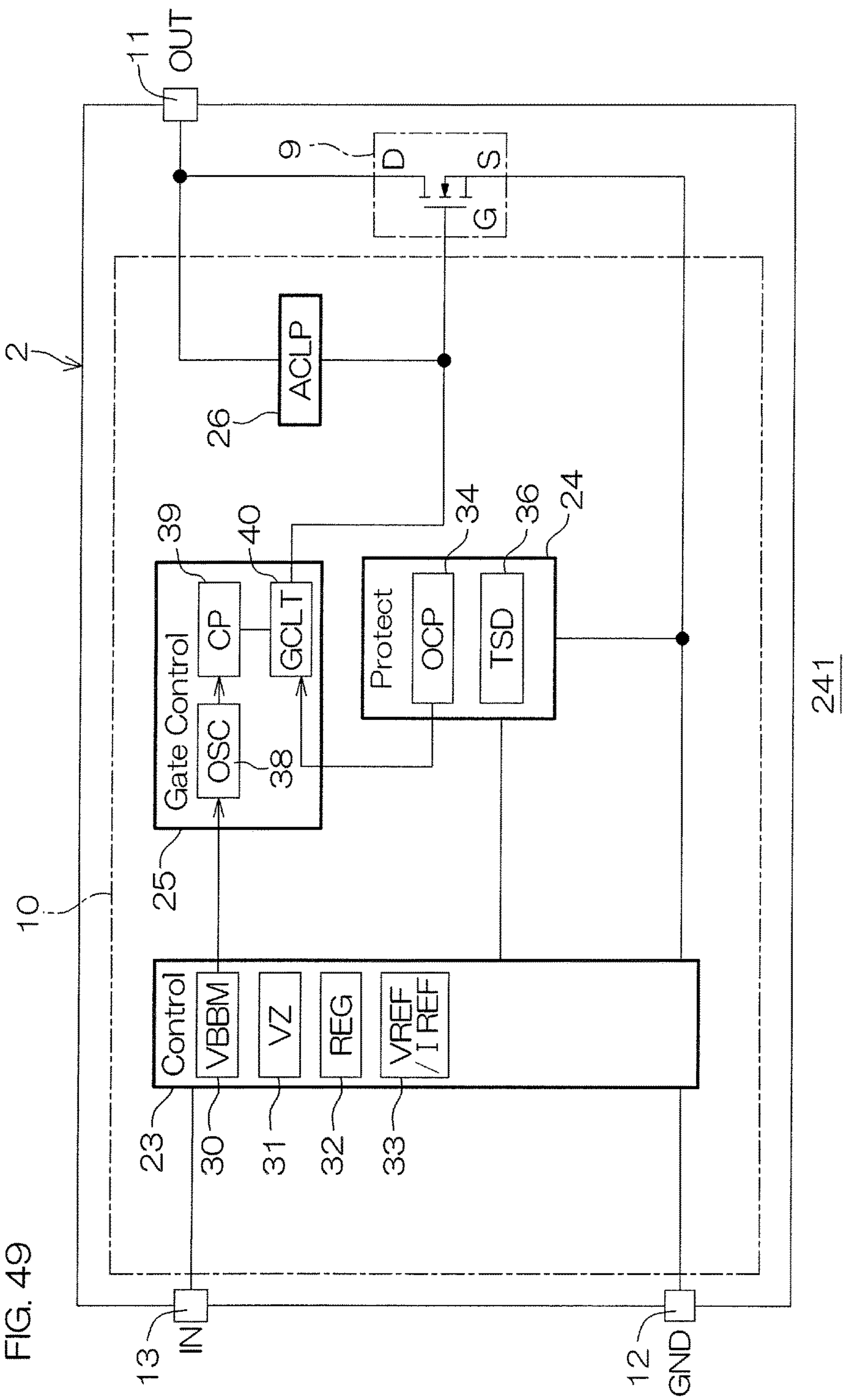
FIG. 49 is a block circuit diagram which shows an electrical configuration of the semiconductor device shown in FIG. 48.

FIG. 49 is a block circuit diagram which shows an electrical configuration of the semiconductor device 241 shown in FIG. 48. Hereinafter, an example in which the semiconductor device 241 is adopted into a vehicle shall be described.

The semiconductor device 241 includes the drain electrode 11 as an output electrode, the source electrode 12 as the reference voltage electrode, the input electrode 13, the gate control wiring 17, the power MISFET 9, and the control IC 10.

The drain electrode 11 is electrically connected to the drain of the power MISFET 9. The drain electrode 11 is connected to a load. The source electrode 12 is electrically connected to the source of the power MISFET 9. The source electrode 12 supplies the reference voltage to the power MISFET 9 and the control IC 10.

The input electrode 13 may be connected to an MCU, a DC/DC converter, a LDO, etc. The input electrode 13 supplies an input voltage to the control IC 10. The gate of the power MISFET 9 is connected to the control IC 10 (the gate control circuit 25 to be described later) through the gate control wiring 17.

In this embodiment, the control IC 10 includes the current-voltage control circuit 23, the protection circuit 24, the gate control circuit 25, and the active clamp circuit 26.

The current-voltage control circuit 23 is connected to the source electrode 12, the input electrode 13, the protection circuit 24, and the gate control circuit 25. The current-voltage control circuit 23 generates various voltages in response to an electrical signal from the input electrode 13 and an electrical signal from the protection circuit 24. In this embodiment, the current-voltage control circuit 23 includes a driving voltage generation circuit 30, the first constant voltage generation circuit 31, the second constant voltage generation circuit 32, and the reference voltage-reference current generation circuit 33.

The driving voltage generation circuit 30 generates the driving voltage for driving the gate control circuit 25. The driving voltage generated by the driving voltage generation circuit 30 is input to the gate control circuit 25.

The first constant voltage generation circuit 31 generates a first constant voltage for driving the protection circuit 24. The first constant voltage generation circuit 31 may include a Zener diode and/or a regulator circuit. The first constant voltage is input to the protection circuit 24 (for example, the overcurrent protection circuit 34).

The second constant voltage generation circuit 32 generates a second constant voltage for driving the protection circuit 24. The second constant voltage generation circuit 32 may include a Zener diode and/or a regulator circuit. A second constant voltage is input to the protection circuit 24 (for example, the overheat protection circuit 36).

The reference voltage-reference current generation circuit 33 generates a reference voltage and a reference current for various types of circuits. The reference voltage and the reference current are input to various types of circuits. In a case where the various types of circuits include the comparator, the reference voltage and the reference current may be input to the comparator.

The protection circuit 24 is connected to the current-voltage control circuit 23, the gate control circuit 25, and the source of the power MISFET 9. The protection circuit 24 includes the overcurrent protection circuit 34 and the overheat protection circuit 36.

The overcurrent protection circuit 34 protects the power MISFET 9 from an overcurrent. The overcurrent protection circuit 34 is connected to the gate control circuit 25. The overcurrent protection circuit 34 may include the current monitor circuit. A signal generated by the overcurrent protection circuit 34 is input to the gate control circuit 25 (specifically, the driving signal output circuit 40 to be described later).

The overheat protection circuit 36 protects the power MISFET 9 from an excessive temperature rise. The overheat protection circuit 36 is connected to the current-voltage control circuit 23. The overheat protection circuit 36 monitors a temperature of the semiconductor device 241. The overheat protection circuit 36 includes the temperature-sensitive diode DT. A signal generated by the overheat protection circuit 36 is input to the current-voltage control circuit 23.

The gate control circuit 25 controls the ON state and the OFF state of the power MISFET 9. The gate control circuit 25 is connected to the current-voltage control circuit 23, the protection circuit 24, and the gate of the power MISFET 9.

The gate control circuit 25 generates plural types of gate control signals according to the number of the gate control wirings 17 in response to an electrical signal from the current-voltage control circuit 23 and an electrical signal from the protection circuit 24. The plural types of gate control signals are input to the gate of the power MISFET 9 through the gate control wiring 17.

Specifically, the gate control circuit 25 includes the oscillation circuit 38, the charge pump circuit 39, and the driving signal output circuit 40. The oscillation circuit 38 oscillates in response to an electrical signal from the current-voltage control circuit 23 to generate a predetermined electrical signal. The electrical signal generated by the oscillation circuit 38 is input to the charge pump circuit 39. The charge pump circuit 39 boosts the electrical signal from the oscillation circuit 38. The electrical signal boosted by the charge pump circuit 39 is input to the driving signal output circuit 40.

The driving signal output circuit 40 generates plural types of gate control signals in response to an electrical signal from the charge pump circuit 39 and an electrical signal from the protection circuit 24 (specifically, the overcurrent protection circuit 34). The plural types of gate control signals are input to the gate of the power MISFET 9 through the gate control wiring 17. Thereby, the power MISFET 9 is driven and controlled.

The active clamp circuit 26 protects the power MISFET 9 from the counter electromotive force. The active clamp circuit 26 is connected to the drain electrode 11 and the gate of the power MISFET 9.

Figure 50:
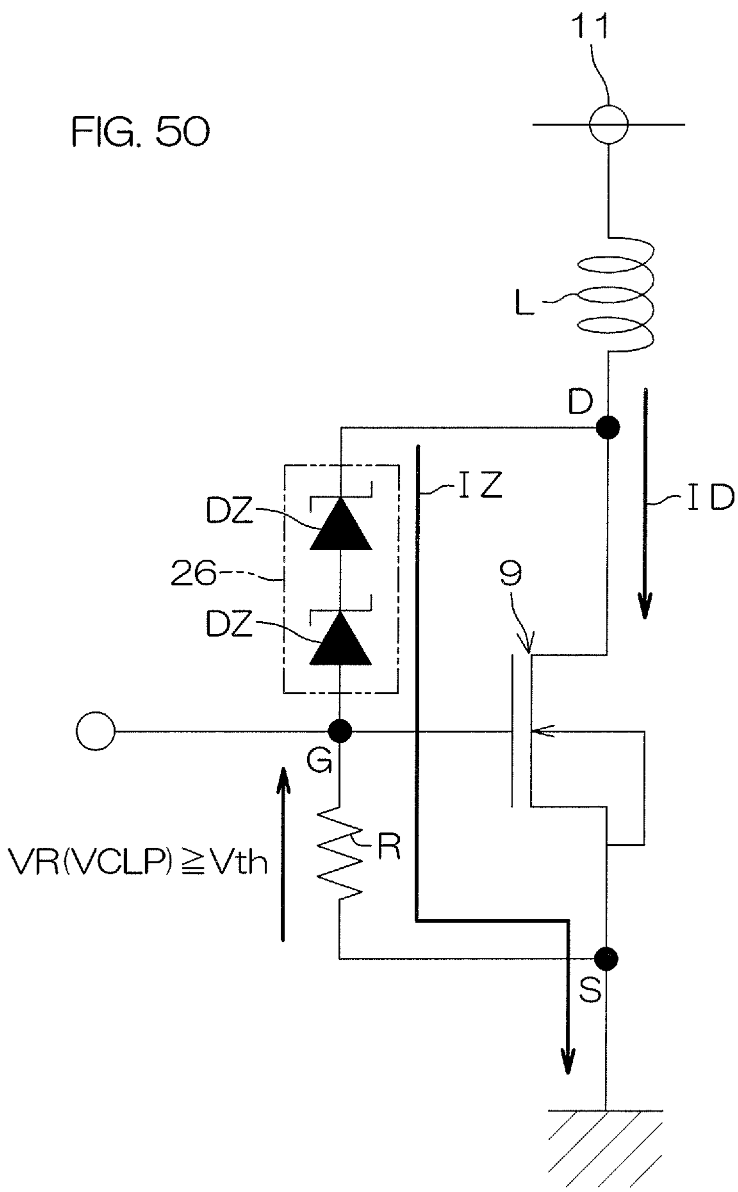
FIG. 50 is a circuit diagram for describing a normal operation and an active clamp operation of the semiconductor device shown in FIG. 48.
Figure 51:
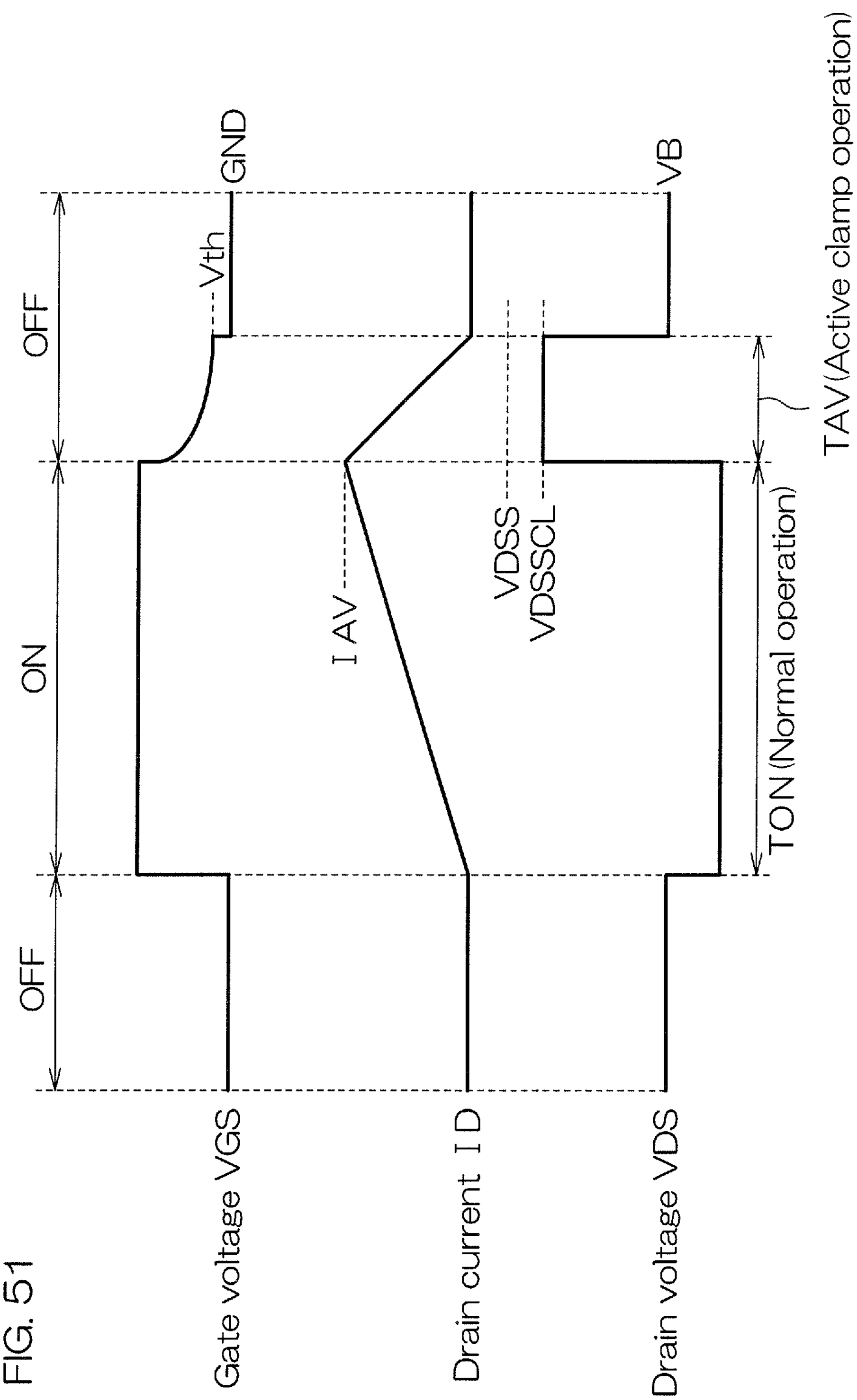
FIG. 51 is a waveform chart of a main electrical signal applied to the circuit diagram shown in FIG. 50.

FIG. 50 is a circuit diagram for describing the normal operation and the active clamp operation of the semiconductor device 241 shown in FIG. 48. FIG. 51 is a waveform chart of a main electrical signal applied to the circuit diagram shown in FIG. 50.

Here, a circuit example in which the inductive load L is connected to the power MISFET 9 is used to describe the normal operation and the active clamp operation of the semiconductor device 241. A device which uses a solenoid, a motor, a transformer, and a winding (coil) such as a relay, etc., is shown as an example of the inductive load L. The inductive load L is also called the L load.

With reference to FIG. 50, the source of the power MISFET 9 is connected to the ground. The drain of the power MISFET 9 is electrically connected to the inductive load L. The gate and the drain of the power MISFET 9 are connected to the active clamp circuit 26. The gate and the source of the power MISFET 9 are connected to a resistance R. In this circuit example, the active clamp circuit 26 includes the k number (k is a natural number) of Zener diodes DZ which are connected to each other in a biased manner.

With reference to FIG. 50 and FIG. 51, when the ON signal Von is input to the gate of the power MISFET 9 in the OFF state, the power MISFET 9 is switched from the OFF state to the ON state (the normal operation). The ON signal Von has a voltage equal to or larger than the gate threshold voltage Vth (Vth≤Von). The power MISFET 9 is kept in the ON state only for a predetermined ON time TON.

When the power MISFET 9 is switched to the ON state, a drain current ID starts to flow from the drain of the power MISFET 9 to the source thereof. The drain current ID is increased proportionally in accordance with the ON time TON of the power MISFET 9. The inductive load L allows an inductive energy to accumulate due to an increase in the drain current ID.

When the OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage). When the power MISFET 9 is switched to the OFF state, an inductive energy of the inductive load L is applied to the power MISFET 9 as the counter electromotive force.

Thereby, the power MISFET 9 is shifted to the active clamp state (the active clamp operation). When the power MISFET 9 is shifted to the active clamp state, a drain voltage VDS is sharply raised to a clamp voltage VDSSCL.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL≤VDSS).

In a case where the clamp voltage VDSSCL is equal to or less than the maximum rated drain voltage VDSS (VDSSCL≤VDSS), a reverse current IZ flows to the active clamp circuit 26. Thereby, a limit voltage VL is formed between terminals of the active clamp circuit 26. In this embodiment, the limit voltage VL is a sum of voltages across terminals VZ of Zener diodes DZ in the active clamp circuit 26 (VL=k·VZ).

Further, the reverse current IZ passes through the resistance R and reaches a ground. Thereby, a voltage VR between terminals is formed between terminals of the resistance R. The voltage VR between terminals of the resistance R (=IZ×R) is adjusted to a voltage not less than the gate threshold voltage Vth (Vth≤VR). The voltage VR between terminals is applied between the gate and the source of the power MISFET 9 as the clamp ON voltage VCLP. Therefore, the power MISFET 9 keeps the ON state in the active clamp state. The clamp ON voltage VCLP (voltage VR between terminals) may have a voltage less than the ON signal Von.

Thereby, the inductive energy of the inductive load L is consumed (absorbed) in the power MISFET 9. After an active clamp time TAV, the drain current ID is reduced to zero from a peak value IAV which is immediately before the power MISFET 9 becomes the OFF state. Thereby, the gate voltage VGS becomes the ground voltage and the drain voltage VDS becomes the power supply voltage VB, and the power MISFET 9 is switched from the ON state to the OFF state.

The active clamp capability Eac of the power MISFET 9 is defined by the capability in the active clamp operation. Specifically, the active clamp capability Eac is defined by the capability with respect to the counter electromotive force caused by an inductive energy of the inductive load L in transition when the power MISFET 9 is switched from the ON state to the OFF state.

More specifically, the active clamp capability Eac is defined by a capability with respect to an energy caused by the clamp voltage VDSSCL, as apparent from the circuit example of FIG. 47.

As described above, the same effects as those described for the semiconductor device 1 can be exhibited as well by the semiconductor device 241.

While the preferred embodiments of the present invention have been described above, the present invention may be implemented in yet other embodiments.

In each of the aforementioned preferred embodiments, a description has been given of an example in which the temperature-sensitive diode structure 431 has the diode trench 432 which includes the annular trench 435, the first connection trench 436, and the second connection trench 437. However, there may be formed the diode trench 432 which does not have the first connection trench 436 and the second connection trench 437.

In each of the aforementioned preferred embodiments, a description has been given of an example in which the temperature-sensitive diode structure 431 has the diode trench 432 which includes the annular trench 435, the first connection trench 436, and the second connection trench 437. However, the diode trench 432 may include a band-shaped trench which extends in a straight line along one direction (for example, second direction Y) in plan view, in place of the annular trench 435.

In this case, the first connection trench 436 is connected to one end portion of the band-shaped trench, and the second connection trench 437 is connected to the other end portion of the band-shaped trench. The band-shaped trench, the first connection trench 436, and the second connection trench 437 form one trench which extends in a straight line.

In each of the aforementioned preferred embodiments, a description has been given of an example in which the region separation structure 401, the anode wiring structure 411, and the cathode wiring structure 421 are formed separately. However, the region separation structure 401, the anode wiring structure 411, and the cathode wiring structure 421 have a structure common to each other, although different in a voltage applied thereto.

Therefore, the anode wiring structure 411 and/or the cathode wiring structure 421 may be formed by using a part of the region separation structure 401. Further, in place of the region separation structure 401, only the anode wiring structure 411 and the cathode wiring structure 421 may be formed.

In each of the aforementioned preferred embodiments, in a case where the first bottom-side electrode 86 and the second bottom-side electrode 106 which are electrically connected to the third gate control wiring 17C each function as a field electrode, the third gate control wiring 17C may be electrically connected to the source electrode 12 in place of the control IC.

In this case, the third gate control wiring 17C may be led out from the source electrode 12. Therefore, the reference voltage (for example, the ground voltage) is transmitted to the first bottom-side electrode 86 and the second bottom-side electrode 106 from the source electrode 12 through the third gate control wiring 17C. The same effects as those described for the semiconductor device 1, etc., can be exhibited as well by the above-described structure.

In each of the aforementioned preferred embodiments, as long as the channel utilization rate RU in the active clamp operation and the channel utilization rate RU in the normal operation can be appropriately controlled, the plurality of first FET structures 58 and the plurality of second FET structures 68 may be arrayed in an arbitrary manner.

For example, the plurality of second FET structures 68 may be alternately arrayed with the plurality of first FET structure 58 in a manner that the plurality of first FET structures 58 are held therebetween. The plurality of second FET structures 68 may be alternately arrayed with the plurality of first FET structures 58 in a manner that 2, 3, 4, 5, 6, 7, 8, 9, or 10 of the first FET structures 58 are held therebetween.

Similarly, the plurality of first FET structures 58 may be alternately arrayed with the plurality of second FET structures 68 in a manner that the plurality of second FET structures 68 are held therebetween. The plurality of first FET structures 58 may be alternately arrayed with the plurality of second FET structures 68 in a manner that 2, 3, 4, 5, 6, 7, 8, 9, or 10 of the second FET structures 68 are held therebetween.

As a matter of course, a group of the plurality (two or more) of first FET structures 58 and a group of the plurality (two or more) of second FET structures 68 may be alternately arrayed with each other. Further, the plurality of first FET structures 58 and the plurality of second FET structures 68 may be formed in a manner that a group of the plurality of first FET structures 58 and one second FET structure 68 are alternately arrayed. Further, the plurality of first FET structures 58 and the plurality of second FET structures 68 may be formed in a manner that one first FET structure 58 and a group of the plurality of second FET structures 68 are alternately arrayed.

However, in a case where the plurality of first FET structures 58 and/or the plurality of second FET structures 68 are arrayed in a group, a biased temperature distribution is easily formed in the semiconductor layer 2. Therefore, it is preferable that not more than four of the first FET structures 58 and/or not more than four of the second FET structures 68 are arrayed in a group.

In each of the aforementioned preferred embodiments, as long as the channel utilization rate RU in the active clamp operation and the channel utilization rate RU in the normal operation can be appropriately controlled, a value of the total channel rate RT in each cell region 75 may take any arbitrary value.

For example, in some of the aforementioned preferred embodiments, a description has been given of an example in which a total channel rate RT including the first total channel rate RT1, the second total channel rate RT2, and the third total channel rate RT3 is applied to the plurality of cell regions 75.

However, plural (two or more) types of total channel rates RT different in value from each other may be applied to the plurality of cell regions 75. For example, 2, 3, 4, 5 or 6 or more of the total channel rates RT different in value from each other may be applied to the plurality of cell regions 75.

Further, in each of the aforementioned preferred embodiments, a description has been given of an example in which the power MISFET 9 includes the first MISFET 56 and the second MISFET 57. However, the power MISFET 9 may include 2, 3, 4, 5 or 6 or more of the MISFETs which can be controlled in a mutually independent mode. The plurality (two or more) of the MISFETs can be formed only by changing the number of the gate control wirings 17 connected to the trench gate structure.

In this case, the control IC 10 controls the plurality (two or more) of the MISFETs such that the channel utilization rate RU in the active clamp operation becomes in excess of zero and less than the channel utilization rate RU in the normal operation.

In each of the aforementioned preferred embodiments, the gate control wiring 17 may be formed in a layer different from the drain electrode 11, the source electrode 12, the input electrode 13, the reference voltage electrode 14, the ENABLE electrode 15, or the SENSE electrode 16 or may be formed in the same layer. Further, in the gate control wiring 17, the first gate control wiring 17A, the second gate control wiring 17B, and the third gate control wiring 17C may be formed in a layer different from each other or may be formed in the same layer.

In each of the aforementioned preferred embodiments, a p-type semiconductor part may be given as an n-type semiconductor part, and an n-type semiconductor part may be given as a p-type semiconductor part. In this case, in a description of each of the aforementioned preferred embodiments, an "n-type" part is read as a "p-type" and a "p-type" part is read as an "n-type."

Figure 52:
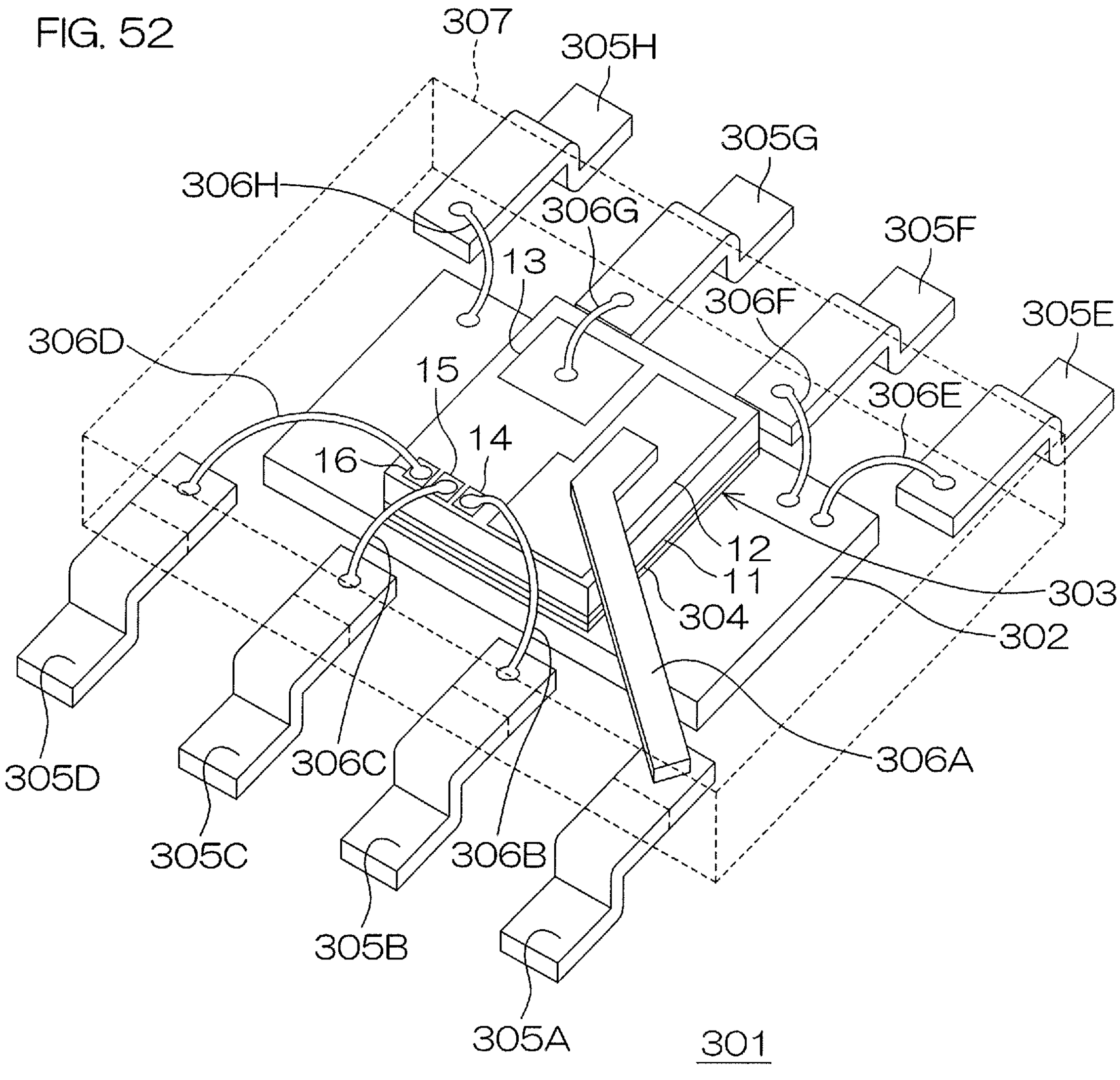
FIG. 52 is a perspective view which shows a semiconductor package as seen through a sealing resin.
Figure 53:
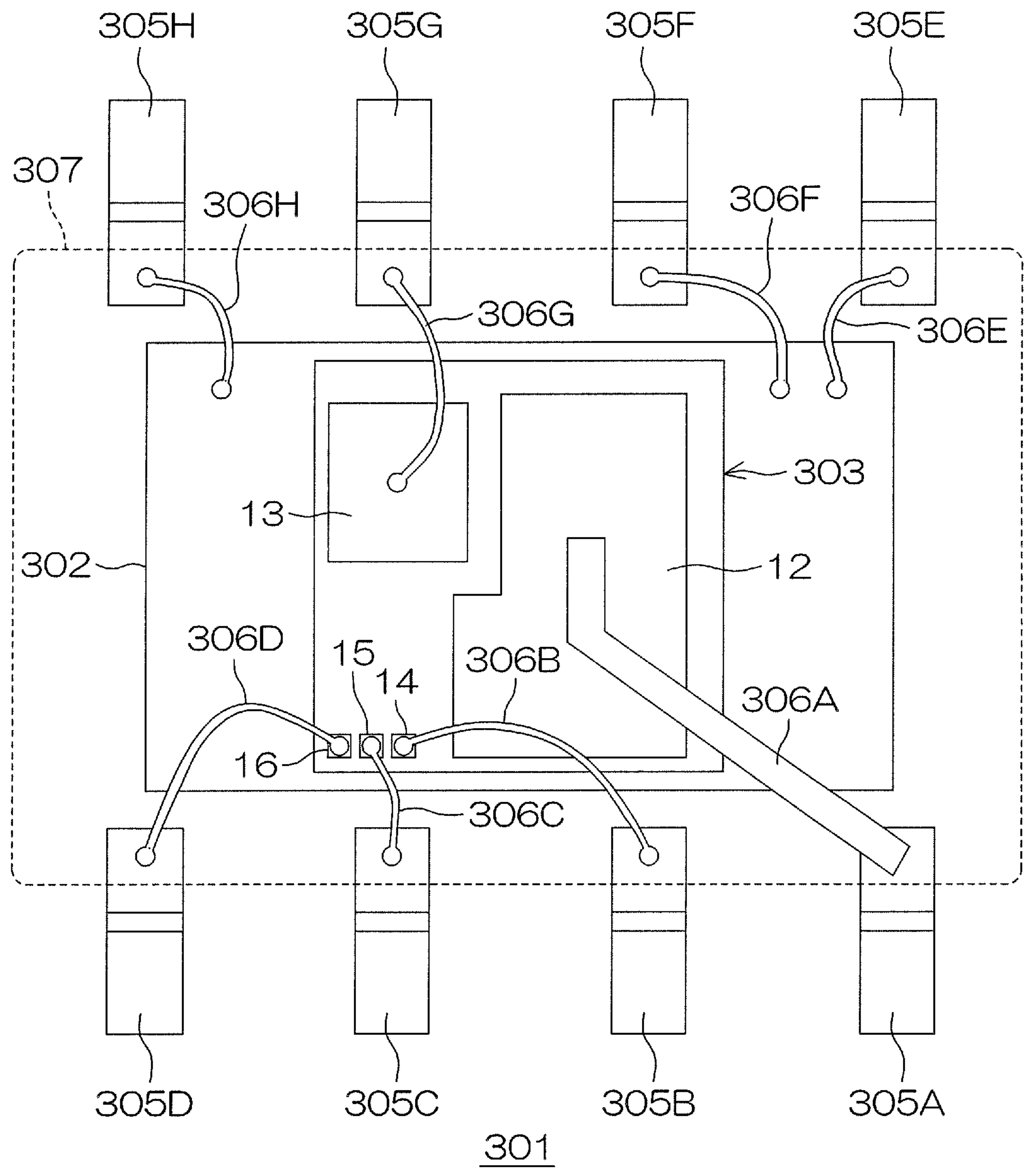
FIG. 53 is a plan view of the semiconductor package shown in FIG. 52.

The semiconductor devices 1, 151, 161, 171, 181, 191, 201, 211, and 241 according to each of the aforementioned preferred embodiments may be incorporated into a semiconductor package as shown in FIG. 52 and FIG. 53. FIG. 52 is a perspective view which shows a semiconductor package 301 as seen through a sealing resin 307. FIG. 53 is a plan view of the semiconductor package 301 shown in FIG. 52.

With reference to FIG. 52 and FIG. 53, in this embodiment, the semiconductor package 301 is a so-called SOP (Small Outline Package). The semiconductor package 301 includes a die pad 302, a semiconductor chip 303, a conductive bonding material 304, a plurality (in this embodiment, eight) of lead electrodes 305A to 305H, a plurality (in this embodiment, eight) of lead wires 306A to 306H, and the sealing resin 307.

The die pad 302 is composed of a metal plate formed in a rectangular parallelepiped shape. The die pad 302 may include iron, aluminum, or copper. The semiconductor chip 303 is composed of any one of the semiconductor devices 1, 151, 161, 171, 181, 191, 201, 211, and 241 according to the first to the ninth preferred embodiment. Here, the semiconductor chip 303 is composed of the semiconductor device 1 according to the first preferred embodiment.

The semiconductor chip 303 is arranged on the die pad 302 in a posture such that the second main surface 4 faces the die pad 302. The drain electrode 11 of the semiconductor chip 303 is connected to the die pad 302 through the conductive bonding material 304. The conductive bonding material 304 may be metal paste or solder.

The plurality of lead electrodes 305A to 305H include a first lead electrode 305A, a second lead electrode 305B, a third lead electrode 305C, a fourth lead electrode 305D, a fifth lead electrode 305E, a sixth lead electrode 305F, a seventh lead electrode 305G, and an eighth lead electrode 305H. The number of lead electrodes is selected according to functions of the semiconductor chip 303 and is not restricted to the number shown in FIG. 52 and FIG. 53.

The plurality of lead electrodes 305A to 305H may include iron, aluminum, or copper. The plurality of lead electrodes 305A to 305H are arranged around the die pad 302 at an interval from the die pad 302.

Specifically, the four lead electrodes 305A to 305D are arrayed at intervals along one side of the die pad 302. The remaining four lead electrodes 305E to 305H are arrayed at intervals along a side facing the side at which the lead electrodes 305A to 305D are arrayed in the die pad 302.

The plurality of lead electrodes 305A to 305H are each formed in a band shape extending along a direction orthogonal to a direction of arrangement. The plurality of lead electrodes 305A to 305H have one end portion which faces the die pad 302 and the other end portion which is the opposite side. One end portions of the plurality of lead electrodes 305A to 305H are internally connected to the semiconductor chip 303. The other end portions of the plurality of lead electrodes 305A to 305H are externally connected to connection targets such as a mounting substrate, etc.

The plurality of lead wires 306A to 306H include a first lead wire 306A, a second lead wire 306B, a third lead wire 306C, a fourth lead wire 306D, a fifth lead wire 306E, a sixth lead wire 306F, a seventh lead wire 306G, and an eighth lead wire 306H. The number of lead wires is selected according to functions of the semiconductor chip 303 (semiconductor device) and is not restricted to the number shown in FIG. 52 and FIG. 53.

The first lead wire 306A is electrically connected to one end portion of the first lead electrode 305A and the source electrode 12. In this embodiment, the first lead wire 306A is composed of a metal clip. The first lead wire 306A may include iron, gold, aluminum, or copper. The first lead wire 306A effectively releases to the outside heat generated in the power MISFET 9. As a matter of course, the first lead wire 306A may be composed of a bonding wire.

The second lead wire 306B is electrically connected to one end portion of the second lead electrode 305B and the reference voltage electrode 14. The third lead wire 306C is electrically connected to one end portion of the third lead electrode 305C and the ENABLE electrode 15. The fourth lead wire 306D is electrically connected to one end portion of the fourth lead electrode 305D and the SENSE electrode 16.

The fifth lead wire 306E is electrically connected to one end portion of the fifth lead electrode 305E and the die pad 302. The sixth lead wire 306F is electrically connected to one end portion of the sixth lead electrode 305F and the die pad 302. The seventh lead wire 306G is electrically connected to one end portion of the seventh lead electrode 305G and the input electrode 13. The eighth lead wire 306H is electrically connected to one end portion of the eighth lead electrode 305H and the die pad 302.

In this embodiment, the second to the eighth lead wire 306B to 306H are composed of a bonding wire. The second to the eighth lead wire 306B to 306H may each include gold, aluminum, or copper. The connection configuration of the plurality of lead wires 306A to 306H to the semiconductor chip 303 and the plurality of lead electrodes 305A to 305H are arbitrary and not restricted to the connection configuration shown in FIG. 52 and FIG. 53.

The sealing resin 307 seals the semiconductor chip 303, the die pad 302, one end portions of the plurality of lead electrodes 305A to 305H, and the plurality of lead wires 306A to 306H such as to expose the other end portions of the plurality of lead electrodes 305A to 305H. The sealing resin 307 is formed in a rectangular parallelepiped shape. The sealing resin 307 may include an epoxy resin.

The configuration of the semiconductor package 301 is not restricted to SOP. TO (Transistor Outline), QFN (Quad For Non Lead Package), DFP (Dual Flat Package), DIP (Dual Inline Package), QFP (Quad Flat Package), SIP (Single Inline Package), SOJ (Small Outline J-leaded Package), or any of various similar configurations may be applied as the semiconductor package 301.

Figure 54:
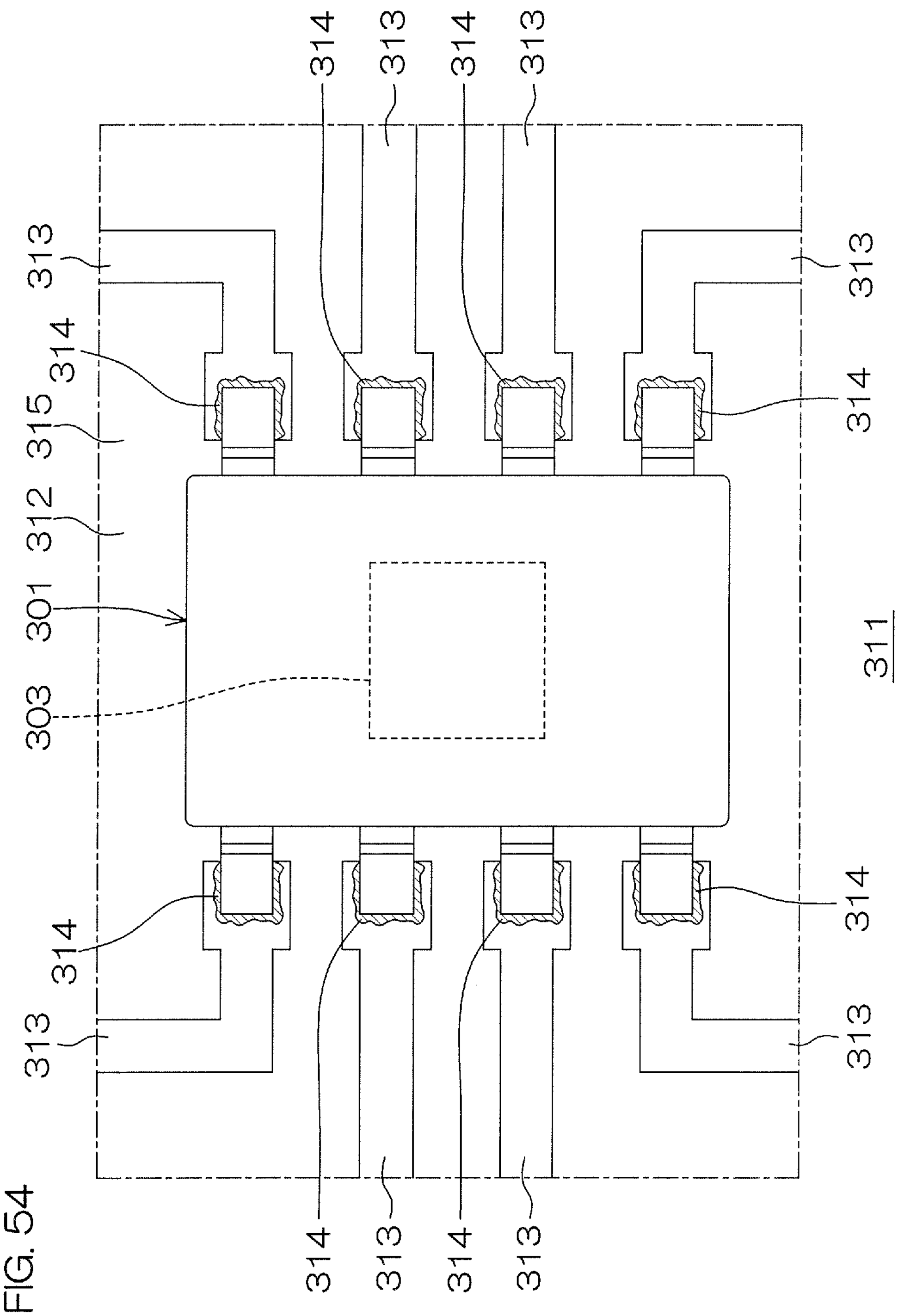
FIG. 54 is a plan view which shows a part of a circuit module according to the first configuration example.

The semiconductor package 301 (semiconductor devices 1, 151, 161, 171, 181, 191, 201, 211, or 241) may be incorporated into a circuit module, as shown in FIG. 54. FIG. 54 is a plan view which shows a part of a circuit module 311 according to the first configuration example.

With reference to FIG. 54, the circuit module 311 includes a mounting substrate 312, a plurality of wirings 313, the semiconductor package 301 (semiconductor device 1, 151, 161, 171, 181, 191, 201, 211 or 241), and a conductive bonding material 314.

The mounting substrate 312 includes a main surface 315. The plurality of wirings 313 are formed on the main surface 315 of the mounting substrate 312. The semiconductor package 301 (semiconductor device 1, 151, 161, 171, 181, 191, 201, 211 or 241) is mounted on the mounting substrate 312 such as to be electrically connected to the plurality of wirings 313 through a conductive bonding material 314. The conductive bonding material 314 may be metal paste or solder.

In each of the aforementioned preferred embodiments, a description has been given of an example in which the semiconductor device 1, 151, 161, 171, 181, 191, 201, 211 or 241 is integrally formed with the power MISFET 9 and the control IC 10.

However, the semiconductor device 1, 151, 161, 171, 181, 191, 201, 211 or 241 which only has the power MISFET 9 may be adopted. Further, the semiconductor device 1, 151, 161, 171, 181, 191, 201, 211 or 241 which only has the power MISFET 9 may be incorporated into the semiconductor package 301 aforementioned.

Figure 55:
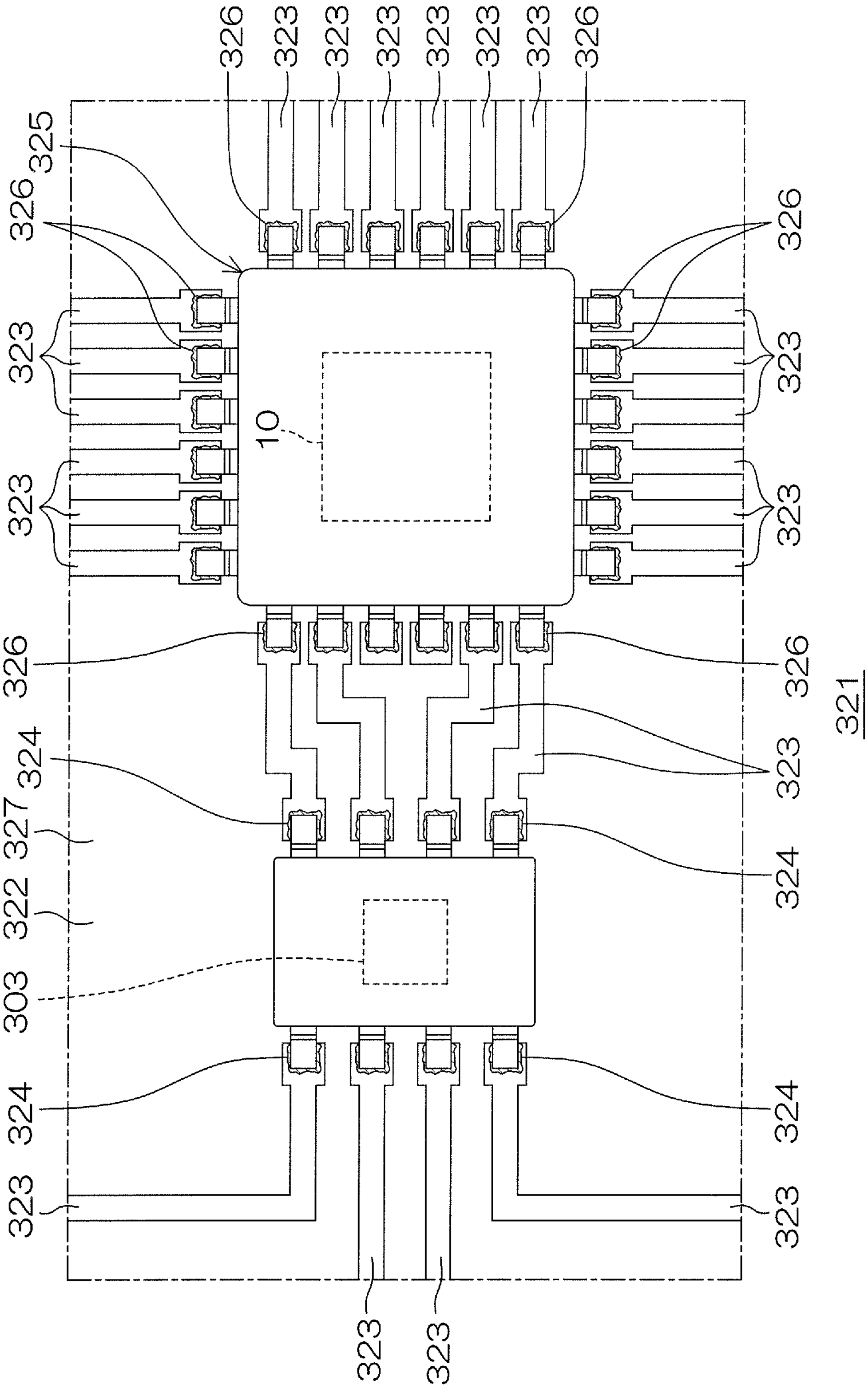
FIG. 55 is a plan view which shows a part of a circuit module according to the second configuration example.

As shown in FIG. 55, the semiconductor package 301 (semiconductor device 1, 151, 161, 171, 181, 191, 201, 211 or 241) which only has the power MISFET 9 may be incorporated into a circuit module. FIG. 55 is a plan view which shows a part of a circuit module 321 according to the second configuration example.

With reference to FIG. 55, the circuit module 321 includes a mounting substrate 322, a plurality of wirings 323, the semiconductor package 301 (semiconductor device 1, 151, 161, 171, 181, 191, 201, 211 or 241), a first conductive bonding material 324, a control IC device 325, and a second conductive bonding material 326.

The mounting substrate 322 includes a main surface 327. The plurality of wirings 323 are formed on the main surface 327 of the mounting substrate 322. The semiconductor package 301 is mounted on the mounting substrate 322. The semiconductor package 301 is electrically connected to the plurality of wirings 323 through the first conductive bonding material 324. The first conductive bonding material 324 may be metal paste or solder.

The control IC device 325 includes the control IC 10 (refer to FIG. 2 and FIG. 49). The control IC device 325 is mounted on the mounting substrate 322. The control IC device 325 is electrically connected to the plurality of wirings 323 through the second conductive bonding material

326. The control IC device 325 is also electrically connected to the semiconductor package 301 through the plurality of wirings 323.

The control IC device 325 is electrically connected to the semiconductor package 301 in a manner similar to that shown in FIG. 2. The control IC device 325 externally controls the semiconductor package 301 (semiconductor device 1, 151, 161, 171, 181, 191, 201, 211 or 241).

The same effects as those described in each of the aforementioned preferred embodiments can be exhibited as well by the above-described structure. In this embodiment, a description has been given of an example in which the one-chip control IC device 325 including the control IC 10 is mounted on the mounting substrate 322.

However, in place of the control IC device 325, a circuit network which has functions similar to those of the control IC 10 may be mounted on the mounting substrate 322. The circuit network which has functions similar to those of the control IC 10 may be configured by mounting on the mounting substrate 322 a plurality of discrete devices and IC chips having any arbitrary functions.

As a matter of course, the control IC 10 in each of the aforementioned preferred embodiments and the circuit network having functions similar to those of the control IC 10 may be configured in any given manner, and it is not necessary to include all of the functional circuits (that is, the sensor MISFET 21, the input circuit 22, the current-voltage control circuit 23, the protection circuit 24, the gate control circuit 25, the active clamp circuit 26, the current detecting circuit 27, the power-supply reverse connection protection circuit 28, and the malfunction detection circuit 29), and some of the functional circuits may be removed.

The description does not restrict any combined configuration of the features shown in the first to the ninth preferred embodiments. The first to the ninth preferred embodiments may be combined with each other in any mode or any form. That is, a semiconductor device may be employed in which the features shown in the first to the ninth preferred embodiments are combined in any mode and any form.

Examples of the features extracted from the description and drawings are shown hereinafter.

Group A is to provide a semiconductor device capable of realizing an excellent ON resistance and an excellent active clamp capability at the same time.

[A1] A semiconductor device comprising: a semiconductor layer; an insulation gate-type first transistor which is formed in the semiconductor layer; an insulation gate-type second transistor which is formed in the semiconductor layer; and a control wiring which is formed on the semiconductor layer such as to be electrically connected to the first transistor and the second transistor, and transmits control signals that control the first transistor and the second transistor to be in ON states in (during) a normal operation and that control the first transistor to be in an OFF state and the second transistor to be in an ON state in (during) an active clamp operation.

According to the semiconductor device, in the normal operation, a current is allowed to flow by using the first transistor and the second transistor. Thereby, it is possible to reduce an ON resistance. On the other hand, in the active clamp operation, a current is allowed to flow by using the second transistor in a state where the first transistor is stopped. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

[A2] The semiconductor device according to A1, wherein the control wiring includes a first control wiring which is electrically connected to the first transistor and a second control wiring which is electrically connected to the second transistor in a state of being electrically insulated from the first transistor.

[A3] A semiconductor device comprising: a semiconductor layer; an insulation gate-type first transistor which is formed in the semiconductor layer; an insulation gate-type second transistor which is formed in the semiconductor layer; and a control circuit which is formed in the semiconductor layer such as to be electrically connected to the first transistor and the second transistor, controls the first transistor and the second transistor to be in ON states in (during) a normal operation, and controls the first transistor to be in an OFF state and the second transistor to be in an ON state in (during) an active clamp operation According to the semiconductor device, in the normal operation, a current is allowed to flow by using the first transistor and the second transistor. Thereby, it is possible to reduce an ON resistance. On the other hand, in the active clamp operation, in a state where the first transistor is stopped, a current is allowed to flow by using the second transistor. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

[A4] A semiconductor device comprising: a semiconductor layer; an insulation gate-type first transistor which includes a first channel and is formed in the semiconductor layer; an insulation gate-type second transistor which includes a second channel and is formed in the semiconductor layer; and a control wiring which is formed in the semiconductor layer such as to be electrically connected to the first transistor and the second transistor, and transmits control signals that control the first transistor and the second transistor such that utilization rates of the first channel and the second channel in an active clamp operation becomes in excess of zero and less than utilization rates of the first channel and the second channel in a normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

[A5] The semiconductor device according to A4, wherein the control wiring includes a first control wiring which is electrically connected to the first transistor and a second control wiring which is electrically connected to the second transistor in a state of being electrically insulated from the first transistor.

[A6] A semiconductor device comprising: a semiconductor layer; an insulation gate-type first transistor which includes a first channel and is formed in the semiconductor layer; an insulation gate-type second transistor which includes a second channel and is formed in the semiconductor layer; and a control circuit which is formed in the semiconductor layer such as to be electrically connected to the first transistor and the second transistor, and controls the first transistor and the second transistor such that utilization rates of the first channel and the second channel in an active clamp operation becomes in excess of zero and less than utilization rates of the first channel and the second channel in a normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

[A7] The semiconductor device according to any one of A4 to A6, wherein the first channel is formed at a first rate in plan view and the second channel is formed at a second rate different from the first rate in plan view.

[A8] The semiconductor device according to A7, wherein the second channel is formed at a second rate less than the first rate.

[A9] The semiconductor device according to any one of A1 to A8, wherein the first transistor includes a first gate structure which has a first insulation layer in contact with the semiconductor layer and a first electrode facing the semiconductor layer across the first insulation layer, and the second transistor includes a second gate structure which has a second insulation layer in contact with the semiconductor layer and a second electrode facing the semiconductor layer across the second insulation layer.

[A10] The semiconductor device according to A9, wherein the first transistor includes the plurality of first gate structures and the second transistor includes the plurality of second gate structures.

[A11] The semiconductor device according to A10, wherein the plurality of second gate structures are alternately arrayed with the plurality of first gate structures in a manner that one or the plurality of first gate structures are held therebetween.

[A12] The semiconductor device according to A10 or A11, wherein the plurality of first gate structures are formed at an interval along a first direction, and each extend in a band shape along a second direction which intersects the first direction, and the plurality of second gate structures are formed at an interval along the first direction, and each extend in a band shape along the second direction.

[A13] The semiconductor device according to any one of A9 to A12, wherein the semiconductor layer includes a main surface, the first gate structure has a first trench gate structure which includes a first trench formed in the main surface, the first insulation layer along an inner wall of the first trench, and the first electrode embedded in the first trench across the first insulation layer, and the second gate structure has a second trench gate structure which includes a second trench formed in the main surface, the second insulation layer along an inner wall of the second trench, and the second electrode embedded in the second trench across the second insulation layer.

[A14] The semiconductor device according to A13, wherein the first electrode has an insulated separation-type electrode structure which includes a first bottom-side electrode embedded in a bottom wall side of the first trench across the first insulation layer, a first opening-side electrode embedded in an opening side of the first trench across the first insulation layer, and a first intermediate insulation layer interposed between the first bottom-side electrode and the first opening-side electrode, and the second electrode has an insulated separation-type electrode structure which includes a second bottom-side electrode embedded in a bottom wall side of the second trench across the second insulation layer, a second opening-side electrode embedded in an opening side of the second trench across the second insulation layer, and a second intermediate insulation layer interposed between the second bottom-side electrode and the second opening-side electrode.

[A15] The semiconductor device according to A14, wherein the second opening-side electrode is electrically insulated from the first opening-side electrode.

[A16] The semiconductor device according to A14 or A15, wherein the second bottom-side electrode is electrically connected to the first bottom-side electrode.

[A17] The semiconductor device according to A14 or A15, wherein the second bottom-side electrode is electrically insulated from the first bottom-side electrode.

[A18] The semiconductor device according to A13, wherein the first electrode is embedded in the first trench as an integrated member and the second electrode is embedded in the second trench as an integrated member.

[A19] A circuit module comprising; a mounting substrate; and the semiconductor device according to any one of A1 to A18 which is mounted in the mounting substrate.

Group B is to provide a semiconductor device which has a structure provided with a plurality of electrodes each embedded in a plurality of annular trenches and capable of electrically connecting the plurality of electrodes by a simple structure while suppressing a wiring resistance.

[B1] A semiconductor device comprising; a substrate which has a main surface; a first trench which is formed in the main surface and which includes a first annular trench and a first connection trench led out from an outer circumferential side wall of the first annular trench in a first direction in plan view; a second trench which is formed in the main surface and which includes a second annular trench formed at an interval from the first trench in the first direction and a second connection trench led out from an outer circumferential side wall of the second annular trench toward the first annular trench such as to face the first connection trench in a second direction orthogonal to the first direction in plan view; a first electrode which is embedded in the first trench and which includes a first annular portion inside the first annular trench and a first connection portion inside the first connection trench; a second electrode which is embedded in the second trench and which includes a second annular portion inside the second annular trench and a second connection portion inside the second connection trench; an insulation layer which covers the first electrode and the second electrode on the main surface; a first through electrode which penetrates through the insulation layer and is connected to the first connection portion of the first electrode; a second through electrode which penetrates through the insulation layer and is connected to the second connection portion of the second electrode; and a wiring which is connected to the first through electrode and the second through electrode on the insulation layer.

According to the semiconductor device, the first electrode embedded in the first annular trench and the second electrode embedded in the second annular trench can be electrically connected by a simple structure while a wiring resistance of the wiring is suppressed.

[B2] The semiconductor device according to B1, wherein the wiring extends along the second direction.

[B3] The semiconductor device according to B1 or B2, wherein the wiring connects the first through electrode and the second through electrode in the shortest distance.

[B4] The semiconductor device according to any one of B1 to B3, wherein the first electrode includes a first polysilicon layer and the second electrode includes a second polysilicon layer.

[B5] The semiconductor device according to B4, further comprising; a first conductive-type first contact region which is formed in the first connection portion of the first polysilicon layer; and a second conductive-type second contact region which is formed in the second connection portion of the second polysilicon layer; wherein the wiring electrically connects the first contact region and the second contact region.

[B6] The semiconductor device according to B4 or B5, further comprising; a first pn junction structure which is formed in the first annular portion of the first polysilicon layer; and a second pn junction structure which is formed in the second annular portion of the second polysilicon layer.

[B7] The semiconductor device according to B6, wherein the wiring connects the first pn junction structure and the second pn junction structure in series.

[C1] A semiconductor device comprising; a semiconductor layer which includes a transistor region and a temperature sensitive device region; an insulation gate-type first transistor which is formed in the transistor region; an insulation gate-type second transistor which is formed in the transistor region; a temperature-sensitive diode which is formed in the temperature sensitive device region and monitors a temperature of the transistor region; and a control wiring which is formed anywhere on the semiconductor layer such as to be electrically connected to the first transistor and the second transistor in the transistor region and transmits control signals that control the first transistor and the second transistor to be in ON states in (during) a normal operation and that control the first transistor to be in an OFF state and the second transistor to be in an ON state in (during) an active clamp operation.

[C2] The semiconductor device according to C1, wherein the control wiring includes a first control wiring which is electrically connected to the first transistor and a second control wiring which is electrically connected to the second transistor in a state of being electrically insulated from the first transistor.

[C3] A semiconductor device comprising; a semiconductor layer which includes a transistor region, a temperature sensitive device region and a control region; an insulation gate-type first transistor which is formed in the transistor region; an insulation gate-type second transistor which is formed in the transistor region; a temperature-sensitive diode which is formed in the temperature sensitive device region and monitors a temperature of the transistor region; and a control circuit which is formed in the control region such as to be electrically connected to the first transistor and the second transistor, controls the first transistor and the second transistor to be in ON states in (during) a normal operation and controls the first transistor to be in an OFF state and the second transistor to be in an ON state in (during) an active clamp operation. According to the semiconductor device, it is possible to appropriately cope with a temperature rise of the transistor region.

[C4] A semiconductor device comprising; a semiconductor layer which includes a transistor region and a temperature sensitive device region; an insulation gate-type first transistor which includes a first channel and is formed in the transistor region; an insulation gate-type second transistor which includes a second channel and is formed in the transistor region; a temperature-sensitive diode which is formed in the temperature sensitive device region and monitors a temperature of the transistor region; and a control wiring which is formed anywhere on the semiconductor layer such as to be electrically connected to the first transistor and the second transistor, and transmits control signals that control the first transistor and the second transistor such that utilization rates of the first channel and the second channel in an active clamp operation becomes in excess of zero and less than utilization rates of the first channel and the second channel in a normal operation. According to the semiconductor device, it is possible to appropriately cope with a temperature rise of the transistor region.

[C5] The semiconductor device according to C4, wherein the control wiring includes a first control wiring which is electrically connected to the first transistor and a second control wiring which is electrically connected to the second transistor in a state of being electrically insulated from the first transistor.

[C6] A semiconductor device comprising; a semiconductor layer which includes a transistor region, a temperature sensitive device region and a control region; an insulation gate-type first transistor which includes a first channel and is formed in the transistor region; an insulation gate-type second transistor which includes a second channel and is formed in the transistor region; a temperature-sensitive diode which is formed in the temperature sensitive device region and monitors a temperature of the transistor region; and a control circuit which is formed in the control region such as to be electrically connected to the first transistor and the second transistor, and controls the first transistor and the second transistor such that utilization rates of the first channel and the second channel in an active clamp operation may be in excess of zero and less than the utilization rates of the first channel and the second channel in a normal operation. According to the semiconductor device, it is possible to appropriately cope with a temperature rise of the transistor region.

[C7] The semiconductor device according to any one of C1 to C6, wherein the temperature-sensitive diode includes a temperature-sensitive diode structure which has a trench formed in the temperature sensitive device region, a polysilicon layer embedded in the trench, a p-type anode region formed in the polysilicon layer, and an n-type cathode region formed in the polysilicon layer.

[D1] A semiconductor device comprising; a substrate which has a main surface, an annular trench which is formed in the main surface, and which integrally includes a first trench portion and a second trench portion extending along a first direction and facing in a second direction orthogonal to the first direction in plan view as well as a third trench portion and a fourth trench portion extending along the second direction and facing in the first direction in plan view; a polysilicon layer which is embedded in the annular trench; a p-type anode region which is formed in a part inside the first trench portion in the polysilicon layer; and an n-type cathode region which is formed in a part inside the second trench portion in the polysilicon layer.

According to the semiconductor device, the diode structure including the trench, the polysilicon layer, the anode region, and the cathode region is fabricated into the substrate. Thereby, it is possible to suppress an increase in size of the semiconductor device due to the diode structure.

[D2] The semiconductor device according to D1, wherein the anode region has one or more of led out portions which is led out to one or both of the third trench portion and the fourth trench portion from the first trench portion.

[D3] The semiconductor device according to D2, wherein one or more of the led out portions of the anode region are formed at an interval from the second trench portion to the first trench portion side.

[D4] The semiconductor device according to any one of D1 to D3, wherein the cathode region has one or more of led out portions which is led out to one or both of the third trench portion and the fourth trench portion from the second trench portion.

[D5] The semiconductor device according to D4, wherein one or more of the led out portions of the cathode region are formed at an interval from the first trench portion to the second trench portion side.

[D6] The semiconductor device according to any one of D1 to D5, wherein the cathode region is formed at an interval from the anode region.

[D7] The semiconductor device according to any one of D1 to D6 further comprising; a first connection trench which is formed in the main surface such as to extend in the second direction and communicate with the first trench portion of the annular trench; and a second connection trench which is formed in the main surface such as to extend in the second direction and communicate with the second trench portion of the annular trench; wherein the polysilicon layer is embedded in the annular trench, the first connection trench, and the second connection trench.

[D8] The semiconductor device according to D7 further comprising; a p-type anode contact region which is formed in a part inside the first connection trench in the polysilicon layer and electrically connected to the anode region; and an n-type cathode contact region which is formed in a part inside the second connection trench in the polysilicon layer and electrically connected to the cathode region.

[D9] The semiconductor device according to any one of D1 to D8 further comprising; a p-type well region which is formed in a surface layer portion of the polysilicon layer; wherein the anode region has a p-type impurity concentration in excess of a p-type impurity concentration of the well region and is formed in a surface layer portion of the well region, and the cathode region is formed in the surface layer portion of the well region.

[E1] A semiconductor device comprising; a semiconductor layer which has a main surface; a temperature-sensitive diode structure which has a trench formed in the main surface; an insulation layer formed on an inner wall of the trench; a polysilicon layer embedded in trench across the insulation layer, and a pn junction structure formed in the polysilicon layer; and a trench gate structure which has a gate trench formed in the main surface, a gate insulation layer formed on an inner wall of the gate trench, and an embedded electrode which is embedded in the gate trench across the gate insulation layer. According to this structure, it is possible to provide a semiconductor device capable of suppressing an increase in size thereof due to the temperature-sensitive diode structure.

[E2] The semiconductor device according to E1 further comprising; a region separation structure which has a separation trench formed in the main surface, a separation insulation layer formed on an inner wall of the separation trench, and a separation electrode embedded in the separation trench across the separation insulation layer to define the main surface to a diode region and a transistor region; wherein the temperature-sensitive diode structure is formed in the diode region, and the trench gate structure is formed in the transistor region.

[E3] The semiconductor device according to E2, wherein the separation electrode is composed of a conductive polysilicon layer.

[E4] The semiconductor device according to any one of E1 to E3, wherein the embedded electrode has an insulated separation-type electrode structure which includes a bottom-side electrode embedded in a bottom wall side of the gate trench across the gate insulation layer, an opening-side electrode embedded in an opening side of the gate trench across the gate insulation layer, and an intermediate insulation layer interposed between the bottom-side electrode and the opening-side electrode.

[E5] The semiconductor device according to E4, wherein the bottom-side electrode is composed of a conductive polysilicon layer, and the opening-side electrode is composed of a conductive polysilicon layer.

[E6] The semiconductor device according to any one of E1 to E5 further comprising; a p-type body region which is formed in a region along the trench gate structure in a surface layer portion of the main surface; wherein the temperature-sensitive diode structure includes a p-type well region which is formed in a surface layer portion of the polysilicon layer and has a p-type impurity concentration equal to a p-type impurity concentration of the body region.

[E7] The semiconductor device according to E6 further comprising; an n-type source region which is formed in a surface layer portion of the body region; wherein the temperature-sensitive diode structure includes an n-type cathode region which has an n-type impurity concentration equal to an n-type impurity concentration of the source region and forms a part of the pn junction structure in the surface layer portion of the well region.

[E8] The semiconductor device according to E6 or E7 further comprising; a p-type contact region which is formed in the surface layer portion of the body region; wherein the temperature-sensitive diode structure includes a p-type anode region which has a p-type impurity concentration equal to a p-type impurity concentration of the contact region and forms a part of the pn junction structure in the surface layer portion of the well region.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:

a substrate which has a main surface;

a trench gate structure which has a gate trench formed in the main surface, a gate insulation layer formed on an inner wall of the gate trench and an embedded electrode embedded in the gate trench across the gate insulation layer; and a temperature-sensitive diode structure which has a trench formed in the main surface at an interval from the gate trench, a polysilicon layer embedded in the trench, a p-type anode region formed in the polysilicon layer, and an n-type cathode region formed in the polysilicon layer;

wherein the trench of the temperature-sensitive diode structure has a depth equal to or more than a depth of the gate trench of the trench gate structure.

2. The semiconductor device according to claim 1, wherein the anode region is formed in a surface layer portion of the polysilicon layer, and the cathode region is formed in the surface layer portion of the polysilicon layer.

3. The semiconductor device according to claim 1, wherein the anode region is formed at an interval from a bottom portion of the polysilicon layer, and the cathode region is formed at an interval from the bottom portion of the polysilicon layer.

4. The semiconductor device according to claim 1, wherein the temperature-sensitive diode structure includes a p-type well region formed in a surface layer portion of the polysilicon layer, the anode region is formed in a surface layer portion of the well region, and the cathode region is formed in the surface layer portion of the well region.

5. The semiconductor device according to claim 4, wherein the well region is formed at an interval from the bottom portion of the polysilicon layer.

6. The semiconductor device according to claim 4, wherein the cathode region is formed at an interval from the anode region.

7. The semiconductor device according to claim 4, wherein the cathode region is electrically connected to the anode region through the well region.

8. The semiconductor device according to claim 1, wherein the temperature-sensitive diode structure includes an impurity-free non-doped region which is formed in a region in a bottom portion side of the polysilicon layer with respect to the anode region and the cathode region.

9. The semiconductor device according to claim 8, wherein a thickness of the non-doped region is in excess of a thickness of the anode region and a thickness of the cathode region.

10. The semiconductor device according to claim 1, wherein the trench includes an annular trench formed in an annular shape in plan view, the anode region is formed in a part inside the annular trench in the polysilicon layer, and the cathode region is formed in a part inside the annular trench in the polysilicon layer.

11. The semiconductor device according to claim 10, wherein the trench includes a first connection trench which communicates with an outer circumferential side wall of the annular trench, and the temperature-sensitive diode structure includes a p-type anode contact region which is formed in a part inside the first connection trench in the polysilicon layer and electrically connected to the anode region.

12. The semiconductor device according to claim 10, wherein the trench includes a second connection trench which communicates with an outer circumferential side wall of the annular trench, and the temperature-sensitive diode structure includes an n-type cathode contact region which is formed in a part inside the second connection trench in the polysilicon layer and electrically connected to the cathode region.

13. The semiconductor device according to claim 1, wherein the semiconductor device includes a plurality of the temperature-sensitive diode structures.

14. The semiconductor device according to claim 13, wherein the plurality of temperature-sensitive diode structures are formed at an interval from each other in an orientation wherein an anode region of one of the temperature-sensitive diode structures faces a cathode region of another of the temperature-sensitive diode structures.

15. The semiconductor device according to claim 1, further comprising:

an anode wiring structure which has an anode trench formed in the main surface at an interval from the trench, and an anode wiring electrode embedded in the anode trench, and an anode-anode wiring which is formed on the main surface and electrically connects the anode wiring electrode and the anode region.

16. The semiconductor device according to claim 1, further comprising:

a cathode wiring structure which has a cathode trench formed in the main surface at an interval from the trench, and a cathode wiring electrode embedded in the cathode trench, and a cathode-cathode wiring which is formed on the main surface and electrically connects the cathode wiring electrode and the cathode region.

17. The semiconductor device according to claim 1, wherein the temperature-sensitive diode structure includes an insulation layer formed on an inner wall of the trench, and the polysilicon layer embedded in the trench across the insulation layer.

18. The semiconductor device according to claim 1, wherein the embedded electrode has an insulated separation-type electrode structure which includes a bottom-side electrode embedded in a bottom wall side of the gate trench across the gate insulation layer, an opening-side electrode embedded in an opening side of the gate trench across the gate insulation layer, and an intermediate insulation layer interposed between the bottom-side electrode and the opening-side electrode.

* * * * *